(12) United States Patent
Lin et al.

(10) Patent No.: US 7,419,851 B2
(45) Date of Patent: *Sep. 2, 2008

(54) METHOD OF MAKING A SEMICONDUCTOR CHIP ASSEMBLY WITH A METAL CONTAINMENT WALL AND A SOLDER TERMINAL

(75) Inventors: Charles W. C. Lin, Singapore (SG); Chia-Chung Wang, Hsinchu (TW)

(73) Assignee: Bridge Semiconductor Corporation, Taipei (TW)

( * ) Notice: Subject to any disclaimer, the term of this patent is extended or adjusted under 35 U.S.C. 154(b) by 513 days.

This patent is subject to a terminal disclaimer.

(21) Appl. No.: 11/216,783

(22) Filed: Aug. 31, 2005

(65) Prior Publication Data

US 2006/0014316 A1 Jan. 19, 2006

Related U.S. Application Data

(63) Continuation of application No. 11/213,398, filed on Aug. 26, 2005, which is a continuation-in-part of application No. 11/137,960, filed on May 26, 2005, now Pat. No. 7,075,186.

(60) Provisional application No. 60/647,592, filed on Jan. 27, 2005, provisional application No. 60/604,522, filed on Aug. 26, 2004.

(51) Int. Cl.
  *H01L 21/44* (2006.01)
(52) U.S. Cl. ............... 438/107; 438/612; 257/E21.503
(58) Field of Classification Search .......... 438/106, 438/112, 612, 613, 745; 257/779, 782
See application file for complete search history.

(56) References Cited

U.S. PATENT DOCUMENTS

| | | | |
|---|---|---|---|
| 4,442,967 A | 4/1984 | van de Pas et al. | 228/159 |
| 4,661,192 A | 4/1987 | McShane | 156/292 |
| 4,717,066 A | 1/1988 | Goldenberg et al. | 228/179 |
| 4,750,666 A | 6/1988 | Neugebauer et al. | 228/160 |
| 4,807,021 A | 2/1989 | Okumura | 357/75 |

(Continued)

FOREIGN PATENT DOCUMENTS

EP 0 718 882 A1 6/1996

(Continued)

OTHER PUBLICATIONS

Markstein et al., "Controlling the Variables in Stencil Printing," Electronic Packaging & Production, Feb. 1997, pp. 48-56.

(Continued)

*Primary Examiner*—Quoc D Hoang
(74) *Attorney, Agent, or Firm*—David M. Sigmond

(57) ABSTRACT

A method of making a semiconductor chip assembly includes providing a metal base, a routing line, a metal containment wall and a solder layer in which the metal containment wall includes a cavity and the solder terminal contacts the metal containment wall in the cavity, mechanically attaching a semiconductor chip to the routing line, forming a connection joint that electrically connects the routing line and the pad, etching the metal base to reduce contact area between the metal base and the routing line and between the metal base and the metal containment wall, and providing a solder terminal that includes the solder layer.

200 Claims, 94 Drawing Sheets

U.S. PATENT DOCUMENTS

| | | | | |
|---|---|---|---|---|
| 4,925,083 A | 5/1990 | Farassat et al. | ............... | 228/102 |
| 4,937,653 A | 6/1990 | Blonder et al. | ................ | 357/68 |
| 4,955,523 A | 9/1990 | Calomagno et al. | ......... | 228/179 |
| 4,970,571 A | 11/1990 | Yamakawa et al. | ............ | 357/71 |
| 4,984,358 A | 1/1991 | Nelson | ........................ | 29/830 |
| 5,014,111 A | 5/1991 | Tsuda et al. | ................... | 357/68 |
| 5,060,843 A | 10/1991 | Yasuzato et al. | ............ | 228/179 |
| 5,074,947 A | 12/1991 | Estes et al. | ............... | 156/307.3 |
| 5,090,119 A | 2/1992 | Tsuda et al. | ................... | 29/843 |
| 5,106,461 A | 4/1992 | Volfson et al. | .............. | 205/125 |
| 5,116,463 A | 5/1992 | Lin et al. | .................... | 156/653 |
| 5,137,845 A | 8/1992 | Lochon et al. | .............. | 437/183 |
| 5,167,992 A | 12/1992 | Lin et al. | .................... | 427/437 |
| 5,172,851 A | 12/1992 | Matsushita et al. | ......... | 228/179 |
| 5,196,371 A | 3/1993 | Kulesza et al. | .............. | 437/183 |
| 5,209,817 A | 5/1993 | Ahmad et al. | ............... | 156/643 |
| 5,237,130 A | 8/1993 | Kulesza et al. | .............. | 174/260 |
| 5,260,234 A | 11/1993 | Long | ........................... | 437/203 |
| 5,261,593 A | 11/1993 | Casson et al. | .......... | 228/180.22 |
| 5,275,330 A | 1/1994 | Isaacs et al. | ............... | 228/180.2 |
| 5,284,796 A | 2/1994 | Nakanishi et al. | ........... | 437/183 |
| 5,293,067 A | 3/1994 | Thompson et al. | ............ | 257/668 |
| 5,294,038 A | 3/1994 | Nakano et al. | ........... | 228/179.1 |
| 5,327,010 A | 7/1994 | Uenaka et al. | ............... | 257/679 |
| 5,334,804 A | 8/1994 | Love et al. | ................... | 174/267 |
| 5,346,750 A | 9/1994 | Hatakeyama et al. | ........ | 428/209 |
| 5,355,283 A | 10/1994 | Marrs et al. | .................. | 361/760 |
| 5,358,621 A | 10/1994 | Oyama | ........................ | 205/123 |
| 5,364,004 A | 11/1994 | Davidson | .................... | 228/1.1 |
| 5,397,921 A | 3/1995 | Karnezos | .................... | 257/779 |
| 5,407,864 A | 4/1995 | Kim | ........................... | 437/203 |
| 5,424,245 A | 6/1995 | Gurtler et al. | ................ | 437/183 |
| 5,438,477 A | 8/1995 | Pasch | ........................ | 361/689 |
| 5,439,162 A | 8/1995 | George et al. | .......... | 228/180.22 |
| 5,447,886 A | 9/1995 | Rai | ............................ | 437/183 |
| 5,454,161 A | 10/1995 | Beilin et al. | .................. | 29/852 |
| 5,454,928 A | 10/1995 | Rogers et al. | ............... | 205/125 |
| 5,475,236 A | 12/1995 | Yoshizaki | ..................... | 257/48 |
| 5,477,933 A | 12/1995 | Nguyen | ....................... | 174/262 |
| 5,478,007 A | 12/1995 | Marrs | .................... | 228/180.22 |
| 5,483,421 A | 1/1996 | Gedney et al. | ................ | 361/771 |
| 5,484,647 A | 1/1996 | Nakatani et al. | .............. | 428/209 |
| 5,485,949 A | 1/1996 | Tomura et al. | ............ | 228/180.5 |
| 5,487,218 A | 1/1996 | Bhatt et al. | .................... | 29/852 |
| 5,489,804 A | 2/1996 | Pasch | ........................ | 257/778 |
| 5,493,096 A | 2/1996 | Koh | ......................... | 219/121.71 |
| 5,508,229 A | 4/1996 | Baker | ......................... | 437/183 |
| 5,525,065 A | 6/1996 | Sobhani | ........................ | 439/67 |
| 5,536,973 A | 7/1996 | Yamaji | ........................ | 257/737 |
| 5,542,601 A | 8/1996 | Fallon et al. | ................... | 228/119 |
| 5,547,740 A | 8/1996 | Higdon et al. | ............... | 428/209 |
| 5,556,810 A | 9/1996 | Fujitsu | ........................ | 437/209 |
| 5,556,814 A | 9/1996 | Inoue et al. | .................... | 437/230 |
| 5,564,181 A | 10/1996 | Dineen et al. | ................... | 29/841 |
| 5,572,069 A | 11/1996 | Schneider | ..................... | 257/690 |
| 5,576,052 A | 11/1996 | Arledge et al. | ................. | 427/98 |
| 5,583,073 A | 12/1996 | Lin et al. | ..................... | 439/183 |
| 5,595,943 A | 1/1997 | Itabashi et al. | .............. | 437/230 |
| 5,599,744 A | 2/1997 | Koh et al. | ................... | 437/195 |
| 5,611,140 A | 3/1997 | Kulesza et al. | ................ | 29/832 |
| 5,611,884 A | 3/1997 | Bearinger et al. | ........... | 156/325 |
| 5,613,296 A | 3/1997 | Kurino et al. | ................... | 29/852 |
| 5,614,114 A | 3/1997 | Owen | ....................... | 219/121.66 |
| 5,615,477 A | 4/1997 | Sweitzer | ..................... | 29/840 |
| 5,619,791 A | 4/1997 | Lambrecht, Jr. et al. | ....... | 29/852 |
| 5,627,405 A | 5/1997 | Chillara | ....................... | 257/668 |
| 5,627,406 A | 5/1997 | Pace | ............................ | 257/700 |
| 5,633,204 A | 5/1997 | Tago et al. | .................. | 438/614 |
| 5,637,920 A | 6/1997 | Loo | ............................ | 257/700 |
| 5,641,113 A | 6/1997 | Somaki et al. | ......... | 228/180.22 |
| 5,645,628 A | 7/1997 | Endo et al. | .................. | 106/1.23 |
| 5,646,067 A | 7/1997 | Gaul | ........................... | 437/180 |
| 5,648,686 A | 7/1997 | Hirano et al. | ................ | 257/778 |
| 5,654,584 A | 8/1997 | Fujitsu | ........................ | 257/666 |
| 5,656,858 A | 8/1997 | Kondo et al. | ................ | 257/737 |
| 5,663,598 A | 9/1997 | Lake et al. | ..................... | 257/737 |
| 5,665,652 A | 9/1997 | Shimizu | ....................... | 438/127 |
| 5,666,008 A | 9/1997 | Tomita et al. | ................ | 257/778 |
| 5,669,545 A | 9/1997 | Pham et al. | ..................... | 228/1.1 |
| 5,674,785 A | 10/1997 | Akram et al. | ................ | 437/217 |
| 5,674,787 A | 10/1997 | Zhao et al. | .................... | 437/230 |
| 5,677,566 A | 10/1997 | King et al. | ..................... | 257/666 |
| 5,682,061 A | 10/1997 | Khandros et al. | ............ | 257/666 |
| 5,686,353 A | 11/1997 | Yagi et al. | .................... | 437/183 |
| 5,691,041 A | 11/1997 | Frankeny et al. | ............. | 428/209 |
| 5,722,162 A | 3/1998 | Chou et al. | ..................... | 29/852 |
| 5,723,369 A | 3/1998 | Barber | ........................ | 438/106 |
| 5,731,223 A | 3/1998 | Padmanabhan | ............. | 437/183 |
| 5,736,456 A | 4/1998 | Akram | ........................ | 438/614 |
| 5,739,585 A | 4/1998 | Akram et al. | ................ | 257/698 |
| 5,744,827 A | 4/1998 | Jeong et al. | ................... | 257/686 |
| 5,744,859 A | 4/1998 | Ouchida | ....................... | 257/668 |
| 5,757,071 A | 5/1998 | Bhansali | ....................... | 257/697 |
| 5,757,081 A | 5/1998 | Chang et al. | ................. | 257/778 |
| 5,764,486 A | 6/1998 | Pendse | ........................ | 361/774 |
| 5,774,340 A | 6/1998 | Chang et al. | ................. | 361/771 |
| 5,789,271 A | 8/1998 | Akram | .......................... | 438/18 |
| 5,798,285 A | 8/1998 | Bentlage et al. | ............. | 438/108 |
| 5,801,072 A | 9/1998 | Barber | ........................ | 438/107 |
| 5,801,447 A | 9/1998 | Hirano et al. | ................ | 257/778 |
| 5,803,340 A | 9/1998 | Yeh et al. | .................... | 228/56.3 |
| 5,804,771 A | 9/1998 | McMahon et al. | .......... | 174/255 |
| 5,808,360 A | 9/1998 | Akram | ......................... | 257/738 |
| 5,811,879 A | 9/1998 | Akram | ......................... | 257/723 |
| 5,813,115 A | 9/1998 | Misawa et al. | ................. | 29/832 |
| 5,817,541 A | 10/1998 | Averkiou et al. | ............. | 438/107 |
| 5,822,856 A | 10/1998 | Bhatt et al. | .................... | 29/832 |
| 5,834,844 A | 11/1998 | Akagawa et al. | ............. | 257/734 |
| 5,854,507 A | 12/1998 | Miremadi et al. | ............ | 257/686 |
| 5,861,666 A | 1/1999 | Bellaar | ........................ | 257/686 |
| 5,863,816 A | 1/1999 | Cho | ........................... | 438/123 |
| 5,870,289 A | 2/1999 | Tokuda et al. | ................ | 361/779 |
| 5,872,399 A | 2/1999 | Lee | ............................ | 257/738 |
| 5,883,435 A | 3/1999 | Geffken et al. | .............. | 257/758 |
| 5,925,931 A | 7/1999 | Yamamoto | .................... | 257/737 |
| 5,973,393 A | 10/1999 | Chia et al. | ..................... | 257/690 |
| 5,994,222 A | 11/1999 | Smith et al. | ................... | 438/689 |
| 6,001,671 A | 12/1999 | Fjelstad | ....................... | 438/112 |
| 6,012,224 A | 1/2000 | DiStefano et al. | ............. | 29/840 |
| 6,013,877 A | 1/2000 | Degani et al. | ................ | 174/264 |
| 6,017,812 A | 1/2000 | Yonezawa et al. | ............ | 438/613 |
| 6,018,196 A | 1/2000 | Noddin | ........................ | 257/777 |
| 6,020,561 A | 2/2000 | Ishida et al. | .................... | 174/261 |
| 6,025,650 A | 2/2000 | Tsuji et al. | ..................... | 257/786 |
| 6,037,665 A | 3/2000 | Miyazaki | ..................... | 257/773 |
| 6,046,909 A | 4/2000 | Joy | ............................. | 361/748 |
| 6,072,233 A | 6/2000 | Corisis et al. | ................ | 257/686 |
| 6,084,297 A | 7/2000 | Brooks et al. | ................ | 257/698 |
| 6,084,781 A | 7/2000 | Klein | ........................... | 361/771 |
| 6,088,236 A | 7/2000 | Tomura et al. | ............... | 361/783 |
| 6,103,552 A | 8/2000 | Lin | ............................. | 438/113 |
| 6,103,992 A | 8/2000 | Noddin | ..................... | 219/121.71 |
| 6,127,204 A | 10/2000 | Isaacs et al. | ................. | 438/106 |
| 6,159,770 A | 12/2000 | Tetaka et al. | ................. | 438/112 |
| 6,180,881 B1 | 1/2001 | Isaak | ........................ | 174/52.4 |
| 6,188,127 B1 | 2/2001 | Senba et al. | ................... | 257/686 |
| 6,218,728 B1 | 4/2001 | Kimura | ....................... | 257/693 |
| 6,281,568 B1 | 8/2001 | Glenn et al. | .................. | 257/684 |
| 6,297,543 B1 | 10/2001 | Hong et al. | ................. | 257/666 |
| 6,303,997 B1 | 10/2001 | Lee | ............................ | 257/778 |
| 6,440,835 B1 | 8/2002 | Lin | ............................. | 438/611 |
| 6,468,836 B1 | 10/2002 | Distefano et al. | ............ | 438/128 |
| 6,483,718 B2 | 11/2002 | Hashimoto | .................... | 361/803 |
| 6,492,252 B1 | 12/2002 | Lin et al. | ..................... | 438/612 |

| | | | |
|---|---|---|---|
| 6,504,241 B1 | 1/2003 | Yanagida | 257/686 |
| 6,576,539 B1 | 6/2003 | Lin | 438/611 |
| 6,608,371 B2 | 8/2003 | Kurashima et al. | 257/686 |
| 6,653,217 B1 | 11/2003 | Lin | 438/612 |
| 7,009,297 B1 | 3/2006 | Chiang et al. | 257/738 |
| 7,232,707 B1 * | 6/2007 | Wang et al. | 438/107 |

FOREIGN PATENT DOCUMENTS

| | | |
|---|---|---|
| WO | WO 97/38563 | 10/1997 |
| WO | WO 99/57762 | 11/1999 |

OTHER PUBLICATIONS

Elenius, "Choosing a Flip Chip Bumping Supplier—Technology an IC Package contractor should look for," Advanced Packaging, Mar./Apr. 1998, pp. 70-73.

Erickson, "Wafer Bumping: The Missing Link for DCA," Electronic Packaging & Production, Jul. 1998, pp. 43-46.

Kuchenmeister et al., "Film Chip Interconnection Systems Prepared By Wet Chemical Metallization," IEEE publication 0-7803-4526-6/98, Jun. 1998, 5 pages.

Ghaffarian, "Long Time BGA Assembly Reliability," Advancing Microelectronics, vol. 25, No. 6, Sep./Oct. 1998, pp. 20-23.

U.S. Appl. No. 09/465,024, filed Dec. 16, 1999, entitled "Bumpless Flip Chip Assembly With Solder Via".

U.S. Appl. No. 09/464,562, filed Dec. 16, 1999, entitled "Bumpless Flip Chip Assembly With Strips And Via-Fill".

U.S. Appl. No. 09/464,561, filed Dec. 16, 1999, entitled "Bumpless Flip Chip Assembly With Strips-In-Via And Plating".

U.S. Appl. No. 09/120,408, filed Jul. 22, 1998, entitled "Flip Chip Assembly With Via Interconnection".

U.S. Appl. No. 09/643,212, filed Aug. 22, 2000, entitled "Semiconductor Chip Assembly With Simultaneously Electroplated Contact Terminal and Connection Joint".

U.S. Appl. No. 09/643,214, filed Aug. 22, 2000, entitled "Semiconductor Chip Assembly with Simultaneously Electrolessly Plated Contact Terminal and Connection Joint".

U.S. Appl. No. 09/643,213, filed Aug. 22, 2000, entitled "Method Of Making A Support Circuit For A Semiconductor Chip Assembly".

U.S. Appl. No. 09/643,445, filed Aug. 22, 2000, entitled "Method Of Making A Semiconductor Chip Assembly".

U.S. Appl. No. 09/665,928, filed Sep. 20, 2000, entitled "Semiconductor Chip Assembly With Ball Bond Connection Joint".

U.S. Appl. No. 09/665,931, filed Sep. 20, 2000, entitled "Method Of Making A Support Circuit With A Tapered Through-Hole For A Semiconductor Chip Assembly".

U.S. Appl. No. 09/677,207, filed Oct. 2, 2000, entitled "Method Of Making A Semiconductor Chip Assembly With A Conductive Trace Subtractively Formed Before And After Chip Attachment".

U.S. Appl. No. 09/865,367, filed May 24, 2001, entitled "Semiconductor Chip Assembly With Simultaneously Electroplated Contact Terminal and Connection Joint".

U.S. Appl. No. 09/864,555, filed May 24, 2001, entitled "Semiconductor Chip Assembly with Simultaneously Electrolessly Plated Contact Terminal and Connection Joint".

U.S. Appl. No. 09/864,773, filed May 24, 2001, entitled "Semiconductor Chip Assembly With Ball Bond Connection Joint".

U.S. Appl. No. 10/714,794, filed Nov. 17, 2003, entitled "Semiconductor Chip Assembly With Embedded Metal Pillar".

U.S. Appl. No. 10/356,800, filed Feb. 1, 2003, entitled "Method of Connecting an Additively and Subtractively Formed Conductive Trace and an Insulative Base to a Semiconductor Chip".

U.S. Appl. No. 10/403,736, filed Mar. 31, 2003, entitled "Method of Making a Semiconductor Chip Assembly with Simultaneously Formed Interconnect and Connection Joint".

U.S. Appl. No. 10/889,368, filed Jul. 8, 2004, entitled "Method of Making a Semiconductor Chip Assembly With a Pillar and a Routing Line using Multiple Etch Steps".

U.S. Appl. No. 10/994,604, filed Nov. 22, 2004, entitled "Semiconductor Chip Assembly With Bumped Metal Pillar".

U.S. Appl. No. 10/994,836, filed Nov. 22, 2004, entitled "Semiconductor Chip Assembly With Carved Bumped Terminal".

* cited by examiner

METHOD OF MAKING A SEMICONDUCTOR CHIP ASSEMBLY WITH A METAL CONTAINMENT WALL AND A SOLDER TERMINAL

CROSS-REFERENCE TO RELATED APPLICATIONS

This application is a continuation of U.S. application Ser. No. 11/213,398 filed Aug. 26, 2005, which is a continuation-in-part of U.S. application Ser. No. 11/137,960 filed May 26, 2005, now U.S. Pat. No. 7,075,186, each of which is incorporated by reference.

This application also claims the benefit of U.S. Provisional Application Ser. No. 60/647,592 filed Jan. 27, 2005, and U.S. Provisional Application Ser. No. 60/604,522 filed Aug. 26, 2004, each of which is incorporated by reference.

BACKGROUND OF THE INVENTION

1. Field of the Invention

The present invention relates to a semiconductor chip assembly, and more particularly to a semiconductor chip assembly with a solder terminal and its method of manufacture.

2. Description of the Related Art

Semiconductor chips have input/output pads that must be connected to external circuitry in order to function as part of an electronic system. The connection media is typically an array of metallic leads (e.g., a lead frame) or a support circuit (e.g., a substrate), although the connection can be made directly to a circuit panel (e.g., a mother board). Several connection techniques are widely used. These include wire bonding, tape automated bonding (TAB) and flip-chip bonding.

The semiconductor chip assembly is subsequently connected to another circuit such as a printed circuit board (PCB) or mother board during next level assembly. Different semiconductor assemblies are connected to the next level assembly in different ways. For instance, ball grid array (BGA) packages contain an array of solder balls, and land grid array (LGA) packages contain an array of metal pads that receive corresponding solder traces on the PCB.

BGA packages typically have the solder balls fused on land metal elements such as nickel terminals. Since the solder balls are contact terminals to the next level assembly, the BGA package becomes degraded or inoperative when the solder balls separate from the land metal elements.

Conventional solder ball attachment techniques focus on allowing the solder ball to be easily fused on the land metal element. For instance, sequentially plating nickel and gold films on a smooth and flat surface of a land metal element allows the solder ball to be easily fused to the land metal element, however this does not avoid the solder ball separation problem.

Conventional solder ball attachment techniques also focus on contacting an insulator such as bismaleimide triazine epoxy to the solder ball in order to enhance the mechanical attachment of the solder ball. However, the solder ball easily separates from the epoxy as well as the land metal element.

In view of the various development stages and limitations in currently available semiconductor chip assemblies, there is a need for a semiconductor chip assembly that is cost-effective, reliable, manufacturable, versatile, provides a solder terminal with excellent mechanical and electrical properties, and makes advantageous use the particular connection joint technique best suited for a given application.

SUMMARY OF THE INVENTION

An object of the present invention is to provide a semiconductor chip assembly with a chip and a solder terminal that provides a low cost, high performance, high reliability package.

Another object of the present invention is to provide a convenient, cost-effective method for manufacturing a semiconductor chip assembly.

Generally speaking, the present invention provides a semiconductor chip assembly that includes a semiconductor chip that includes a conductive pad, a conductive trace that includes a routing line, a metal containment wall and a solder terminal, and a connection joint that electrically connects the routing line and the pad. The metal containment wall includes a cavity, and the solder terminal contacts the metal containment wall in the cavity and is spaced from the routing line.

Generally speaking, the present invention also provides a method of making a semiconductor chip assembly that includes providing a metal base, a routing line, a metal containment wall and a solder layer in which the metal containment wall includes a cavity and the solder terminal contacts the metal containment wall in the cavity, mechanically attaching a semiconductor chip to the routing line, forming a connection joint that electrically connects the routing line and the pad, etching the metal base to reduce contact area between the metal base and the routing line and between the metal base and the metal containment wall, and providing a solder terminal that includes the solder layer.

In accordance with an aspect of the invention, a semiconductor chip assembly, in which first and second opposing vertical directions are orthogonal to a lateral direction, includes (1) a semiconductor chip that includes first and second opposing surfaces, wherein the first surface of the chip includes a conductive pad, (2) a conductive trace that includes a routing line, a metal containment wall and a solder terminal, wherein (A) the routing line extends laterally beyond the metal containment wall and the solder terminal, (B) the metal containment wall includes a cavity and has essentially constant thickness and is the only electrical conductor of the assembly that contacts the solder terminal, and (C) the solder terminal contacts the metal containment wall in the cavity, (3) a connection joint that electrically connects the routing line and the pad, (4) an encapsulant that contacts the chip, and (5) an insulative base that contacts the routing line and the metal containment wall. The chip is embedded in the encapsulant, the metal containment wall is embedded in the insulative base, extends vertically beyond the solder terminal in the first direction and extends vertically beyond the routing line in the second direction, the cavity extends into the insulative base, the solder terminal extends into the insulative base and is not covered in the second direction by any material of the assembly, and the entire portion of the solder terminal that extends into the insulative base is within a surface area of the cavity and is covered in the first direction by the metal containment wall.

The chip can be the only chip embedded in the encapsulant, or alternatively, multiple chips can be embedded in the encapsulant. The first surface of the chip can face in the first direction and the second surface of the chip can face in the second direction, or alternatively, the first surface of the chip can face in the second direction and the second surface of the chip can face in the first direction. The chip can extend vertically beyond the routing line, the metal containment wall, the solder terminal and the insulative base in the first direction. The chip can also extend vertically beyond the conductive trace in the first direction. In addition, any chip embedded in the encapsulant can extend vertically beyond the conductive trace in the first direction.

The routing line can extend laterally beyond the metal containment wall and the solder terminal towards the chip. The routing line can extend vertically beyond the metal containment wall and the solder terminal in the first direction, and can extend vertically beyond the chip in the second direction. The routing line can extend within and outside the periphery of the chip, or alternatively, can be disposed outside the periphery of the chip. The routing line can also be essentially flat and parallel to the first and second surfaces of the chip. The routing line can contact and be non-integral with the metal containment wall, or alternatively, the routing line can be spaced from the metal containment wall. Furthermore, the routing line can be in an electrically conductive path between the metal containment wall and any chip embedded in the encapsulant, and between the solder terminal and any chip embedded in the encapsulant. That is, any chip embedded in the encapsulant can be electrically connected to the metal containment wall and the solder terminal by an electrically conductive path that includes the routing line.

The metal containment wall can be embedded in the insulative base. The metal containment wall can extend vertically beyond the solder terminal in the first direction, can extend vertically beyond the chip, the routing line, the connection joint and the encapsulant in the second direction, and can be disposed within or outside the periphery of the chip. The metal containment wall can be the only electrical conductor of the assembly that contacts the solder terminal, and can span 360 degrees laterally around the entire portion of the solder terminal that extends into the insulative base. The metal containment wall can have a bowl shape, a U shape in a vertical plane parallel to the first and second directions and a circular, rectangular or square shape in a lateral plane orthogonal to the first and second directions at an opening in the cavity. The metal containment wall can be substantially thinner than the routing line, can be a single-piece metal such as nickel and can include a continuous single-piece metal surface that defines the cavity. The metal containment wall can contact only the routing line, the solder terminal and the insulative base, or alternatively, can contact only a metal pillar, the solder terminal and the insulative base.

The cavity can extend across a majority of a height and diameter of the metal containment wall, can be covered in the first and lateral directions by the metal containment wall, can include an opening that faces in the second direction and can have a concave shape.

The solder terminal can extend within and outside the cavity, or alternatively, can be disposed within the cavity. The solder terminal can extend vertically beyond the chip, the routing line, the connection joint and the encapsulant in the second direction, and can be disposed within or outside the periphery of the chip. For example, the solder terminal can extend within and outside the cavity, can extend vertically beyond the metal containment wall and the insulative base in the second direction and can cover the metal containment wall in the second direction. The solder terminal can fill the cavity. In addition, the entire portion of the solder terminal that extends into the insulative base can be within the cavity, contact only the metal containment wall and be confined by the metal containment wall in the first and lateral directions. Furthermore, essentially all contact between the metal containment wall and the solder terminal can be within the cavity.

The connection joint can extend between and electrically connect the routing line and the pad. The connection joint can be electroplated metal, electrolessly plated metal, solder, conductive adhesive or a wire bond.

The encapsulant can cover the chip, the routing line, the metal containment wall, the solder terminal, the connection joint and the insulative base in the first direction and can be spaced from the metal containment wall and the solder terminal.

The insulative base can extend vertically beyond the metal containment wall and the solder terminal in the first direction, can extend vertically beyond the chip, the routing line, the connection joint and the encapsulant in the second direction, can cover the chip in the second direction and can be spaced from the solder terminal. The insulative base can span 360 degrees laterally around the metal containment wall. Furthermore, the insulative base can be laterally aligned with the metal containment wall at a planar surface that faces in the second direction, and the solder terminal can be disposed within the cavity and laterally aligned with the planar surface, or alternatively, the solder terminal can extend within and outside the cavity and extend vertically beyond the planar surface in the second direction.

The conductive trace can include a metal pillar that contacts and electrically connects and is non-integral with the routing line and the metal containment wall such that the routing line is spaced from the metal containment wall and extends laterally beyond the metal pillar.

The metal pillar can extend vertically beyond the metal containment wall and the solder terminal in the first direction, extend vertically beyond the chip, the routing line, the connection joint and the encapsulant in the second direction, and can be disposed within or outside the periphery of the chip. The metal pillar can be covered in the first direction by the routing line and covered in the second direction by the metal containment wall and the solder terminal. The metal pillar can be substantially thicker than the routing line and can be a single-piece metal such as copper. The metal pillar can have a generally conical shape with a diameter that substantially continuously decreases as the metal pillar extends in the second direction. Furthermore, the metal pillar can include a first surface that faces in the first direction and a second surface that faces in the second direction, a surface area of the second surface of the metal pillar can be disposed within a surface area of the first surface of the metal pillar, and the surface area of the first surface of the metal pillar can be at least 20 percent larger than the surface area of the second surface of the metal pillar.

The assembly can include an insulative adhesive that contacts the chip and the encapsulant and extends vertically beyond the chip in the second direction.

The assembly can include an electrically conductive path between the pad and the solder terminal that requires the routing line, the metal containment wall and the connection joint. Furthermore, the routing line can provide horizontal routing and no appreciable vertical routing between the pad and the solder terminal, and the metal containment wall can provide no appreciable routing between the solder terminal and any other electrical conductor.

The assembly can be a first-level package that is a single-chip or multi-chip package.

In accordance with another aspect of the invention, a method of making a semiconductor chip assembly includes (1) providing a metal base, a routing line, a metal containment wall and a solder layer, wherein the metal base includes first and second opposing surfaces, the first surface of the metal base faces in a first direction, the second surface of the metal base faces in a second direction opposite the first direction, the metal containment wall extends into the metal base from the second surface of the metal base towards the first surface of the metal base and includes a cavity, the cavity extends into the metal base from the second surface of the metal base towards the first surface of the metal base and includes an opening that faces in the second direction, and the solder layer contacts the metal containment wall in the cavity, (2) mechanically attaching a semiconductor chip to the routing line, wherein the chip includes a conductive pad, (3) forming a connection joint that electrically connects the routing line and the pad, (4) etching the metal base using a wet chemical etch, thereby reducing contact area between the metal base and the routing line and between the metal base and the metal containment wall, and (5) providing a solder terminal that contacts the metal containment wall in the cavity and includes the solder layer.

The method can include forming the routing line by depositing the routing line on the metal base. For instance, the method can include forming a plating mask on the metal base that includes an opening that exposes a portion of the metal base, and then electroplating the routing line on the exposed portion of the metal base through the opening in the plating mask.

The method can include forming the metal containment wall by depositing the metal containment wall on the metal base. For instance, the method can include forming a plating mask on the metal base that includes an opening that exposes a portion of the metal base, and then electroplating the metal containment wall on the exposed portion of the metal base through the opening in the plating mask.

The method can include forming the metal containment wall by etching the metal base to form a via that extends into the metal base from the second surface of the metal base towards the first surface of the metal base, and then depositing the metal containment wall into the via. For instance, the via can be a through-hole that extends through the metal base and exposes the routing line, the metal containment wall can extend through the metal base and contact the routing line, and etching the metal base using the wet chemical etch can eliminate contact area between the metal base and the routing line and between the metal base and the metal containment wall. Alternatively, the via can be a recess that extends into but not through the metal base and is spaced from the first surface of the metal base and the routing line, the metal containment wall can extend into but not through the metal base and be spaced from the first surface of the metal base and the routing line, and etching the metal base using the wet chemical etch can form a metal pillar from an unetched portion of the metal base that is defined by the metal containment wall and that contacts the routing line and the metal containment wall.

The method can include forming the solder layer by depositing the solder layer on the metal containment wall. Likewise, forming the solder layer can include contacting the solder layer only to the metal containment wall.

The method can include forming the solder terminal by forming the solder layer, or alternatively, forming the solder layer and then forming the solder terminal. For instance, forming the solder terminal can include depositing solder paste on the metal containment wall and then reflowing the solder paste to form the solder layer and the solder terminal, or alternatively, depositing solder paste on the metal containment wall and then reflowing the solder paste to form the solder layer, then depositing a solder material on the solder layer and then reflowing the solder material and the solder layer together to form the solder terminal.

The method can include forming the metal containment wall and the solder layer by etching the metal base to form the via, then depositing the metal containment wall on the metal base and into the via, and then depositing the solder layer on the metal containment wall. For instance, forming the metal containment wall and the solder layer can include, in sequence, etching the metal base to form the via, electroplating the metal containment wall on an exposed portion of the metal base and into the via, depositing solder paste on the metal containment wall, and reflowing the solder paste to form the solder layer. Furthermore, forming the via and the metal containment wall can include, in sequence, forming a mask on the metal base that includes an opening that exposes a portion of the metal base, etching the metal base through the opening in the mask to form the via, electroplating the metal containment wall on the exposed portion of the metal base and into the via through the opening in the mask, and removing the mask, or alternatively, forming an etch mask on the metal base that includes an opening that exposes a portion of the metal base, etching the metal base through the opening in the etch mask to form the via, removing the etch mask, forming a plating mask on the metal base that includes an opening that exposes a portion of the metal base and exposes the via, electroplating the metal containment wall on the exposed portion of the metal base and into the via through the opening in the plating mask, and removing the plating mask. Moreover, forming the solder layer can include, in sequence, depositing solder paste through the opening in the mask (that provides an etch mask for the via and a plating mask for the metal containment wall) on the metal containment wall, reflowing the solder paste, and removing the mask, or alternatively, removing the mask, depositing the solder paste on the metal containment wall, and reflowing the solder paste. Likewise, forming the solder layer can include, in sequence, depositing the solder paste through the opening in the plating mask (for the metal containment wall after the etch mask for the via is removed) on the metal containment wall, reflowing the solder paste, and removing the plating mask, or alternatively, removing the plating mask, depositing the solder paste on the metal containment wall, and reflowing the solder paste.

The method can include attaching the chip to the routing line by disposing an insulative adhesive between the chip and the metal base and then hardening the adhesive.

The method can include forming the connection joint by plating the connection joint between the routing line and the pad. For instance, the connection joint can be electroplated or electrolessly plated between the routing line and the pad. Alternatively, the method can include forming the connection joint by depositing a non-solidified material between the routing line and the pad and then hardening the non-solidified material. For instance, solder paste can be deposited between the routing line and the pad and then hardened by reflowing, or conductive adhesive can be deposited between the routing line and the pad and then hardened by curing. Alternatively, the method can include forming the connection joint by wire bonding.

The method can include etching the metal base using the wet chemical etch, thereby exposing the routing line, removing all of the metal base within the periphery of the pad and removing all of the metal base within the periphery of the chip. For instance, etching the metal base using the wet chemical etch can eliminate contact area between the metal base and the routing line and between the metal base and the metal containment wall and can remove the metal base, or alternatively, etching the metal base using the wet chemical etch can form a metal pillar from an unetched portion of the metal base that is defined by the metal containment wall and that contacts and electrically connects the routing line and the metal containment wall and can remove most of the metal base. Furthermore, etching the metal base using the wet chemical etch can electrically isolate the routing line from other routing lines that contact the metal base, and electrically isolate the pad from other pads of the chip. For instance, the method can include forming the connection joint by wire bonding, and then etching the metal base using the wet chemical etch, thereby electrically isolating the routing line from the other routing lines and the pad from other pads. Alternatively, the method can include forming the connection joint by electroplating using the metal base as a plating bus, and then etching the metal base using the wet chemical etch, thereby electrically isolating the routing line from the other routing lines and the pad from the other pads. Alternatively, the method can include etching the metal base using the wet chemical etch, thereby electrically isolating the routing line from the other routing lines, and then forming the connection joint by electroless plating in which case the pad remains electrically isolated from the other pads.

The method can include forming the routing line before forming the metal containment wall, or alternatively, forming the routing line simultaneously with the metal containment wall, or alternatively, forming the routing line after forming the metal containment wall.

The method can include forming the metal containment wall before forming the solder layer.

The method can include forming the metal containment wall before attaching the chip to the metal base and the routing line, or alternatively, forming the metal containment wall after attaching the chip to the metal base and the routing line.

The method can include forming the solder layer before attaching the chip to the metal base and the routing line, or alternatively, forming the solder layer after attaching the chip to the metal base and the routing line.

The method can include forming the solder layer before forming the solder terminal, or alternatively, forming the solder layer as the solder terminal.

The method can include forming the connection joint before etching the metal base using the wet chemical etch, or alternatively, forming the connection joint after etching the metal base using the wet chemical etch.

The method can include forming the solder terminal before attaching the chip to the metal base and the routing line, or alternatively, forming the solder terminal after attaching the chip to the metal base and the routing line.

The method can include forming the solder terminal before forming the connection joint, or alternatively, forming the solder terminal after forming the connection joint.

The method can include forming the solder terminal before etching the metal base using the wet chemical etch, or alternatively, forming the solder terminal after etching the metal base using the wet chemical etch.

The method can include forming the metal containment wall, then forming the solder layer, then attaching the chip to the metal base, the routing line, the metal containment wall and the solder layer, and then etching the metal base using the wet chemical etch.

The method can include forming the metal containment wall, then attaching the chip to the metal base, the routing line and the metal containment wall, then forming the solder layer, and then etching the metal base using the wet chemical etch.

The method can include attaching the chip to the metal base and the routing line, then forming the metal containment wall, then forming the solder layer, and then etching the metal base using the wet chemical etch.

The method can include forming an encapsulant that contacts the chip and covers the chip in the first direction after attaching the chip to the metal base and the routing line. The encapsulant can be formed by transfer molding or curing.

The method can include forming an insulative base that contacts the routing line, the metal containment wall and the solder layer and covers the routing line, the metal containment wall and the solder layer in the second direction after forming the encapsulant, and then removing a portion of the insulative base such that the insulative base does not cover the solder layer in the second direction.

The method can include (1) providing a metal base that includes first and second opposing surfaces, wherein the first surface of the metal base faces in a first direction and the second surface of the metal base faces in a second direction opposite the first direction, then (2) forming a routing line on the first surface of the metal base, wherein the routing line contacts the first surface of the metal base and is spaced from the second surface of the metal base, (3) etching the metal base using a first wet chemical etch to form a via in the metal base that extends into the metal base from the second surface of the metal base towards the first surface of the metal base, (4) forming a metal containment wall on the metal base, wherein the metal containment wall contacts the metal base in the via, extends into the metal base from the second surface of the metal base towards the first surface of the metal base and includes a cavity, and the cavity extends into the metal base from the second surface of the metal base towards the first surface of the metal base, is covered in the first direction by the metal containment wall and includes an opening that faces in the second direction, (5) forming a solder layer that contacts the metal containment wall in the cavity and is spaced from the routing line, (6) mechanically attaching a semiconductor chip to the metal base and the routing line, wherein the chip includes a conductive pad, (7) forming a connection joint that electrically connects the routing line and the pad, (8) etching the metal base using a second wet chemical etch after attaching the chip to the metal base and the routing line and forming the metal containment wall and the solder layer, thereby reducing contact area between the metal base and the routing line and between the metal base and the metal containment wall, and (9) providing a solder terminal that contacts the metal containment wall in the cavity and includes the solder layer.

The method can include (1) providing a metal base that includes first and second opposing surfaces, wherein the first surface of the metal base faces in a first direction and the second surface of the metal base faces in a second direction opposite the first direction, then (2) forming a routing line on the first surface of the metal base, wherein the routing line contacts the first surface of the metal base and is spaced from the second surface of the metal base, (3) etching the metal base using a first wet chemical etch, thereby forming a via in the metal base that extends into the metal base from the second surface of the metal base towards the first surface of the metal base, (4) forming a metal containment wall on the metal base, wherein the metal containment wall contacts the metal base in the via, extends into the metal base from the second surface of the metal base towards the first surface of the metal base and includes a cavity, and the cavity extends into the metal base from the second surface of the metal base towards the first surface of the metal base, is covered in the first direction by the metal containment wall and includes an opening that faces in the second direction, (5) forming a solder layer that contacts the metal containment wall in the cavity and is spaced from the routing line, (6) mechanically attaching a semiconductor chip to the metal base and the routing line, wherein the chip includes a conductive pad, (7) forming a connection joint that electrically connects the routing line and the pad, (8) forming an encapsulant after attaching the chip to the metal base and the routing line, wherein the encapsulant contacts the chip and extends vertically beyond the chip, the metal base and the routing line in the first direction, and the metal base extends vertically beyond the chip and the routing line in the second direction, (9) etching the metal base using a second wet chemical etch after forming the metal containment wall, the solder layer and the encapsulant, thereby reducing contact area between the metal base and the routing line and between the metal base and the metal containment wall, (10) forming an insulative base that contacts the routing line, the metal containment wall and the solder layer and covers the routing line, the metal containment wall and the solder layer in the second direction after etching the metal base using the second wet chemical etch, (11) removing a portion of the insulative base such than the insulative base does not cover the solder layer in the second direction, and (12) providing a solder terminal that contacts the metal containment wall in the cavity and includes the solder layer.

The method can include forming the metal containment wall and the solder layer by, in sequence, electroplating the metal containment wall on the metal base and into the via through an opening in a plating mask, depositing solder paste on the metal containment wall, and reflowing the solder paste to form the solder layer.

The method can include forming the solder terminal by forming the solder layer, or alternatively, by depositing a solder material on the solder layer after etching the metal base using the second wet chemical etch and then reflowing the solder material and the solder layer together to form the solder terminal.

The method can include attaching the chip to the metal base and the routing line (and, if already formed, the metal containment wall and the solder layer) by disposing an insulative adhesive between the chip and the metal base and then hardening the adhesive.

The method can include etching the metal base using the first wet chemical etch to form the via as a through-hole that extends through the metal base and exposes the routing line, and etching the metal base using the second wet chemical etch to eliminate contact area between the metal base and the routing line and between the metal base and the metal containment wall and remove the metal base, or alternatively, etching the metal base using the first wet chemical etch to form the via as a recess that extends into but not through the metal base, and etching the metal base using the second wet chemical etch to form a metal pillar from an unetched portion of the metal base that is defined by the metal containment wall and that contacts and electrically connects the routing line and the metal containment wall and remove most of the metal base.

The method can include removing the portion of the insulative base by grinding, laser ablation, plasma etching or photolithography. In addition, the method can include removing the portion of the insulative base to remove all of the insulative base that covers the metal containment wall and the solder layer in the second direction and to expose the metal containment wall and the solder layer in the second direction without exposing the routing line. For instance, the method can include grinding the insulative base without grinding the metal containment wall and without grinding the solder layer, then grinding the insulative base, the metal containment wall and the solder layer, and then discontinuing the grinding such that the insulative base is laterally aligned with the metal containment wall and the solder layer at a planar surface that faces in the second direction and the metal containment wall and the solder layer are exposed. Furthermore, after discontinuing the grinding, the solder terminal can consist of the solder layer and can be laterally aligned with the planar surface, or alternatively, the method can include depositing a solder material on the solder layer and then reflowing the solder material and the solder layer together to form the solder terminal which can extend vertically beyond the metal containment wall and the insulative base in the second direction.

The method can include etching the metal base using the first wet chemical etch to form the via, then forming the metal containment wall, then forming the solder layer, then attaching the chip to the metal base, the routing line, the metal containment wall and the solder layer, then forming the encapsulant, then etching the metal base using the second wet chemical etch, then forming the insulative base, and then removing the portion of the insulative base.

The method can include etching the metal base using the first wet chemical etch to form the via, then forming the metal containment wall, then attaching the chip to the metal base, the routing line and the metal containment wall, then forming the encapsulant, then forming the solder layer, then etching the metal base using the second wet chemical etch, then forming the insulative base, and then removing the portion of the insulative base.

The method can include attaching the chip to the metal base and the routing line, then forming the encapsulant, then etching the metal base using the first wet chemical etch to form the via, then forming the metal containment wall, then forming the solder layer, then etching the metal base using the second wet chemical etch, then forming the insulative base, and then removing the portion of the insulative base.

An advantage of the present invention is that the semiconductor chip assembly can be manufactured conveniently and cost effectively. Another advantage is that the encapsulant can be provided before the metal base is etched to reduce contact area between the metal base and the metal containment wall, thereby enhancing mechanical support and protection for the routing line. Another advantage is that the metal pillar can be formed by etching (subtractively) rather than by electroplating or electroless plating (additively) which improves uniformity and reduces manufacturing time and cost. Another advantage is that the solder terminal can extend into the metal containment wall within the insulative base rather than contact the assembly at a high-stress boundary in a lateral plane where an exposed major surface faces in the second direction, thereby reducing solder separation and improving reliability. Another advantage is that the connection joint can be made from a wide variety of materials and processes, thereby making advantageous use of mature connection joint technologies in a unique and improved manufacturing approach. Another advantage is that the assembly need not include wire bonds or TAB leads, although the process is flexible enough to accommodate these techniques if desired. Another advantage is that the assembly can be manufactured using low temperature processes which reduces stress and improves reliability. A further advantage is that the assembly can be manufactured using well-controlled processes which can be easily implemented by circuit board, lead frame and tape manufacturers. Still another advantage is that the assembly can be manufactured using materials that are compatible with copper chip and lead-free environmental requirements.

These and other objects, features and advantages of the invention will be further described and more readily apparent from a review of the detailed description of the preferred embodiments which follows.

BRIEF DESCRIPTION OF THE DRAWINGS

The following detailed description of the preferred embodiments can best be understood when read in conjunction with the following drawings, in which:

FIGS. 1A-27A are cross-sectional views showing a method of making a semiconductor chip assembly in accordance with a first embodiment of the present invention;

FIGS. 1B-27B are top plan views corresponding to FIGS. 1A-27A, respectively;

FIGS. 1C-27C are bottom plan views corresponding to FIGS. 1A-27A, respectively;

FIGS. 28A-54A are cross-sectional views showing a method of making a semiconductor chip assembly in accordance with a second embodiment of the present invention;

FIGS. 28B-54B are top plan views corresponding to FIGS. 28A-54A, respectively;

FIGS. 28C-54C are bottom plan views corresponding to FIGS. 28A-54A, respectively;

FIGS. 55A-81A are cross-sectional views showing a method of making a semiconductor chip assembly in accordance with a third embodiment of the present invention;

FIGS. 55B-81B are top plan views corresponding to FIGS. 55A-81A, respectively;

FIGS. 55C-81C are bottom plan views corresponding to FIGS. 55A-81A, respectively;

DETAILED DESCRIPTION OF THE PREFERRED EMBODIMENTS

FIGS. 1A-27A, 1B-27B and 1C-27C are cross-sectional, top and bottom views, respectively, of a method of making a semiconductor chip assembly in accordance with a first embodiment of the present invention.

Figure 1A:
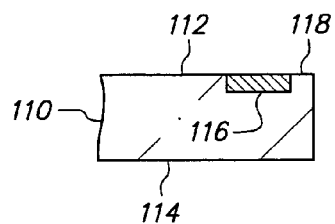
Figure 1B:
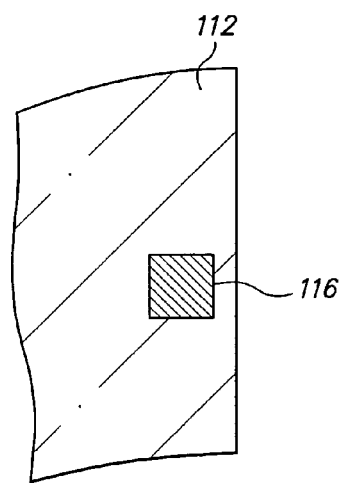
Figure 1C:
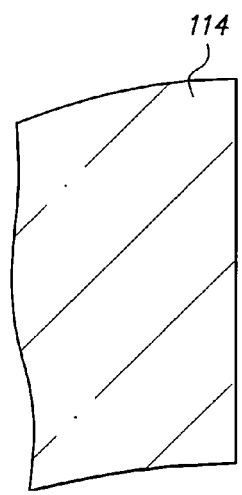

FIGS. 1A, 1B and 1C are cross-sectional, top and bottom views, respectively, of semiconductor chip 110 which is an integrated circuit in which various transistors, circuits, interconnect lines and the like are formed (not shown). Chip 110 includes opposing major surfaces 112 and 114 and has a thickness (between surfaces 112 and 114) of 150 microns. Surface 112 is the active surface and includes conductive pad 116 and passivation layer 118.

Pad 116 is substantially aligned with passivation layer 118 so that surface 112 is essentially flat. Alternatively, if desired, pad 116 can extend above or be recessed below passivation layer 118. Pad 116 provides a bonding site to electrically couple chip 110 with external circuitry. Thus, pad 116 can be an input/output pad or a power/ground pad. Pad 116 has a length and width of 100 microns.

Pad 116 has an aluminum base that is cleaned by dipping chip 110 in a solution containing 0.05 M phosphoric acid at room temperature for 1 minute and then rinsed in distilled water. Pad 116 can have the aluminum base serve as a surface layer, or alternatively, pad 116 can be treated to include a surface layer that covers the aluminum base, depending on the nature of a connection joint that shall subsequently contact the surface layer. In this embodiment, the connection joint is a gold wire bond. Therefore, pad 116 need not be treated to accommodate this connection joint. Alternatively, pad 116 can be treated by depositing several metal layers, such as chromium/copper/gold or titanium/nickel/gold on the aluminum base. The chromium or titanium layer provides a barrier for the aluminum base and an adhesive between the overlaying metal and the aluminum base. The metal layers, however, are typically selectively deposited by evaporation, electroplating or sputtering using a mask which is a relatively complicated process. Alternatively, pad 116 is treated by forming a nickel surface layer on the aluminum base. For instance, chip 110 is dipped in a zinc solution to deposit a zinc layer on the aluminum base. This step is commonly known as zincation. Preferably, the zinc solution contains about 150 grams/liter of NaOH, 25 grams/liter of ZnO, and 1 gram/liter of $NaNO_3$, as well as tartaric acid to reduce the rate at which the aluminum base dissolves. Thereafter, the nickel surface layer is electrolessly deposited on the zincated aluminum base. A suitable electroless nickel plating solution is Enthone Enplate NI-424 at 85° C.

Chip 110 includes many other pads on surface 112, and only pad 116 is shown for convenience of illustration. In addition, chip 110 has already been singulated from other chips that it was previously attached to on a wafer.

Figure 2A:
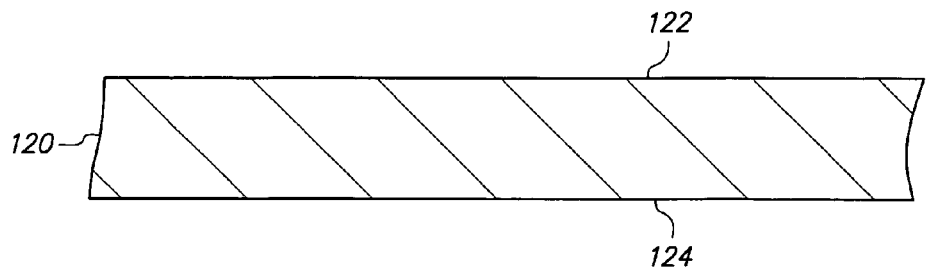
Figure 2B:
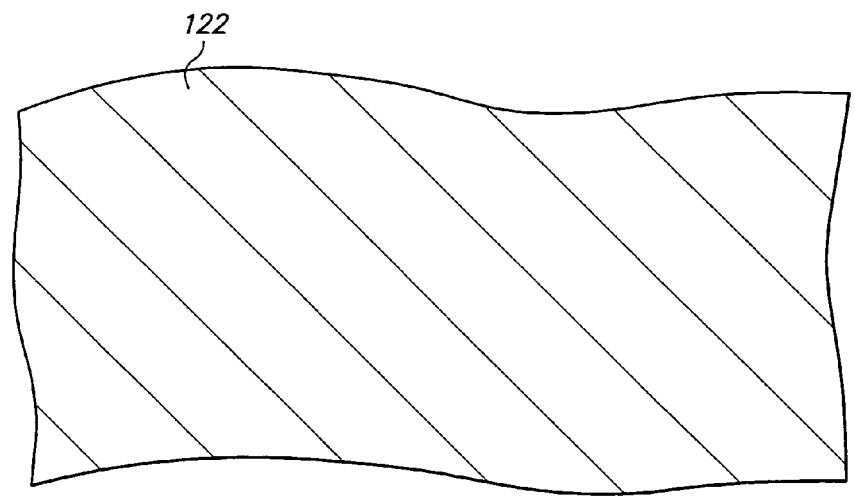
Figure 2C:
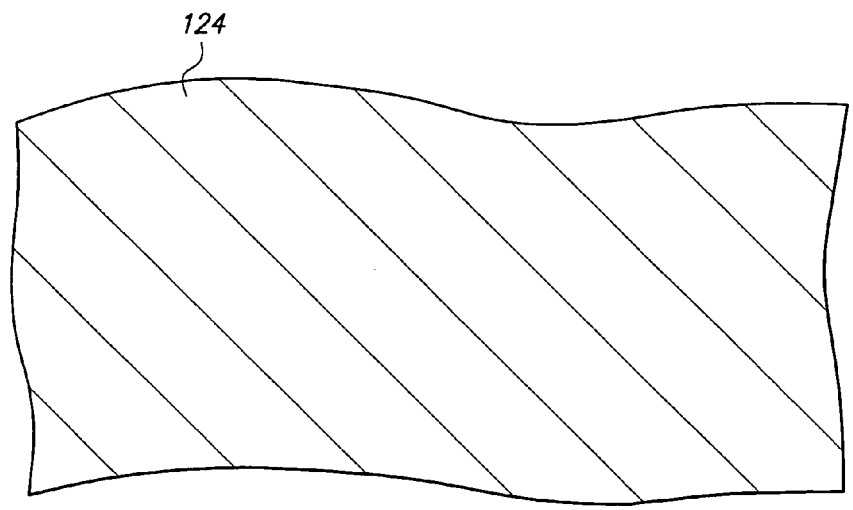

FIGS. 2A, 2B and 2C are cross-sectional, top and bottom views, respectively, of metal base 120 which includes opposing major surfaces 122 and 124. Metal base 120 is a copper plate with a thickness of 150 microns.

Figure 3A:
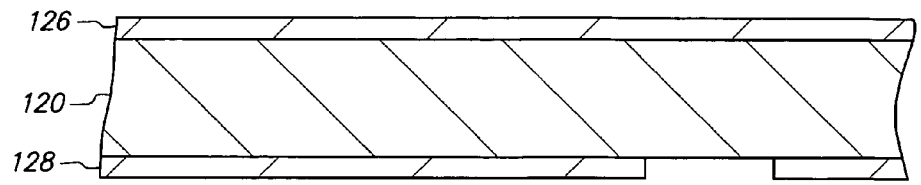
Figure 3B:
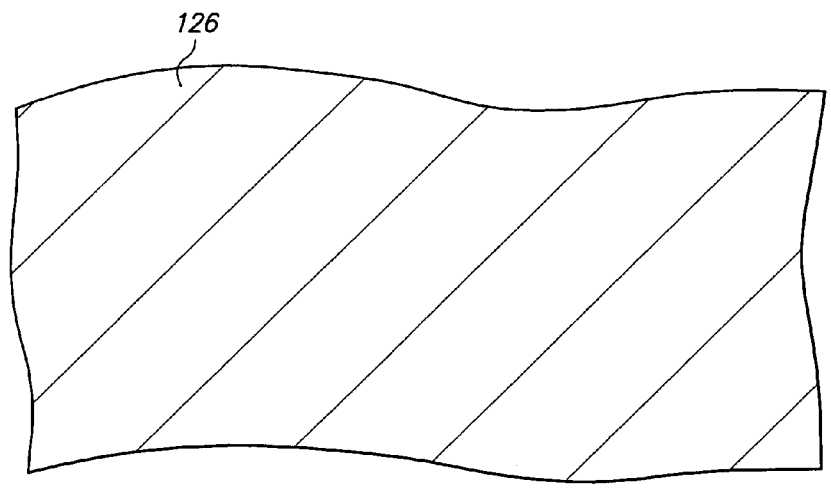
Figure 3C:
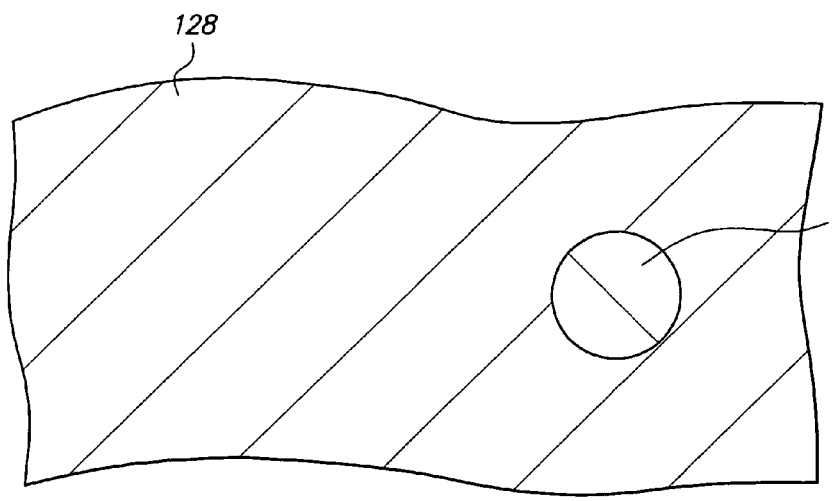

FIGS. 3A, 3B and 3C are cross-sectional, top and bottom views, respectively, of photoresist layers 126 and 128 formed on metal base 120. Photoresist layers 126 and 128 are deposited using a dry film lamination process in which hot rolls simultaneously press photoresist layers 126 and 128 onto surfaces 122 and 124, respectively. A reticle (not shown) is positioned proximate to photoresist layer 128. Thereafter, photoresist layer 128 is patterned by selectively applying light through the reticle, applying a developer solution to remove the photoresist portion rendered soluble by the light, and then hard baking, as is conventional. As a result, photoresist layer 128 contains an opening with a diameter of 250 microns that selectively exposes surface 124, and photoresist layer 126 remains unpatterned. Photoresist layers 126 and 128 have a thickness of 25 microns beyond surfaces 122 and 124, respectively.

Figure 4A:
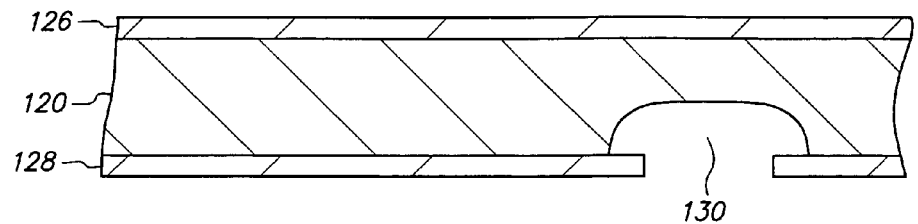
Figure 4B:
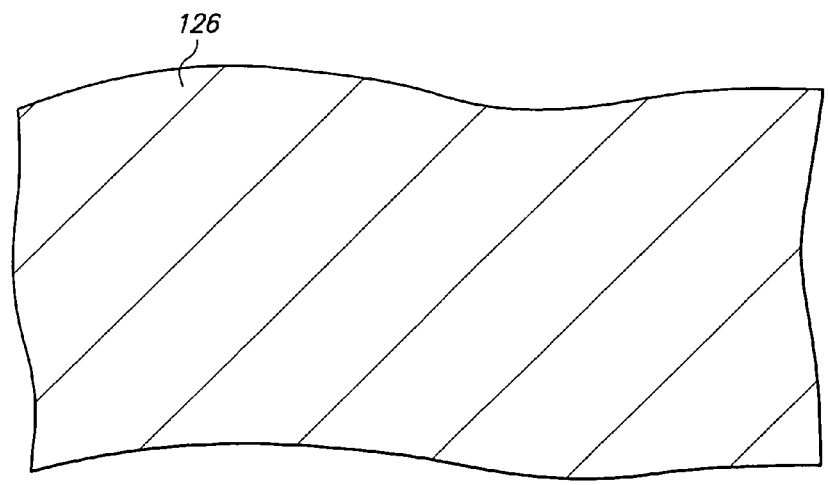
Figure 4C:
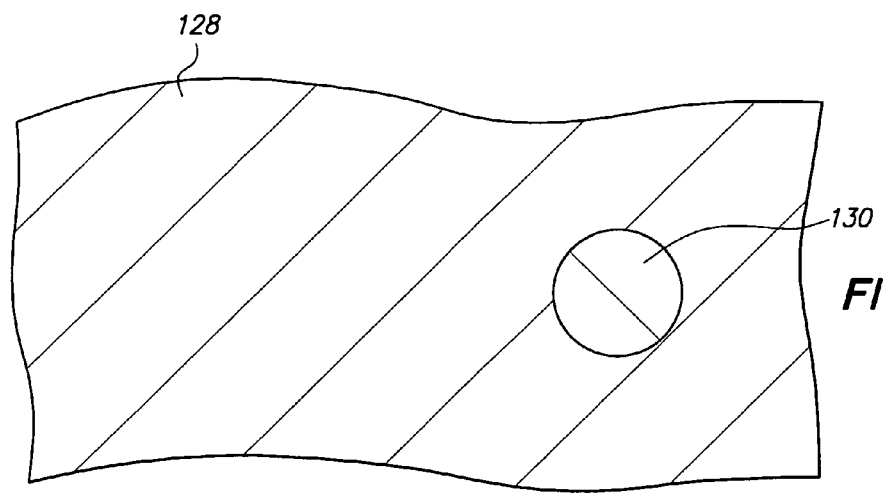

FIGS. 4A, 4B and 4C are cross-sectional, top and bottom views, respectively, of recess 130 formed in metal base 120.

Recess 130 is formed by applying a back-side wet chemical etch to the exposed portion of surface 124 using photoresist layer 128 as an etch mask. For instance, a bottom spray nozzle (not shown) can spray the wet chemical etch on metal base 120 while a top spray nozzle (not shown) is deactivated, or the structure can be dipped in the wet chemical etch since photoresist layer 126 provides front-side protection. The wet chemical etch is highly selective of copper and etches 80 microns into metal base 120. As a result, recess 130 is a blind via that extends from surface 124 into but not through metal base 120. Recess 130 has a diameter of 300 microns at surface 124, a depth of 80 microns relative to surface 124 and is spaced from surface 122 by 70 microns.

A suitable wet chemical etch can be provided by a solution containing alkaline ammonia. The optimal etch time for exposing metal base 120 to the wet chemical etch in order to form recess 130 with the desired dimensions can be established through trial and error.

Figure 5A:
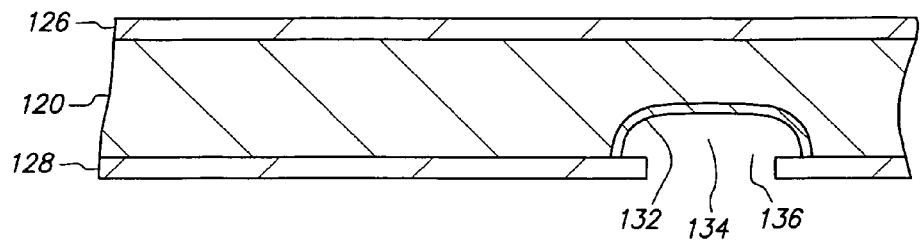
Figure 5B:
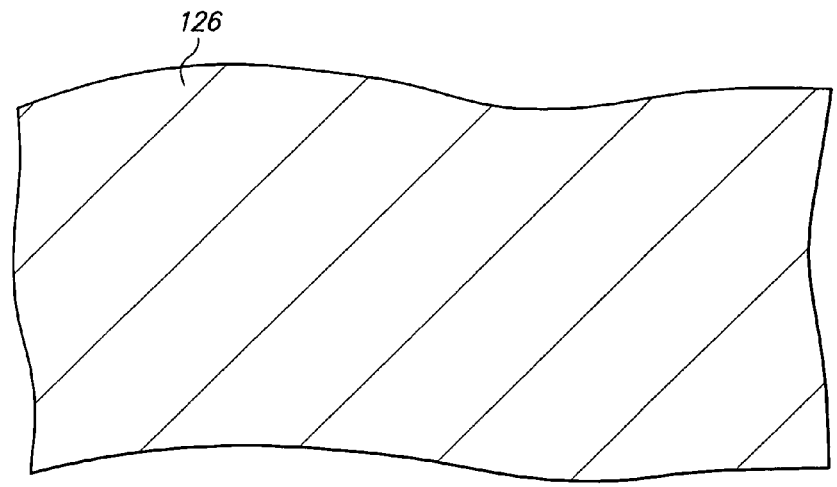
Figure 5C:
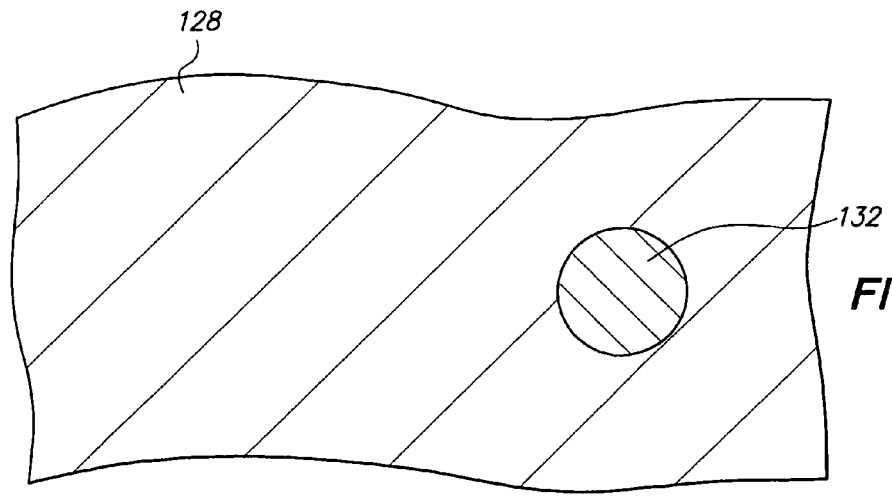

FIGS. 5A, 5B and 5C are cross-sectional, top and bottom views, respectively, of metal containment wall 132 formed on metal base 120.

Metal containment wall 132 contacts metal base 120 in recess 130, contours to recess 130, covers recess 130 in the downward direction and is disposed within recess 130 but does not fill recess 130. Furthermore, metal containment wall 132 is electrically connected to and non-integral with metal base 120.

Metal containment wall 132 is composed of a nickel layer electroplated on metal base 120 and a gold layer electroplated on the nickel layer. The nickel layer contacts and is sandwiched between metal base 120 and the gold layer, and the gold layer contacts the nickel layer and is spaced from metal base 120. Thus, the nickel layer is buried beneath the gold layer, and the gold layer is exposed. Metal containment wall 132 has a thickness of 10.1 microns. In particular, the nickel layer has a thickness of 10 microns, and the gold layer has a thickness of 0.1 microns. For convenience of illustration, the nickel and gold layers are shown as a single layer.

Metal containment wall 132 is formed by an electroplating operation using photoresist layers 126 and 128 as plating masks. Thus, metal containment wall 132 is formed additively. Initially, a plating bus (not shown) is connected to metal base 120, current is applied to the plating bus from an external power source, and the structure is submerged in an electrolytic nickel plating solution such as Technic Techni Nickel "S" at room temperature. As a result, the nickel layer electroplates on the exposed portion of metal base 120 in recess 130. The nickel electroplating operation continues until the nickel layer has the desired thickness. Thereafter, the structure is removed from the electrolytic nickel plating solution and submerged in an electrolytic gold plating solution such as Technic Orotemp at room temperature while current is applied to the plating bus to electroplate the gold layer on the nickel layer. The gold electroplating operation continues until the gold layer has the desired thickness. Thereafter, the structure is removed from the electrolytic gold plating solution and rinsed in distilled water to remove contaminants.

Metal containment wall 132 has a bowl shape, a U shape in a vertical plane parallel to the upward and downward directions and a circular shape in a lateral plane orthogonal to the upward and downward directions at surface 124. Metal containment wall 132 has a height of 80 microns, a diameter of 300 microns at surface 124 and an essentially constant thickness of 10.1 microns. That is, metal containment wall 132 may have slight thickness variation. For instance, metal containment wall 132 may be slightly thicker near surface 124 due to the higher flow rate of the electrolytic plating solutions near surface 124. Metal containment wall 132 consists of the continuous single-piece electroplated nickel layer and the continuous single-piece electroplated gold layer. Furthermore, metal containment wall 132 includes or defines cavity 134 that is spaced from metal base 120 and extends into and faces away from recess 130. Cavity 134 extends across a majority of the height and diameter of metal containment wall 132, is covered in the upward and lateral directions by metal containment wall 132, includes opening 136 that faces in the downward direction and has a concave, crater-like shape.

Figure 6A:
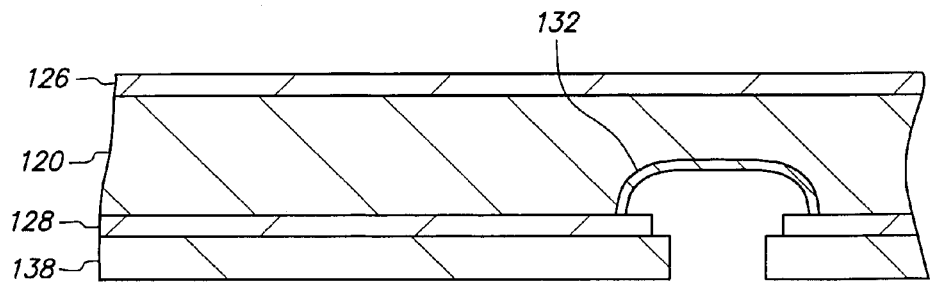
Figure 6B:
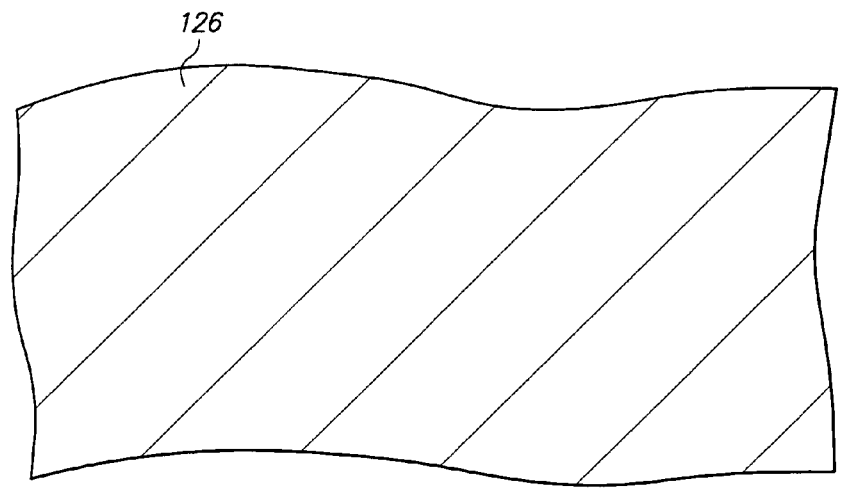
Figure 6C:
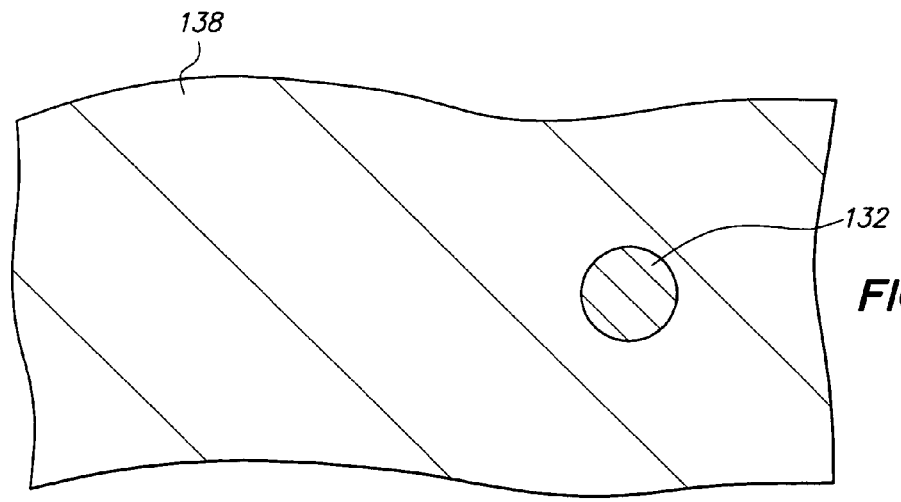

FIGS. 6A, 6B and 6C are cross-sectional, top and bottom views, respectively, of stencil 138 mounted on photoresist layer 128.

Stencil 138 has a thickness of 80 microns and includes an opening with a diameter of 200 microns that is vertically aligned with the opening in photoresist layer 128, metal containment wall 132 and cavity 134.

For convenience of illustration, metal base 120 is shown above stencil 138 to retain a single orientation throughout the figures for ease of comparison between the figures, although the structure would be inverted so that gravitational force would assist with mounting stencil 138 on photoresist layer 128.

Figure 7A:
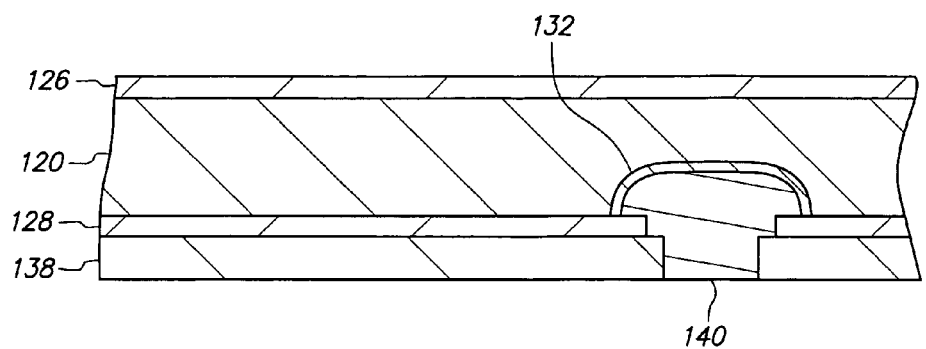
Figure 7B:
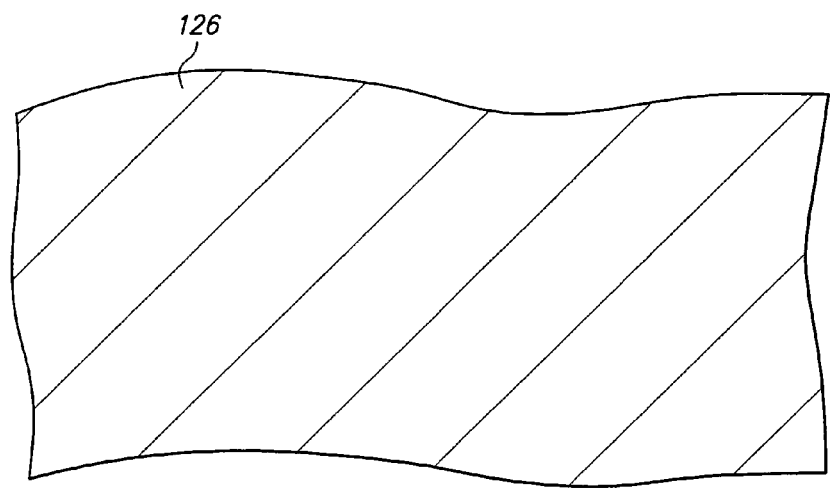
Figure 7C:
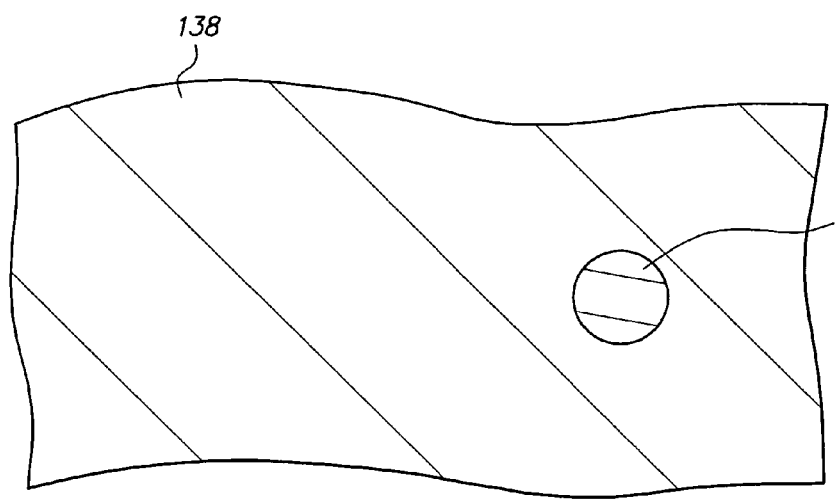

FIGS. 7A, 7B and 7C are cross-sectional, top and bottom views, respectively, of solder paste 140 deposited on metal containment wall 132.

Solder paste 140 includes finely powdered tin-silver-copper solder particles mixed in a viscous organic resin containing a fluxing agent. Solder paste 140 is deposited on metal containment wall 132 using stencil printing. During the stencil printing process, a squeegee (not shown) pushes solder paste 140 along the surface of stencil 138 opposite metal base 120, through the openings in photoresist layer 128 and stencil 138, onto metal containment wall 132 and into cavity 134. Solder paste 140 is compliant enough at room temperature to conform to virtually any shape. As a result, solder paste 140 fills cavity 134 and the openings in photoresist layer 128 and stencil 138. However, solder paste 140 is spaced from metal base 120.

For convenience of illustration, metal base 120 is shown above solder paste 140 to retain a single orientation throughout the figures for ease of comparison between the figures, although the structure would be inverted during the deposition of solder paste 140 so that gravitational force would assist with the deposition of solder paste 140.

Figure 8A:
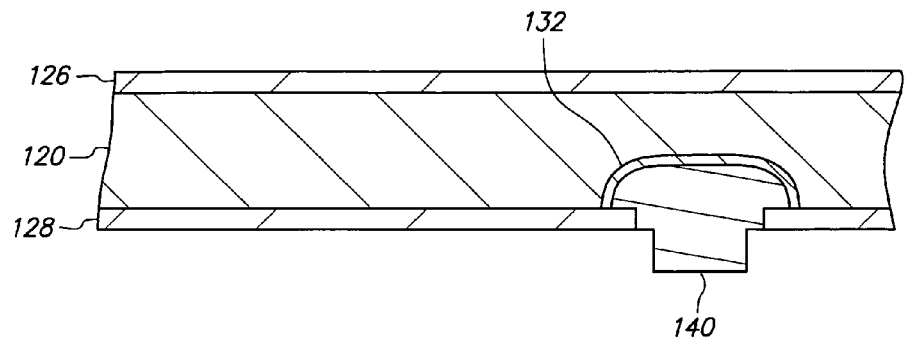
Figure 8B:
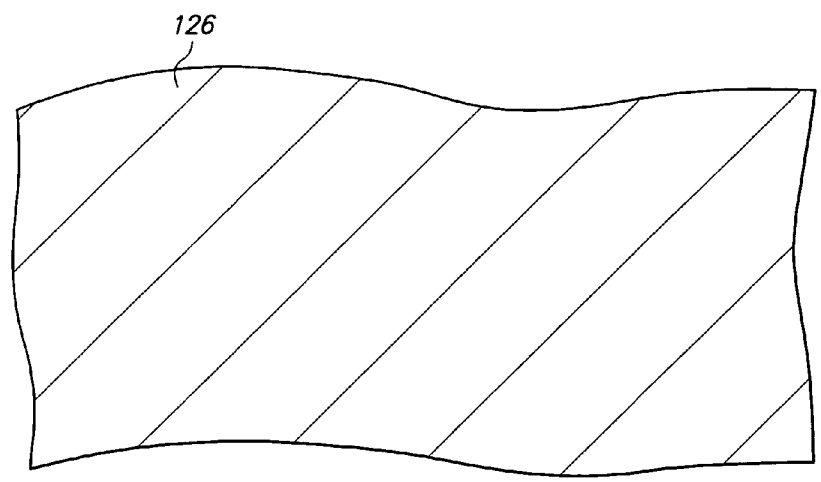
Figure 8C:
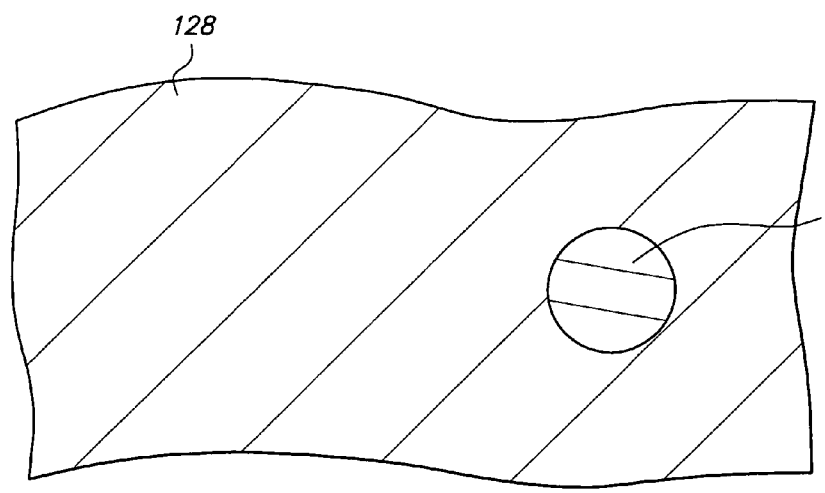

FIGS. 8A, 8B and 8C are cross-sectional, top and bottom views, respectively, of stencil 138 removed from photoresist layer 128.

For convenience of illustration, metal base 120 is shown above solder paste 140 to retain a single orientation throughout the figures for ease of comparison between the figures, although the structure would be inverted during the removal of stencil 138 so that gravitational force would assist with maintaining the placement of solder paste 140.

Figure 9A:
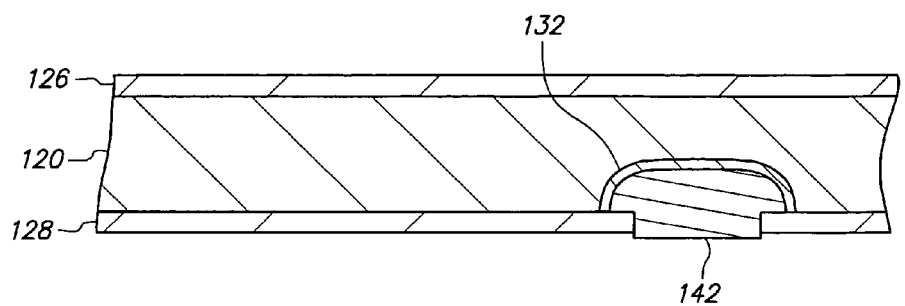
Figure 9B:
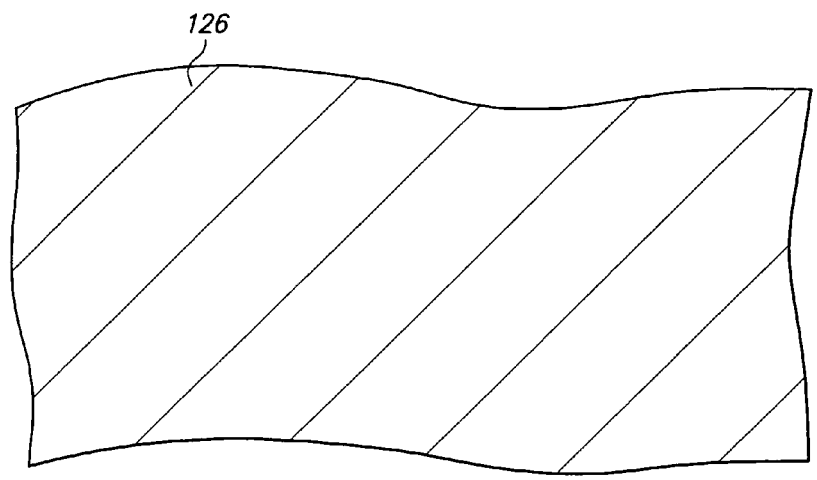
Figure 9C:
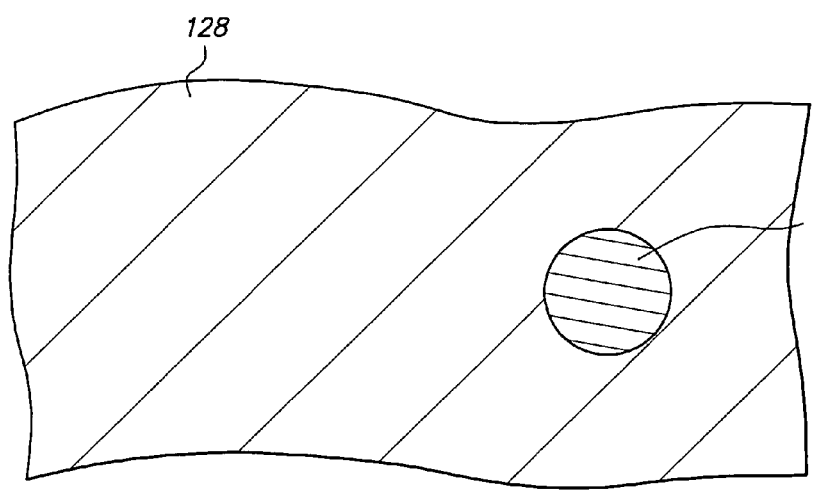

FIGS. 9A, 9B and 9C are cross-sectional, top and bottom views, respectively, of solder layer 142 formed from solder paste 140.

Solder layer 142 contacts and is electrically connected to and is non-integral with metal containment wall 132 and is spaced from metal base 120. Furthermore, solder layer 142 fills cavity 134 and has a thickness of 30 microns in the downward direction relative to metal base 120, metal containment wall 132 and cavity 134.

Solder layer 142 is formed by reflowing solder paste 140. Initially, the structure is heated to a temperature of about 260° C. The heat causes the flux in solder paste 140 to react with and remove oxides from metal containment wall 132 and the solder particles in solder paste 140, renders the solder particles in solder paste 140 molten such that they coalesce, and vaporizes the organic resin in solder paste 140. As a result, solder paste 140 contracts from its original size and solder reflow occurs. In addition, the gold layer of metal containment wall 132 provides a wettable surface for solder reflow and dissolves in the molten solder, and therefore metal containment wall 132 is converted from a dual-piece metal that consists of the nickel and gold layers to a single-piece metal that consists of the nickel layer. Furthermore, photoresist layer 128 essentially confines the solder reflow to metal containment wall 132 and prevents the solder from contacting metal base 120. Thereafter, the heat is removed and the molten solder particles cool and solidify into solder layer 142 which is hardened.

Solder layer 142 has a diameter of 280 microns and is vertically aligned with the opening in photoresist layer 128, metal containment wall 132 and cavity 134.

For convenience of illustration, metal base 120 is shown above solder layer 142 to retain a single orientation throughout the figures for ease of comparison between the figures, although the structure would be inverted during the formation of solder layer 142 so that gravitational force would assist with the solder reflow.

Figure 10A:
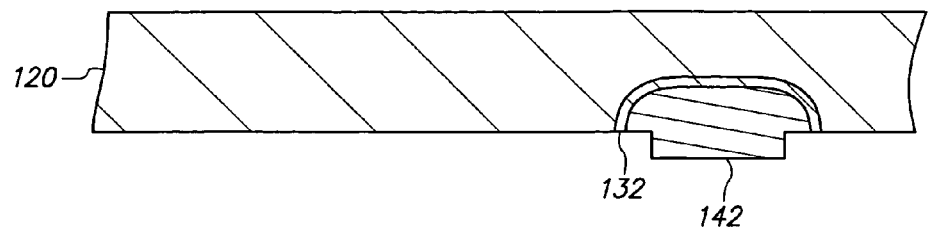
Figure 10B:
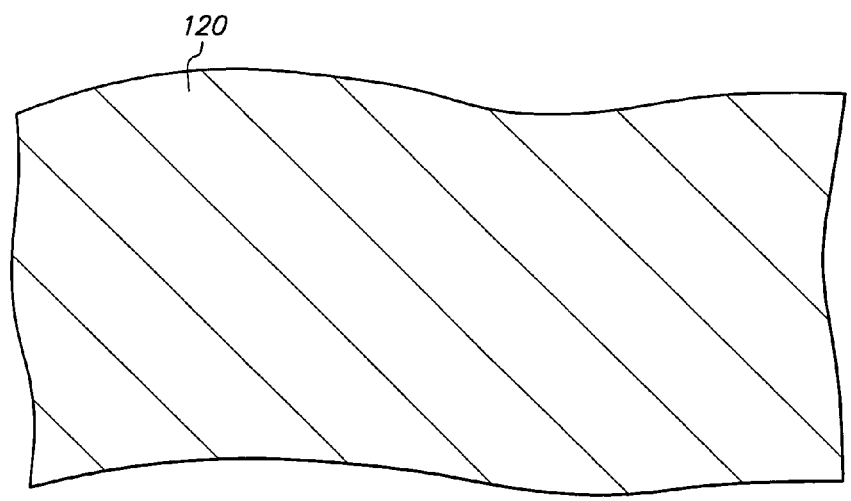
Figure 10C:
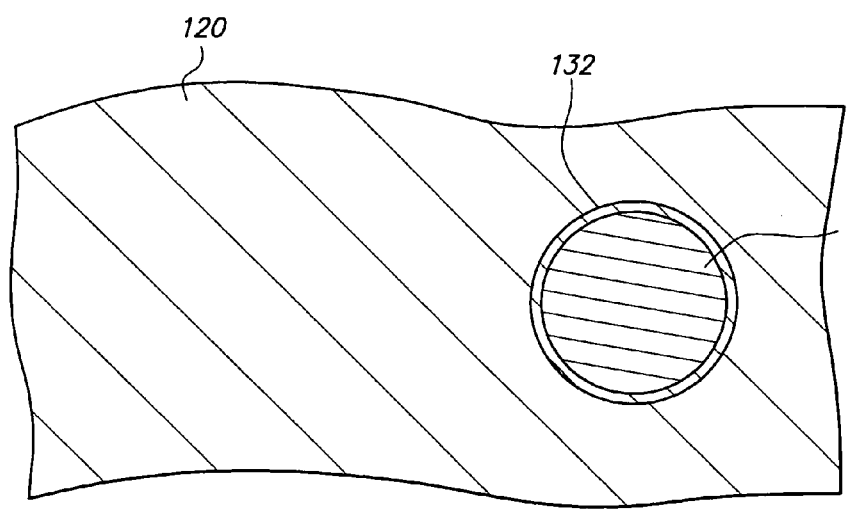

FIGS. 10A, 10B and 10C are cross-sectional, top and bottom views, respectively, of metal base 120, metal containment wall 132 and solder layer 142 after photoresist layers 126 and 128 are stripped. Photoresist layers 126 and 128 are removed using a solvent, such as a mild alkaline solution with a pH of 9, that is highly selective of photoresist with respect to copper, nickel and solder. Therefore, no appreciable amount of metal base 120, metal containment wall 132 or solder layer 142 is removed.

Figure 11A:
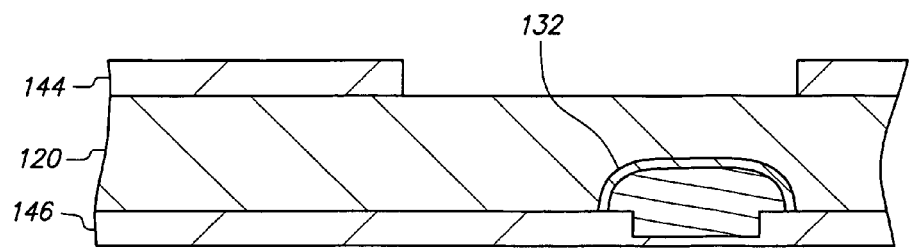
Figure 11B:
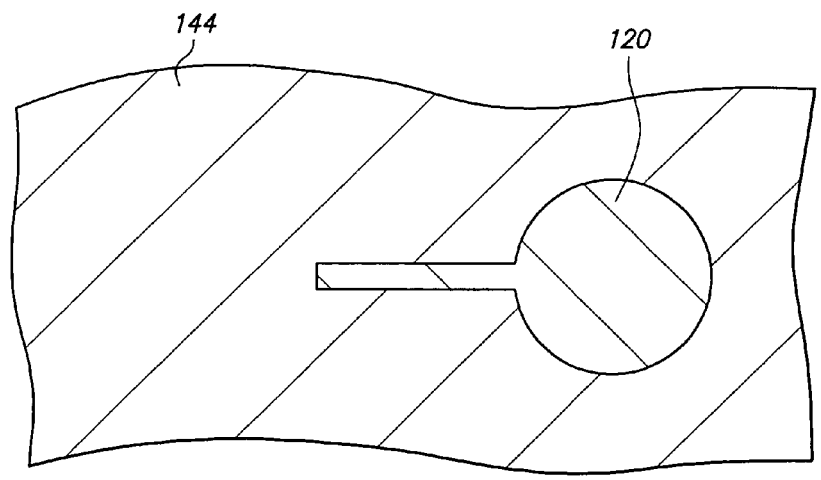
Figure 11C:
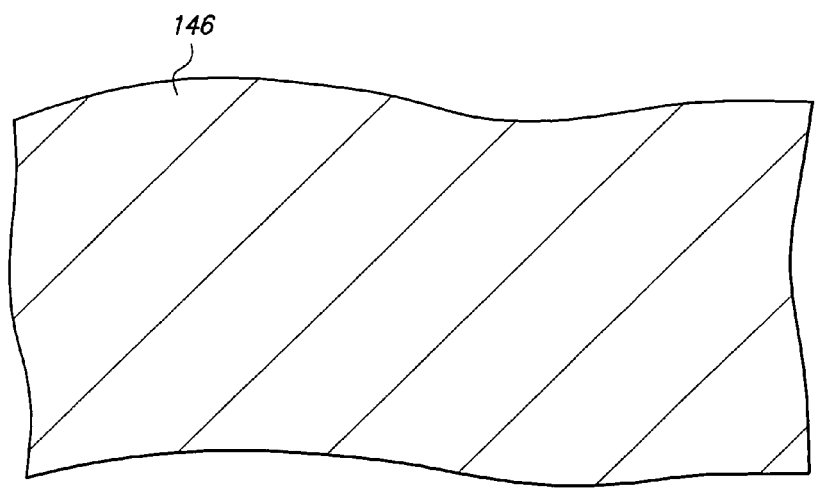

FIGS. 11A, 11B and 11C are cross-sectional, top and bottom views, respectively, of photoresist layers 144 and 146 formed on metal base 120. Photoresist layers 144 and 146 are deposited using a dry film lamination process in which hot rolls simultaneously press photoresist layers 144 and 146 onto surfaces 122 and 124, respectively. A reticle (not shown) is positioned proximate to photoresist layer 144. Thereafter, photoresist layer 144 is patterned by selectively applying light through the reticle, applying a developer solution to remove the photoresist portion rendered soluble by the light, and then hard baking, as is conventional. As a result, photoresist layer 144 contains an opening that selectively exposes surface 122, and photoresist layer 146 remains unpatterned. Photoresist layers 144 and 146 have a thickness of 50 microns beyond surfaces 122 and 124, respectively.

Figure 12A:
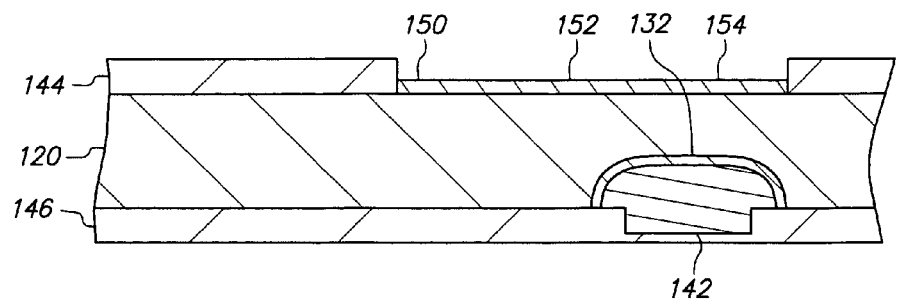
Figure 12B:
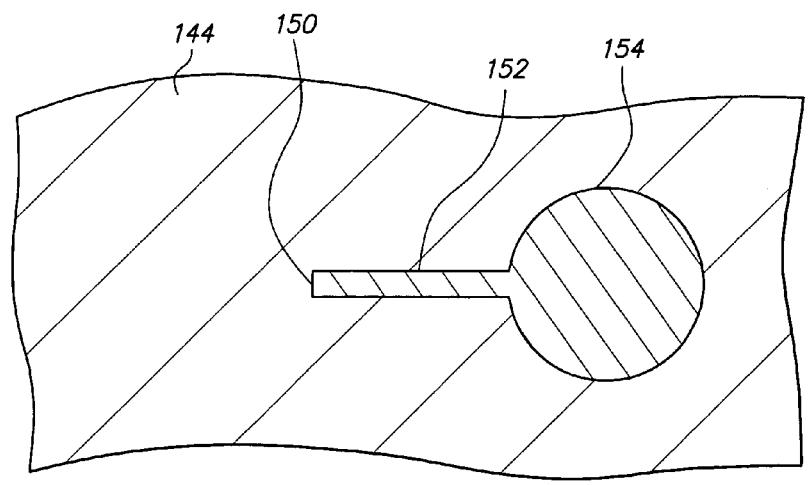
Figure 12C:
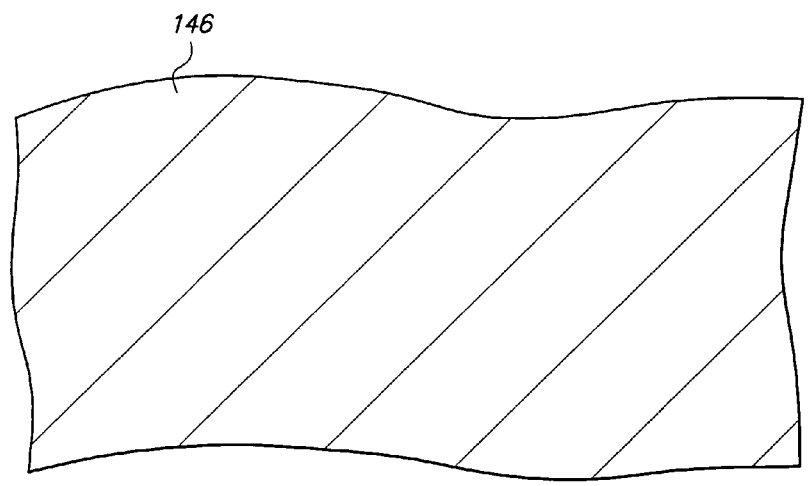

FIGS. 12A, 12B and 12C are cross-sectional, top and bottom views, respectively, of routing line 150 formed on metal base 120.

Routing line 150 contacts metal base 120 at surface 122 and is spaced from surface 124, metal containment wall 132 and solder terminal 142. Routing line 150 is composed of a nickel layer electroplated on metal base 120 and a copper layer electroplated on the nickel layer. The nickel layer contacts and is sandwiched between metal base 120 and the copper layer, and the copper layer contacts the nickel layer and is spaced from metal base 120. Thus, the nickel layer is buried beneath the copper layer, and the copper layer is exposed. Routing line 150 has a thickness of 30 microns. In particular, the nickel layer has a thickness of 5 microns, and the copper layer has a thickness of 25 microns. For convenience of illustration, the nickel and copper layers are shown as a single layer.

Routing line 150 is formed by an electroplating operation using photoresist layers 144 and 146 as plating masks. Thus, routing line 150 is formed additively. Initially, a plating bus (not shown) is connected to metal base 120, current is applied to the plating bus from an external power source, and metal base 120 is submerged in an electrolytic nickel plating solution such as Technic Techni Nickel "S" at room temperature. As a result, the nickel layer electroplates (deposits or grows) on the exposed portions of metal base 120. The nickel electroplating operation continues until the nickel layer has the desired thickness. Thereafter, the structure is removed from the electrolytic nickel plating solution and submerged in an electrolytic copper plating solution such as Sel-Rex CUBATH M™ at room temperature while current is applied to the plating bus to electroplate the copper layer on the nickel layer. The copper electroplating operation continues until the copper layer has the desired thickness. Thereafter, the structure is removed from the electrolytic copper plating solution and rinsed in distilled water to remove contaminants.

Routing line 150 is a flat planar lead that includes elongated routing portion 152 and enlarged circular portion 154. Elongated routing portion 152 and enlarged circular portion 154 are adjacent to and coplanar with one another. Elongated routing portion 152 has a width (orthogonal to its elongated length) of 100 microns, and enlarged circular portion 154 has a diameter of 300 microns. Furthermore, elongated routing portion 152 extends laterally from enlarged circular portion 154, and metal containment wall 132 and solder layer 142 are vertically aligned with enlarged circular portion 154.

Figure 13A:
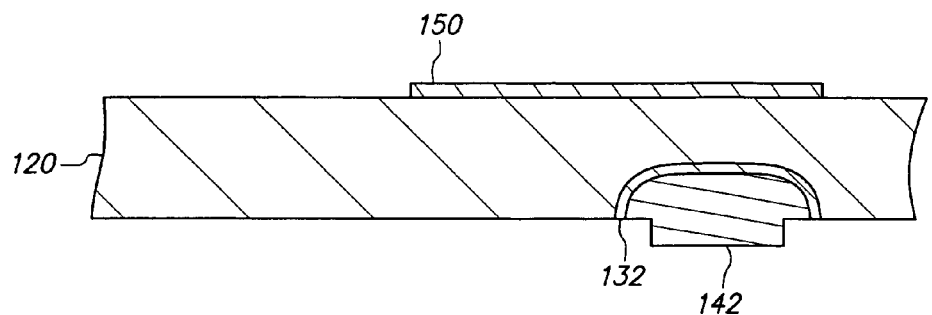
Figure 13B:
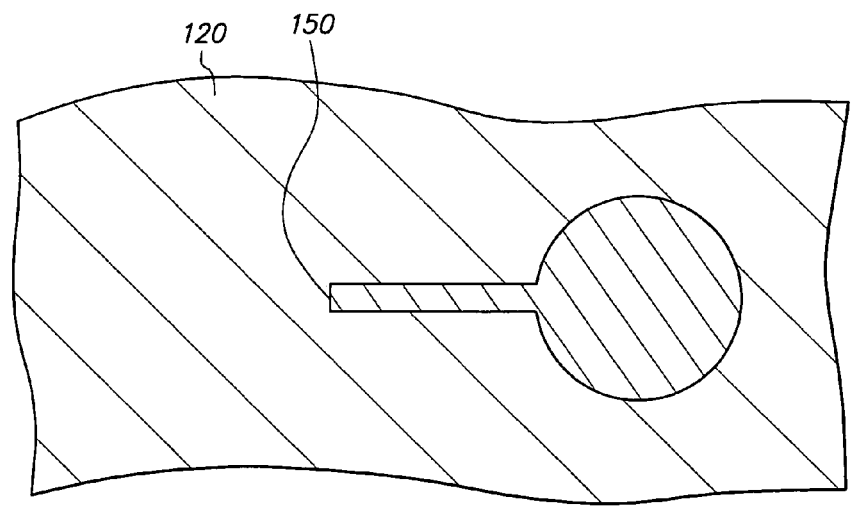
Figure 13C:
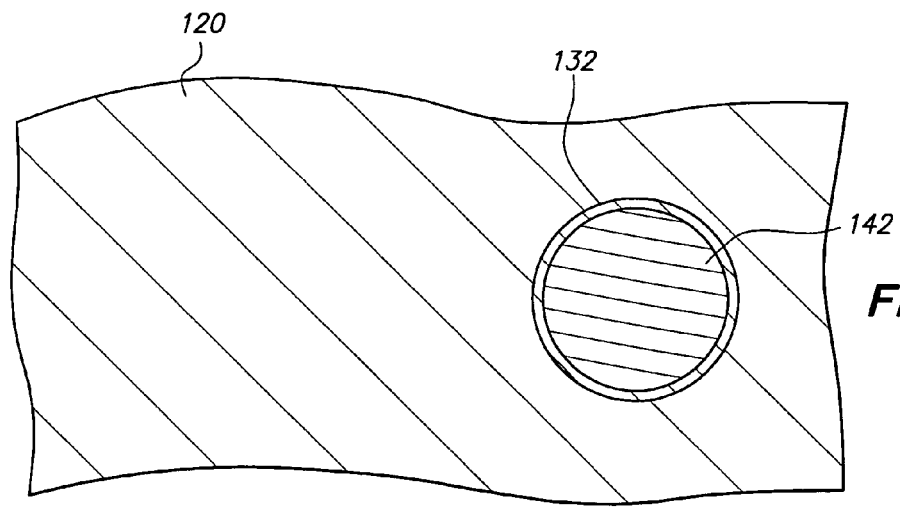

FIGS. 13A, 13B and 13C are cross-sectional, top and bottom views, respectively, of metal base 120, metal containment wall 132, solder layer 142 and routing line 150 after photoresist layers 144 and 146 are stripped. Photoresist layers 144 and 146 are removed using a solvent, such as a mild alkaline solution with a pH of 9, that is highly selective of photoresist with respect to copper, nickel and solder. Therefore, no appreciable amount of metal base 120, metal containment wall 132, solder layer 142 or routing line 150 is removed.

Figure 14A:
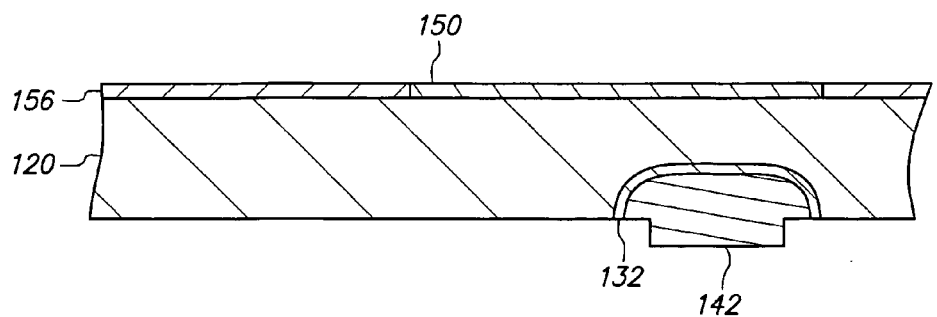
Figure 14B:
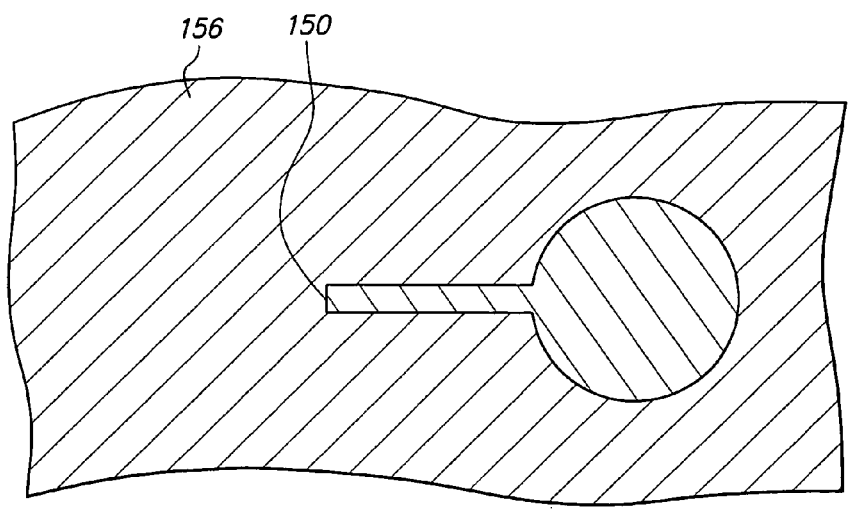
Figure 14C:
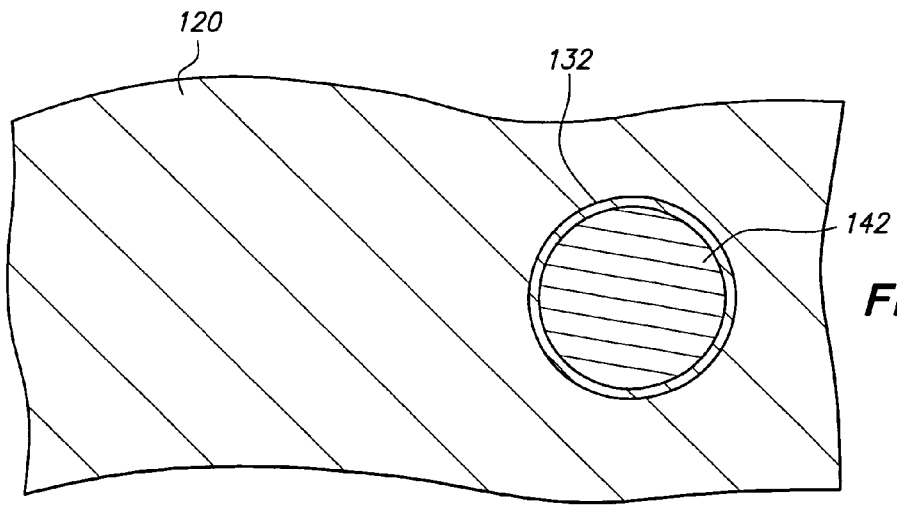

FIGS. 14A, 14B and 14C are cross-sectional, top and bottom views, respectively, of solder mask 156 formed on metal base 120 and routing line 150.

Solder mask 156 is blanketly deposited on metal base 120 and routing line 150 as a liquid resin (A stage). Thereafter, the liquid resin is cured or hardened at relatively low temperature in the range of 100 to 250° C. to form a solid insulative epoxy layer with a thickness of 50 microns that contacts metal base 120 and routing line 150 and covers and extends 20 microns upwardly beyond routing line 150.

Thereafter, an upper portion of solder mask 156 is removed by grinding. In particular, a rotating diamond sand wheel and distilled water are applied to the front-side of solder mask 156. Initially, the diamond sand wheel grinds only solder mask 156. As the grinding continues, solder mask 156 becomes thinner as the grinded surface migrates downwardly. Eventually the diamond sand wheel contacts routing line 150, and as a result, begins to grind routing line 150 as well. As the grinding continues, routing line 150 and solder mask 156 become thinner as their grinded surfaces migrate downwardly. The grinding continues until routing line 150 and solder mask 156 have the desired thickness, and then halts before it reaches metal base 120. Thereafter, the structure is rinsed in distilled water to remove contaminants.

Routing line 150 and solder mask 156 extend upwardly beyond metal base 120 by 25 microns after the grinding operation. Thus, the grinding removes a 5 micron thick upper portion of routing line 150 and a 25 micron thick upper portion of solder mask 156. At this stage, solder mask 156 continues to contact and cover the peripheral sidewalls of routing line 150, however solder mask 156 no longer covers routing line 150 in the upward direction. Thus, routing line 150 and solder mask 156 are exposed. Furthermore, routing line 150 and solder mask 156 are laterally aligned with one another at a surface that faces upwardly. Thus, an exposed planarized horizontal surface that faces upwardly includes routing line 150 and solder mask 156.

Figure 15A:
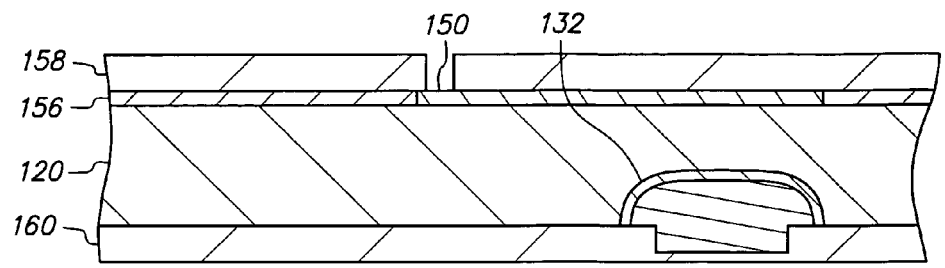
Figure 15B:
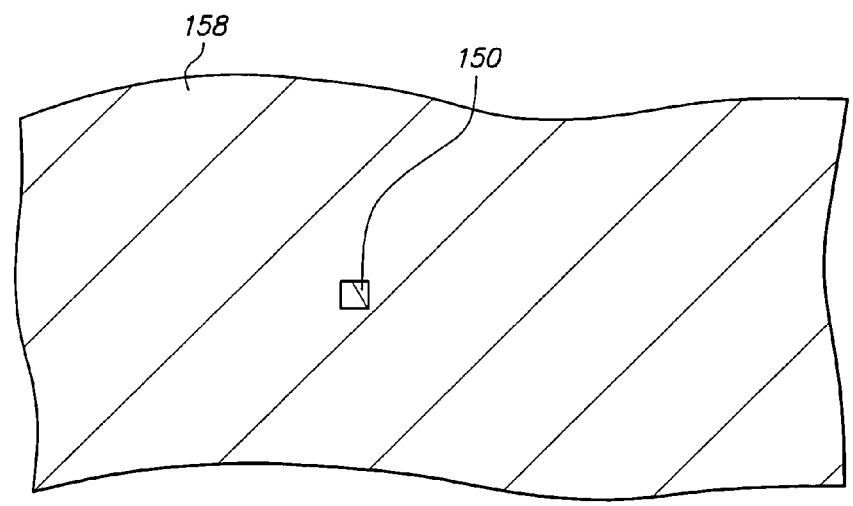
Figure 15C:
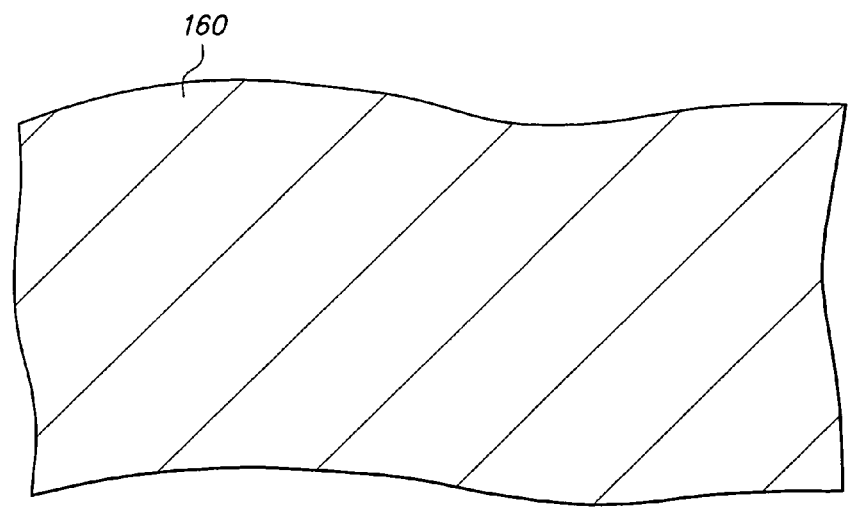

FIGS. 15A, 15B and 15C are cross-sectional, top and bottom views, respectively, of photoresist layers 158 and 160 formed on the structure. Photoresist layer 158 is formed on routing line 150 and solder mask 156, and photoresist layer 160 is formed on metal base 120, metal containment wall 132 and solder layer 142. Photoresist layers 158 and 160 are deposited in liquid form using roller coating onto the respective opposing surfaces. A reticle (not shown) is positioned proximate to photoresist layer 158. Thereafter, photoresist layer 158 is patterned by selectively applying light through the reticle, applying a developer solution to remove the photoresist portion rendered soluble by the light, and then hard baking, as is conventional. As a result, photoresist layer 158 contains an opening that selectively exposes routing line 150, and photoresist layer 160 remains unpatterned. Photoresist layers 158 and 160 each have a thickness of 50 microns beyond routing line 150 and metal base 120, respectively.

Figure 16A:
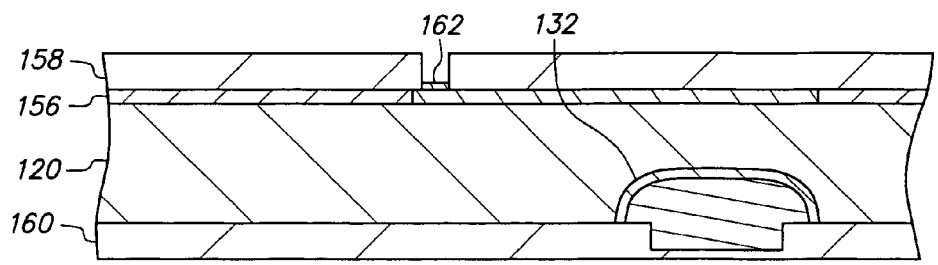
Figure 16B:
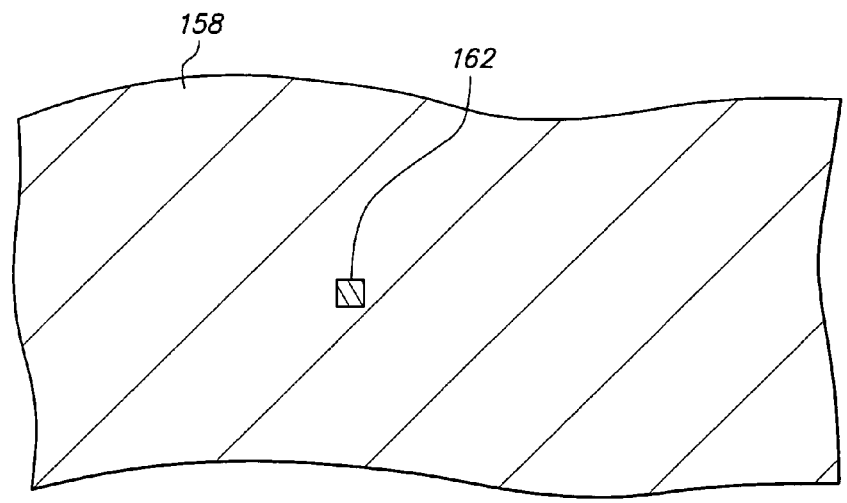
Figure 16C:
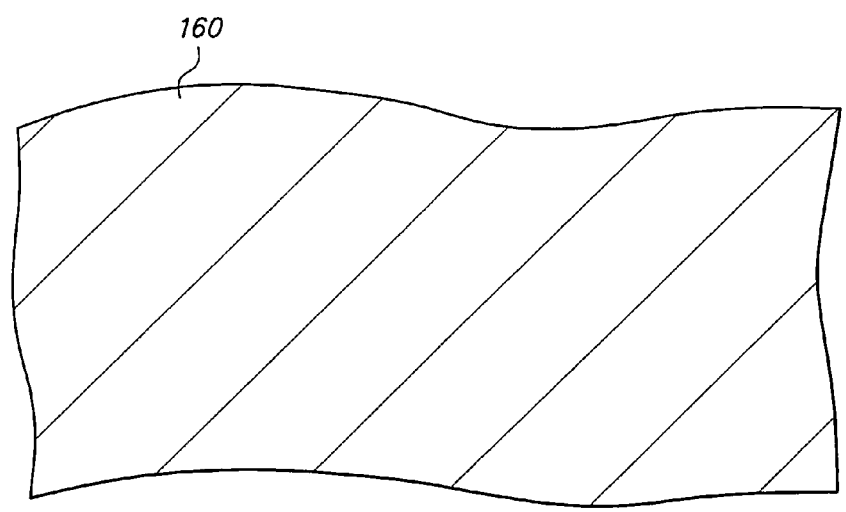

FIGS. 16A, 16B and 16C are cross-sectional, top and bottom views, respectively, of plated contact 162 formed on routing line 150.

Plated contact 162 contacts and is electrically connected to and is non-integral with routing line 150, and is spaced from metal base 120. Plated contact 162 is composed of a nickel layer electroplated on routing line 150 and a gold layer electroplated on the nickel layer. The nickel layer contacts and is sandwiched between routing line 150 and the gold layer, and the gold layer contacts the nickel layer and is spaced from routing line 150. Thus, the nickel layer is buried beneath the gold layer, and the gold layer is exposed. Plated contact 162 has a thickness of 3.5 microns. In particular, the nickel layer has a thickness of 3 microns, and the gold layer has a thickness of 0.5 microns. For convenience of illustration, the nickel and gold layers are shown as a single layer.

Plated contact 162 is formed by an electroplating operation using photoresist layers 158 and 160 as plating masks. Thus, plated contact 162 is formed additively. Initially, a plating bus (not shown) is connected to metal base 120, current is applied to the plating bus from an external power source, and the structure is submerged in an electrolytic nickel plating solution such as Technic Techni Nickel "S" at room temperature. As a result, the nickel layer electroplates on the exposed portion of routing line 150. The nickel electroplating operation continues until the nickel layer has the desired thickness. Thereafter, the structure is removed from the electrolytic nickel plating solution and submerged in an electrolytic gold plating solution such as Technic Orotemp at room temperature while current is applied to the plating bus to electroplate the gold layer on the nickel layer. The gold electroplating operation continues until the gold layer has the desired thickness. Thereafter, the structure is removed from the electrolytic gold plating solution and rinsed in distilled water to remove contaminants.

Figure 17A:
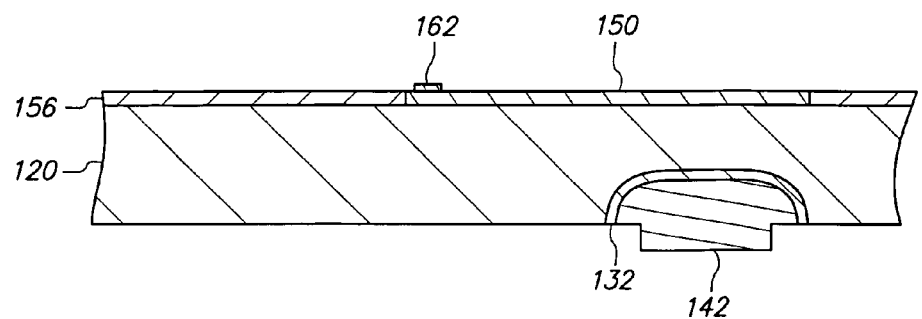
Figure 17B:
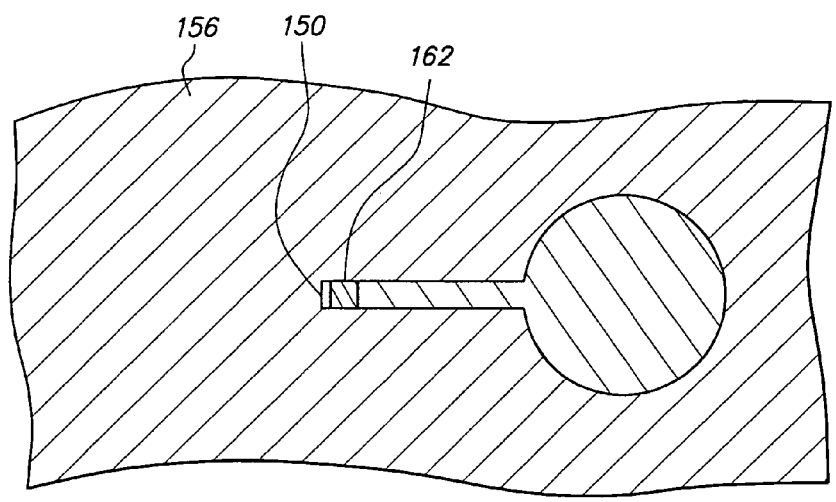
Figure 17C:
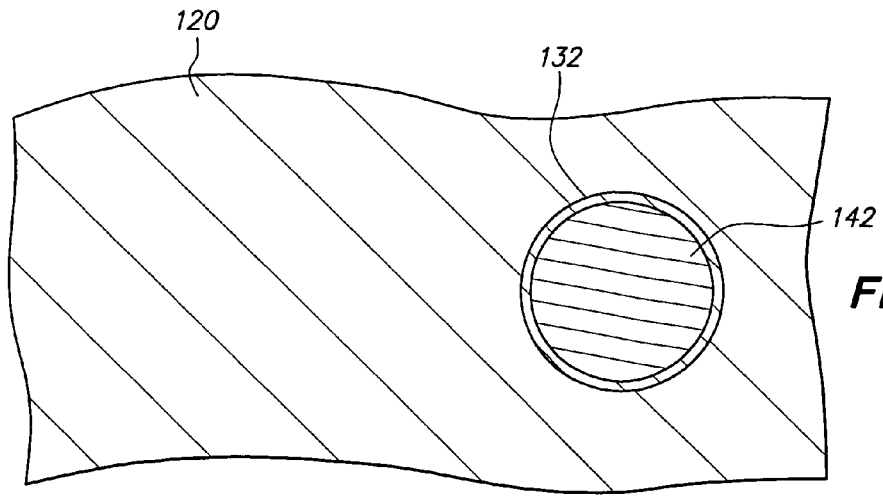

FIGS. 17A, 17B and 17C are cross-sectional, top and bottom views, respectively, of metal base 120, metal containment wall 132, solder layer 142, routing line 150, solder mask 156 and plated contact 162 after photoresist layers 158 and 160 are stripped. Photoresist layers 158 and 160 are removed using a solvent, such as a mild alkaline solution with a pH of 9, that is highly selective of photoresist with respect to copper, nickel, gold, solder and epoxy. Therefore, no appreciable amount of metal base 120, metal containment wall 132, solder layer 142, routing line 150, solder mask 156 or plated contact 162 is removed.

Figure 18A:
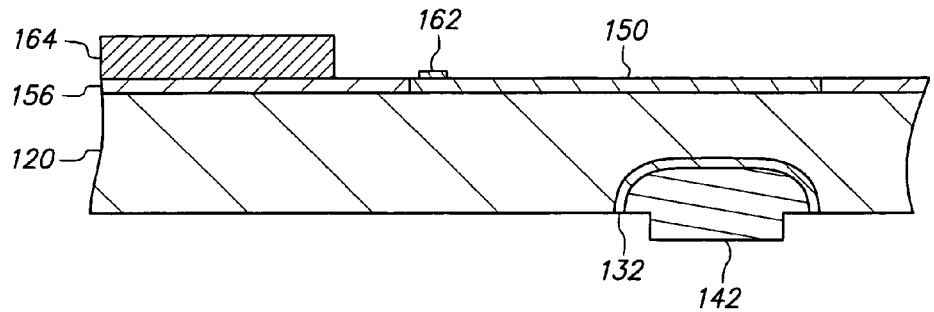
Figure 18B:
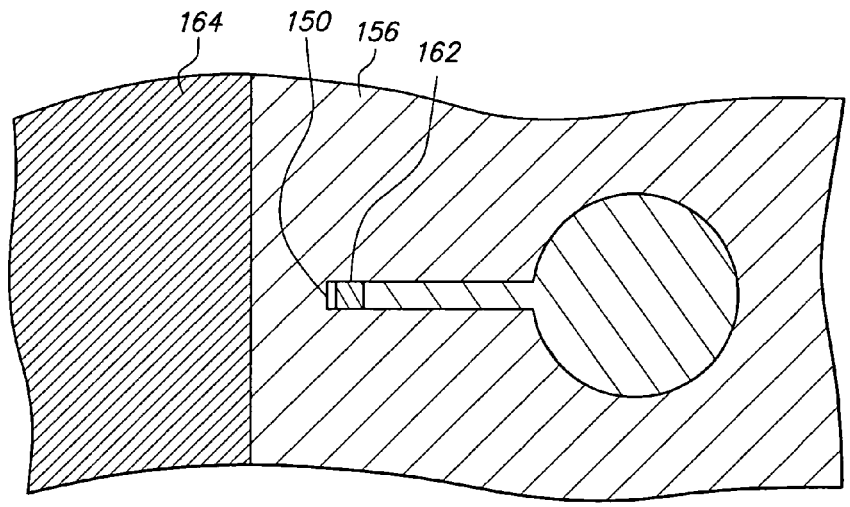
Figure 18C:
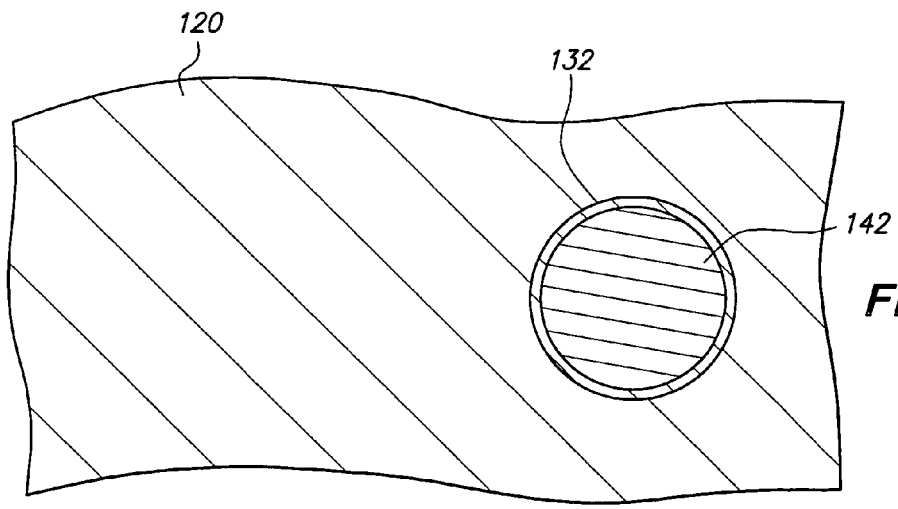

FIGS. 18A, 18B and 18C are cross-sectional, top and bottom views, respectively, of adhesive 164 formed on solder mask 156.

Adhesive 164 may include an organic surface protectant such as HK 2000 which is promptly applied to the structure after photoresist layers 158 and 160 are removed to reduce native oxide formation on the exposed copper surfaces. The use of organic surface protectant layers in insulative adhesives for semiconductor chip assemblies is well-known in the art.

Thereafter, a liquid resin (A stage) such as polyamic acid is deposited on solder mask 156 using stencil printing. During stencil printing, a stencil (not shown) is placed on routing line 150 and solder mask 156, a stencil opening is aligned with metal base 120 and offset from routing line 150, and then a squeegee (not shown) pushes the liquid resin along the surface of the stencil opposite solder mask 156, through the stencil opening and onto solder mask 156 but not metal base 120, routing line 150 or plated contact 162. The liquid resin is compliant enough at room temperature to conform to virtually any shape. Therefore, the liquid resin flows over and covers a portion of solder mask 156 but remains spaced from metal base 120, routing line 150 and plated contact 162.

Figure 19A:
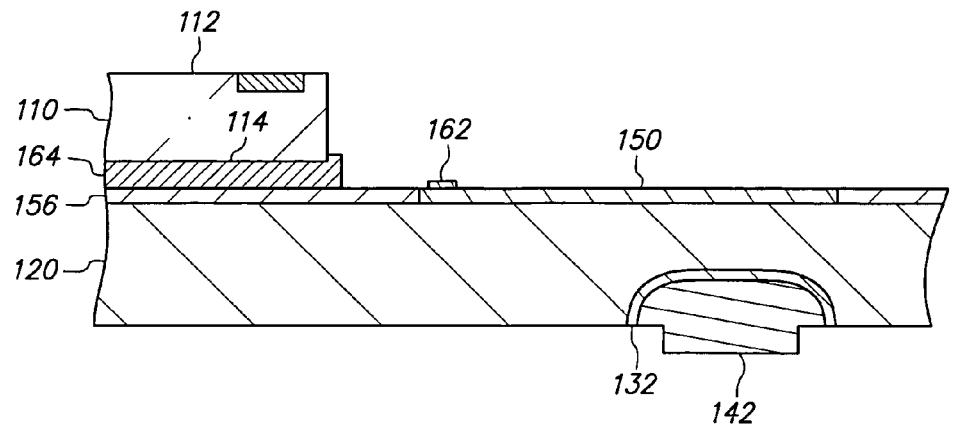
Figure 19B:
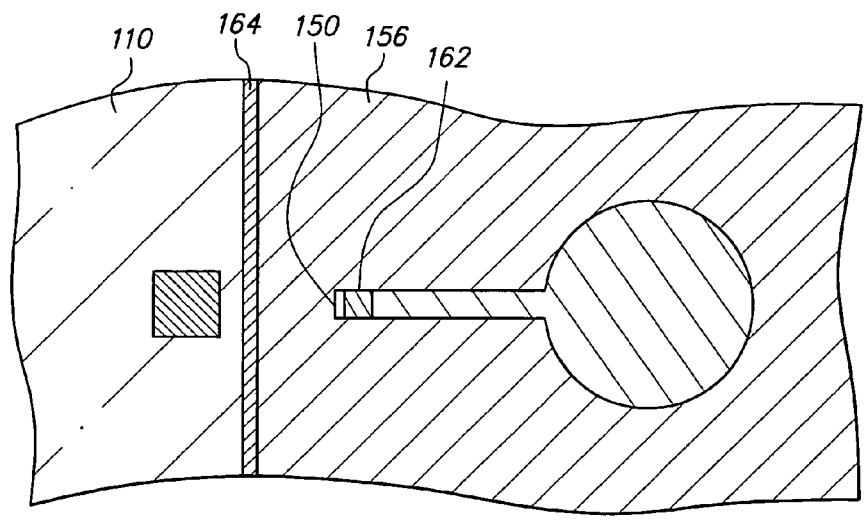
Figure 19C:
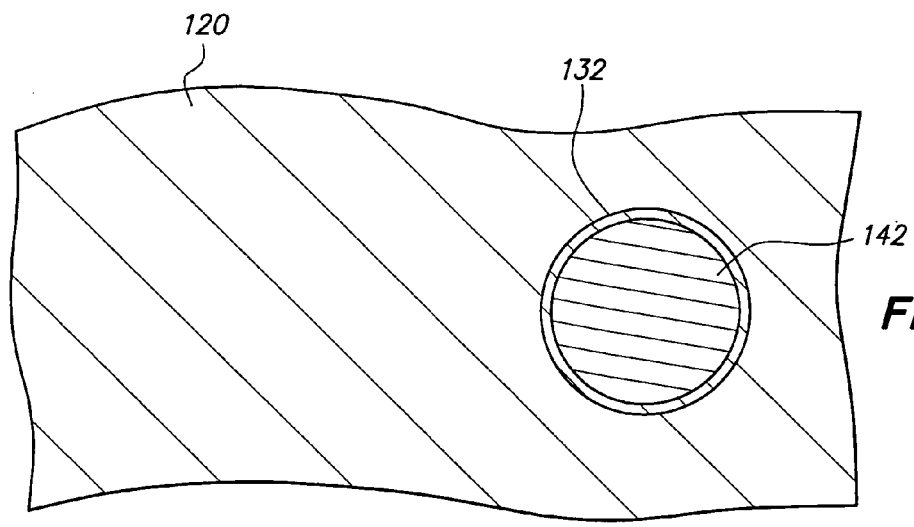

FIGS. 19A, 19B and 19C are cross-sectional, top and bottom views, respectively, of chip 110 mechanically attached to metal base 120, metal containment wall 132, solder layer 142, routing line 150, solder mask 156 and plated contact 162 by adhesive 164.

Adhesive 164 contacts and extends between chip 110 and solder mask 156 but remains spaced from metal base 120, routing line 150 and plated contact 162. Surface 112 of chip 110 faces upwardly and away from solder mask 156 and is exposed, and surface 114 of chip 110 faces downwardly and towards solder mask 156 and is covered by adhesive 164. Chip 110 and metal base 120 do not contact one another, chip 110 and routing line 150 do not contact one another, and chip 110 and solder mask 156 do not contact one another.

Adhesive 164 is sandwiched between chip 110 and solder mask 156 using relatively low pressure from a pick-up head that places chip 110 on adhesive 164, holds chip 110 against adhesive 164 for 5 seconds and then releases chip 110. The pick-up head is heated to a relatively low temperature such as 150° C., and adhesive 164 receives heat from the pick-up head transferred through chip 110. As a result, adhesive 164 proximate to chip 110 is partially polymerized (B stage) and forms a gel but is not fully cured, and adhesive 164 that is partially polymerized provides a loose mechanical bond between chip 110 and solder mask 156.

Chip 110 and metal base 120 are positioned relative to one another so that chip 110 is disposed within the periphery of adhesive 164, and metal containment wall 132, solder layer 142, routing line 150 and plated contact 162 are disposed outside the periphery of chip 110. Chip 110 and metal base 120 can be aligned using an automated pattern recognition system.

Thereafter, the structure is placed in an oven and adhesive 164 is fully cured (C stage) at relatively low temperature in the range of 200 to 250° C. to form a solid adhesive insulative thermosetting polyimide layer that contacts and is sandwiched between and mechanically attaches chip 110 and solder mask 156. Adhesive 164 is 35 microns thick between chip 110 and solder mask 156.

At this stage, metal base 120 covers and extends downwardly beyond chip 110, routing line 150, solder mask 156, plated contact 162 and adhesive 164, metal containment wall 132 is disposed outside the periphery of chip 110 and extends downwardly beyond chip 110, routing line 150, solder mask 156, plated contact 162 and adhesive 164, solder layer 142 is disposed outside the periphery of chip 110 and extends downwardly beyond chip 110, metal containment wall 132, routing line 150, solder mask 156, plated contact 162 and adhesive 164, routing line 150 is disposed downwardly beyond and outside the periphery of chip 110 and extends laterally beyond metal containment wall 132 and solder layer 142 towards chip 110, and adhesive 164 extends downwardly beyond chip 110. Furthermore, chip 110 remains electrically isolated from metal base 120, metal containment wall 132, solder layer 142, routing line 150 and plated contact 162.

Figure 20A:
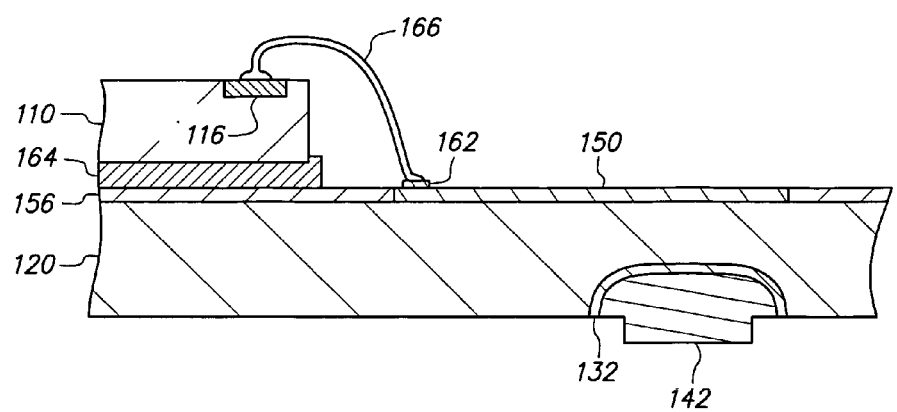
Figure 20B:
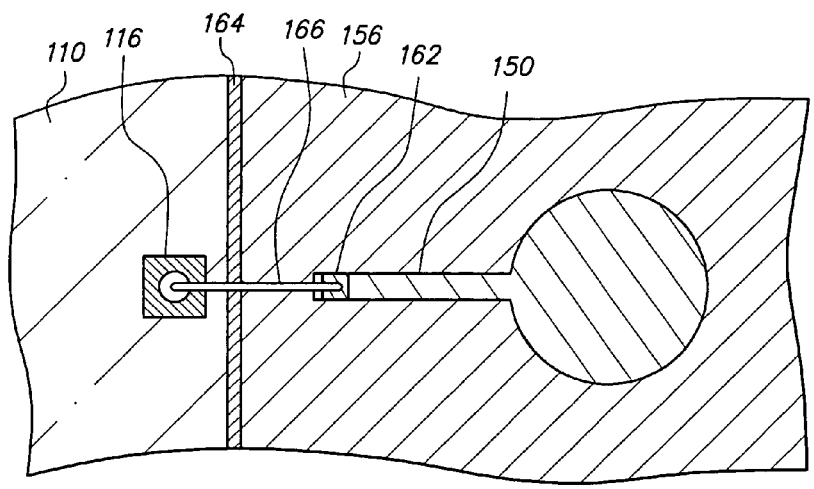
Figure 20C:
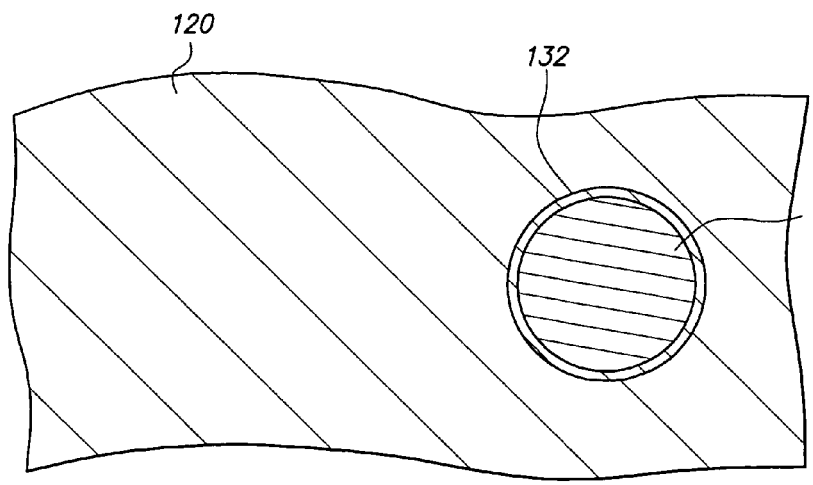

FIGS. 20A, 20B and 20C are cross-sectional, top and bottom views, respectively, of connection joint 166 formed on pad 116 and plated contact 162.

Connection joint 166 is a gold wire bond that is ball bonded to pad 116 and then wedge bonded to plated contact 162. The gold wire between the ball bond and the wedge bond has a thickness of 25 microns. Thus, connection joint 166 contacts and electrically connects pad 116 and plated contact 162, and consequently, electrically connects pad 116 to metal base 120, metal containment wall 132, solder layer 142 and routing line 150. Furthermore, connection joint 166 extends within and outside the periphery of chip 110, extends upwardly beyond chip 110 by 100 microns and is spaced from metal base 120, metal containment wall 132, solder layer 142, routing line 150 and solder mask 156.

Figure 21A:
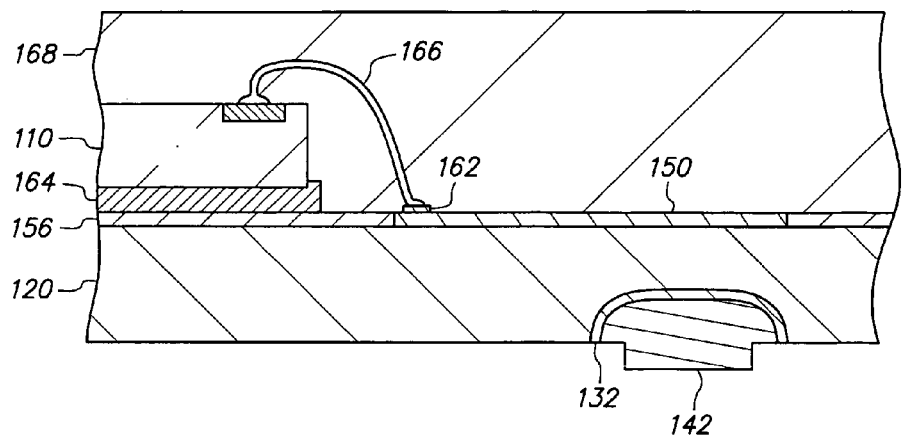
Figure 21B:
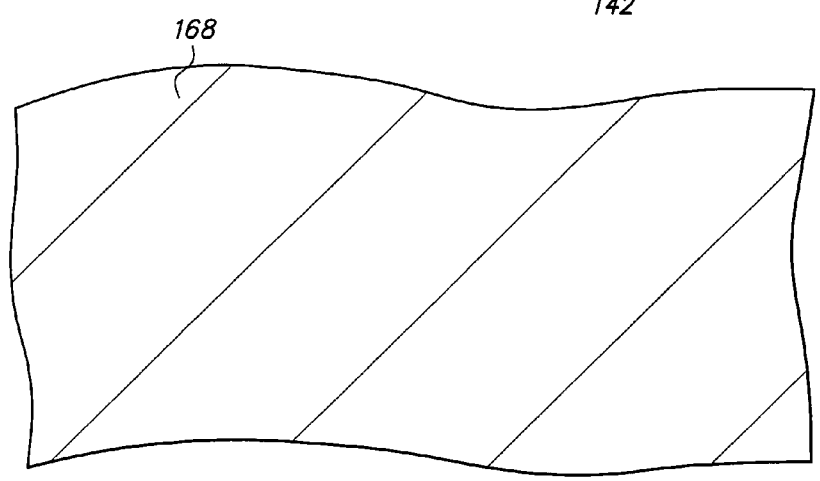
Figure 21C:
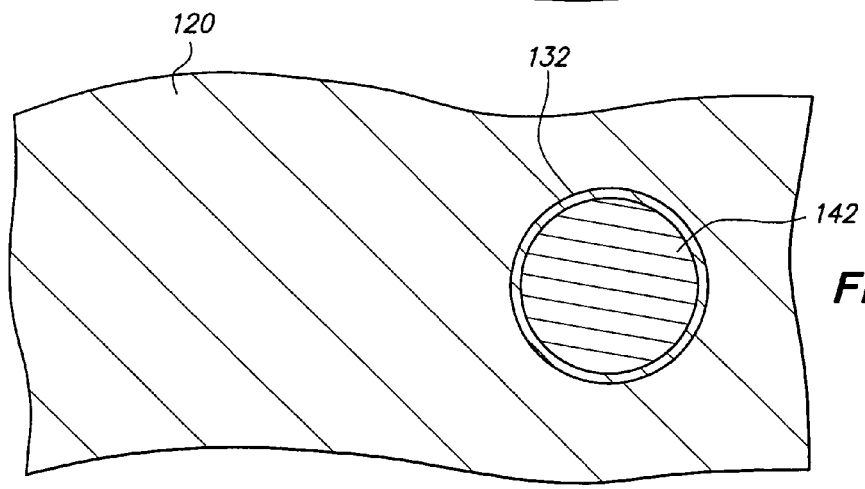

FIGS. 21A, 21B and 21C are cross-sectional, top and bottom views, respectively, of encapsulant 168 formed on chip 110, routing line 150, solder mask 156, plated contact 162, adhesive 164 and connection joint 166.

Encapsulant 168 is deposited by transfer molding. Transfer molding is the most popular chip encapsulation method for essentially all plastic packages. Generally speaking, transfer molding involves forming components in a closed mold from a molding compound that is conveyed under pressure in a hot, plastic state from a central reservoir called the transfer pot through a tree-like array of runners and gates into closed cavities. Molding compounds are well-known in the art.

The preferred transfer molding system includes a preheater, a mold, a press and a cure oven. The mold includes an upper mold section and a lower mold section, also called "platens" or "halves" which define the mold cavities. The mold also includes the transfer pot, runners, gates and vents. The transfer pot holds the molding compound. The runners and gates provide channels from the transfer pot to the cavities. The gates are placed near the entrances of the cavities and are constricted to control the flow and injection velocity of the molding compound into the cavities and to facilitate removal of the solidified molding compound after molding occurs. The vents allow trapped air to escape but are small enough to permit only a negligible amount of the molding compound to pass through them.

The molding compound is initially in tablet form. The preheater applies high-frequency energy to preheat the molding compound to a temperature in the range of 50 to 100° C. The preheated temperature is below the transfer temperature and therefore the preheated molding compound is not in a fluid state. In addition, the structure is placed in one of the mold cavities, and the press operates hydraulically to close the mold and seal the mold cavities by clamping together the upper and lower mold sections. Guide pins ensure proper mating of the upper and lower mold sections at the parting line. In addition, the mold is heated to a transfer temperature in the range of 150 to 250° C. by inserting electric heating cartridges in the upper and lower mold sections.

After closing the mold, the preheated molding compound in tablet form is placed in the transfer pot. Thereafter, a transfer plunger applies pressure to the molding compound in the transfer pot. The pressure is in the range of 10 to 100 kgf/cm$^2$ and preferably is set as high as possible without introducing reliability problems. The combination of heat from the mold and pressure from the transfer plunger converts the molding compound in the transfer pot into a fluid state. Furthermore, the pressure from the transfer plunger forces the fluid molding compound through the runners and the gates into the mold cavities. The pressure is maintained for a certain optimum time to ensure that the molding compound fills the cavities.

The lower mold section contacts and makes sealing engagement with and is generally flush with metal base 120. However, the upper mold section is spaced from connection joint 166 by 120 microns. As a result, the molding compound contacts the exposed portions of the chip 110, routing line 150, solder mask 156, plated contact 162, adhesive 164 and connection joint 166 in the cavity. After 1 to 3 minutes at the transfer temperature, the molding compound polymerizes and is partially cured in the mold.

Once the partially cured molding compound is resilient and hard enough to withstand ejection forces without significant permanent deformation, the press opens the mold, ejector pins remove the molded structure from the mold, and excess molding compound attached to the molded structure that solidified in the runners and the gates is trimmed and removed. The molded structure is then loaded into a magazine and postcured in the curing oven for 4 to 16 hours at a temperature somewhat lower than the transfer temperature but well above room temperature to completely cure the molding compound.

The molding compound is a multi-component mixture of an encapsulating resin with various additives. The principal additives include curing agents (or hardeners), accelerators, inert fillers, coupling agents, flame retardants, stress-relief agents, coloring agents and mold-release agents. The encapsulating resin provides a binder, the curing agent provides linear/cross-polymerization, the accelerator enhances the polymerization rate, the inert filler increases thermal conductivity and thermal shock resistance and reduces the thermal coefficient of expansion, resin bleed, shrinkage and residual stress, the coupling agent enhances adhesion to the structure, the flame retardant reduces flammability, the stress-relief agent reduces crack propagation, the coloring agent reduces photonic activity and device visibility, and the mold-release agent facilitates removal from the mold.

Encapsulant 168 contacts and covers chip 110, routing line 150, solder mask 156, plated contact 162, adhesive 164 and connection joint 166. More particularly, encapsulant 168 contacts surface 112 and the outer edges of chip 110, but is spaced from surface 114 of chip 110 (due to adhesive 164). Furthermore, encapsulant 168 covers but is spaced from metal base 120, metal containment wall 132 and solder terminal 142.

Encapsulant 168 is a solid adherent compressible protective layer that provides environmental protection such as moisture resistance and particle protection for chip 110 as well as mechanical support for routing line 150. Furthermore, chip 110 is embedded in encapsulant 168.

Encapsulant 168 extends upwardly beyond chip 110, metal base 120, metal containment wall 132, solder layer 142, routing line 150, solder mask 156, plated contact 162, adhesive 164 and connection joint 166, has a thickness of 400 microns and extends 120 microns upwardly beyond connection joint 166.

Figure 22A:
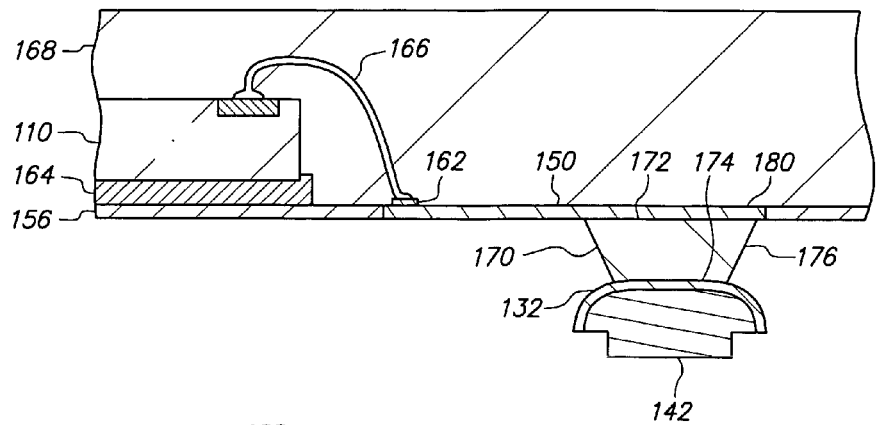
Figure 22B:
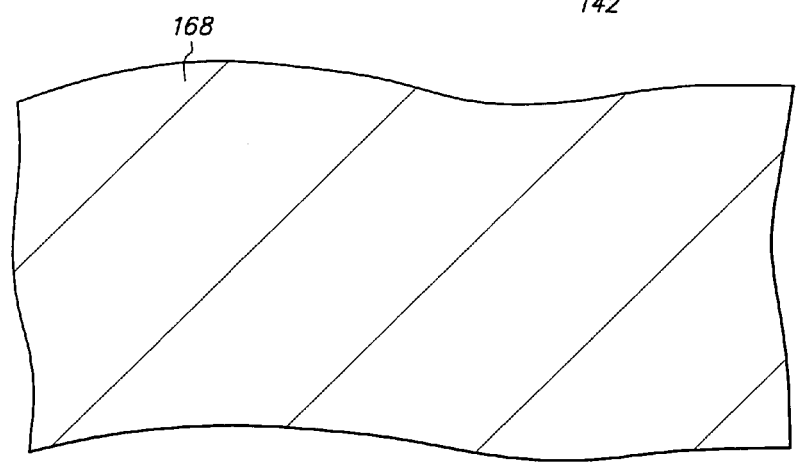
Figure 22C:
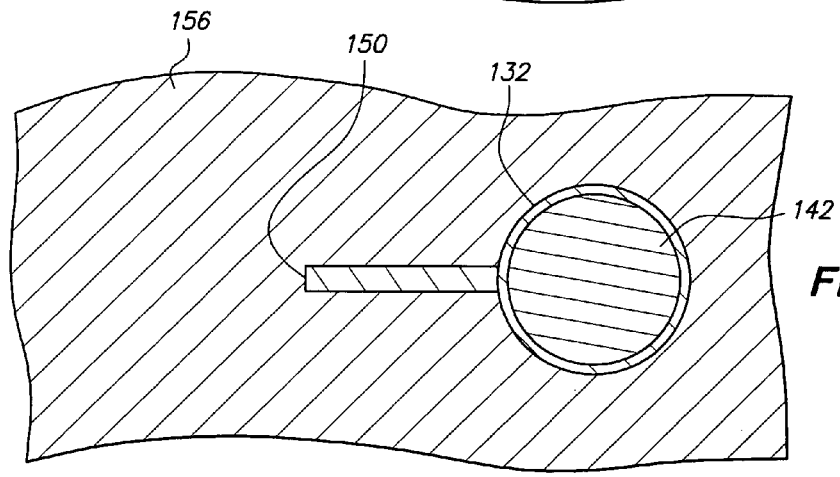

FIGS. 22A, 22B and 22C are cross-sectional, top and bottom views, respectively, of metal pillar 170 formed from metal base 120.

Metal pillar 170 is an unetched portion of metal base 120 that contacts and is sandwiched between and electrically connects and is non-integral with metal containment wall 132 and routing line 150 and is composed of copper.

Metal pillar 170 is formed by applying a wet chemical etch to metal base 120 using metal containment wall 132 and solder layer 142 as an etch mask to selectively protect metal base 120. Thus, metal pillar 170 is an unetched portion of metal base 120 defined by metal containment wall 132 that is formed subtractively.

A back-side wet chemical etch is applied to surface 124 of metal base 120, metal containment wall 132 and solder layer 142. For instance, the bottom spray nozzle can spray the wet chemical etch on metal base 120 while the top spray nozzle is deactivated, or the structure can be dipped in the wet chemical etch since encapsulant 168 provides front-side protection. The wet chemical etch is highly selective of copper with respect to nickel, solder, epoxy and the molding compound, and therefore, highly selective of metal base 120 with respect to metal containment wall 132, solder layer 142, the nickel layer of routing line 150, solder mask 156 and encapsulant 168.

The wet chemical etch etches completely through metal base 120, thereby effecting a pattern transfer of metal containment wall 132 onto metal base 120, exposing routing line 150 and solder mask 156, reducing but not eliminating contact area between metal base 120 and metal containment wall 132, reducing but not eliminating contact area between metal base 120 and routing line 150, and eliminating contact area between metal base 120 and solder mask 156. However, no appreciable amount of metal containment wall 132, solder layer 142, the nickel layer of routing line 150, solder mask 156 or encapsulant 168 is removed. Furthermore, the nickel layer of routing line 150 protects the underlying copper layer of routing line 150 from the wet chemical etch. Therefore, no appreciable amount of routing line 150 is removed.

The wet chemical etch removes all of metal base 120 within the periphery of chip 110 and removes most of metal base 120. The wet chemical etch also laterally undercuts metal base 120 relative to metal containment wall 132, causing metal pillar 170 to taper inwardly with increasing height. A suitable taper is between 45 and slightly less than 90 degrees, such as approximately 75 degrees.

Metal pillar 170 contacts routing line 150 at enlarged circular portion 154, is spaced from elongated routing portion 152 and extends downwardly beyond routing line 150. Thus, metal pillar 170 overlaps routing line 150 in the downward direction, however metal pillar 170 does not cover routing line 150 in the downward direction.

A suitable wet chemical etch can be provided by a solution containing alkaline ammonia. The optimal etch time for exposing metal base 120 to the wet chemical etch in order to etch through metal base 120 and form metal pillar 170 with the desired dimensions without excessively undercutting metal containment wall 132 or exposing routing line 150 to the wet chemical etch can be established through trial and error.

Metal pillar 170 includes opposing surfaces 172 and 174 and tapered sidewalls 176 therebetween. Surface 172 of metal pillar 170 constitutes an unetched portion of surface 122 of metal base 120, and surface 174 of metal pillar 170 constitutes an unetched portion of metal base 120 at recess 130. Thus, surface 172 faces upwardly and surface 174 faces downwardly. Surface 172 contacts and faces towards routing line 150 and is spaced from and faces away from metal containment wall 132, and surface 174 contacts and faces towards metal containment wall 132 and is spaced from and faces away from routing line 150. In addition, surface 172 is flat and parallel to surfaces 112 and 114 of chip 110 and routing line 150, and surface 174 contours to metal containment wall 132. Tapered sidewalls 176 are adjacent to surfaces 172 and 174 and slant inwardly towards surface 174.

Metal pillar 170 has a generally conical shape with a height (between surfaces 172 and 174) of 70 microns and a diameter that substantially continuously decreases as metal pillar 170 extends downwardly (from surface 172 towards surface 174). Surface 172 has a circular shape with a diameter of 250 microns, and surface 174 has a circular shape with a diameter of 200 microns. Surfaces 172 and 174 are vertically aligned with metal containment wall 132, solder layer 142, enlarged circular portion 154 and one another. Thus, surface 174 is concentrically disposed within the surface area of metal containment wall 132, solder layer 142, enlarged circular portion 154 and surface 172. Furthermore, surface 172 has a surface area that is at least 20 percent larger than the surface area of surface 174.

Metal pillar 170 is disposed outside the periphery of chip 110 and downwardly beyond chip 110, routing line 150, solder mask 156, adhesive 164, connection joint 166 and encapsulant 168, and extends upwardly beyond metal containment wall 132 and solder layer 142. Furthermore, chip 110 extends upwardly beyond routing line 150, solder mask 156, adhesive 164 and metal pillar 170, routing line 150 is disposed upwardly beyond metal containment wall 132, solder layer 142 and metal pillar 170 and extends laterally beyond metal containment wall 132, solder layer 142 and metal pillar 170 towards chip 110, and encapsulant 168 covers and extends upwardly beyond chip 110, metal containment wall 132, solder layer 142, routing line 150, solder mask 156, adhesive 164, connection joint 166 and metal pillar 170.

Encapsulant 168 provides mechanical support for routing line 150 and metal pillar 170 and reduces mechanical strain on adhesive 164, which is particularly useful after metal base 120 is etched to form metal pillar 170. Encapsulant 168 protects routing line 150 and metal pillar 170 from mechanical damage by the wet chemical etch and subsequent cleaning steps (such as rinsing in distilled water and air blowing). For instance, encapsulant 168 absorbs physical force of the wet chemical etch and cleaning steps that might otherwise separate chip 110 and routing line 150. Thus, encapsulant 168 improves structural integrity and allows the wet chemical etch and subsequent cleaning steps to be applied more vigorously, thereby improving manufacturing throughput.

Conductive trace 180 includes metal containment wall 132, solder layer 142, routing line 150, plated contact 162 and metal pillar 170. Conductive trace 180 is adapted for providing horizontal and vertical routing between pad 116 and a next level assembly.

Figure 23A:
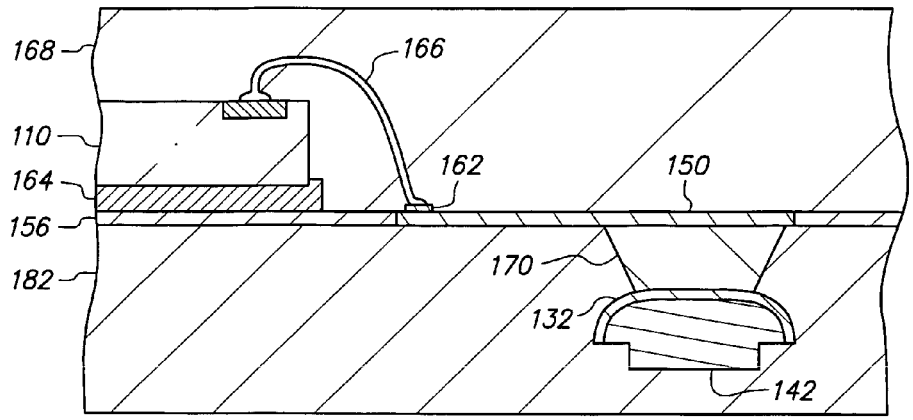
Figure 23B:
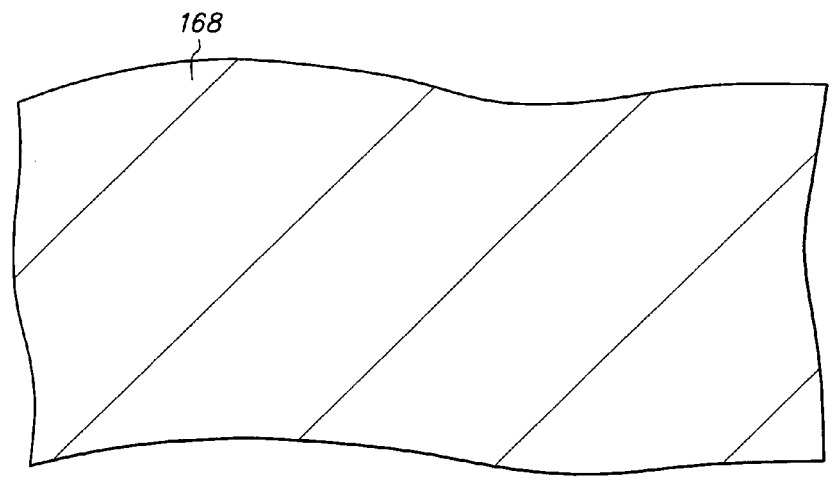
Figure 23C:
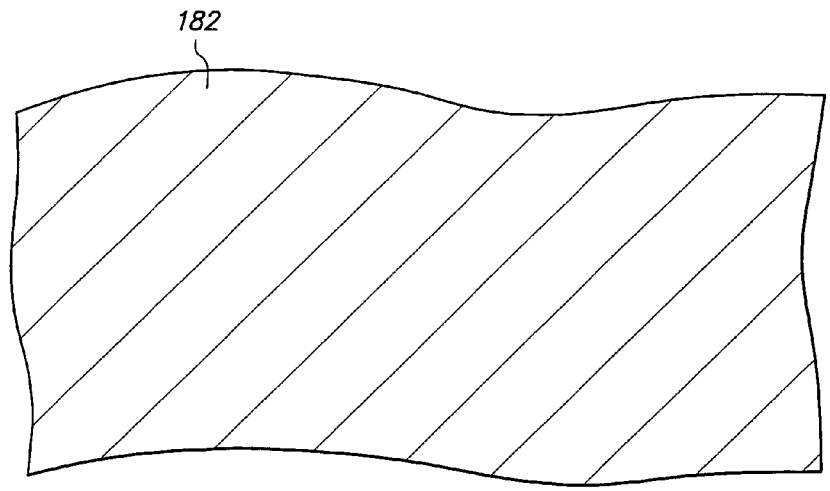

FIGS. 23A, 23B and 23C are cross-sectional, top and bottom views, respectively, of insulative base 182 formed on metal containment wall 132, solder layer 142, routing line 150, solder mask 156 and metal pillar 170.

Insulative base 182 is initially an epoxy in paste form that includes an epoxy resin, a curing agent, an accelerator and a filler. The filler is an inert material, such as silica (powdered fused quartz), that improves thermal conductivity, thermal shock resistance, and thermal coefficient of expansion matching. The epoxy paste is blanketly deposited on metal containment wall 132, solder layer 142, routing line 150, solder mask 156 and metal pillar 170, and then the epoxy paste is cured or hardened at a relatively low temperature in the range of 100 to 250° C. to form a solid adherent insulator that provides a protective seal for routing line 150 and metal pillar 170.

Insulative base 182 contacts and covers and extends downwardly beyond metal containment wall 132, solder layer 142, routing line 150, solder mask 156 and metal pillar 170, covers and extends downwardly beyond and is spaced from chip 110, plated contact 162, connection joint 166 and encapsulant 168, and has a thickness of 200 microns. Thus, insulative base 182 extends downwardly beyond metal containment wall 132, solder layer 142, routing line 150 and metal pillar 170 and metal containment wall 132, solder layer 142, routing line 150 and metal pillar 170 are unexposed.

For convenience of illustration, insulative base 182 is shown below chip 110 to retain a single orientation throughout the figures for ease of comparison between the figures, although in this step the structure would be inverted so that gravitational force would assist the epoxy paste deposition.

Figure 24A:
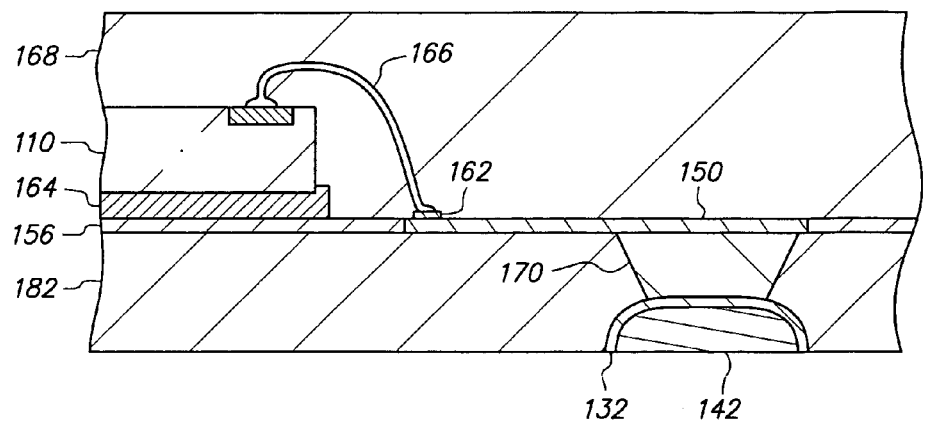
Figure 24B:
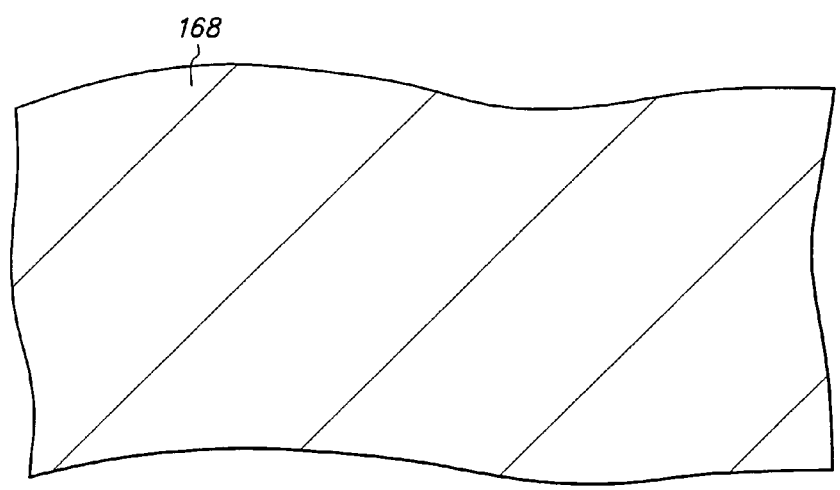
Figure 24C:
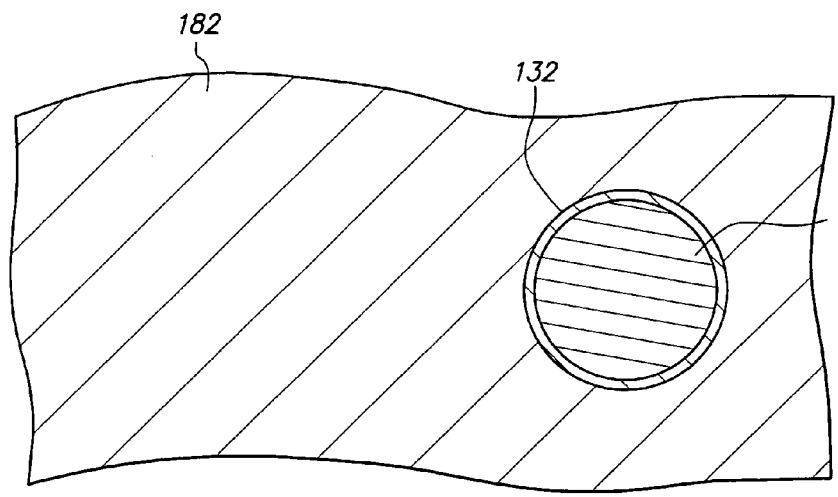

FIGS. 24A, 24B and 24C are cross-sectional, top and bottom views, respectively, of the structure after a lower portion of insulative base 182 is removed.

The lower portion of insulative base 182 is removed by grinding. In particular, a rotating diamond sand wheel and distilled water are applied to the back-side of insulative base 182. Initially, the diamond sand wheel grinds only insulative base 182.

As the grinding continues, insulative base 182 becomes thinner as the grinded surface migrates upwardly. Eventually the diamond sand wheel contacts solder layer 142, and as a result, begins to grind solder layer 142 as well. As the grinding continues, solder layer 142 and insulative base 182 become thinner as their grinded surfaces migrate upwardly. Eventually the diamond sand wheel contacts metal containment wall 132, and as a result, begins to grind metal containment wall 132 as well. As the grinding continues, metal containment wall 132, solder layer 142 and insulative base 182 become thinner as their grinded surfaces migrate upwardly. The grinding continues until metal containment wall 132, solder layer 142 and insulative base 182 have the desired thickness, and then halts before it reaches chip 110, routing line 150, solder mask 156, plated contact 162, adhesive 164, connection joint 166, encapsulant 168 or metal pillar 170. Thereafter, the structure is rinsed in distilled water to remove contaminants.

Metal containment wall 132, solder layer 142 and insulative base 182 extend downwardly beyond metal pillar 170 by 70 microns after the grinding operation. Thus, the grinding removes a 10 micron thick lower portion of metal containment wall 132, a 40 micron thick lower portion of solder layer 142 and a 60 micron thick lower portion of insulative base 182.

At this stage, chip 110 remains embedded in encapsulant 168, metal pillar 170 remains embedded in insulative base 182, routing line 150 and metal pillar 170 remain unexposed, and metal containment wall 132 and solder layer 142 are exposed. Insulative base 182 continues to cover and extend downwardly beyond and be spaced from chip 110, plated contact 162, adhesive 164 and connection joint 166, contact and extend downwardly beyond routing line 150, solder mask 156 and metal pillar 170, contact metal containment wall 132 and be spaced from solder layer 142. Insulative base 182 also continues to overlap routing line 150, solder mask 156, encapsulant 168 and metal pillar 170 in the downward direction, however insulative base 182 no longer covers routing line 150, solder mask 156, encapsulant 168 or metal pillar 170 in the downward direction. Furthermore, metal containment wall 132, solder layer 142 and insulative base 182 are laterally aligned with one another at a surface that faces downwardly. Thus, an exposed planarized horizontal surface that faces downwardly includes metal containment wall 132, solder layer 142 and insulative base 182.

Figure 25A:
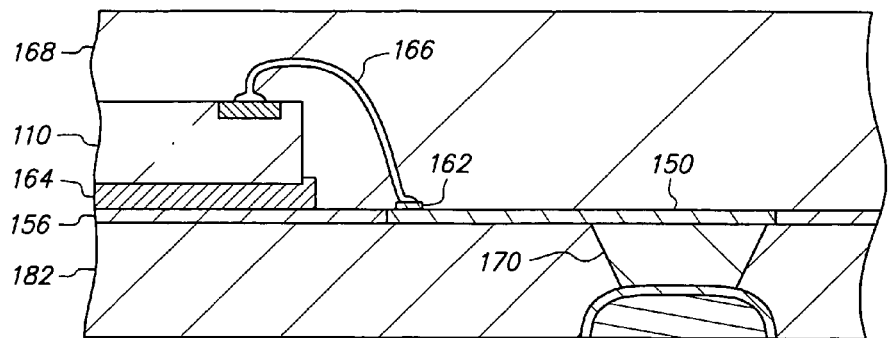
Figure 25B:
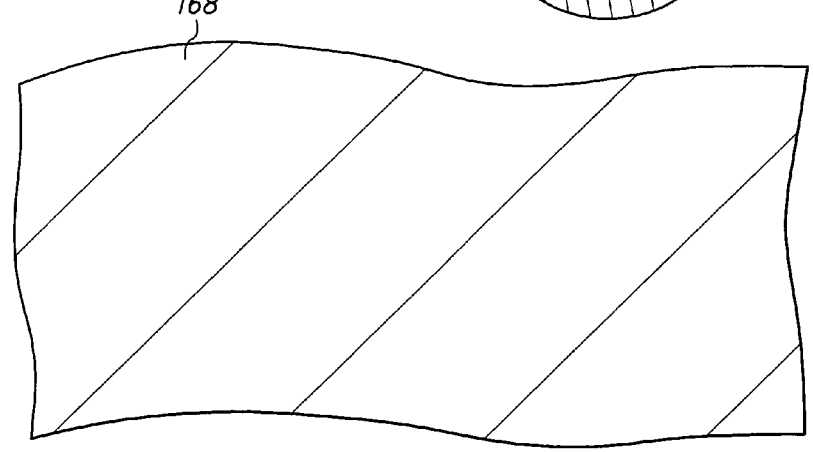
Figure 25C:
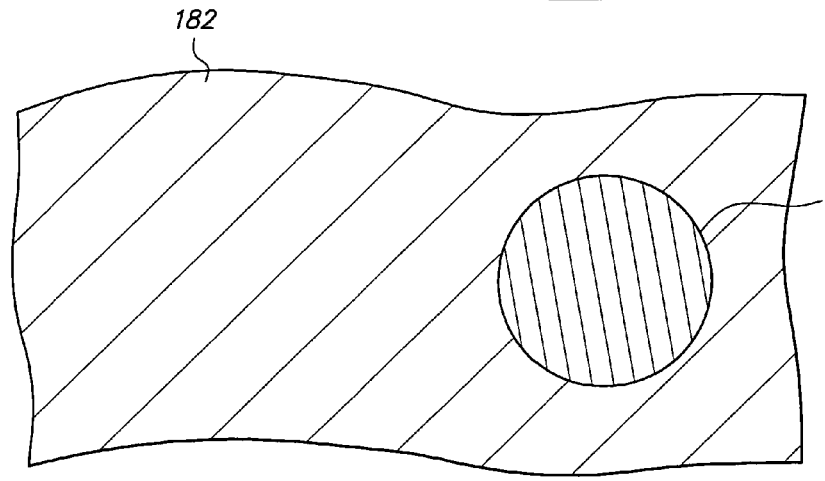

FIGS. 25A, 25B and 25C are cross-sectional, top and bottom views, respectively, of solder ball 184 formed on solder layer 142.

Solder ball 184 is initially a lead-free ball with a spherical shape and a diameter of 300 microns. The lead-free ball is dipped in flux to provide solder ball 184 with a flux surface coating that surrounds the lead-free ball. Thereafter, the structure is inverted so that solder layer 142 faces upwardly, and then solder ball 184 is deposited on solder layer 142. Solder ball 184 weakly adheres to solder layer 142 due to the flux surface coating of solder ball 184.

For convenience of illustration, solder ball 184 is shown below solder layer 142 to retain a single orientation throughout the figures for ease of comparison between the figures, although the structure would be inverted during the deposition of solder ball 184 so that gravitational force would assist with the adhesion of solder ball 184 to solder layer 142.

Figure 26A:
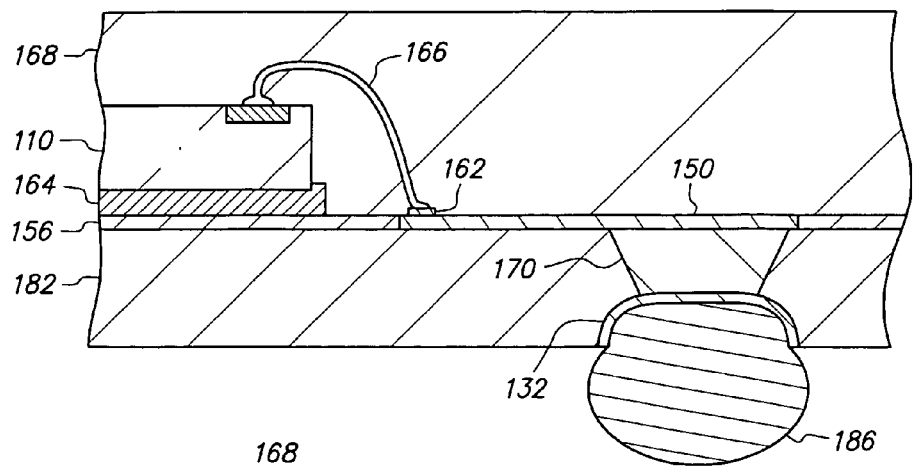
Figure 26B:
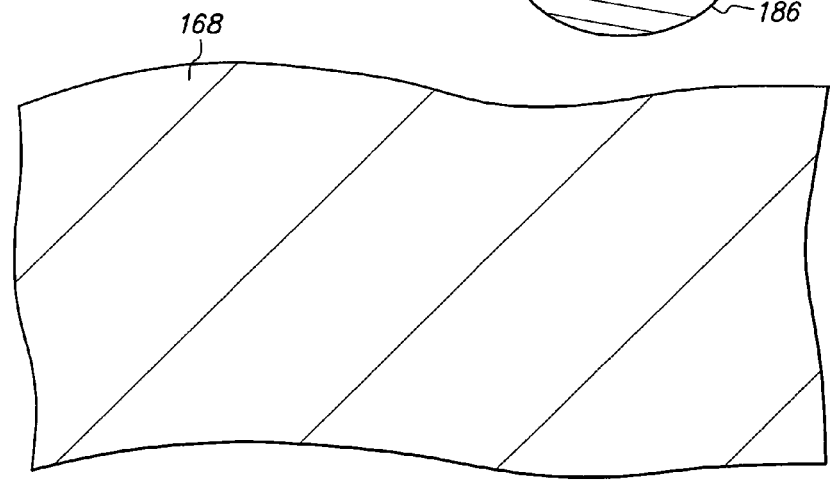
Figure 26C:
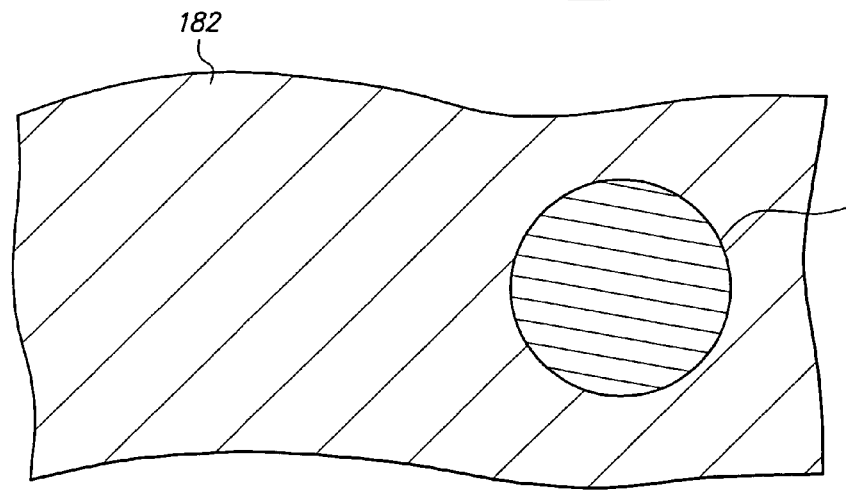

FIGS. 26A, 26B and 26C are cross-sectional, top and bottom views, respectively, of solder terminal 186 formed on metal containment wall 132.

Solder terminal 186 includes and is formed from solder layer 142 and solder ball 184. Initially, solder ball 184 rests upon solder layer 142. Thereafter, the structure is heated to a temperature of about 260° C. The heat causes the flux in solder ball 184 to react with and remove oxides from solder layer 142 and renders solder layer 142 and solder ball 184 molten. As a result, solder layer 142 and solder ball 184 reflow together into a molten solder mixture and solder reflow occurs. Furthermore, insulative base 182 does not provide a wettable surface to facilitate the solder reflow. As a result, the solder reflow is essentially confined to metal containment wall 132. Thereafter, the heat is removed and the molten solder cools and solidifies into solder terminal 186 which is hardened. In this manner, solder layer 142 and solder ball 184 are converted into solder terminal 186.

Thus, solder layer 142 and solder terminal 186 are formed in sequence. That is, metal containment wall 132 is electroplated on metal base 120, then solder paste 140 is deposited on metal containment wall 132 and then reflowed to form solder layer 142, then solder ball 184 is deposited on solder layer 142, and then solder layer 142 and solder ball 184 are reflowed together to form solder terminal 186.

Solder terminal 186 has a diameter of 400 microns, a thickness of 50 microns in the downward direction relative to metal containment wall 132 and insulative base 182, fills cavity 134 and is vertically aligned with metal containment wall 132, enlarged circular portion 154 and metal pillar 170.

Solder terminal 186 contacts and is electrically connected to and is non-integral with metal containment wall 132, contacts only metal containment wall 132, and contacts metal containment wall 132 only in cavity 134. Thus, solder terminal 186 is spaced from and extends downwardly beyond chip 110, routing line 150, solder mask 156, plated contact 162, adhesive 164, connection joint 166, encapsulant 168, metal pillar 170 and insulative base 182. Furthermore, solder terminal 186 extends within and outside cavity 134, covers metal containment wall 132 and metal pillar 170 in the downward direction and is not covered in the downward direction by any material of the assembly. Likewise, the entire portion of solder terminal 186 that extends into insulative base 182 contacts only metal containment wall 132, is covered and confined by metal containment wall 132 in the upward and lateral directions and is within cavity 134.

Solder terminal 186 provides a robust, permanent electrical connection to metal containment wall 132 and a contact terminal for external circuitry. Advantageously, solder terminal 186 extends into metal containment wall 132 within insulative base 182 and avoids contact at a high-stress boundary in a lateral plane at opening 136 where the exposed major surface of insulative base 182 faces in the downward direction, thereby reducing solder separation and improving reliability.

At this stage, conductive trace 180 includes metal containment wall 132, routing line 150, plated contact 162, metal pillar 170 and solder terminal 186.

For convenience of illustration, solder terminal 186 is shown below chip 110 to retain a single orientation throughout the figures for ease of comparison between the figures, although the structure would be inverted during the formation of solder terminal 186 so that gravitational force would assist with the solder reflow.

Figure 27A:
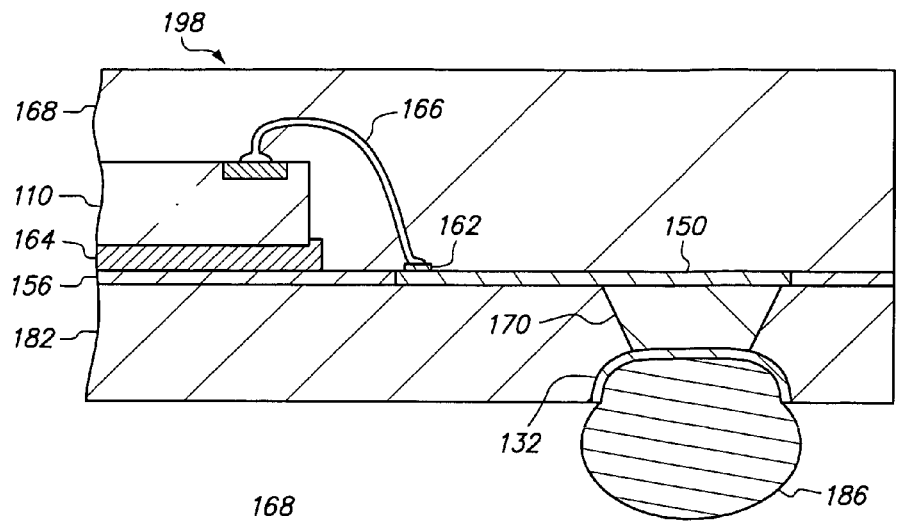
Figure 27B:
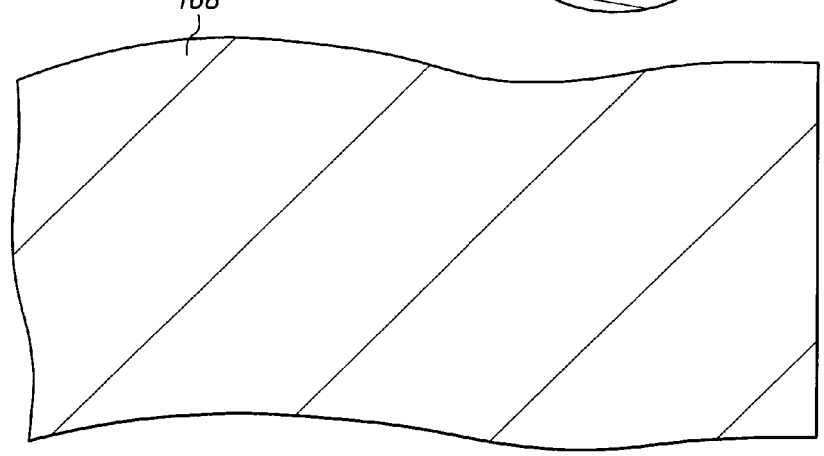
Figure 27C:
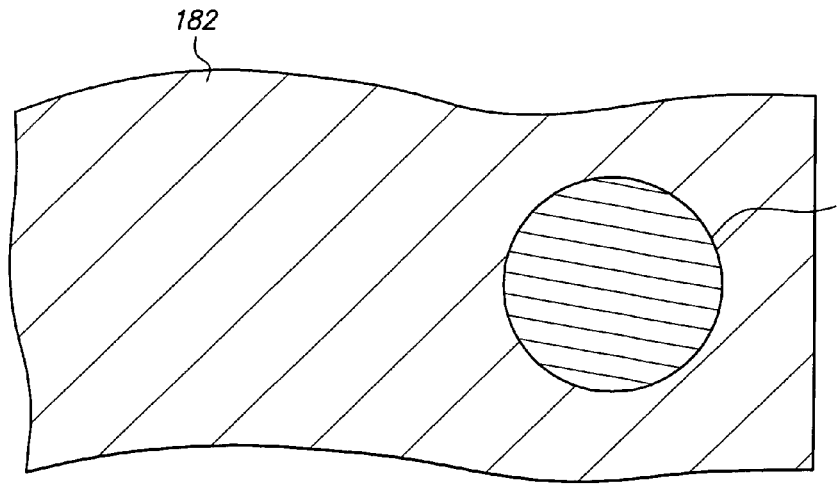

FIGS. 27A, 27B and 27C are cross-sectional, top and bottom views, respectively, of the structure after cutting solder mask 156, encapsulant 168 and insulative base 182 with an excise blade to singulate the assembly from other assemblies.

At this stage, the manufacture of semiconductor chip assembly 198 that includes chip 110, metal containment wall 132, routing line 150, solder mask 156, plated contact 162, adhesive 164, connection joint 166, encapsulant 168, metal pillar 170, insulative base 182 and solder terminal 186 can be considered complete.

Chip 110 extends upwardly beyond conductive trace 180, overlaps insulative base 182 in the upward direction but does not overlap conductive 180 in the upward direction. Thus, conductive trace 180 is disposed outside the periphery of chip 110. Metal containment wall 132 extends upwardly beyond solder terminal 186, has essentially constant thickness and contacts only metal pillar 170, insulative base 182 and solder terminal 186. Cavity 134 is disposed within insulative base 182 and is filled by solder terminal 186. Routing line 150 is mechanically coupled to chip 110 by adhesive 164, is electrically coupled to chip 110 by connection joint 166, extends laterally beyond metal containment wall 132, metal pillar 170 and solder terminal 186 towards chip 110 and is flat and parallel to surfaces 112 and 114 of chip 110. Encapsulant 168 covers chip 110, solder mask 156, adhesive 164, connection joint 166, conductive trace 180 and insulative base 182 in the upward direction. Metal pillar 170 is covered in the upward direction by routing line 150 and is covered in the downward direction by metal containment wall 132 and solder terminal 186. Although metal pillar 170 is not exposed, and is overlapped by metal containment wall 132, insulative base 182 and solder terminal 186 in the downward direction, metal pillar 170 is not covered in the downward direction by encapsulant 168, insulative base 182 or any other insulative material of the assembly. Insulative base 182 contacts metal containment wall 132, routing line 150, solder mask 156 and metal pillar 170, extends upwardly beyond metal containment wall 132 and solder terminal 186 and extends downwardly beyond chip 110, routing line 150, solder mask 156, connection joint 166, encapsulant 168 and metal pillar 170.

Metal containment wall 132, metal pillar 170 and solder terminal 186 extend downwardly beyond but do not cover routing line 150 in the downward direction. Metal containment wall 132 spans 360 degrees laterally around the entire portion of solder terminal 186 that extends into insulative base 182, and insulative base 182 spans 360 degrees laterally around metal containment wall 132. Encapsulant 168 and insulative base 182 provide mechanical support and environmental protection for the assembly.

Connection joint 166 provides horizontal and vertical routing between pad 116 and external circuitry, routing line 150 provides horizontal fan-out routing but no appreciable vertical routing between pad 116 and external circuitry, metal pillar 170 and solder terminal 186 provide vertical routing but no appreciable horizontal routing between pad 116 and external circuitry, and metal containment wall 132 and plated contact 162 provide no appreciable horizontal or vertical routing between pad 116 and external circuitry. Likewise, metal containment wall 132 provides no appreciable routing between solder terminal 186 and any other electrical conductor.

The semiconductor chip assembly is a single-chip first-level package. Thus, chip 110 is the only chip embedded in encapsulant 168.

The semiconductor chip assembly includes other conductive traces embedded in solder mask 156, encapsulant 168 and insulative base 182, and only a single conductive trace 180 is shown for convenience of illustration. The conductive traces are spaced and separated and electrically isolated from one another. The conductive traces each include a respective metal containment wall, routing line, plated contact, metal pillar and solder terminal. The conductive traces are each electrically connected to a respective pad on chip 110 by a respective connection joint. The conductive traces each provide horizontal fan-out routing and vertical routing for their respective pads. Furthermore, the conductive traces each include a downwardly protruding solder terminal to provide a ball grid array (BGA) package.

Chip 110 is designed with the pads electrically isolated from one another. However, the corresponding routing lines are initially electroplated on metal base 120 and electrically connected to one another by metal base 120. Furthermore, the connection joints electrically connect the routing lines and the corresponding pads, thereby electrically connecting the pads with one another. Thereafter, once metal base 120 is etched to form the metal pillars, the routing lines are electrically isolated from one another, and therefore, the pads return to being electrically isolated from one another.

Advantageously, there is no plating bus or related circuitry that need be disconnected or severed from the conductive traces after metal base 120 is etched to form the metal pillars.

FIGS. 28A-54A, 28B-54B and 28C-54C are cross-sectional, top and bottom views, respectively, of a method of making a semiconductor chip assembly in accordance with a second embodiment of the present invention. In the second embodiment, the solder layer is formed after the encapsulant is formed. For purposes of brevity, any description in the first embodiment is incorporated herein insofar as the same is applicable, and the same description need not be repeated. Likewise, elements of the second embodiment similar to those in the first embodiment have corresponding reference numerals indexed at two-hundred rather than one-hundred. For instance, chip 210 corresponds to chip 110, routing line 250 corresponds to routing line 150, etc.

Figure 28A:
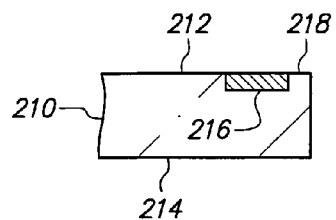
Figure 28B:
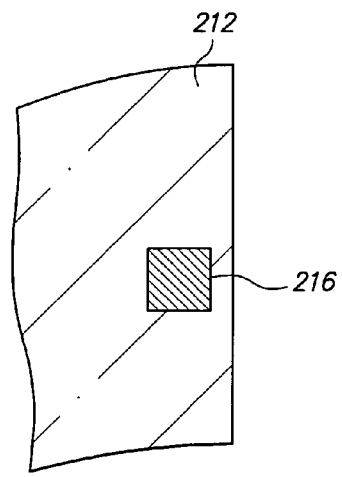
Figure 28C:
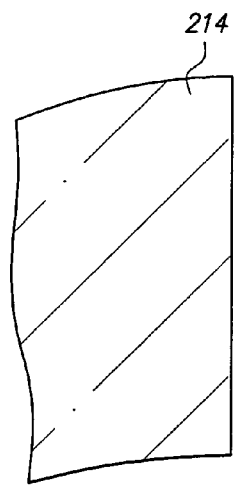

FIGS. 28A, 28B and 28C are cross-sectional, top and bottom views, respectively, of semiconductor chip 210 which includes opposing major surfaces 212 and 214. Upper surface 212 includes conductive pad 216 and passivation layer 218.

Figure 29A:
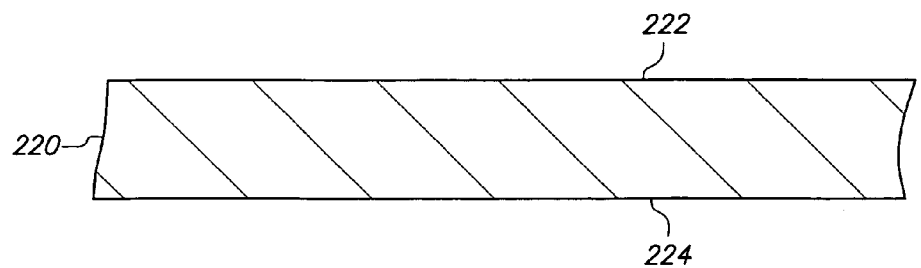
Figure 29B:
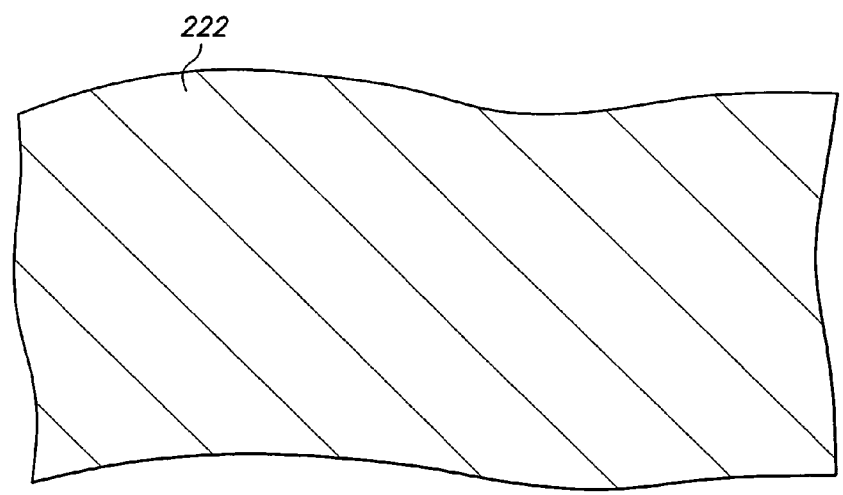
Figure 29C:
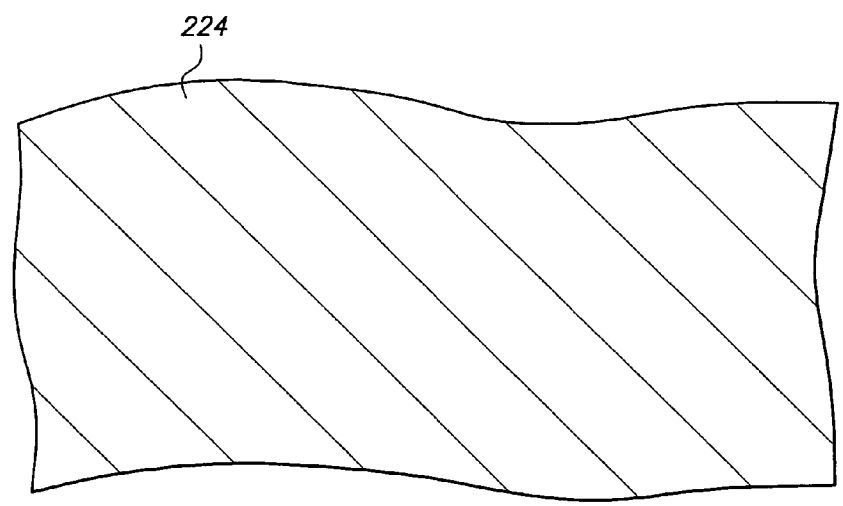

FIGS. 29A, 29B and 29C are cross-sectional, top and bottom views, respectively, of metal base 220 which includes opposing major surfaces 222 and 224.

Figure 30A:
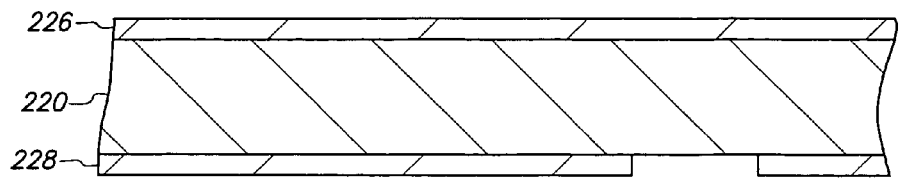
Figure 30B:
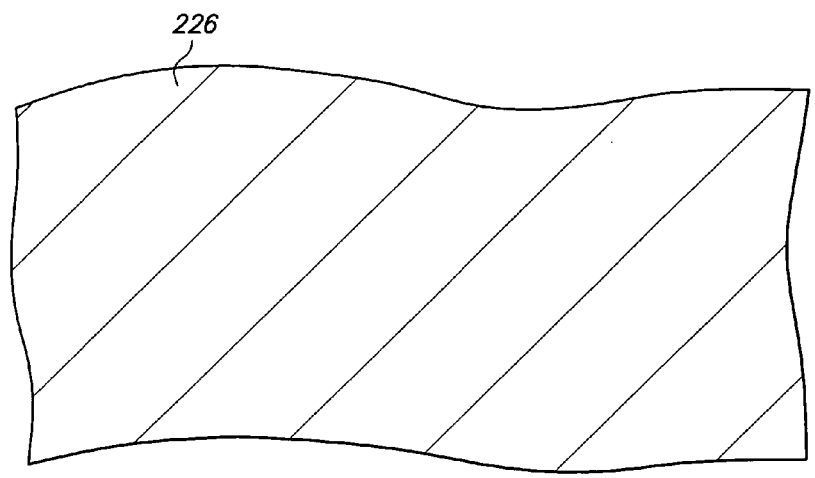
Figure 30C:
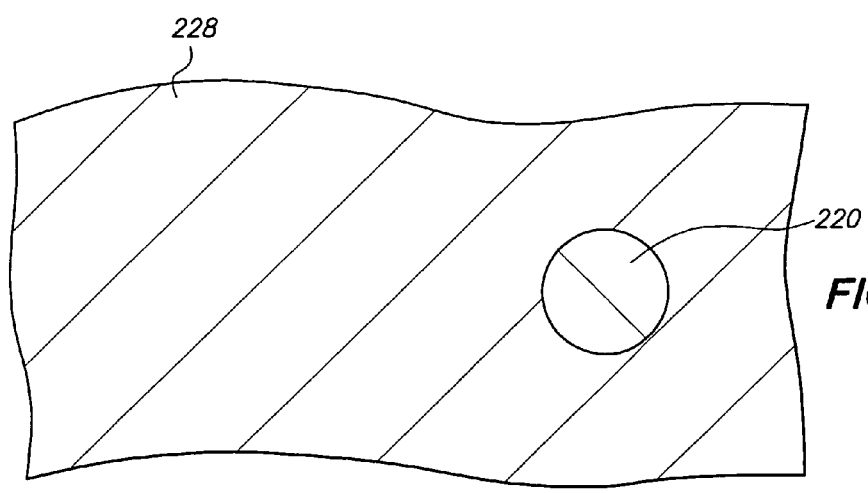

FIGS. 30A, 30B and 30C are cross-sectional, top and bottom views, respectively, of photoresist layers 226 and 228 formed on metal base 220. Photoresist layer 228 includes an opening that selectively exposes surface 224, and photoresist layer 226 remains unpatterned.

Figure 31A:
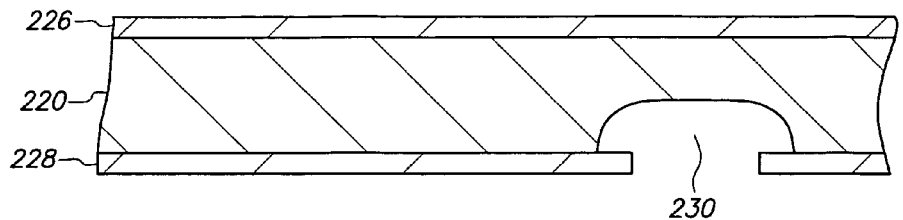
Figure 31B:
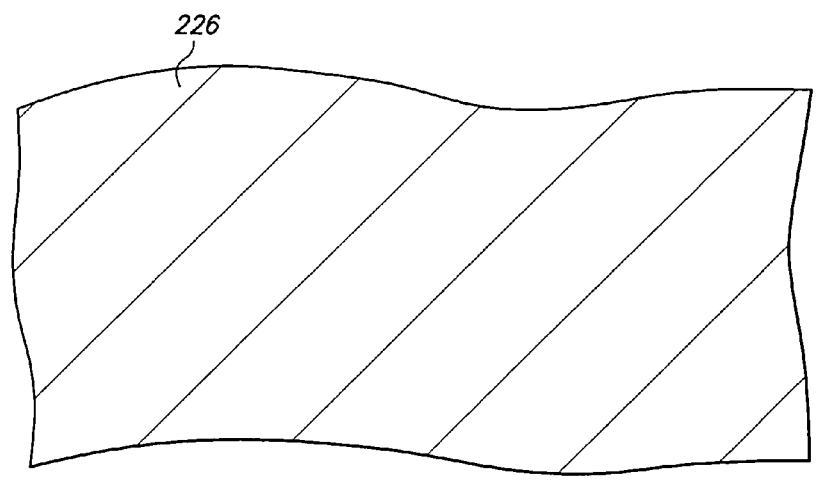
Figure 31C:
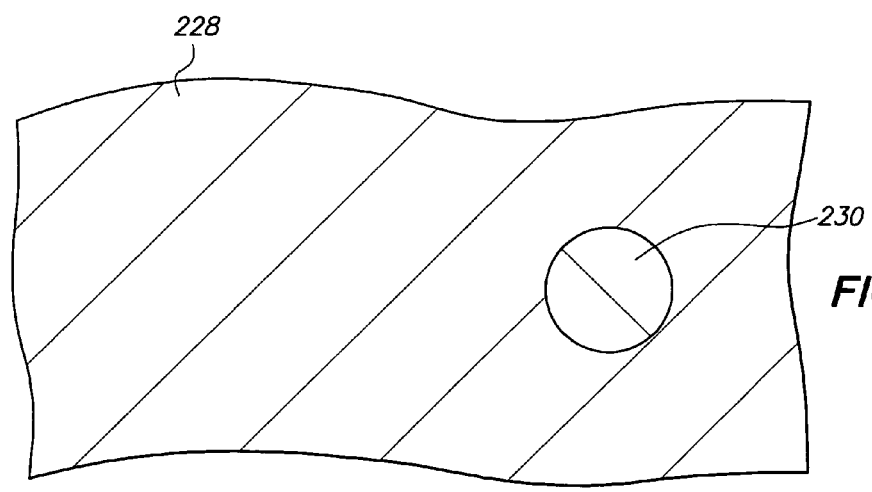

FIGS. 31A, 31B and 31C are cross-sectional, top and bottom views, respectively, of recess 230 formed in metal base 220.

Figure 32A:
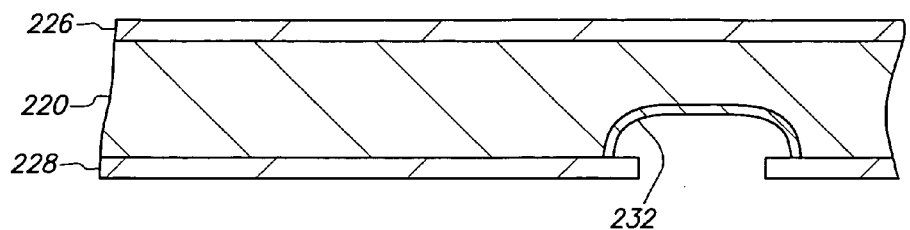
Figure 32B:
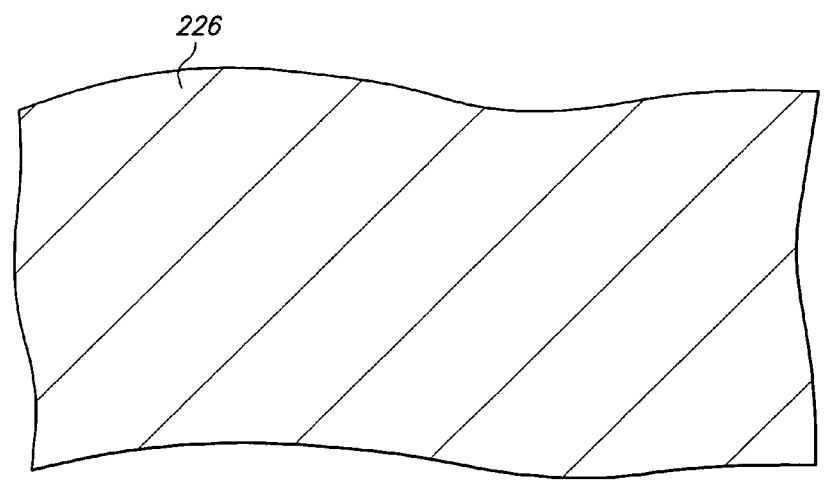
Figure 32C:
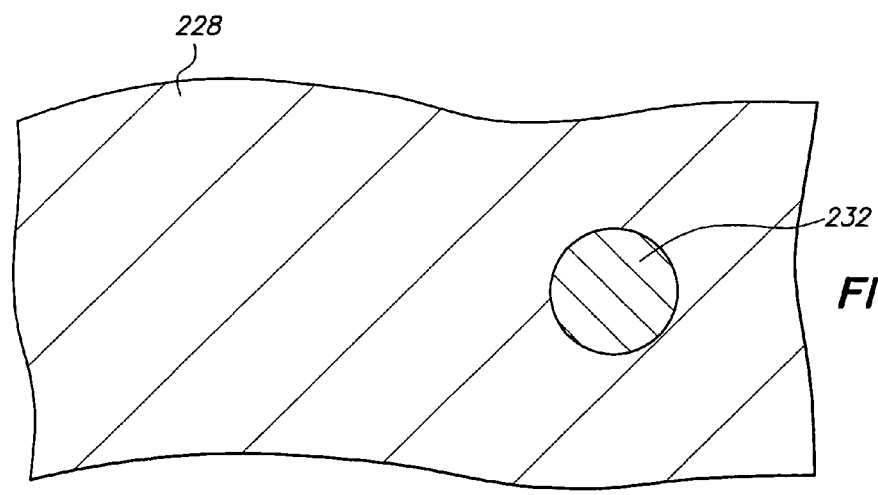

FIGS. 32A, 32B and 32C are cross-sectional, top and bottom views, respectively, of metal containment wall 232 formed on metal base 220.

Figure 33A:
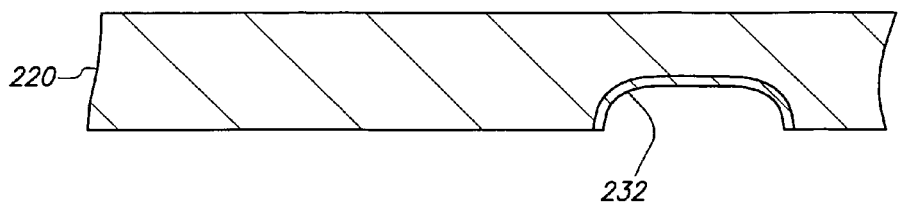
Figure 33B:
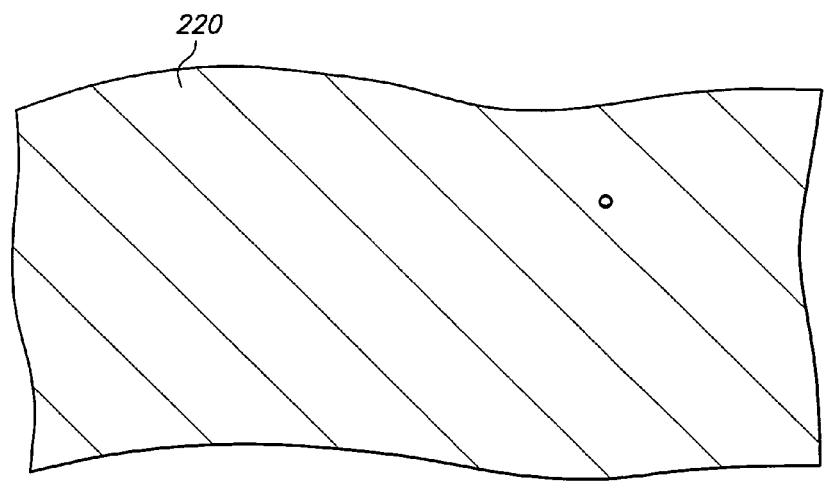
Figure 33C:
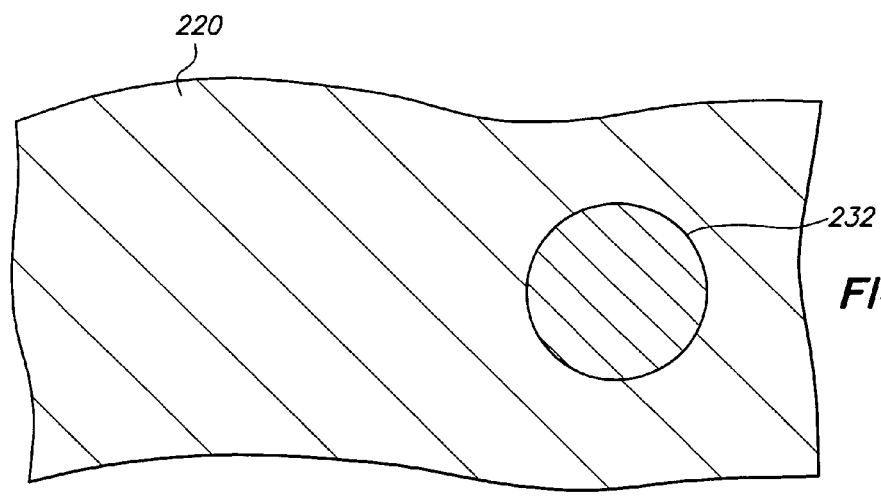

FIGS. 33A, 33B and 33C are cross-sectional, top and bottom views, respectively, of metal base 220 and metal containment wall 232 after photoresist layers 226 and 228 are stripped.

Figure 34A:
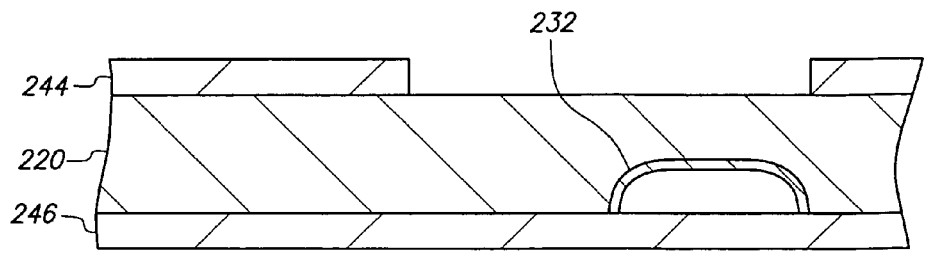
Figure 34B:
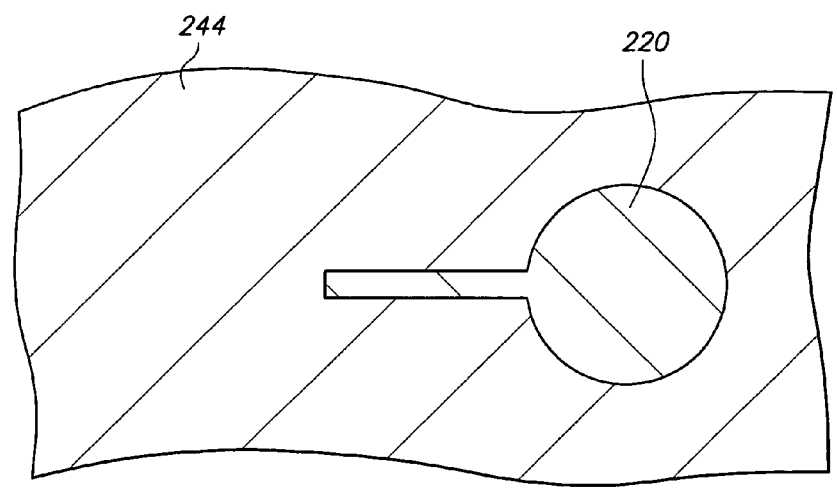
Figure 34C:
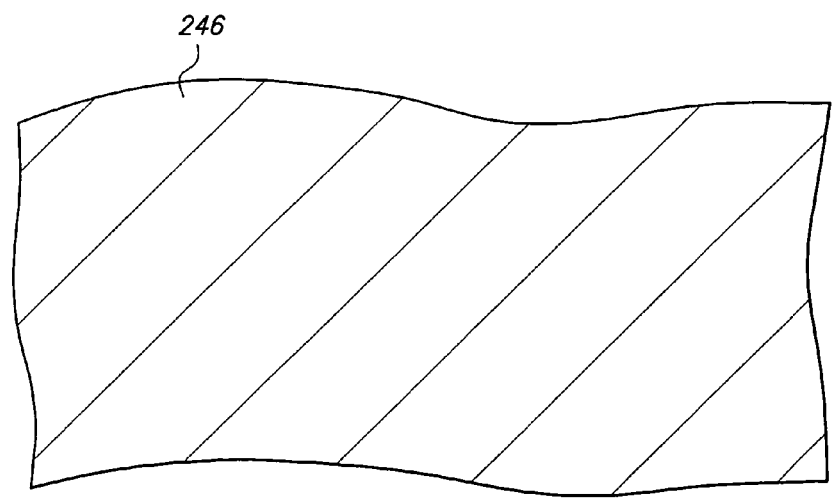

FIGS. 34A, 34B and 34C are cross-sectional, top and bottom views, respectively, of photoresist layers 244 and 246 formed on metal base 220. Photoresist layer 244 includes an opening that selectively exposes surface 222, and photoresist layer 246 remains unpatterned.

Figure 35A:
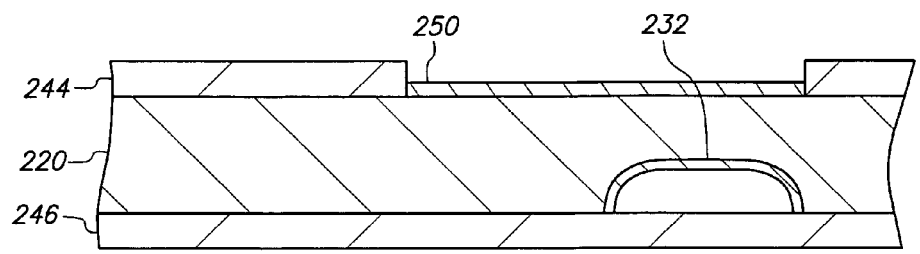
Figure 35B:
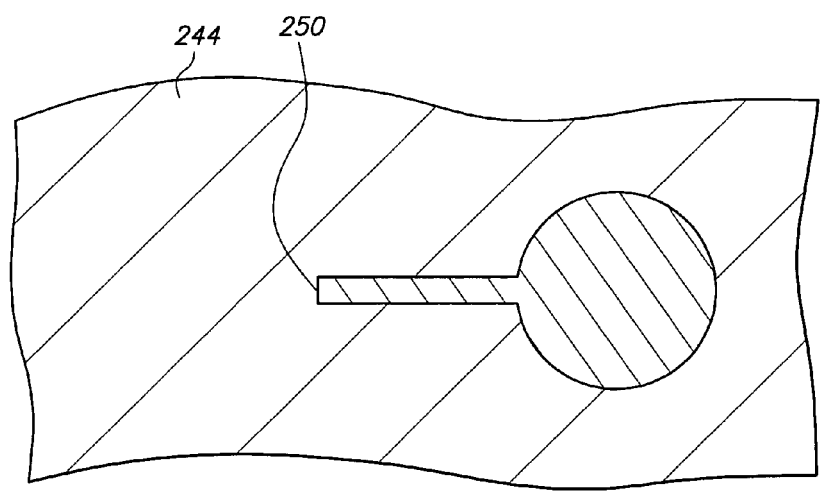
Figure 35C:
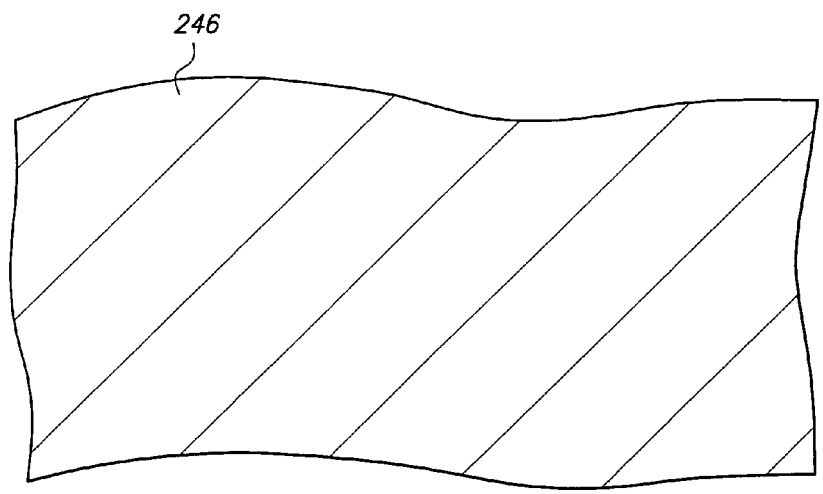

FIGS. 35A, 35B and 35C are cross-sectional, top and bottom views, respectively, of routing line 250 formed on metal base 220 by electroplating.

Figure 36A:
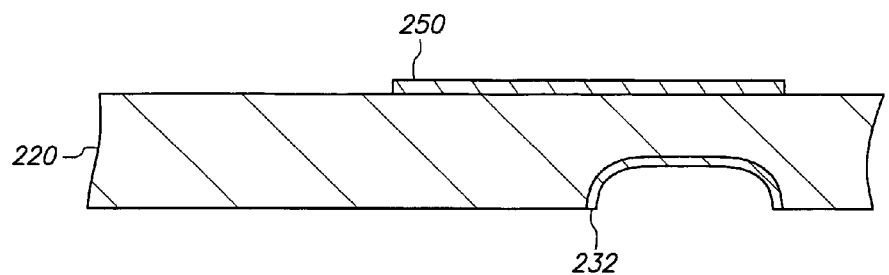
Figure 36B:
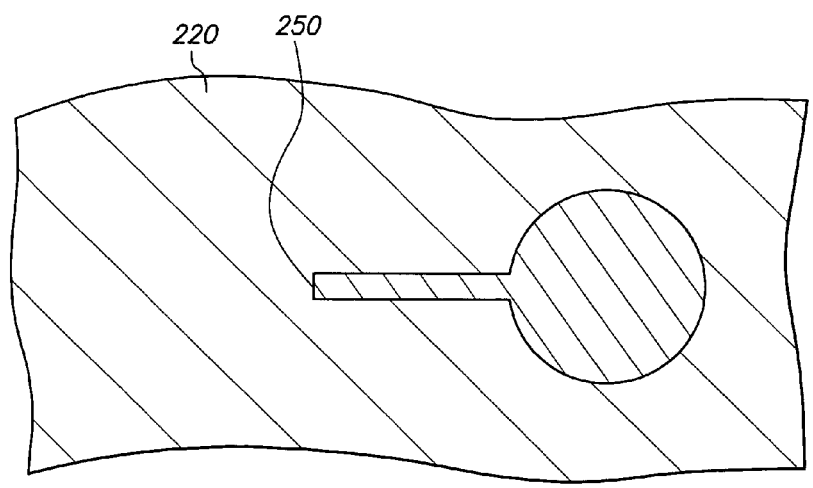
Figure 36C:
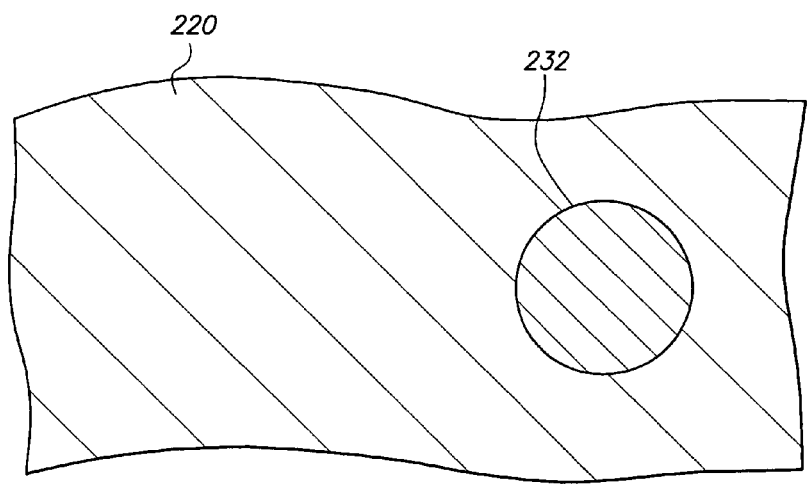

FIGS. 36A, 36B and 36C are cross-sectional, top and bottom views, respectively, of metal base 220, metal containment wall 232 and routing line 250 after photoresist layers 244 and 246 are stripped.

Figure 37A:
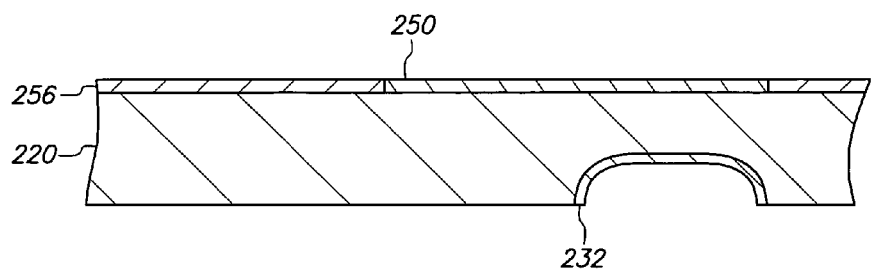
Figure 37B:
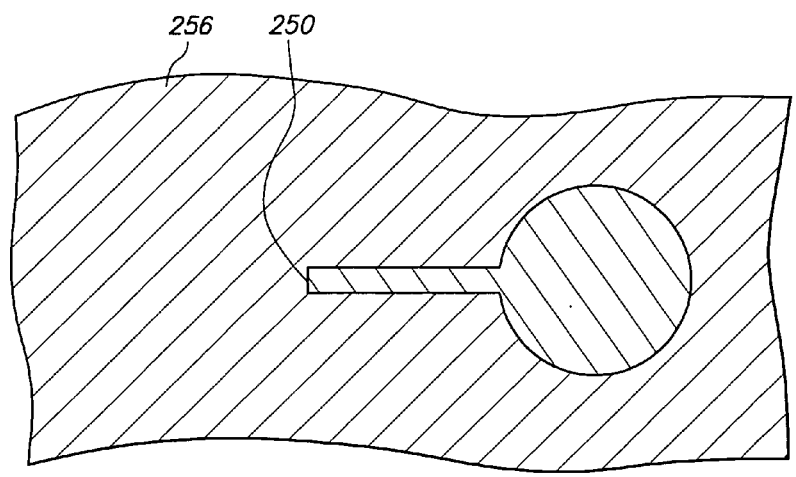
Figure 37C:
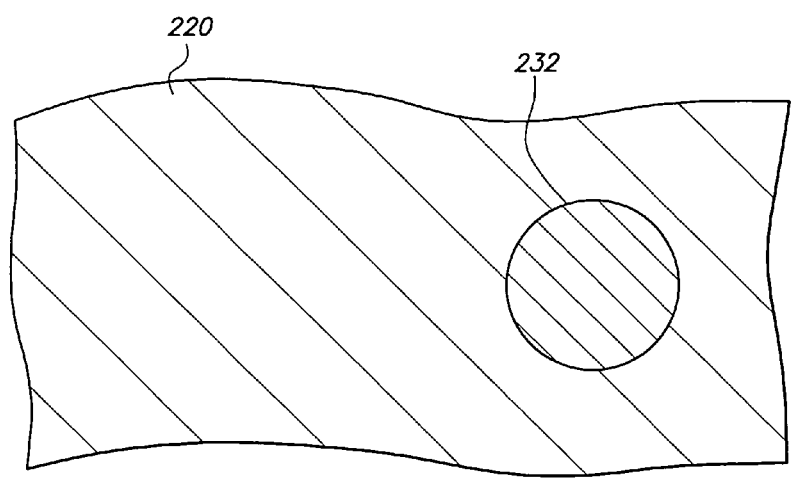

FIGS. 37A, 37B and 37C are cross-sectional, top and bottom views, respectively, of solder mask 256 formed on metal base 220 and routing line 250.

Figure 38A:
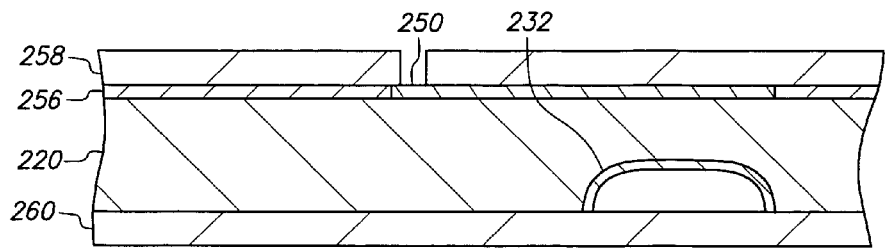
Figure 38B:
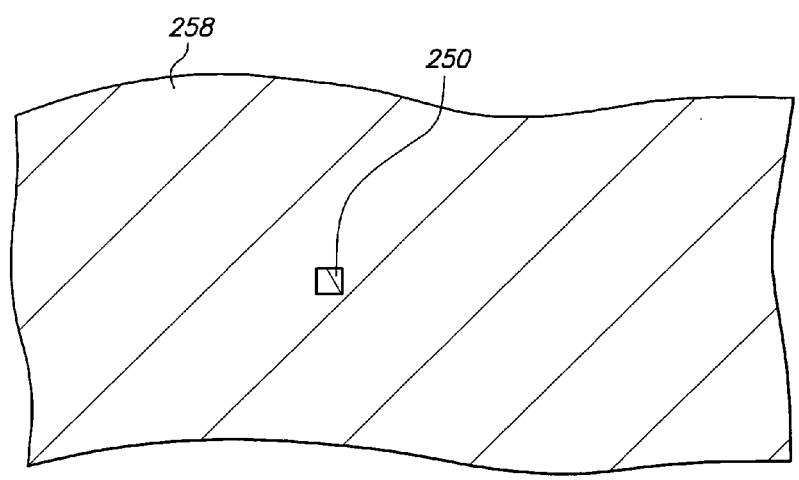
Figure 38C:
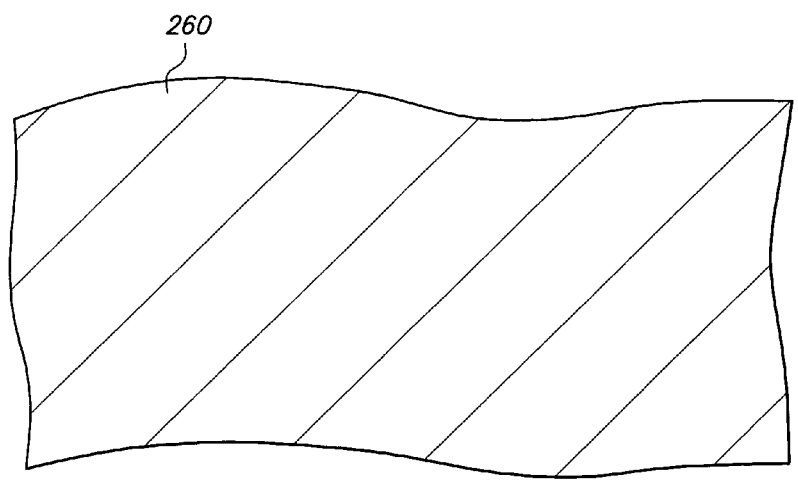

FIGS. 38A, 38B and 38C are cross-sectional, top and bottom views, respectively, of photoresist layers 258 and 260 formed on the structure. Photoresist layer 258 is formed on routing line 250 and solder mask 256, and photoresist layer 260 is formed on metal base 220 and metal containment wall 232. Photoresist layers 258 and 260 are deposited using dry film lamination onto the respective opposing surfaces. Photoresist layer 258 includes an opening that selectively exposes routing line 250, and photoresist layer 260 remains unpatterned.

Figure 39A:
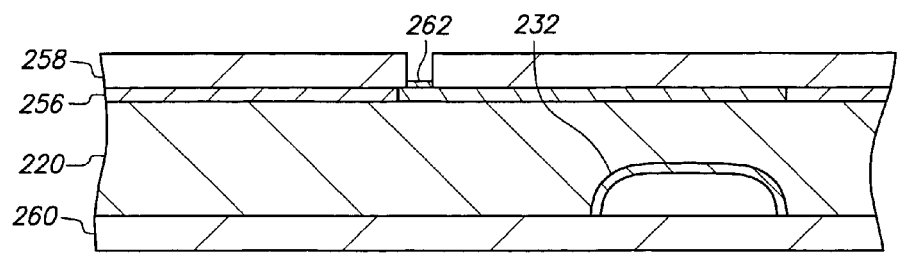
Figure 39B:
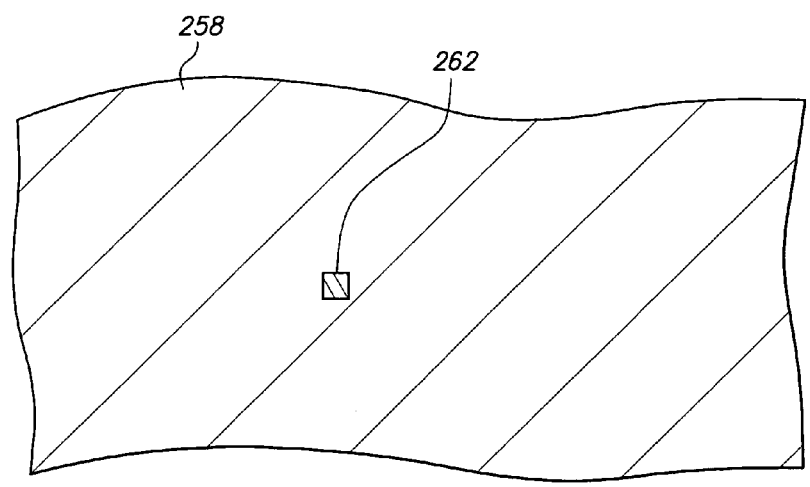
Figure 39C:
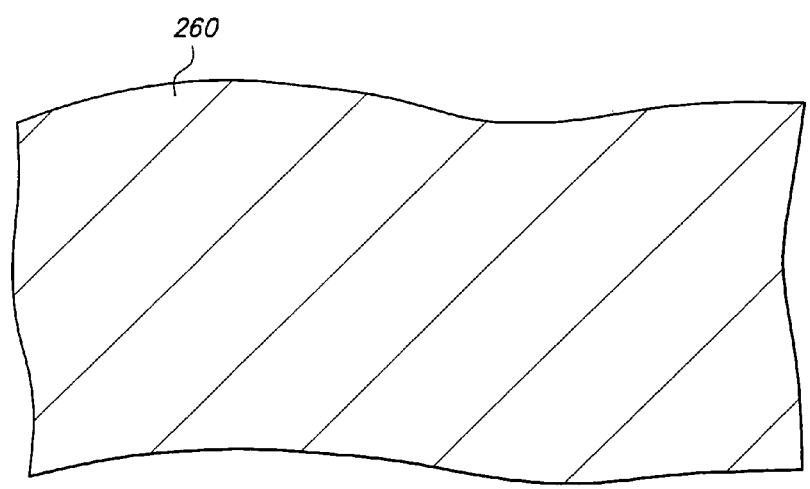

FIGS. 39A, 39B and 39C are cross-sectional, top and bottom views, respectively, of plated contact 262 formed on routing line 250 by electroplating.

Figure 40A:
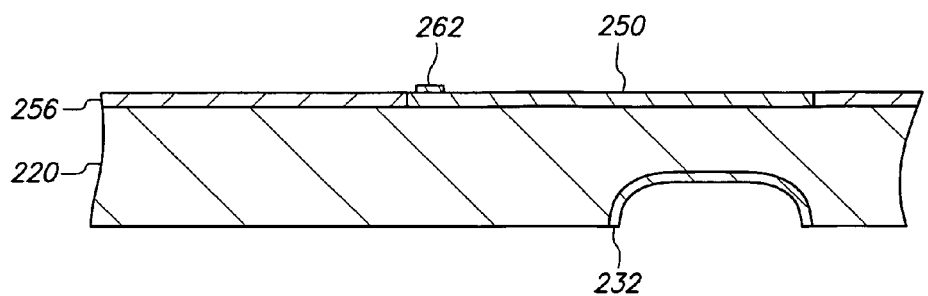
Figure 40B:
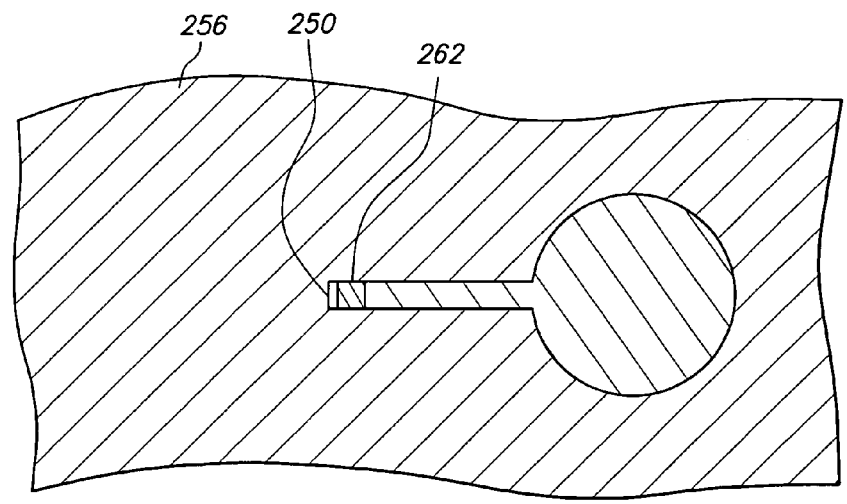
Figure 40C:
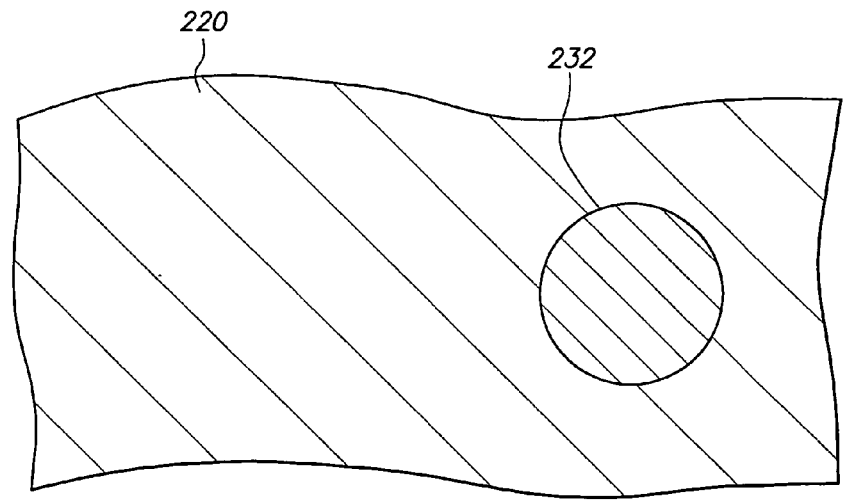

FIGS. 40A, 40B and 40C are cross-sectional, top and bottom views, respectively, of metal base 220, metal containment wall 232, routing line 250 and plated contact 262 after photoresist layers 258 and 260 are stripped.

Figure 41A:
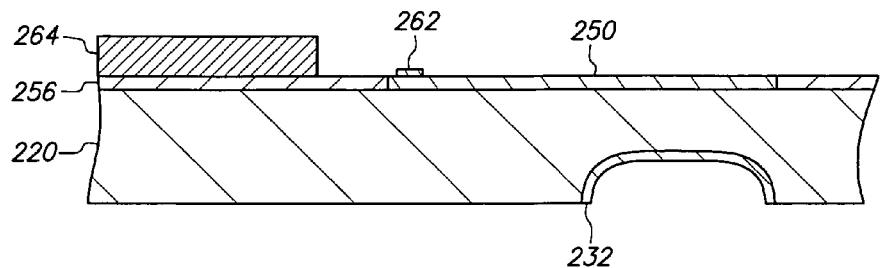
Figure 41B:
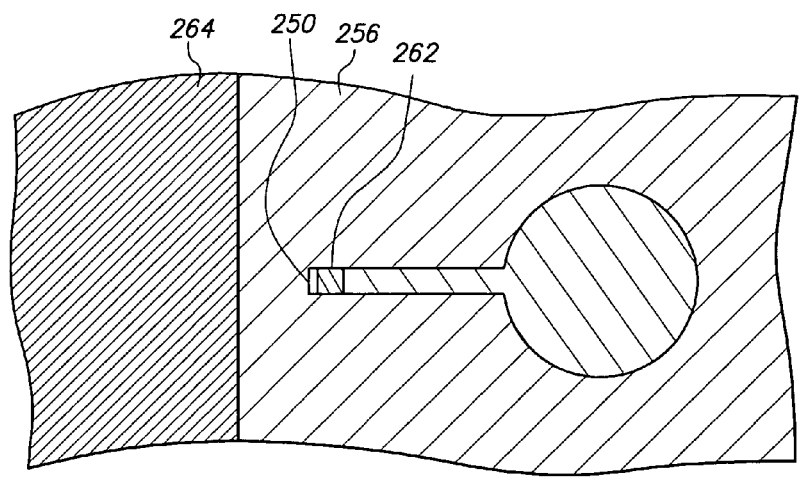
Figure 41C:
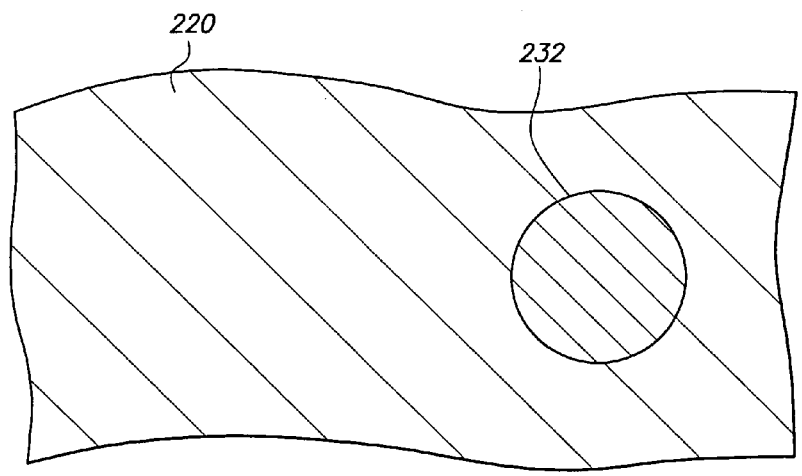

FIGS. 41A, 41B and 41C are cross-sectional, top and bottom views, respectively, of adhesive 264 formed on solder mask 256.

Figure 42A:
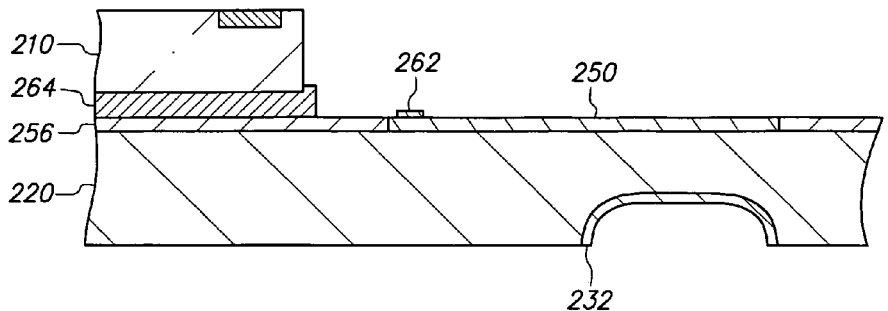
Figure 42B:
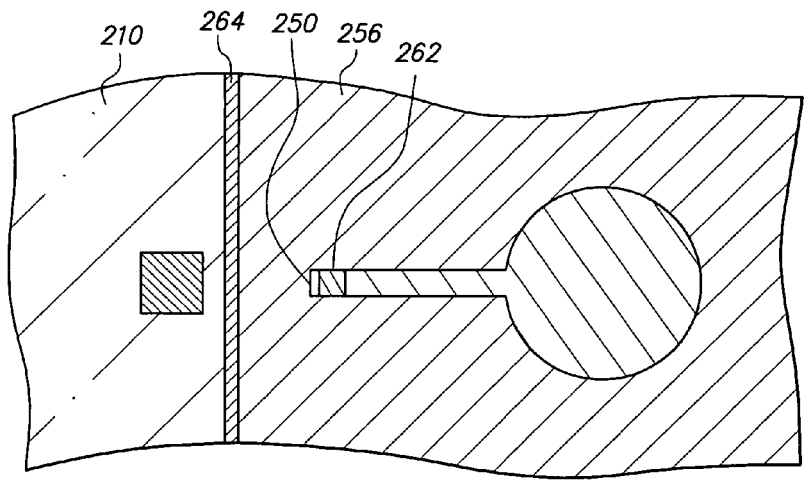
Figure 42C:
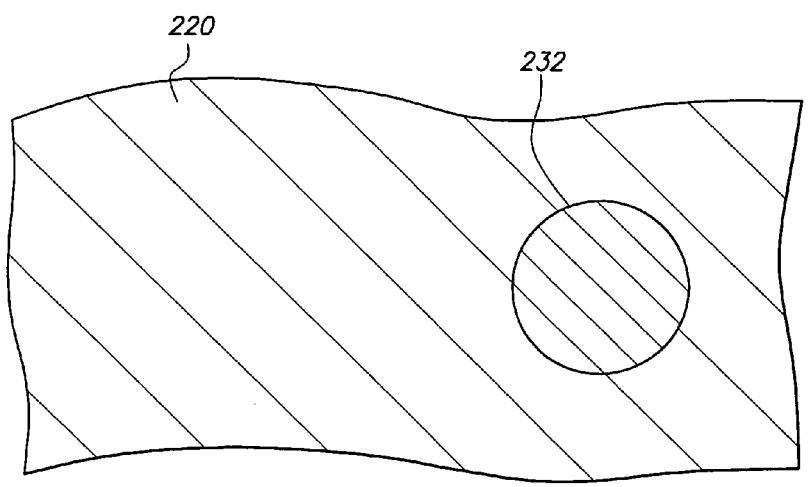

FIGS. 42A, 42B and 42C are cross-sectional, top and bottom views, respectively, of chip 210 mechanically attached to metal base 220, metal containment wall 232, routing line 250, solder mask 256 and plated contact 262 by adhesive 264.

Figure 43A:
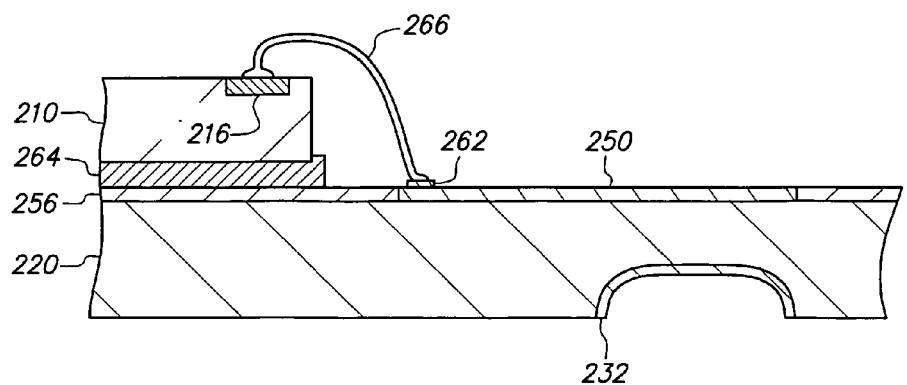
Figure 43B:
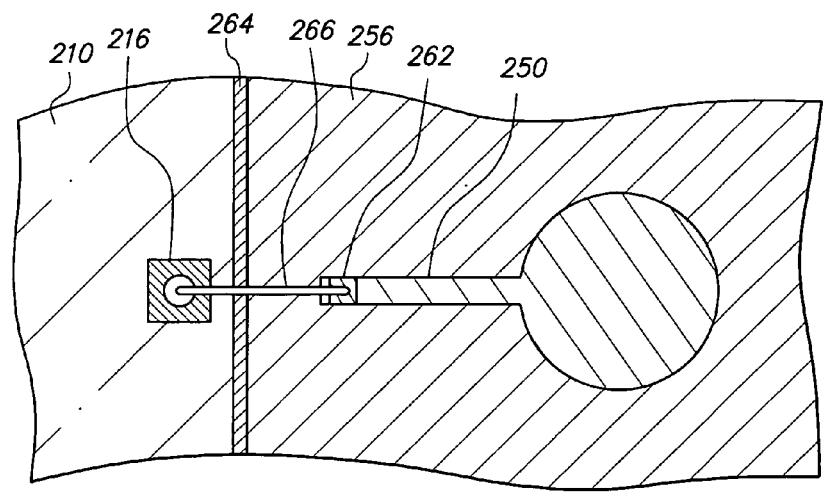
Figure 43C:
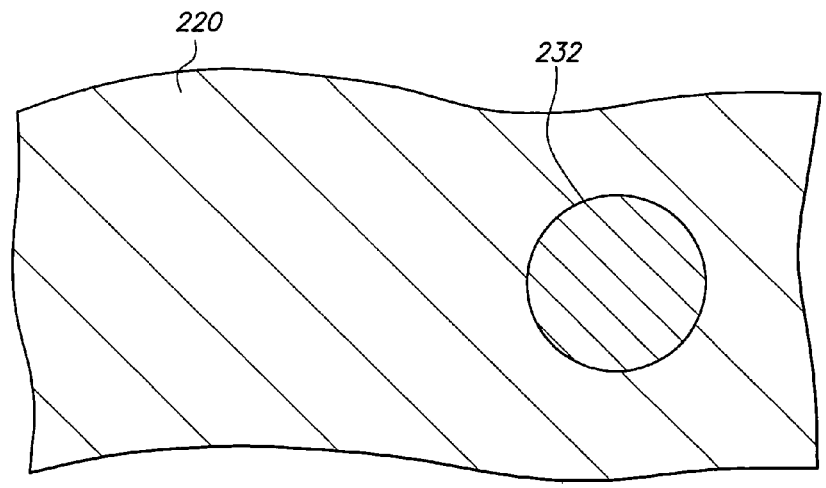

FIGS. 43A, 43B and 43C are cross-sectional, top and bottom views, respectively, of connection joint 266 formed on pad 216 and plated contact 262.

Figure 44A:
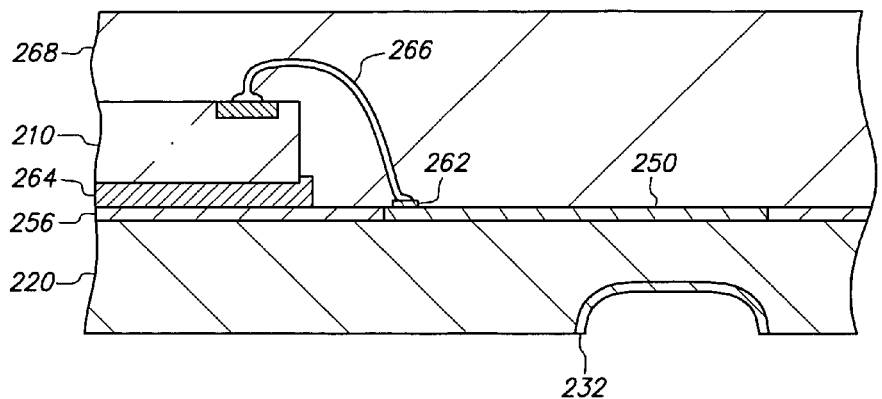
Figure 44B:
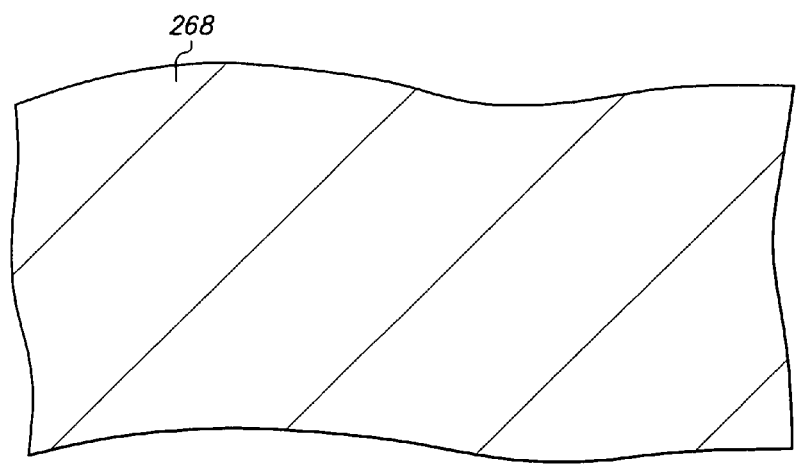
Figure 44C:
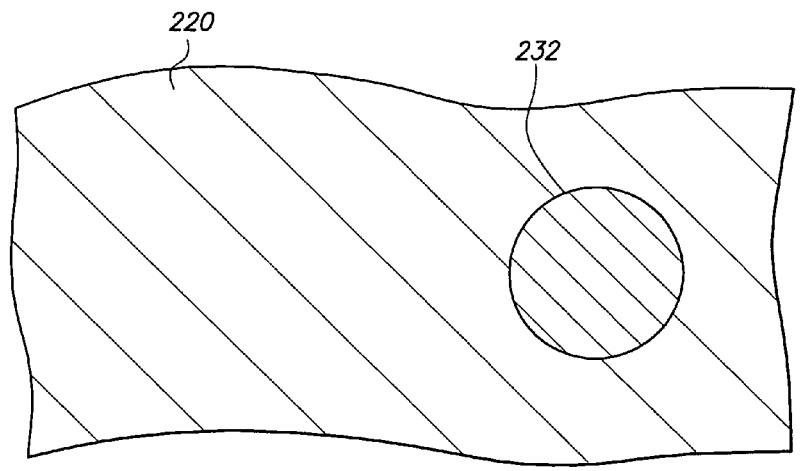

FIGS. 44A, 44B and 44C are cross-sectional, top and bottom views, respectively, of encapsulant 268 formed on chip 210, routing line 250, solder mask 256, plated contact 262, adhesive 264 and connection joint 266.

Figure 45A:
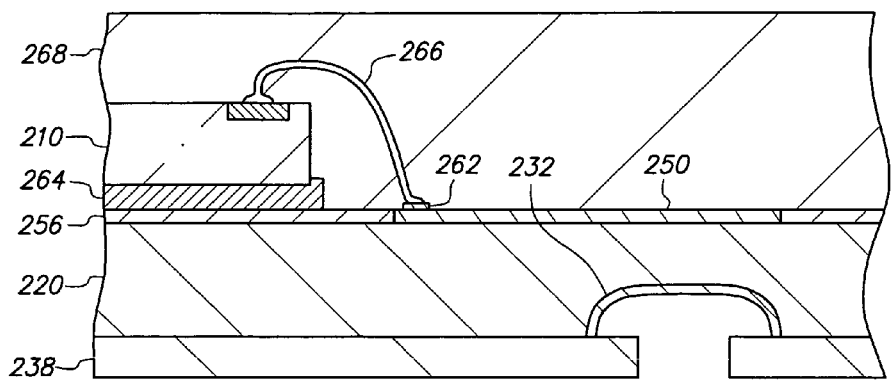
Figure 45B:
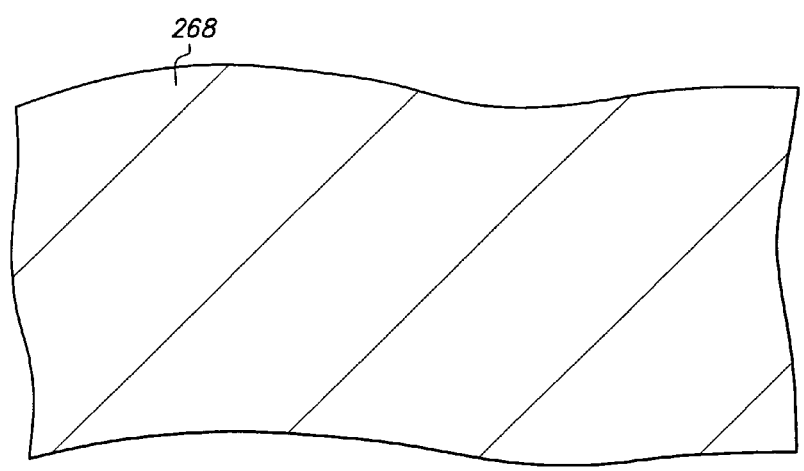
Figure 45C:
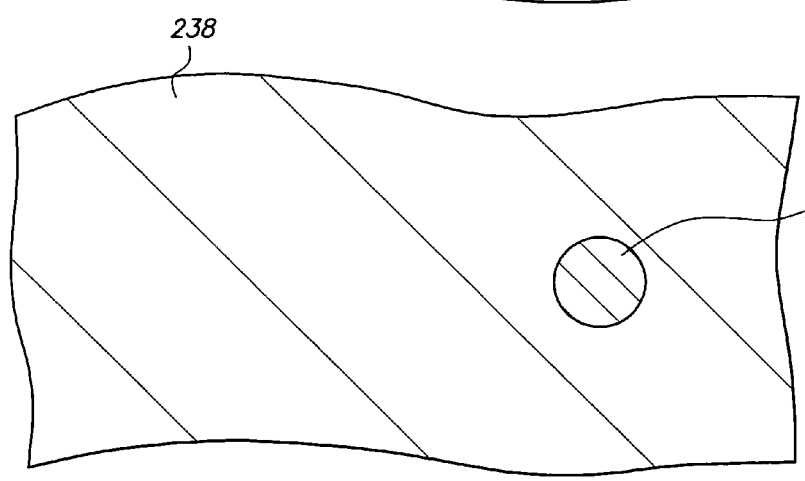

FIGS. 45A, 45B and 45C are cross-sectional, top and bottom views, respectively, of stencil 238 mounted on metal base 220.

Figure 46A:
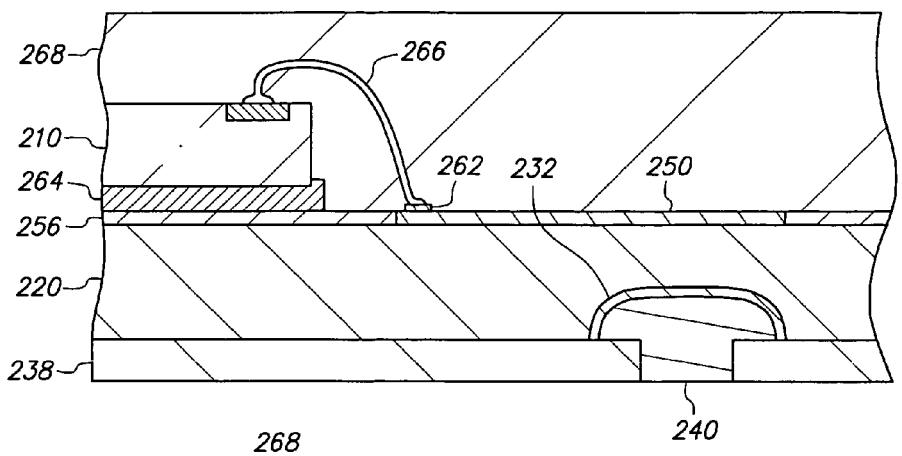
Figure 46B:
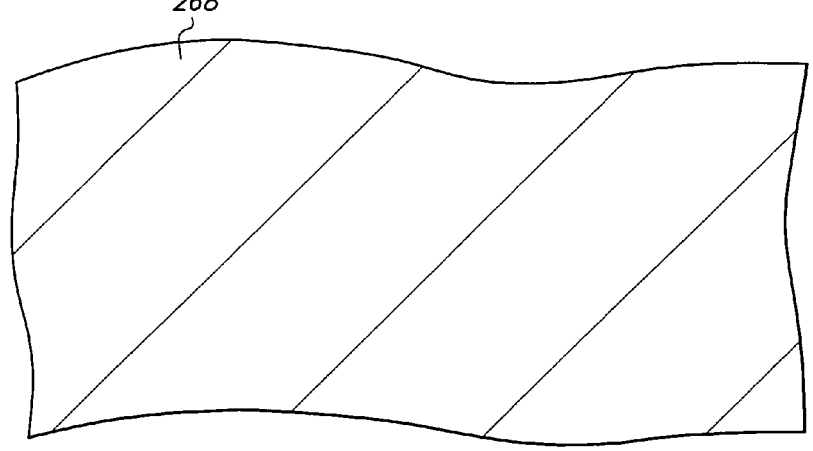
Figure 46C:
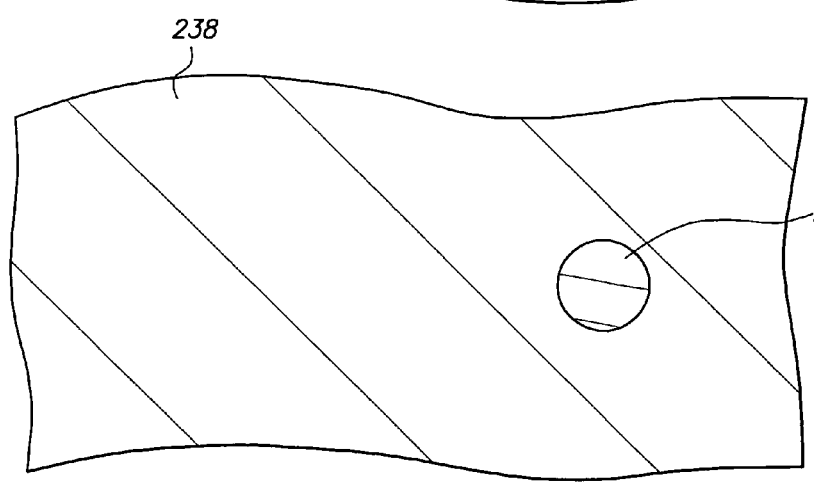

FIGS. 46A, 46B and 46C are cross-sectional, top and bottom views, respectively, of solder paste 240 deposited on metal containment wall 232.

Figure 47A:
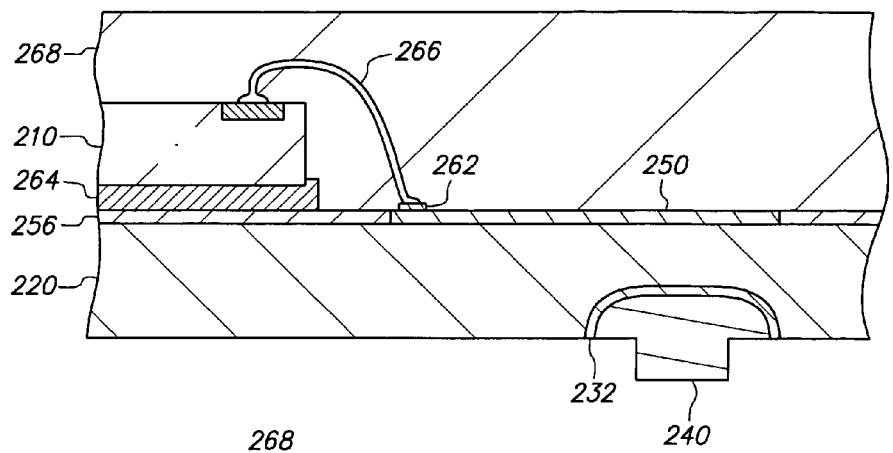
Figure 47B:
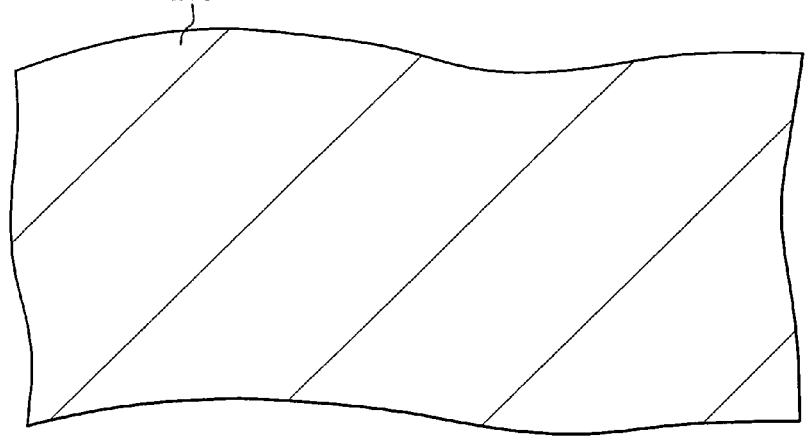
Figure 47C:
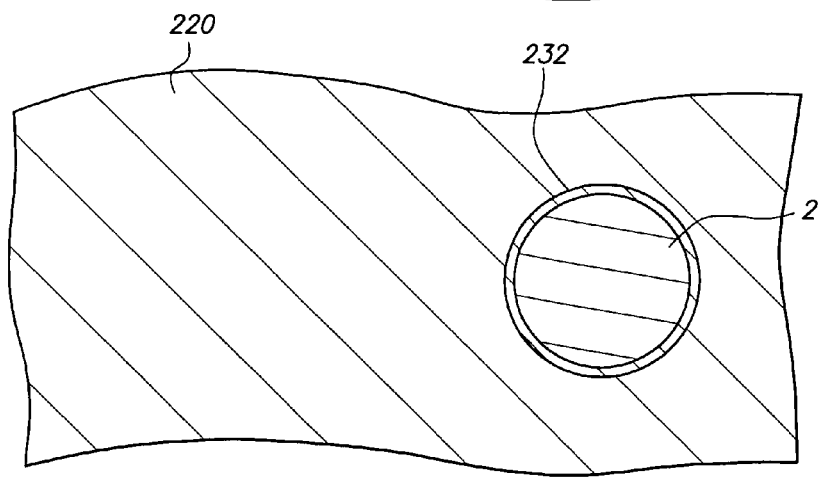

FIGS. 47A, 47B and 47C are cross-sectional, top and bottom views, respectively, of stencil 238 removed from metal base 220.

Figure 48A:
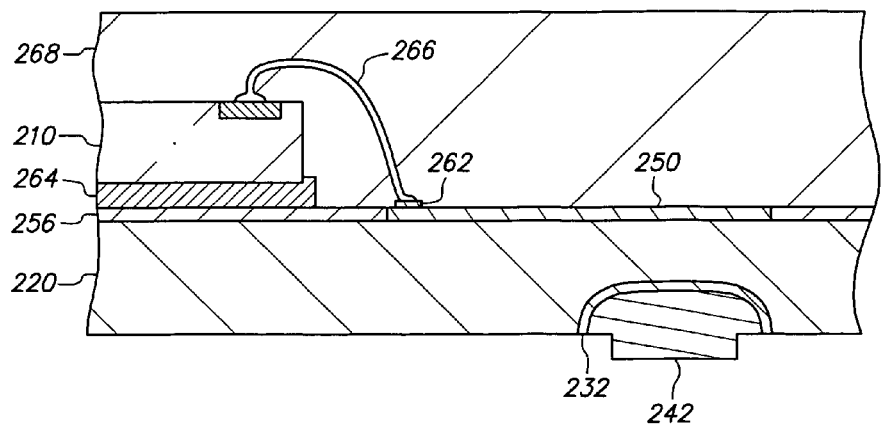
Figure 48B:
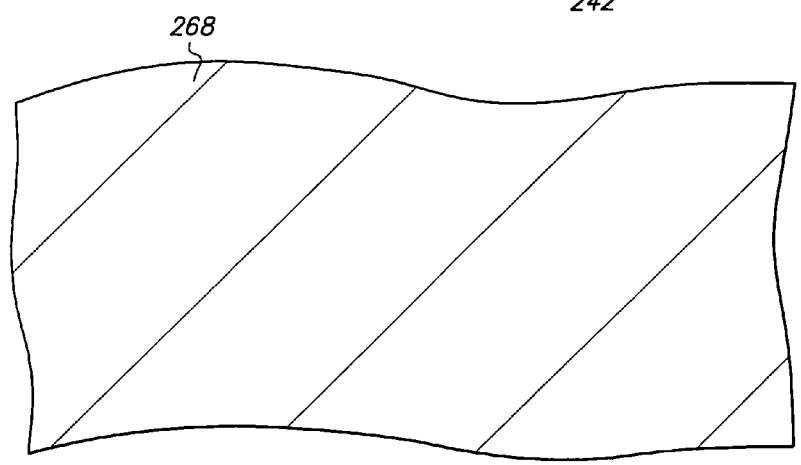
Figure 48C:
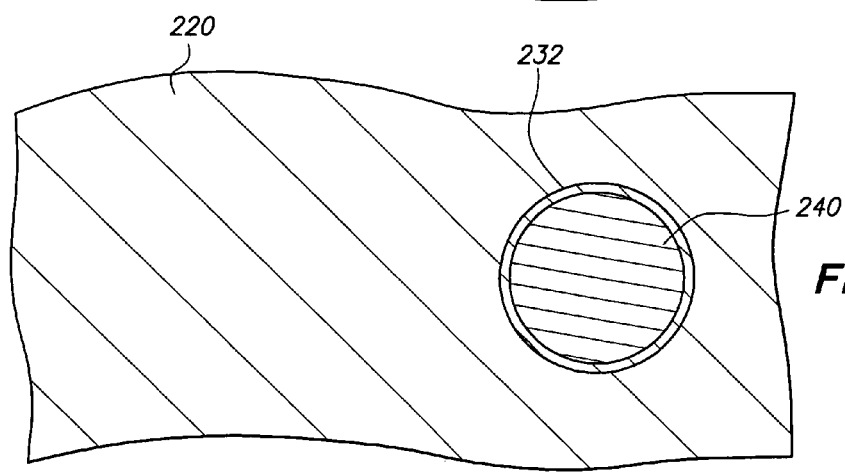

FIGS. 48A, 48B and 48C are cross-sectional, top and bottom views, respectively, of solder layer 242 formed from solder paste 240. Metal containment wall 232 provides a wettable surface to facilitate the solder reflow, however metal base 220 does not. As a result, the solder reflow is essentially confined to metal containment wall 232.

Figure 49A:
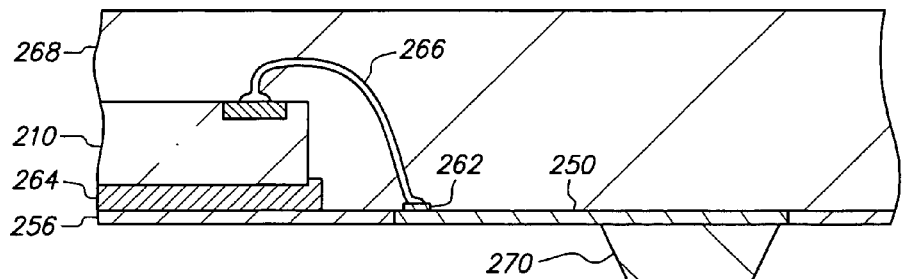
Figure 49B:
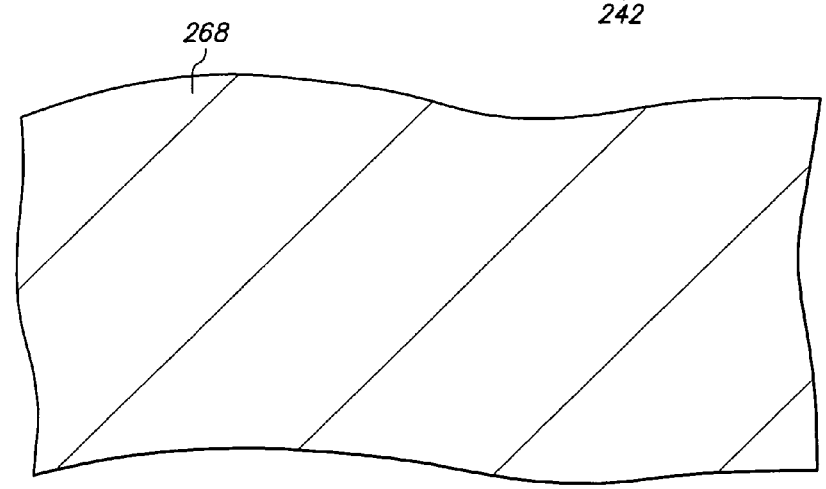
Figure 49C:
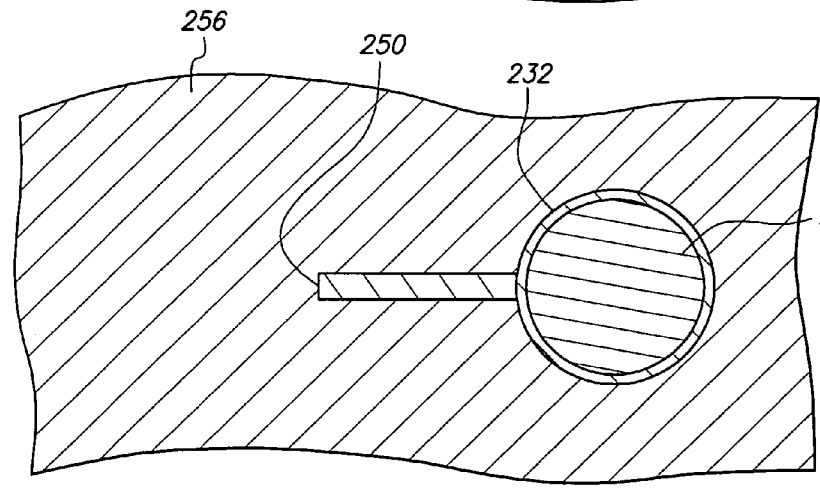

FIGS. 49A, 49B and 49C are cross-sectional, top and bottom views, respectively, of metal pillar 270 formed from metal base 220.

Figure 50A:
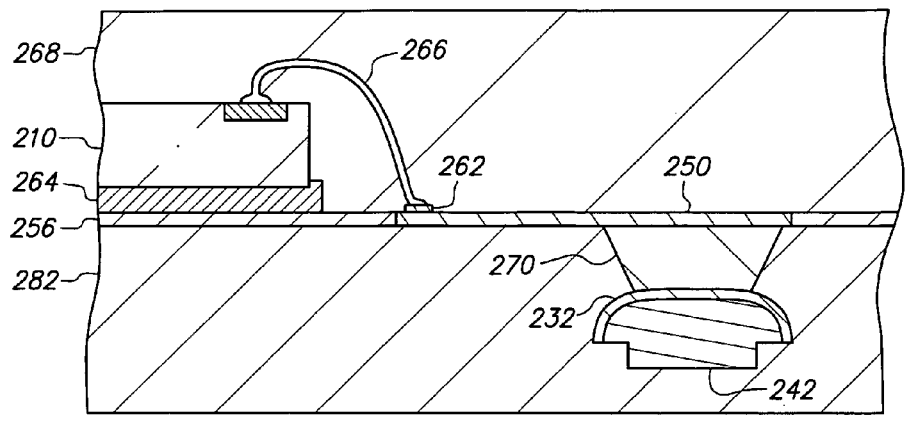
Figure 50B:
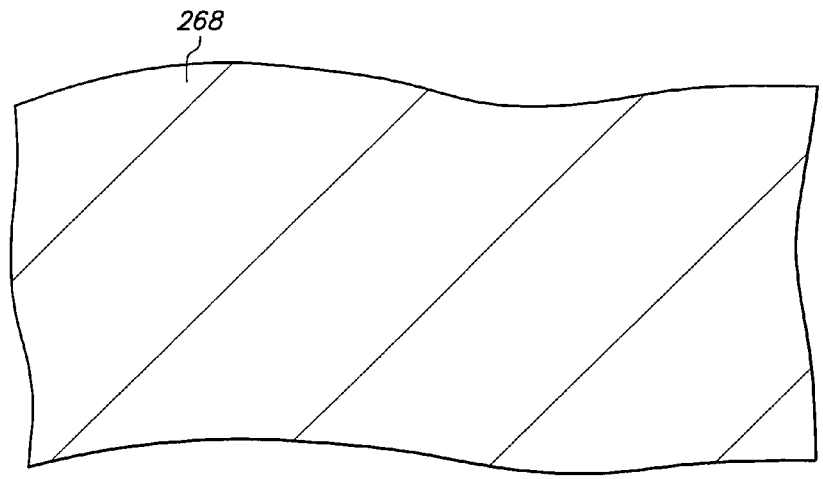
Figure 50C:
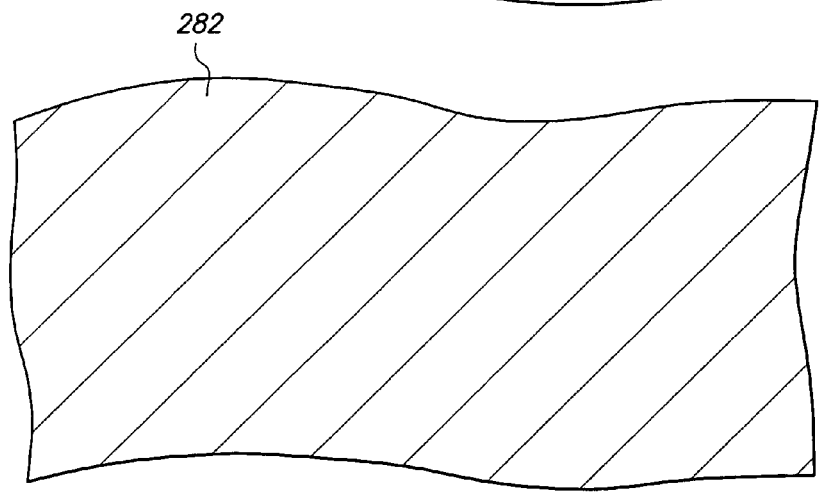

FIGS. 50A, 50B and 50C are cross-sectional, top and bottom views, respectively, of insulative base 282 formed on metal containment wall 232, solder layer 242, routing line 250, solder mask 256 and metal pillar 270.

Figure 51A:
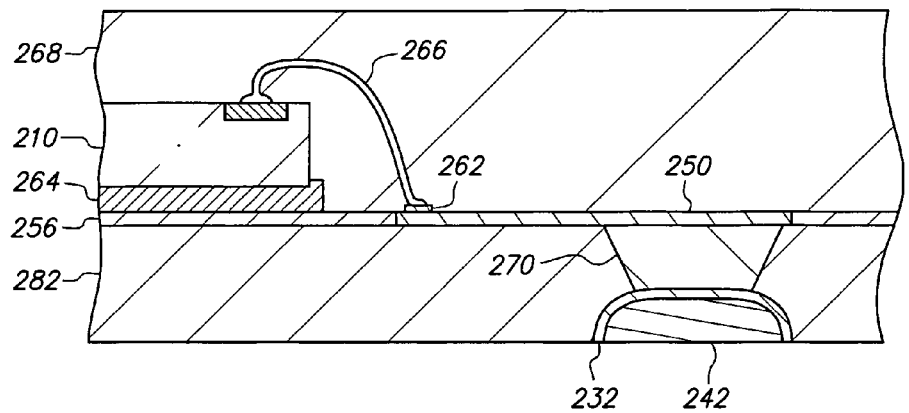
Figure 51B:
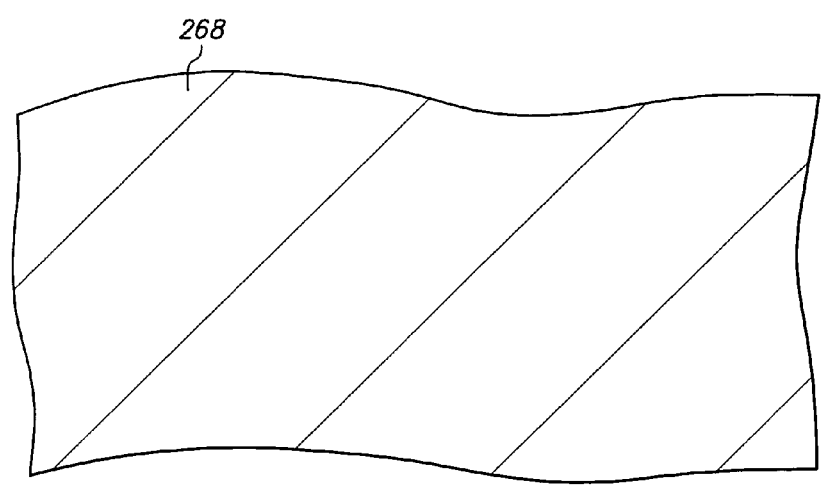
Figure 51C:
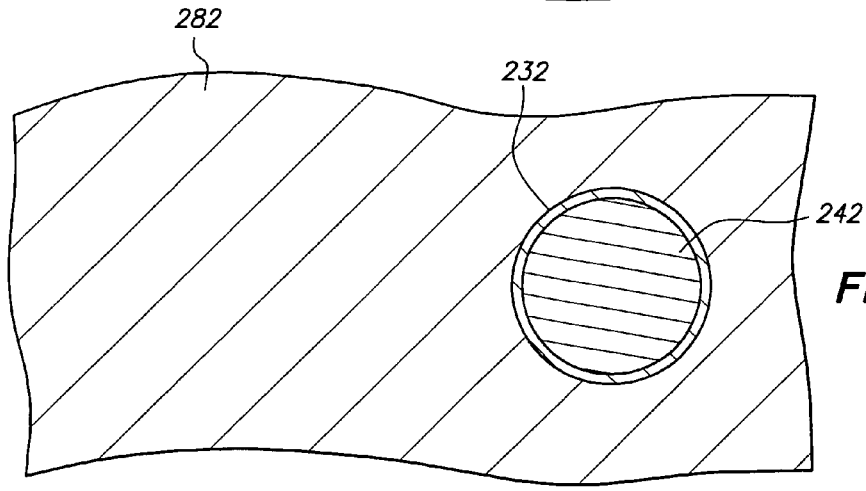

FIGS. 51A, 51B and 51C are cross-sectional, top and bottom views, respectively, of the structure after a lower portion of insulative base 282 is removed.

Figure 52A:
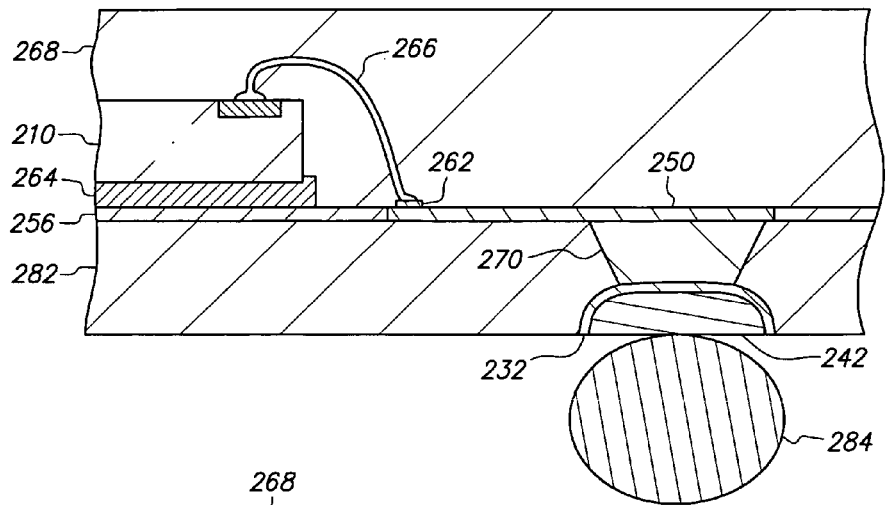
Figure 52B:
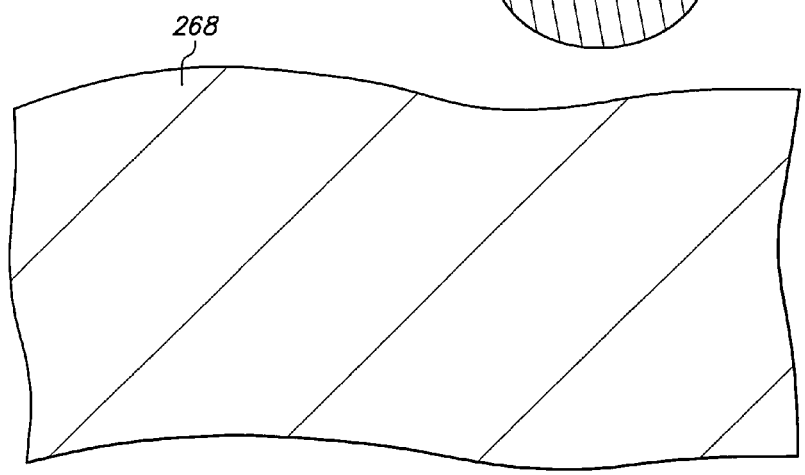
Figure 52C:
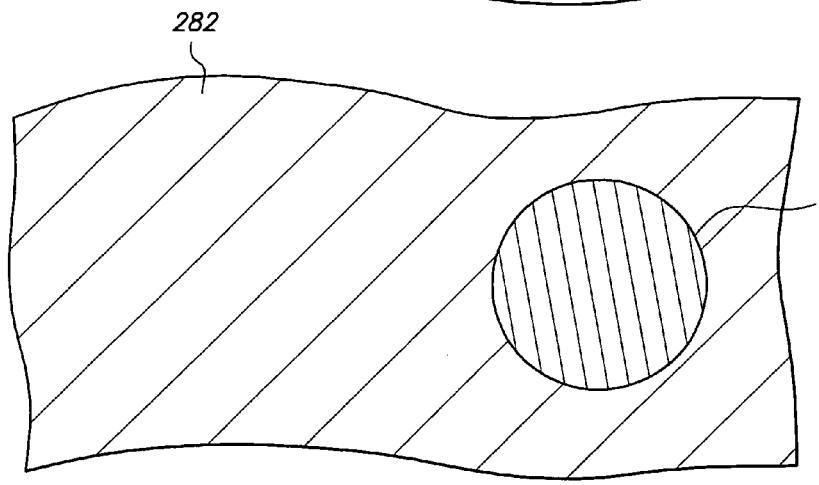

FIGS. 52A, 52B and 52C are cross-sectional, top and bottom views, respectively, of solder ball 284 formed on solder layer 242.

Figure 53A:
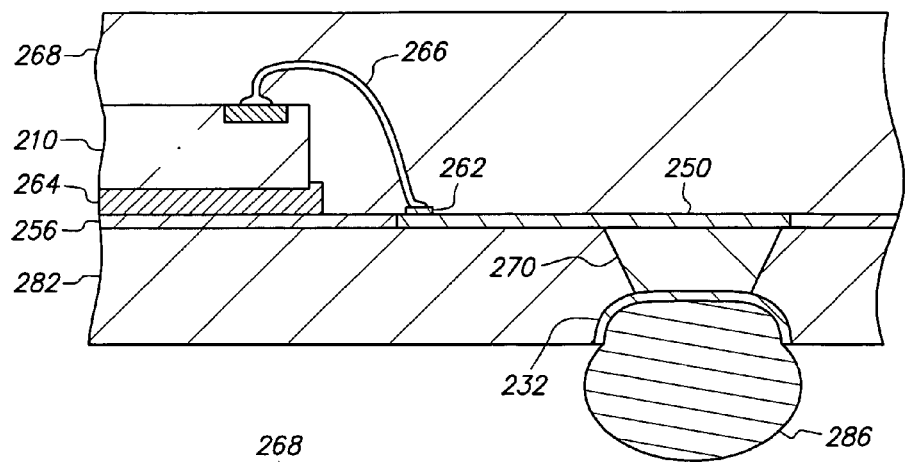
Figure 53B:
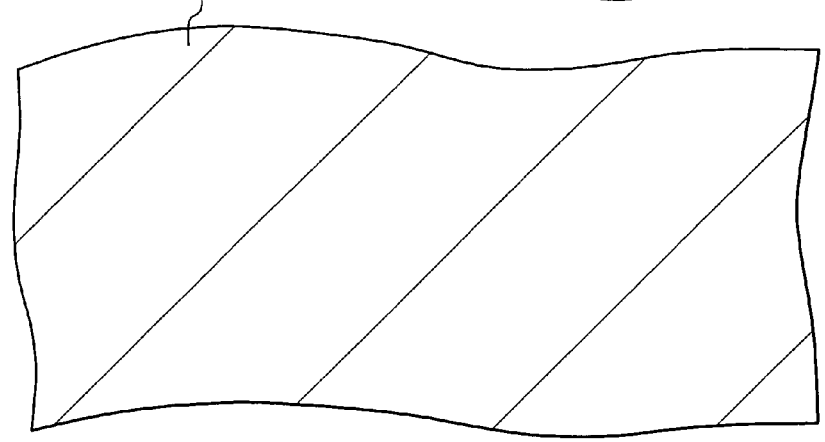
Figure 53C:
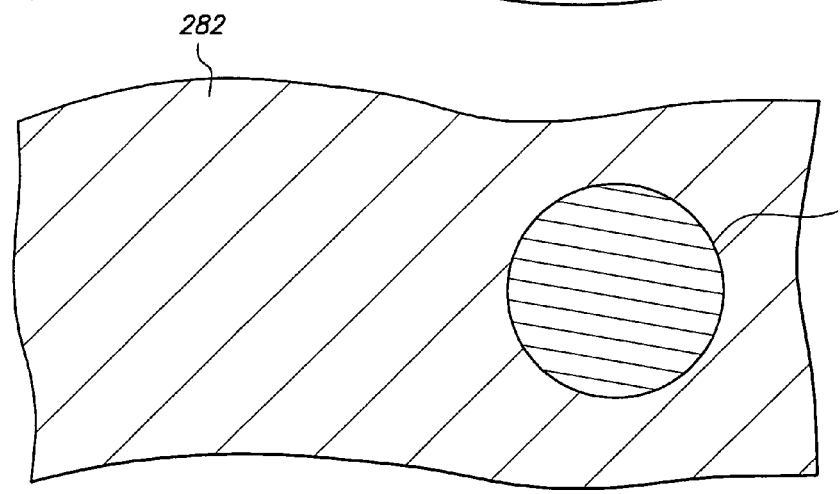

FIGS. 53A, 53B and 53C are cross-sectional, top and bottom views, respectively, of solder terminal 286 formed from solder layer 242 and solder ball 284.

Figure 54A:
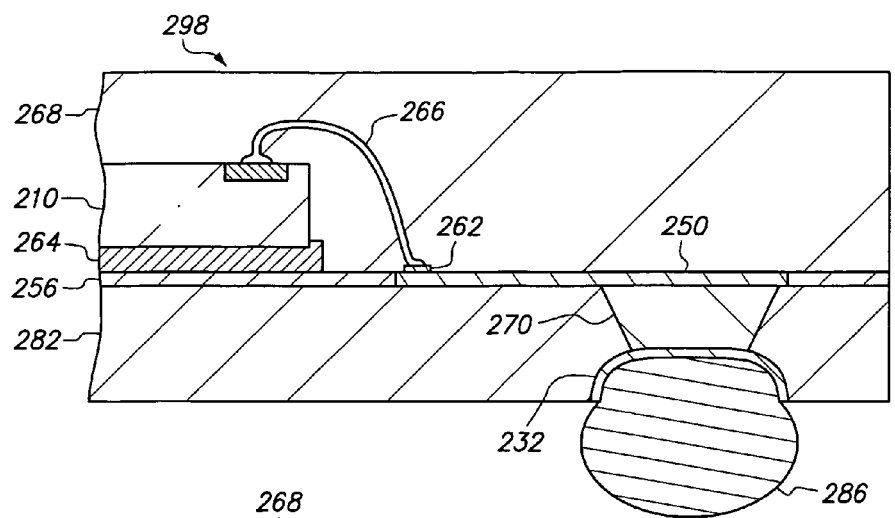
Figure 54B:
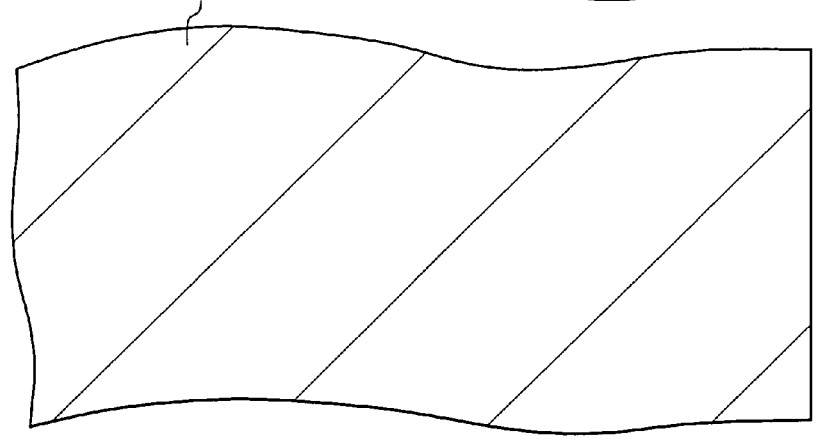
Figure 54C:
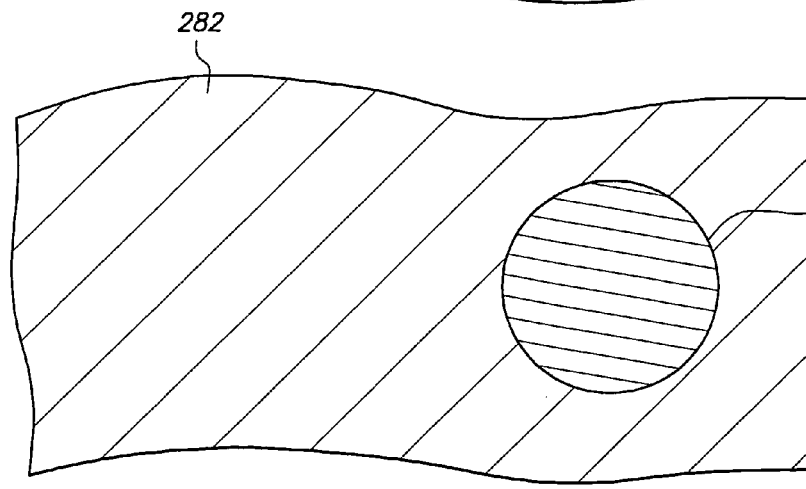

FIGS. 54A, 54B and 54C are cross-sectional, top and bottom views, respectively, of the structure after cutting solder mask 256, encapsulant 268 and insulative base 282 with an excise blade to singulate the assembly from other assemblies.

At this stage, the manufacture of semiconductor chip assembly 298 that includes chip 210, metal containment wall 232, routing line 250, solder mask 256, plated contact 262, adhesive 264, connection joint 266, encapsulant 268, metal pillar 270, insulative base 282 and solder terminal 286 can be considered complete.

FIGS. 55A-81A, 55B-81B and 55C-81C are cross-sectional, top and bottom views, respectively, of a method of making a semiconductor chip assembly in accordance with a third embodiment of the present invention. In the third embodiment, the metal containment wall and the solder layer are formed after the encapsulant is formed, and the metal pillar is omitted. For purposes of brevity, any description in the first embodiment is incorporated herein insofar as the same is applicable, and the same description need not be repeated. Likewise, elements of the third embodiment similar to those in the first embodiment have corresponding reference numerals indexed at three-hundred rather than one-hundred. For instance, chip 310 corresponds to chip 110, routing line 350 corresponds to routing line 150, etc.

Figure 55A:
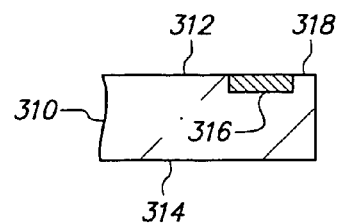
Figure 55B:
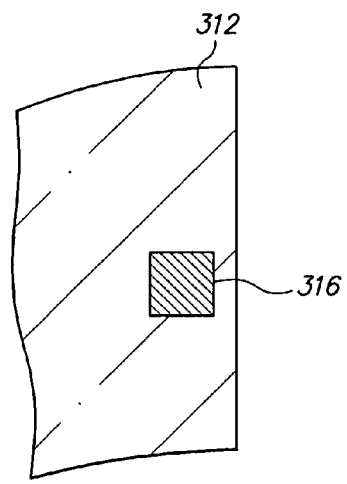
Figure 55C:
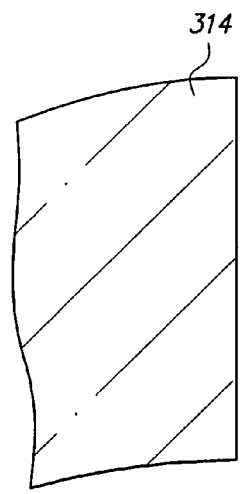

FIGS. 55A, 55B and 55C are cross-sectional, top and bottom views, respectively, of semiconductor chip 310 which includes opposing major surfaces 312 and 314. Upper surface 312 includes conductive pad 316 and passivation layer 318.

Figure 56A:
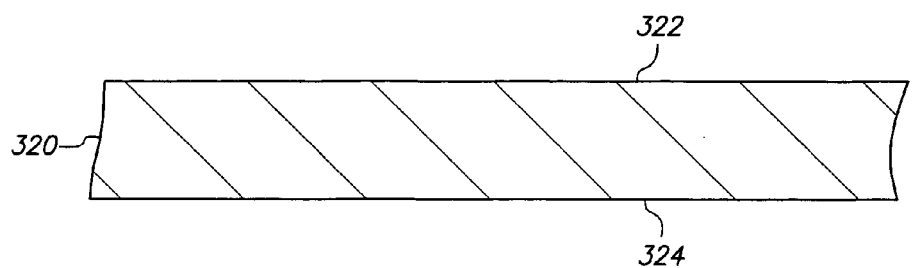
Figure 56B:
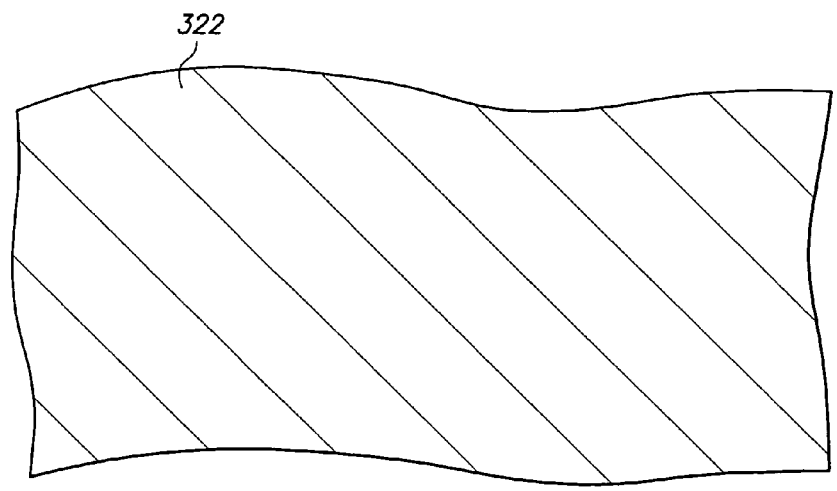
Figure 56C:
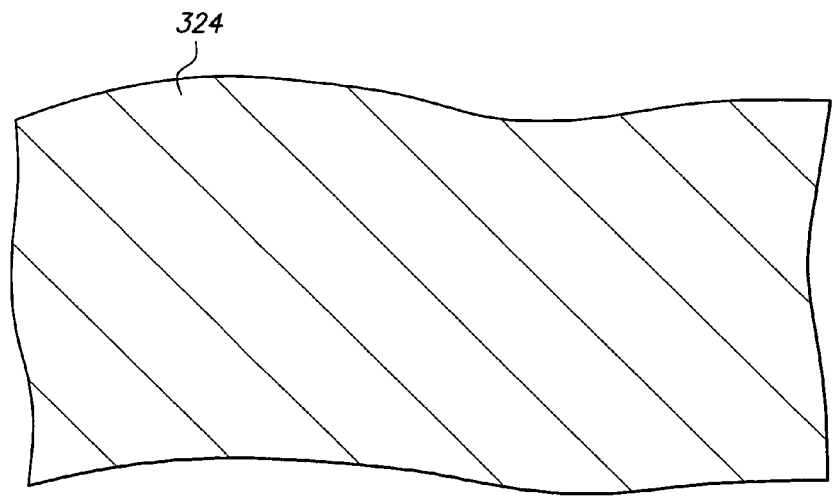

FIGS. 56A, 56B and 56C are cross-sectional, top and bottom views, respectively, of metal base 320 which includes opposing major surfaces 322 and 324.

Figure 57A:
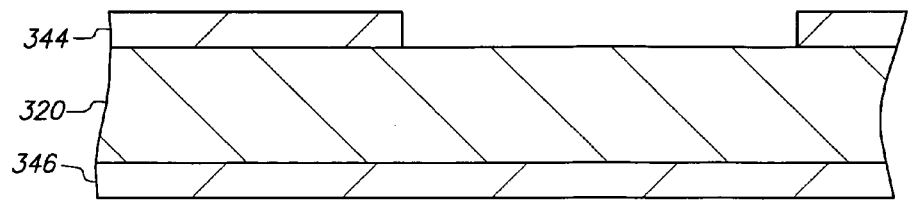
Figure 57B:
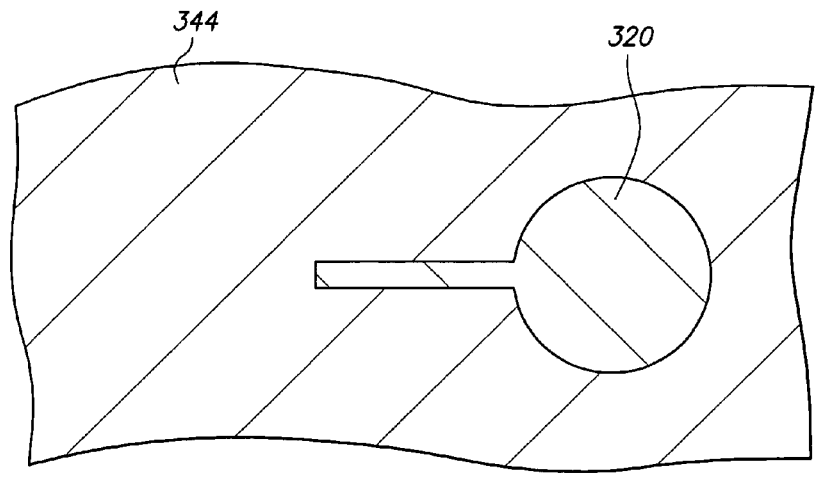
Figure 57C:
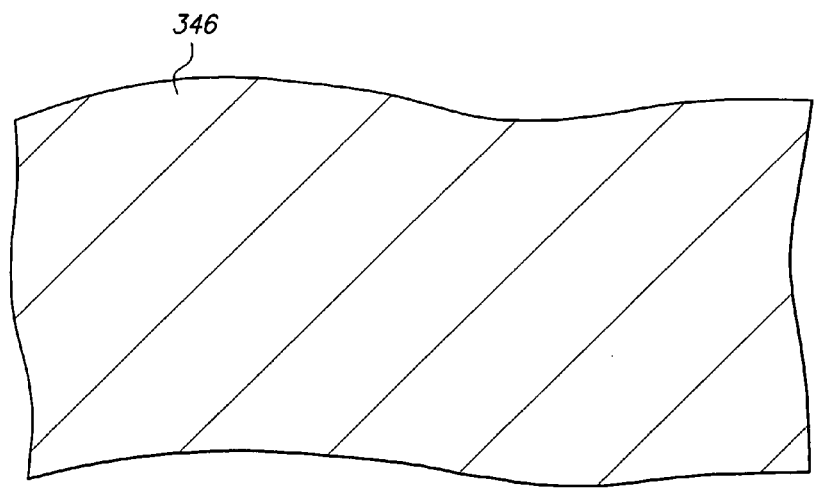

FIGS. 57A, 57B and 57C are cross-sectional, top and bottom views, respectively, of photoresist layers 344 and 346 formed on metal base 320. Photoresist layer 344 includes an opening that selectively exposes surface 322, and photoresist layer 346 remains unpatterned.

Figure 58A:
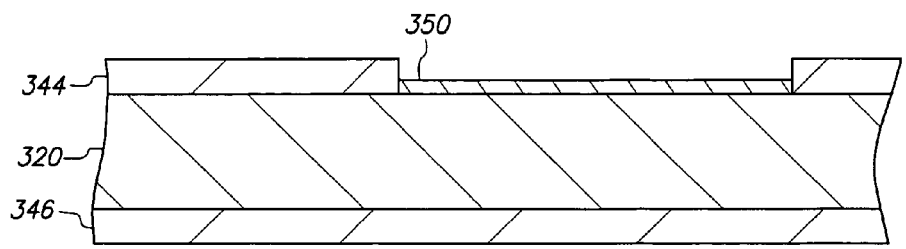
Figure 58B:
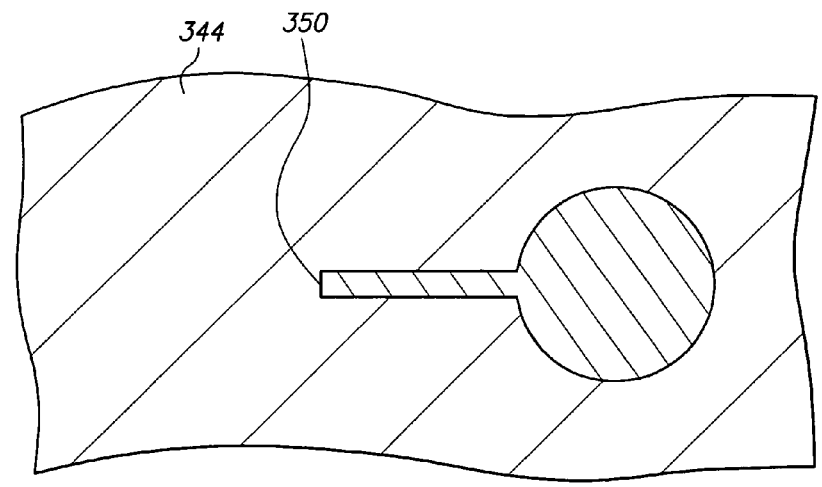
Figure 58C:
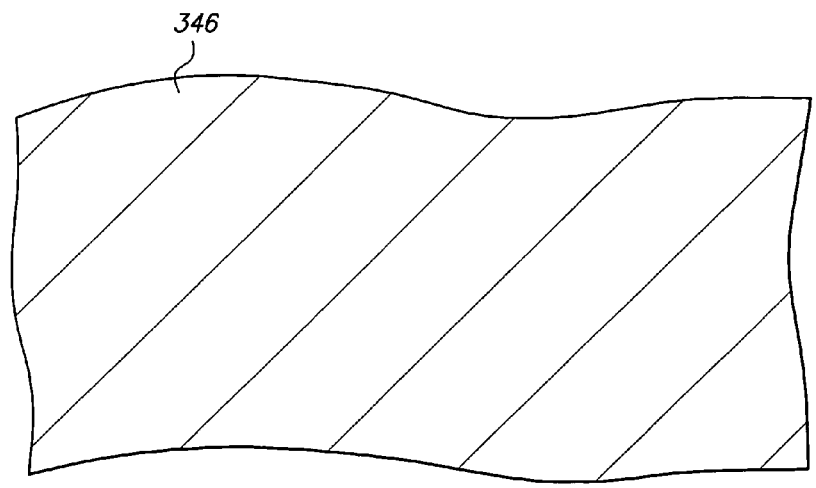

FIGS. 58A, 58B and 58C are cross-sectional, top and bottom views, respectively, of routing line 350 formed on metal base 320 by electroplating.

Figure 59A:
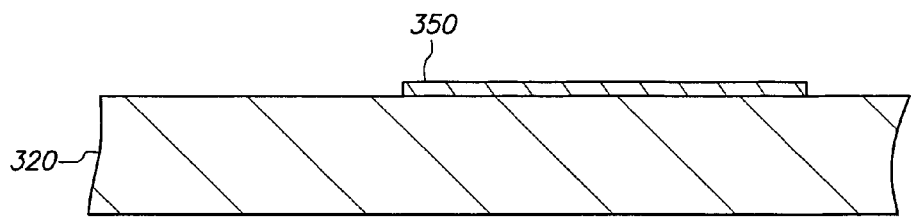
Figure 59B:
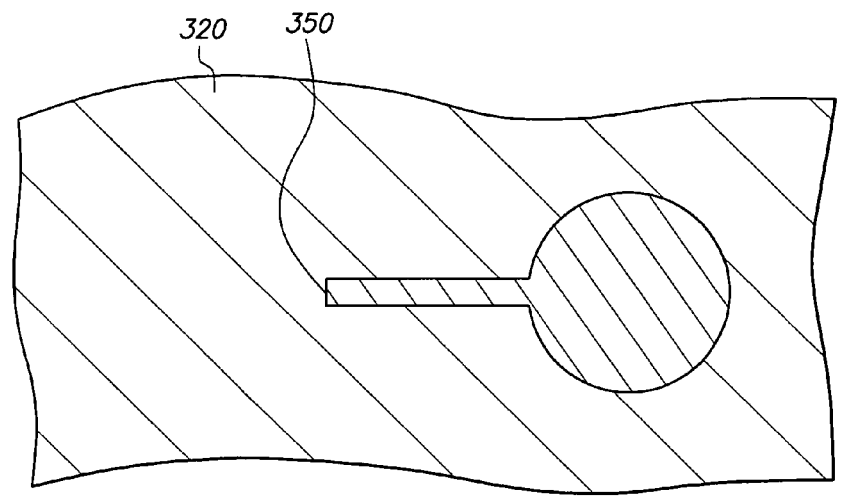
Figure 59C:
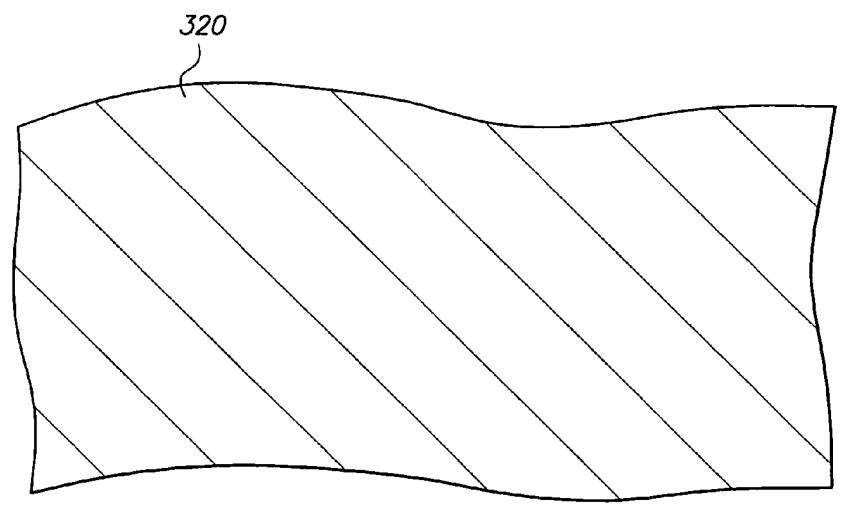

FIGS. 59A, 59B and 59C are cross-sectional, top and bottom views, respectively, of metal base 320 and routing line 350 after photoresist layers 344 and 346 are stripped.

Figure 60A:
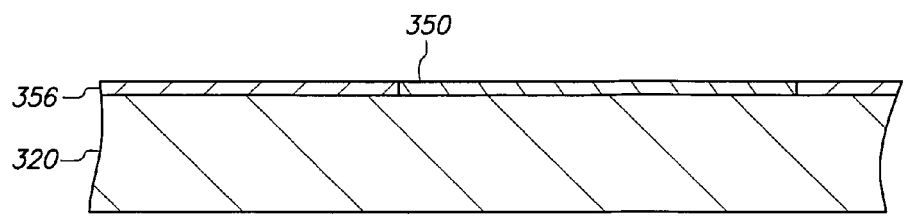
Figure 60B:
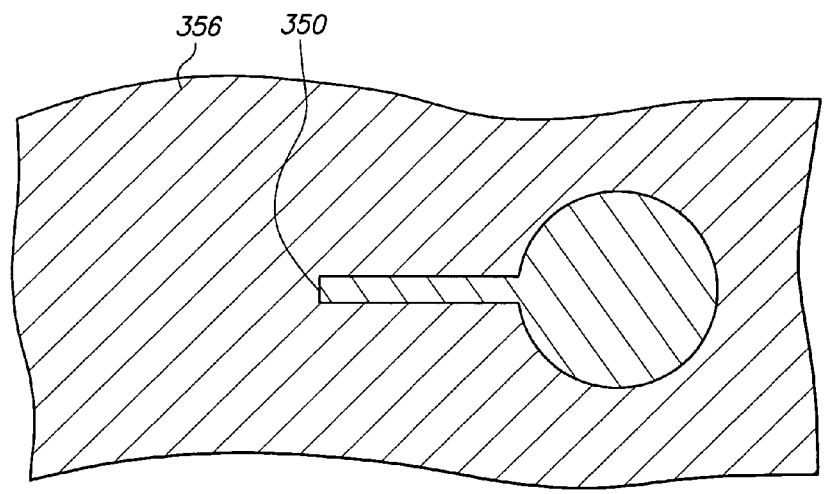
Figure 60C:
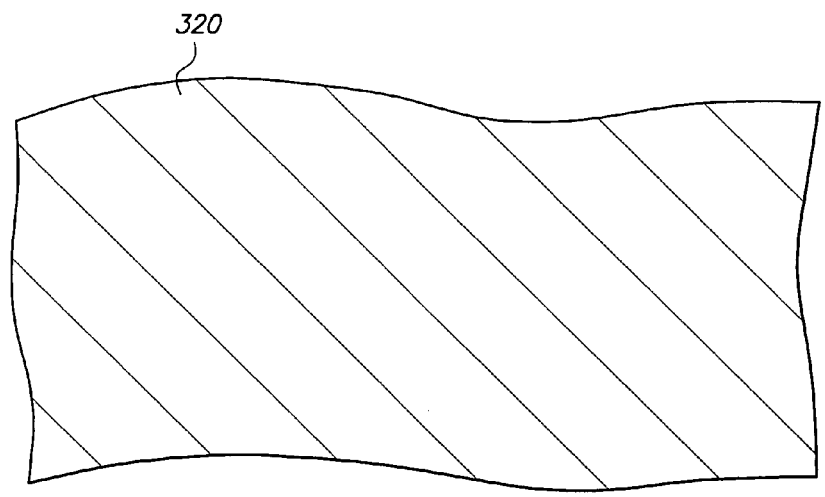

FIGS. 60A, 60B and 60C are cross-sectional, top and bottom views, respectively, of solder mask 356 formed on metal base 320 and routing line 350.

Figure 61A:
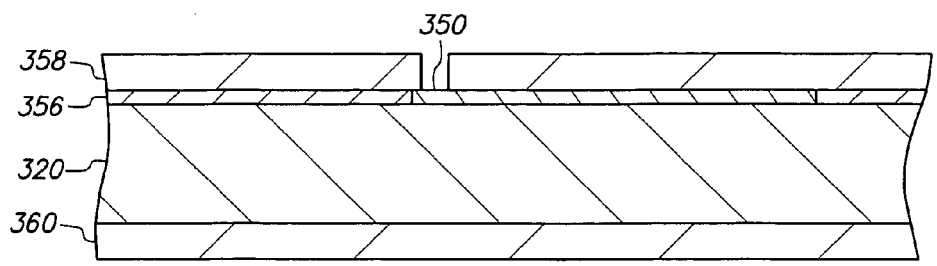
Figure 61B:
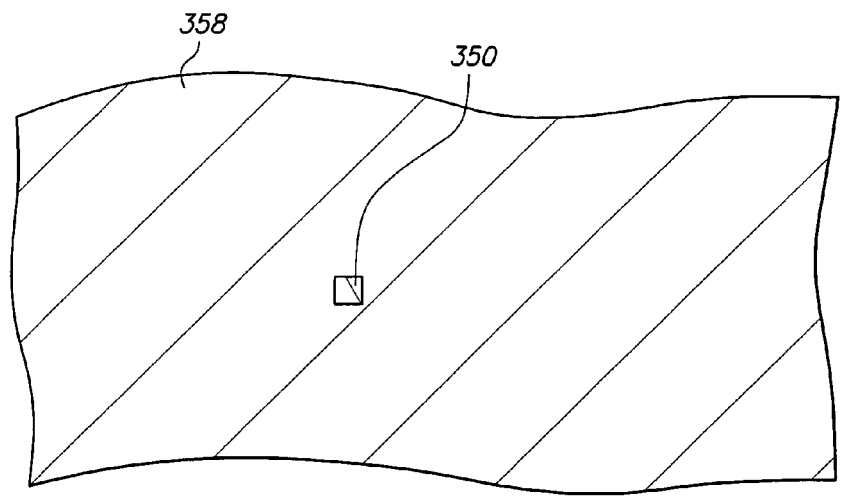
Figure 61C:
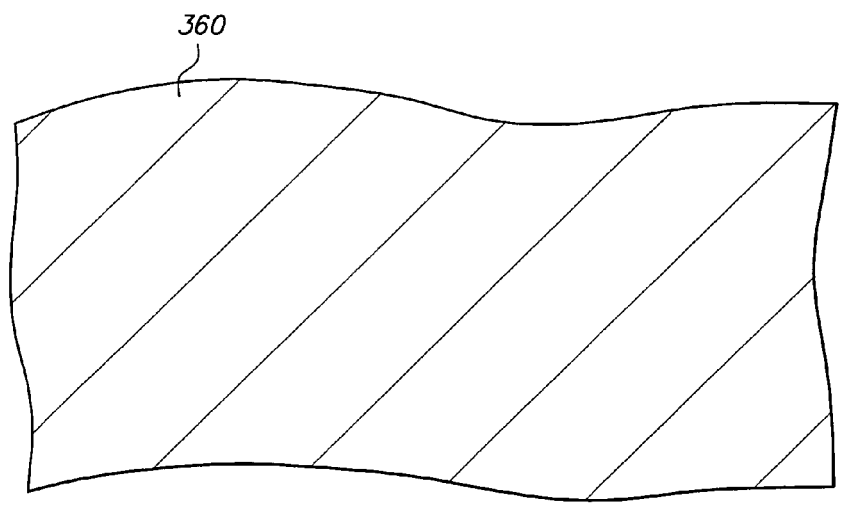

FIGS. 61A, 61B and 61C are cross-sectional, top and bottom views, respectively, of photoresist layers 358 and 360 formed on the structure. Photoresist layer 358 is formed on routing line 350 and solder mask 356, and photoresist layer 360 is formed on metal base 320. Photoresist layer 358 includes an opening that selectively exposes routing line 350, and photoresist layer 360 remains unpatterned.

Figure 62A:
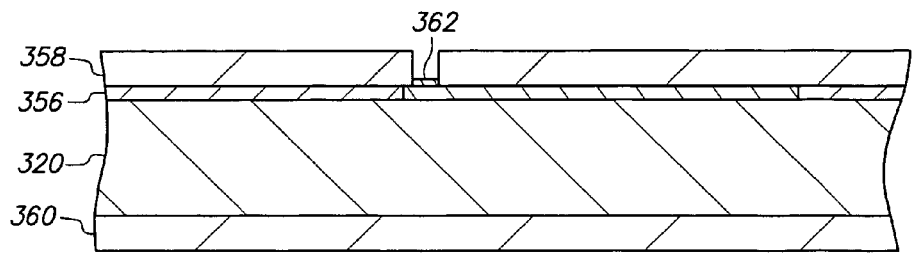
Figure 62B:
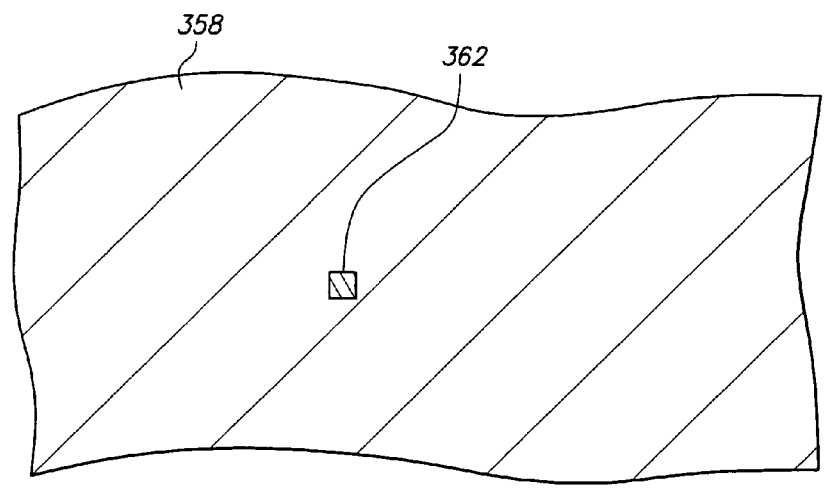
Figure 62C:
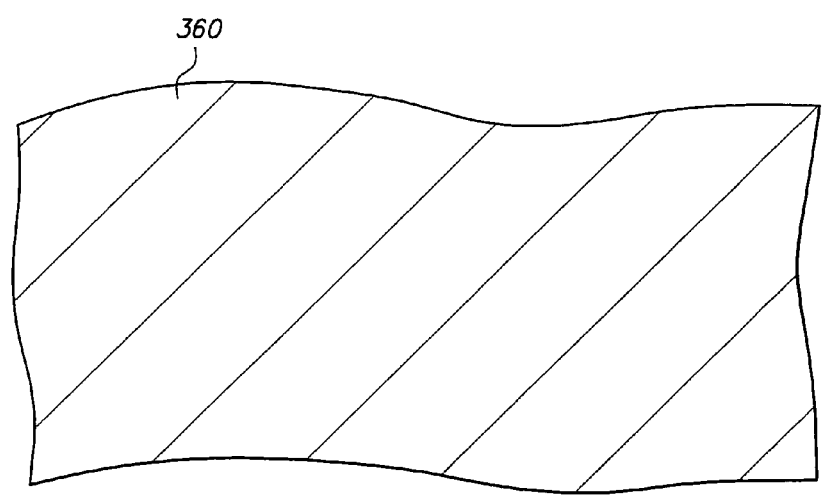

FIGS. 62A, 62B and 62C are cross-sectional, top and bottom views, respectively, of plated contact 362 formed on routing line 350 by electroplating.

Figure 63A:
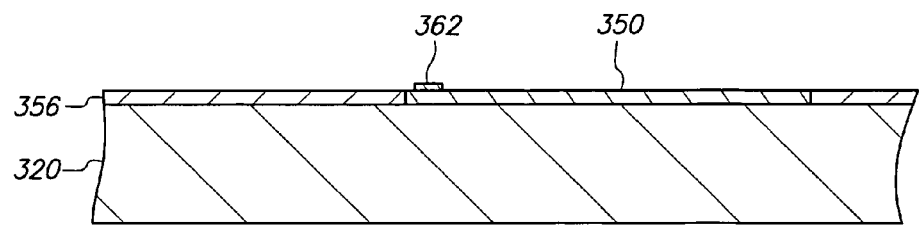
Figure 63B:
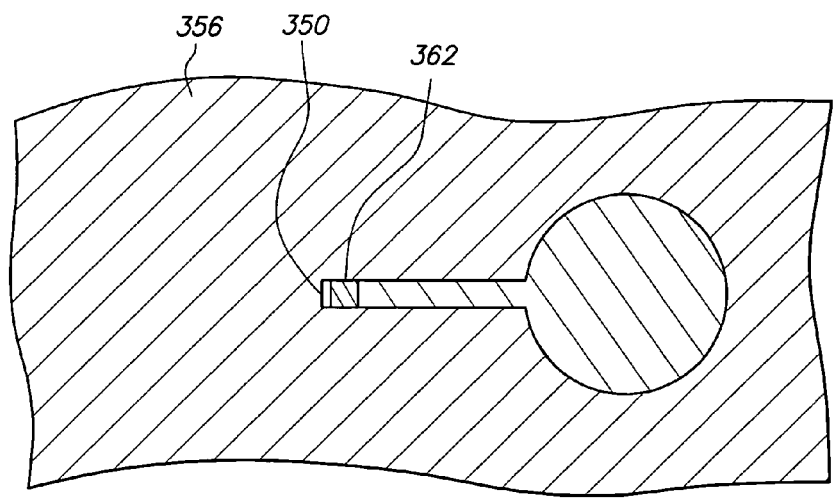
Figure 63C:
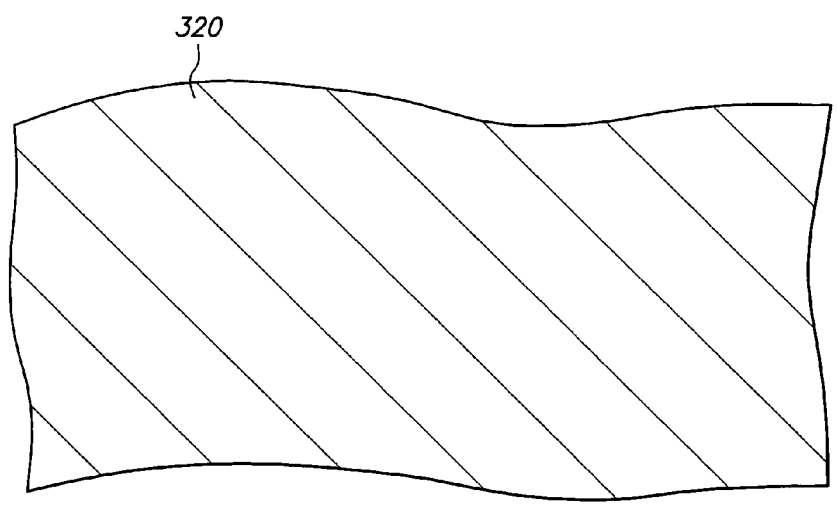

FIGS. 63A, 63B and 63C are cross-sectional, top and bottom views, respectively, of metal base 320, routing line 350 and plated contact 362 after photoresist layers 358 and 360 are stripped.

Figure 64A:
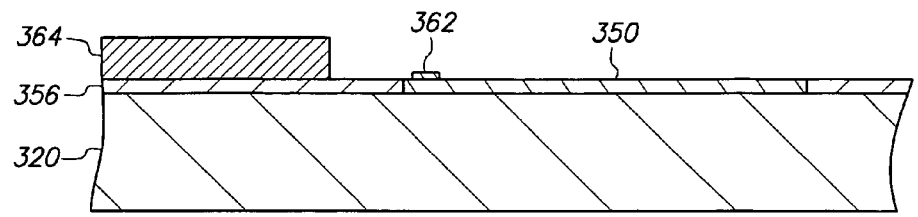
Figure 64B:
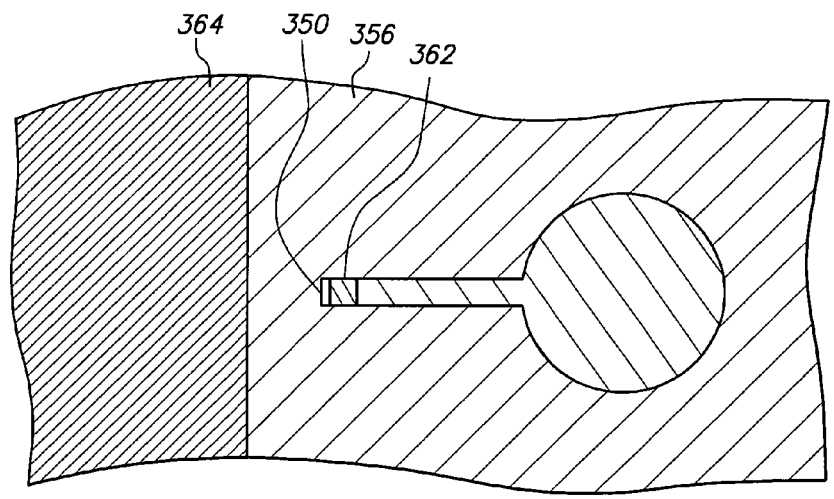
Figure 64C:
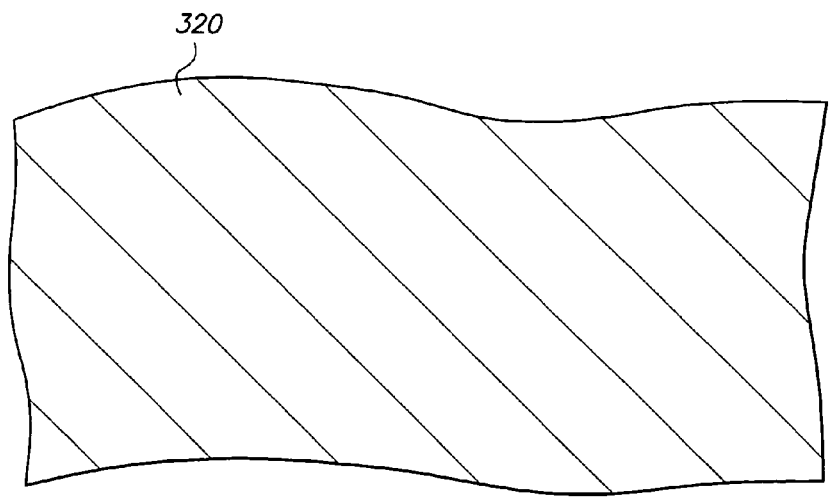

FIGS. 64A, 64B and 64C are cross-sectional, top and bottom views, respectively, of adhesive 364 formed on solder mask 356.

Figure 65A:
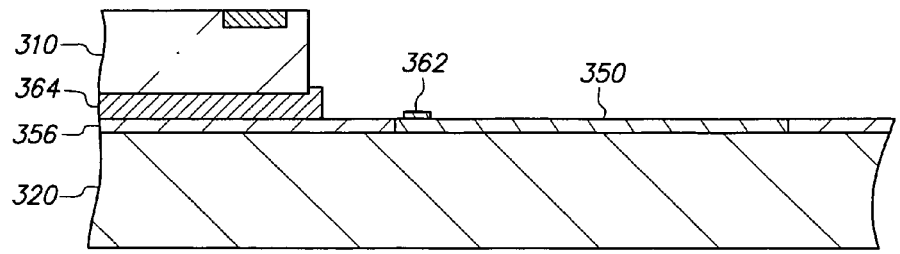
Figure 65B:
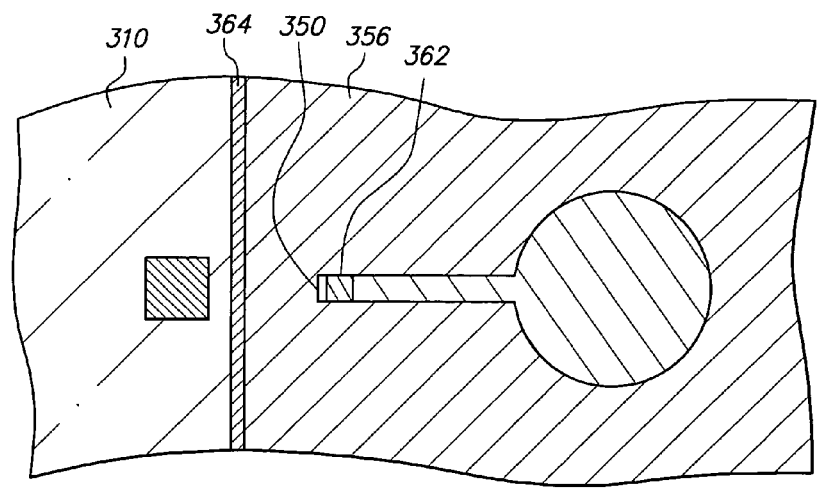
Figure 65C:
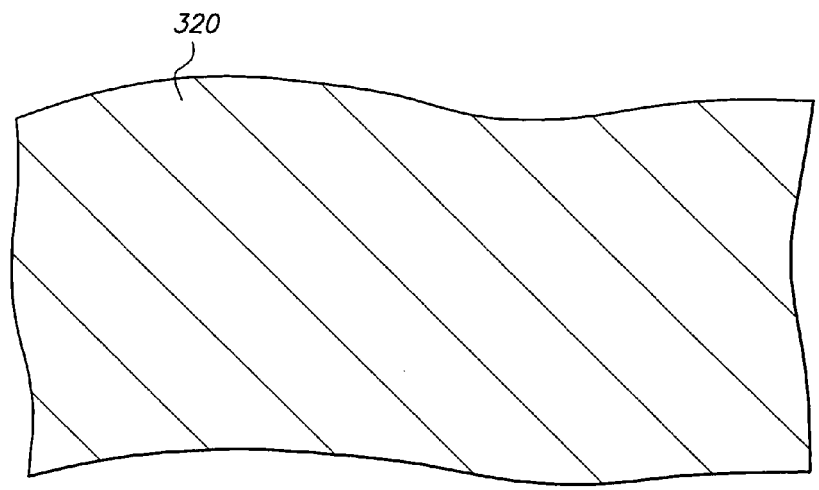

FIGS. 65A, 65B and 65C are cross-sectional, top and bottom views, respectively, of chip 310 mechanically attached to metal base 320, routing line 350, solder mask 356 and plated contact 362 by adhesive 364.

Figure 66A:
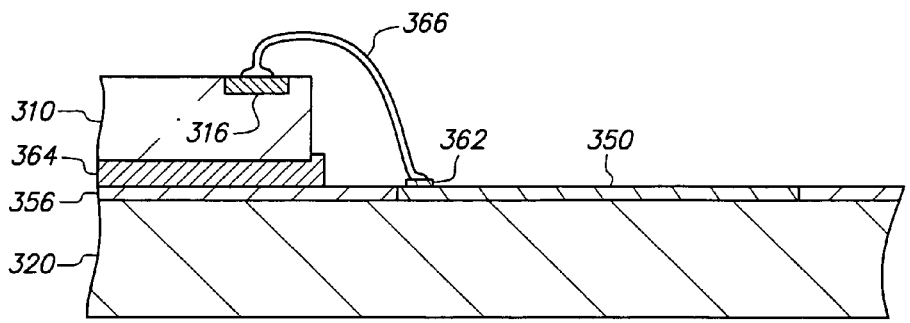
Figure 66B:
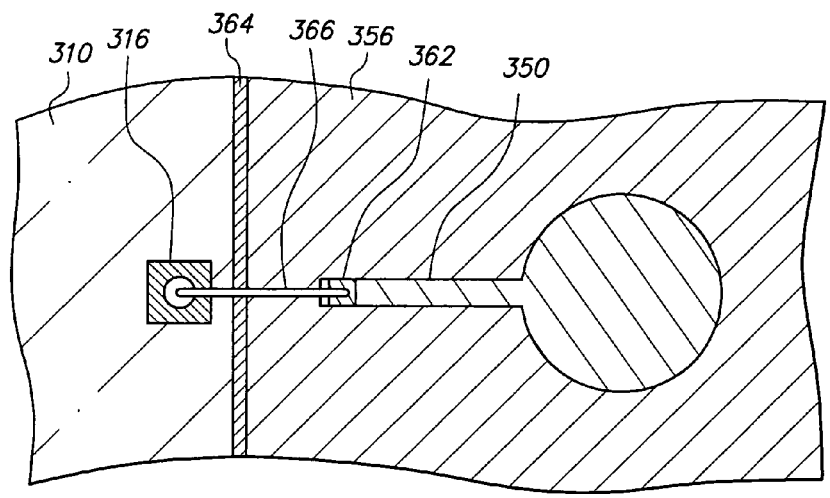
Figure 66C:
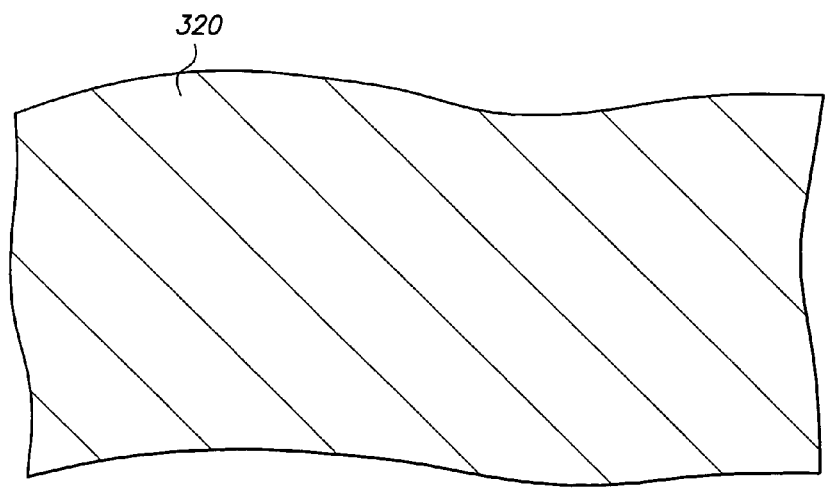

FIGS. 66A, 66B and 66C are cross-sectional, top and bottom views, respectively, of connection joint 366 formed on pad 316 and plated contact 362.

Figure 67A:
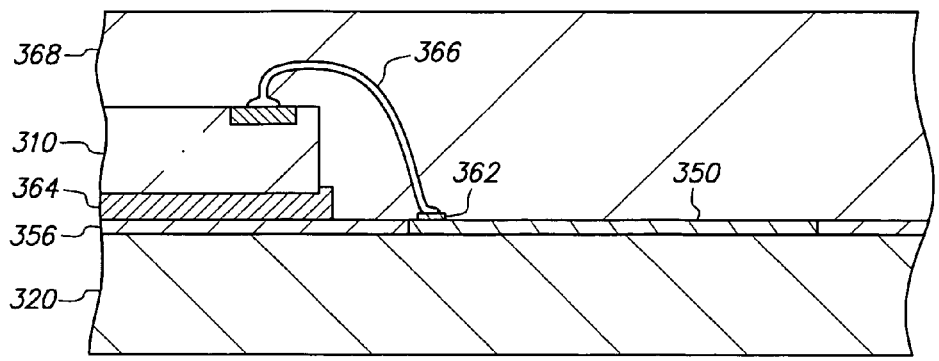
Figure 67B:
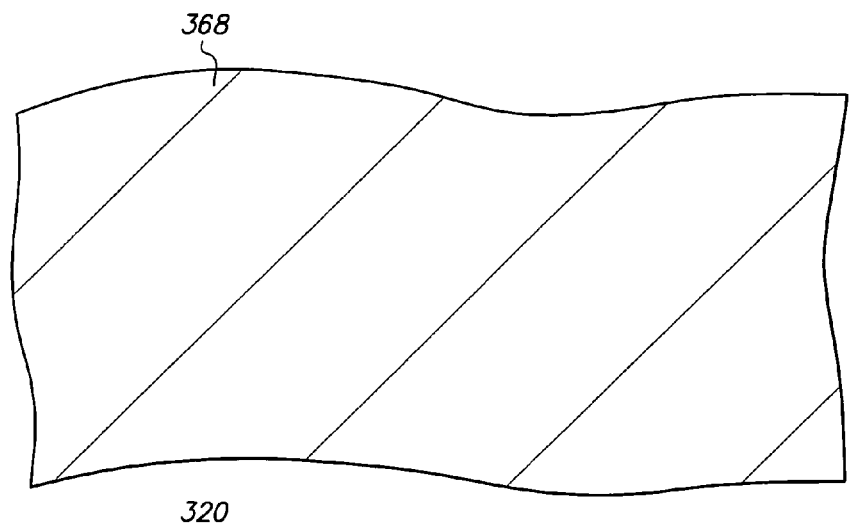
Figure 67C:
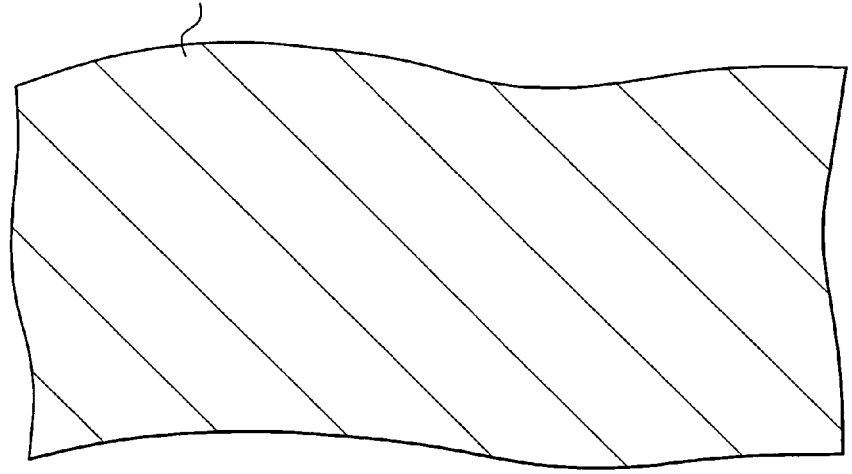

FIGS. 67A, 67B and 67C are cross-sectional, top and bottom views, respectively, of encapsulant 368 formed on chip 310, routing line 350, solder mask 356, plated contact 362, adhesive 364 and connection joint 366.

Figure 68A:
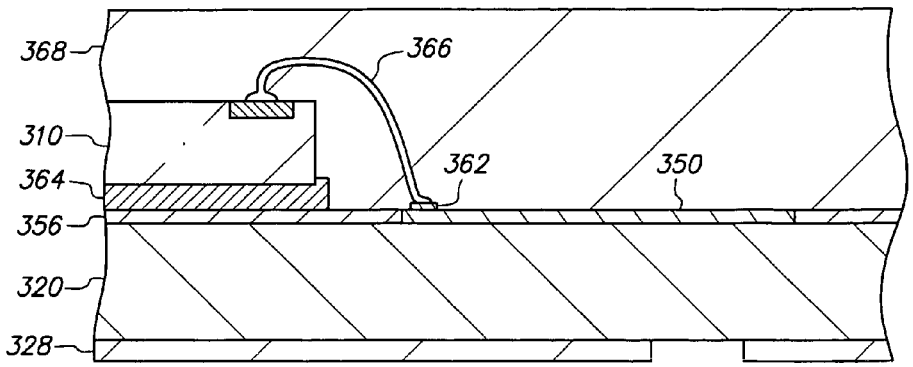
Figure 68B:
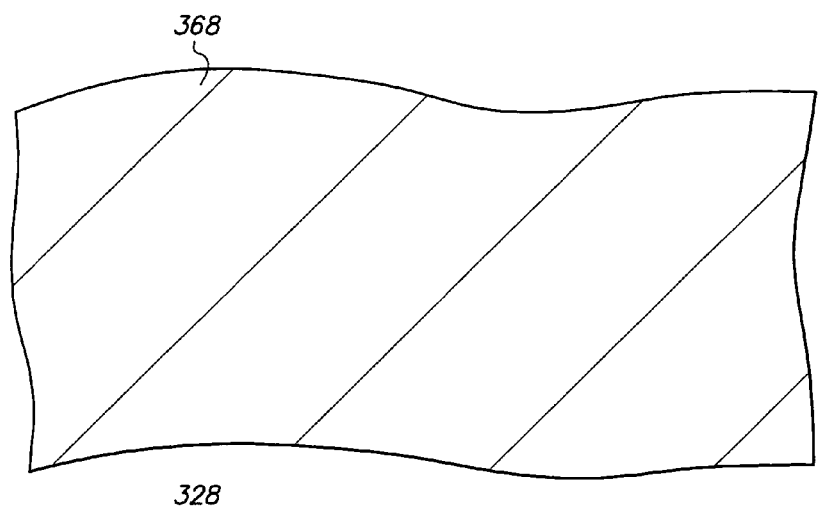
Figure 68C:
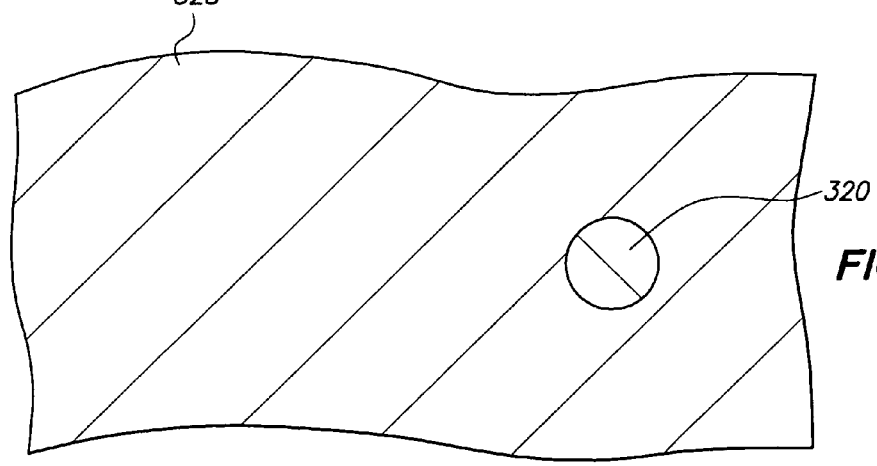

FIGS. 68A, 68B and 68C are cross-sectional, top and bottom views, respectively, of photoresist layer 328 formed on metal base 320. Photoresist layer 328 includes an opening with a diameter of 200 microns (rather than 250 microns) that selectively exposes surface 324.

Figure 69A:
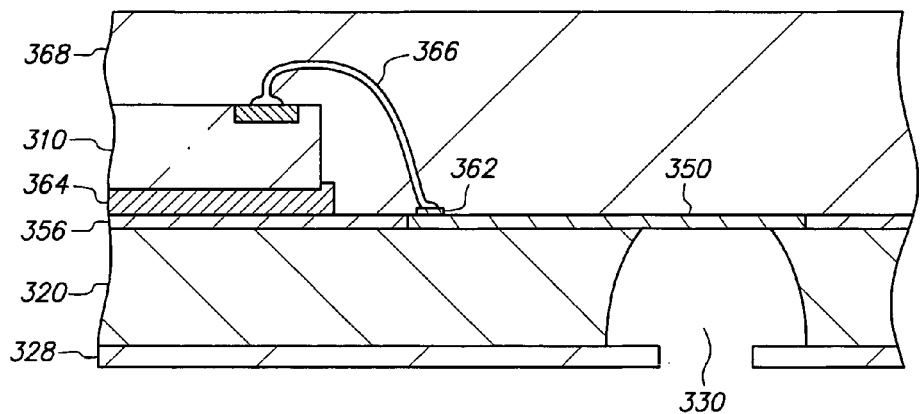
Figure 69B:
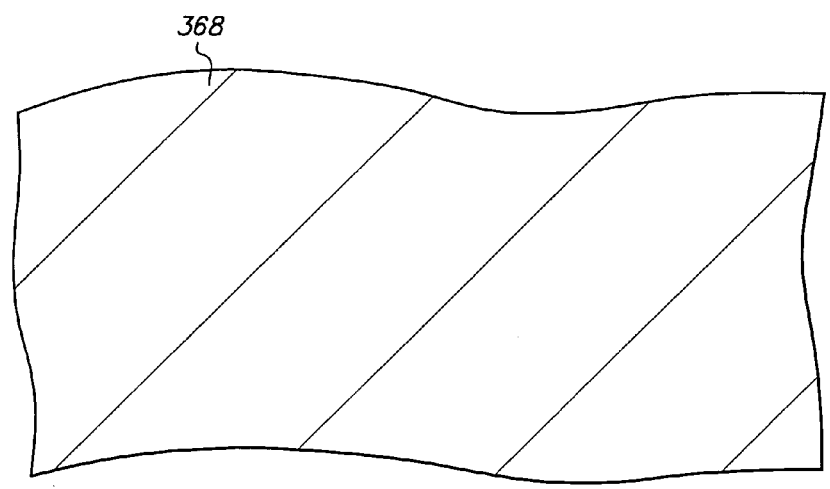
Figure 69C:
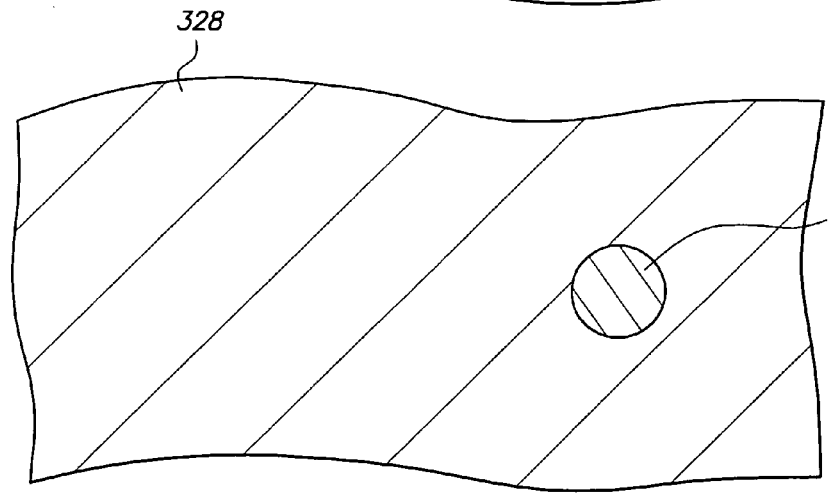

FIGS. 69A, 69B and 69C are cross-sectional, top and bottom views, respectively, of through-hole 330 formed in metal base 320.

Through-hole 330 is formed by applying a back-side wet chemical etch to the exposed portion of surface 324 using photoresist layer 328 as an etch mask. For instance, the bottom spray nozzle can spray the wet chemical etch on metal base 320 while the top spray nozzle is deactivated, or the structure can be dipped in the wet chemical etch since encapsulant 368 provides front-side protection. The wet chemical etch is highly selective of copper and etches through metal base 320. As a result, through-hole 330 is a through via that extends between surfaces 322 and 324 and exposes routing line 350. Through-hole 330 has a diameter of 200 microns at surface 322, a diameter of 300 microns at surface 324 and a depth of 150 microns.

Thus, through-hole 330 is formed in essentially the same manner as recess 130 except that the wet chemical etch is applied longer so that it etches through (rather than about half-way into) metal base 320.

A suitable wet chemical etch can be provided by a solution containing alkaline ammonia. The optimal etch time for exposing metal base 320 to the wet chemical etch in order to form through-hole 330 with the desired dimensions can be established through trial and error.

Figure 70A:
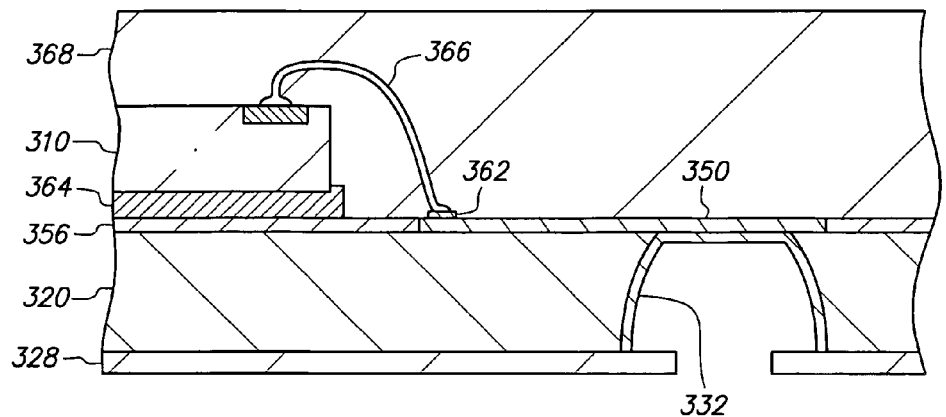
Figure 70B:
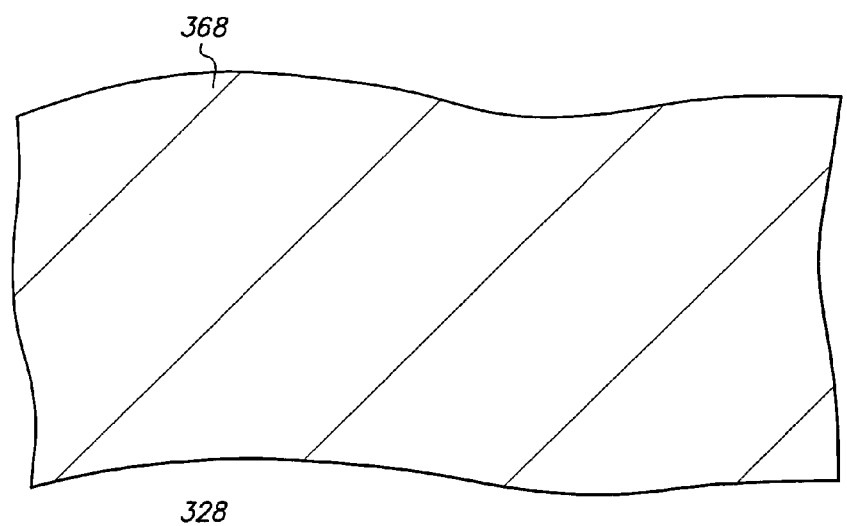
Figure 70C:
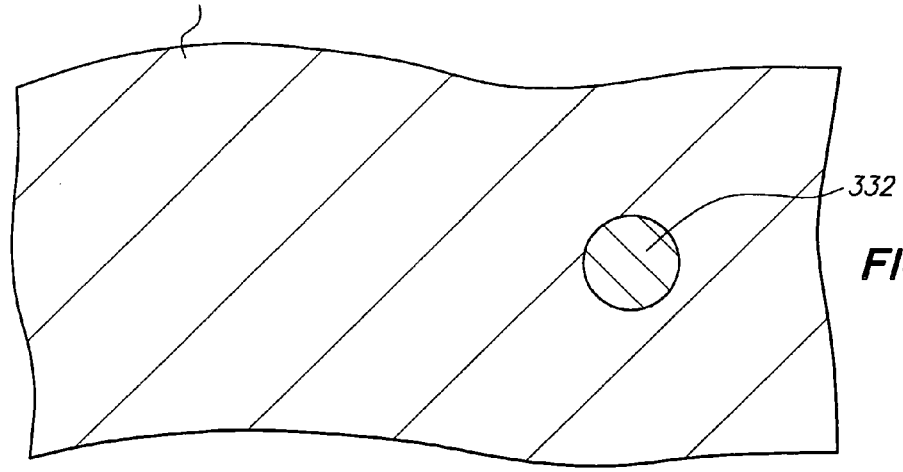

FIGS. 70A, 70B and 70C are cross-sectional, top and bottom views, respectively, of metal containment wall 332 formed on metal base 320 and routing line 350. Metal containment wall 332 contacts and is electrically connected to and is non-integral with metal base 320 and routing line 350 in through-hole 330.

Figure 71A:
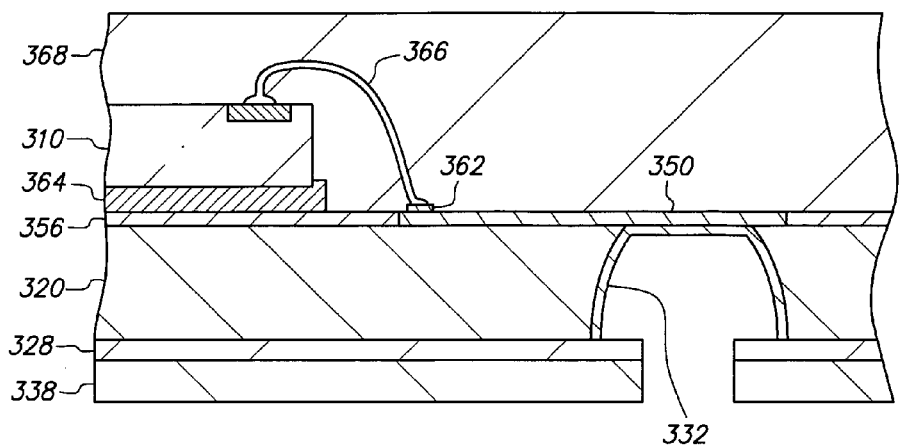
Figure 71B:
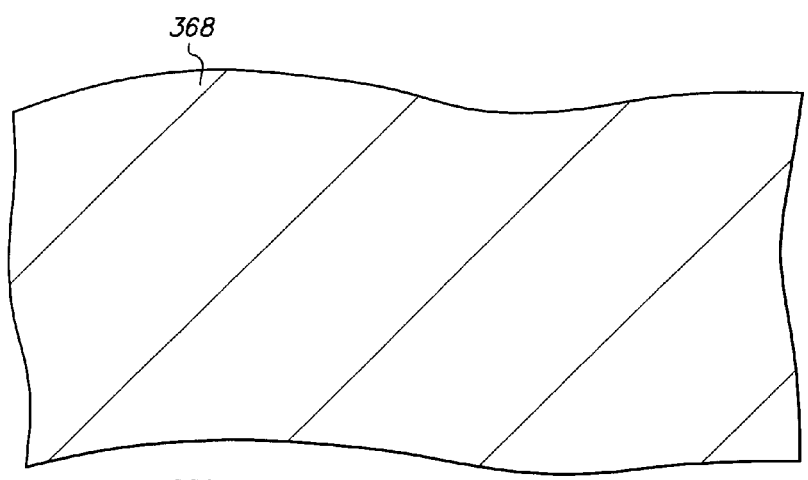
Figure 71C:
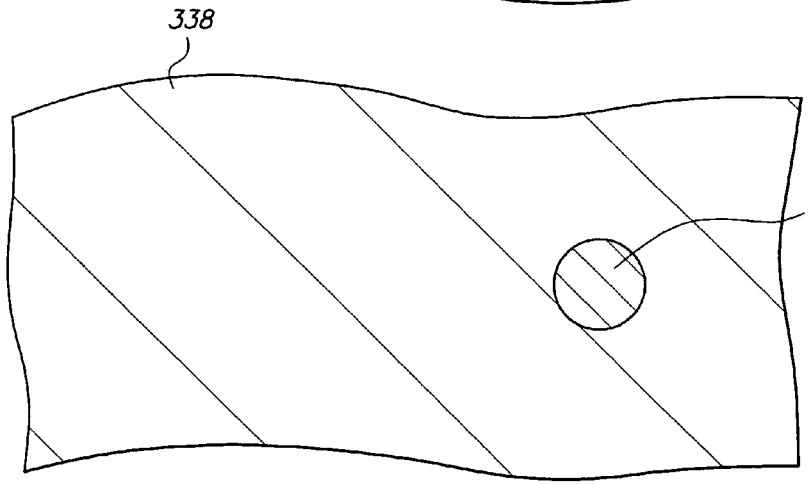

FIGS. 71A, 71B and 71C are cross-sectional, top and bottom views, respectively, of stencil 338 mounted on photoresist layer 328.

Figure 72A:
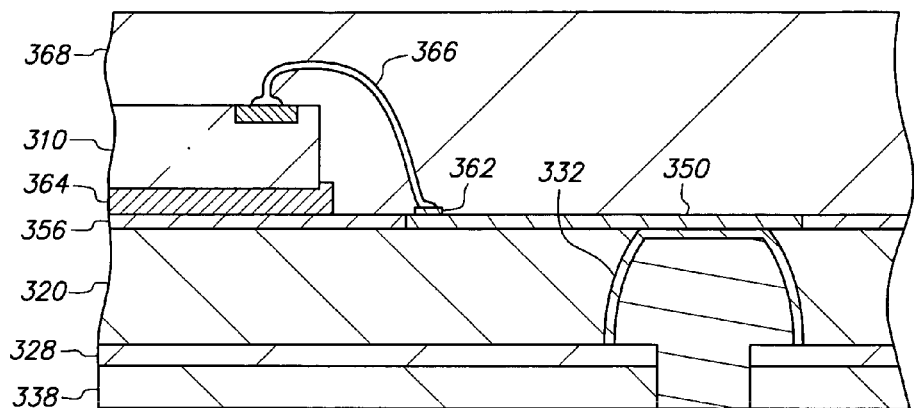
Figure 72B:
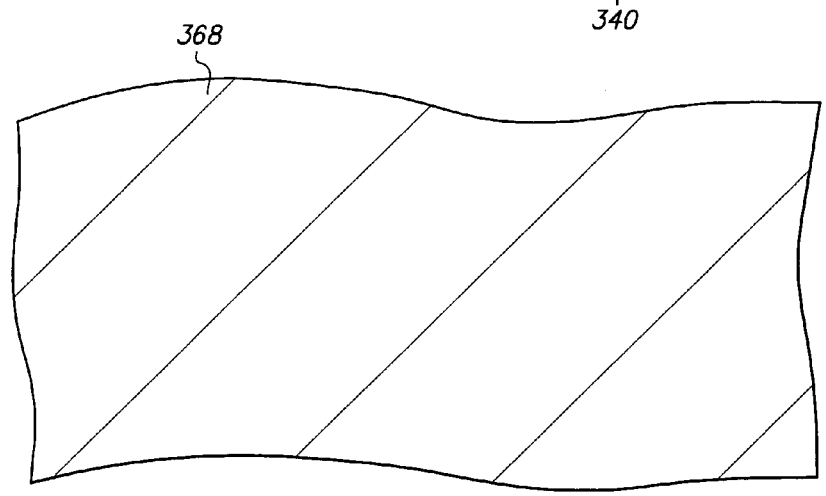
Figure 72C:
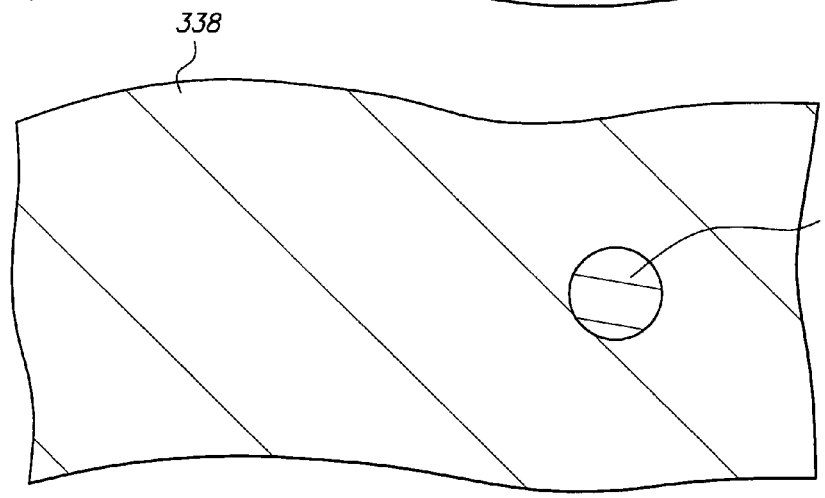

FIGS. 72A, 72B and 72C are cross-sectional, top and bottom views, respectively, of solder paste 340 deposited on metal containment wall 332.

Figure 73A:
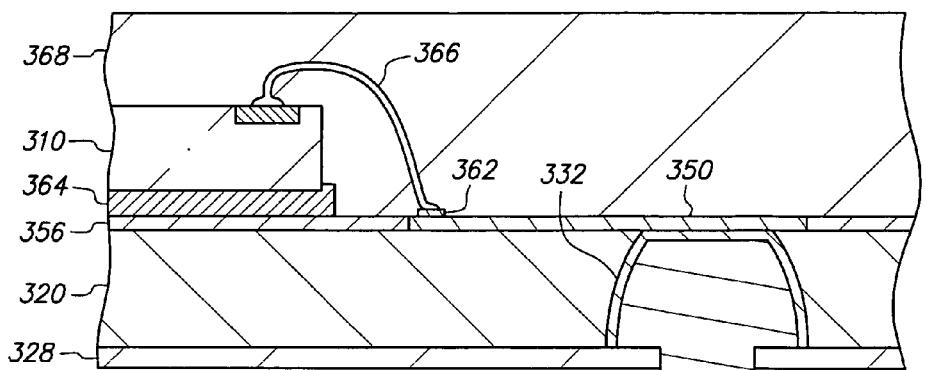
Figure 73B:
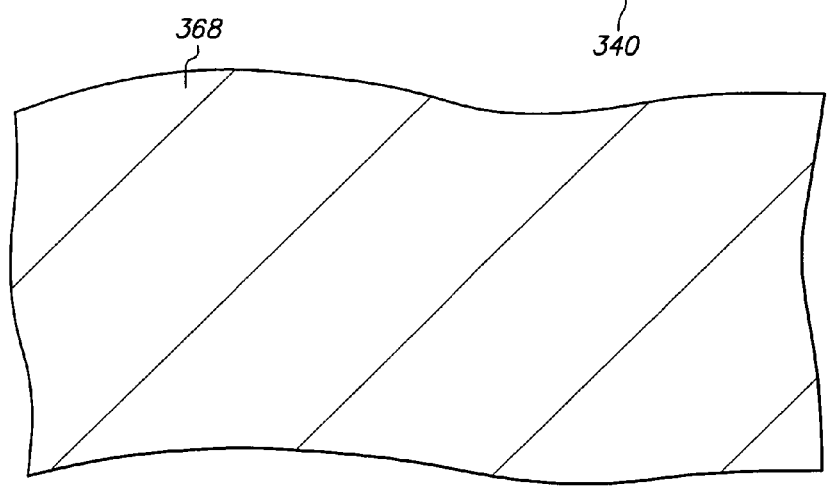
Figure 73C:
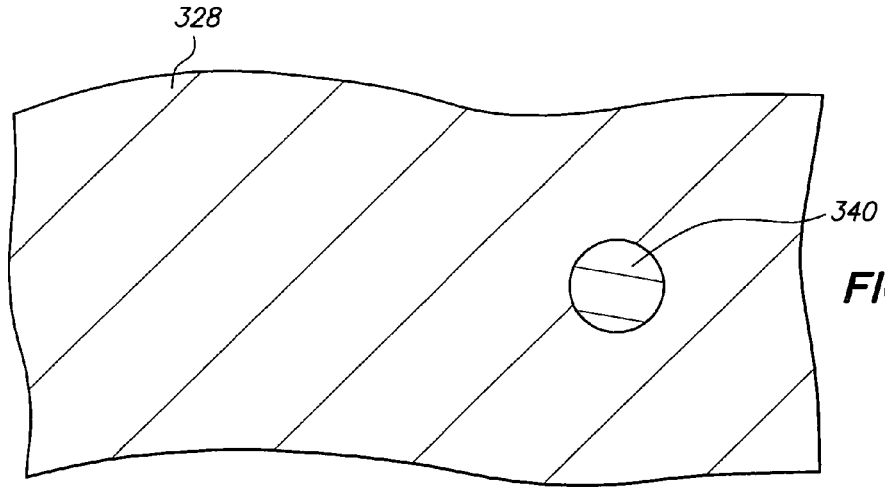

FIGS. 73A, 73B and 73C are cross-sectional, top and bottom views, respectively, of stencil 338 removed from photoresist layer 328.

Figure 74A:
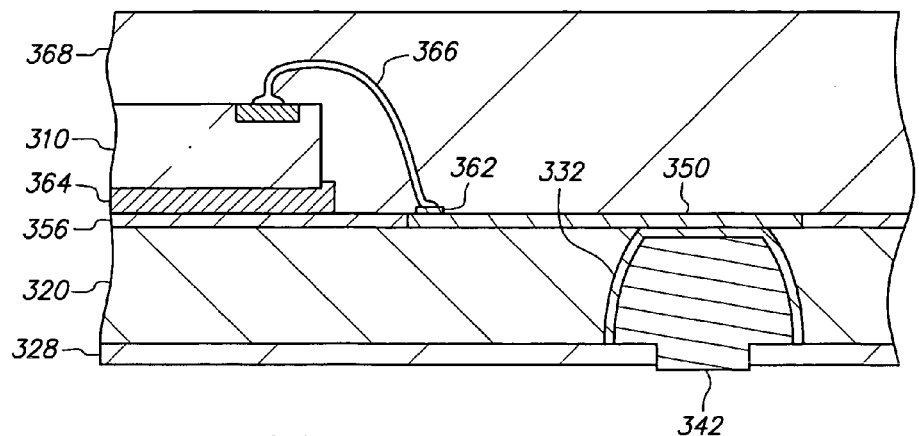
Figure 74B:
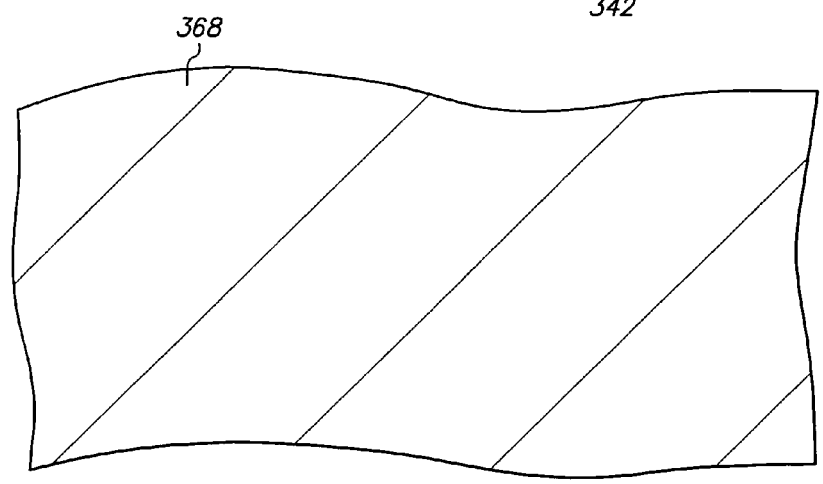
Figure 74C:
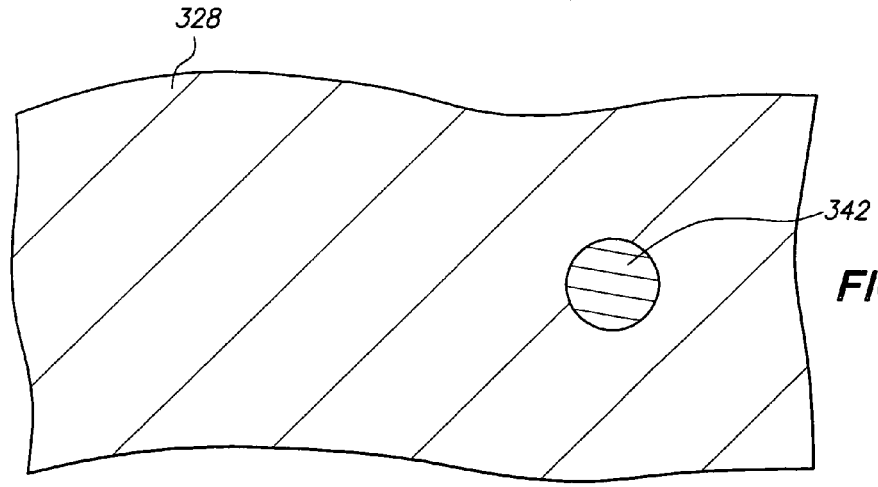

FIGS. 74A, 74B and 74C are cross-sectional, top and bottom views, respectively, of solder layer 342 formed from solder paste 340.

Figure 75A:
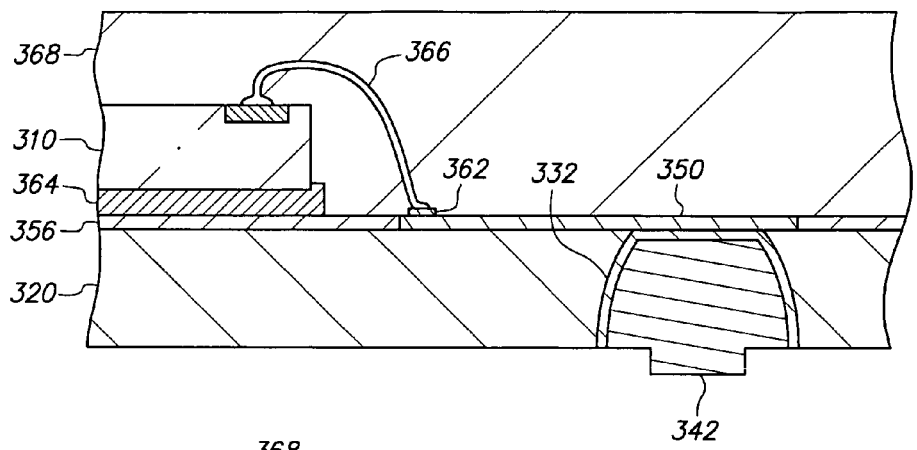
Figure 75B:
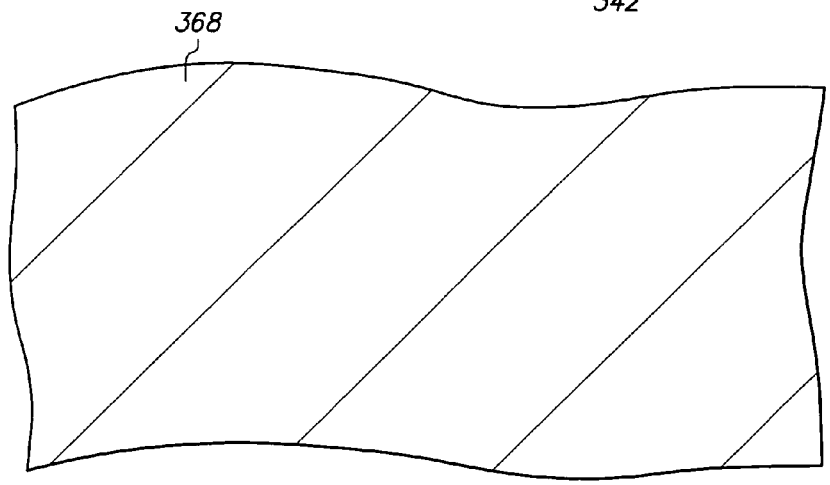
Figure 75C:
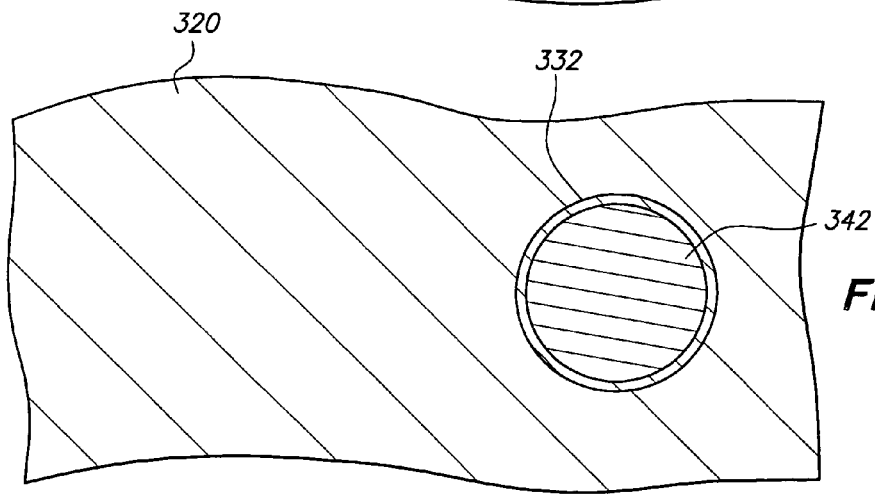

FIGS. 75A, 75B and 75C are cross-sectional, top and bottom views, respectively, of chip 310, metal base 320, metal containment wall 332, solder layer 342, routing line 350, plated contact 362, adhesive 364, connection joint 366 and encapsulant 368 after photoresist layer 328 is stripped.

Figure 76A:
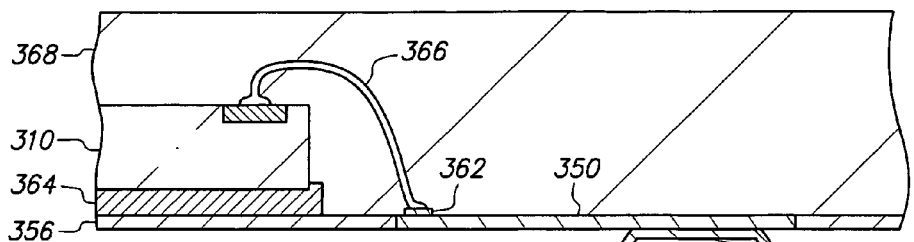
Figure 76B:
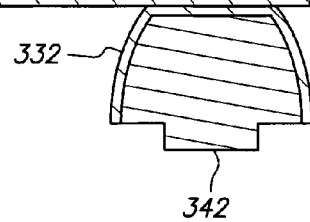
Figure 76B:
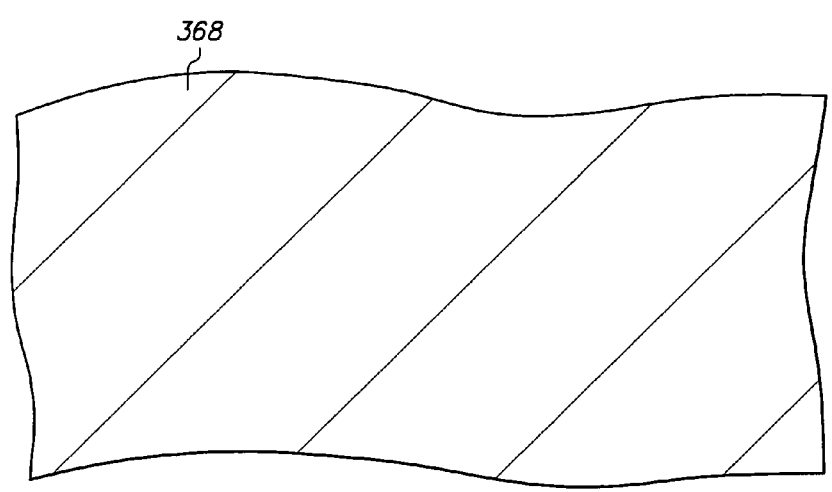
Figure 76C:
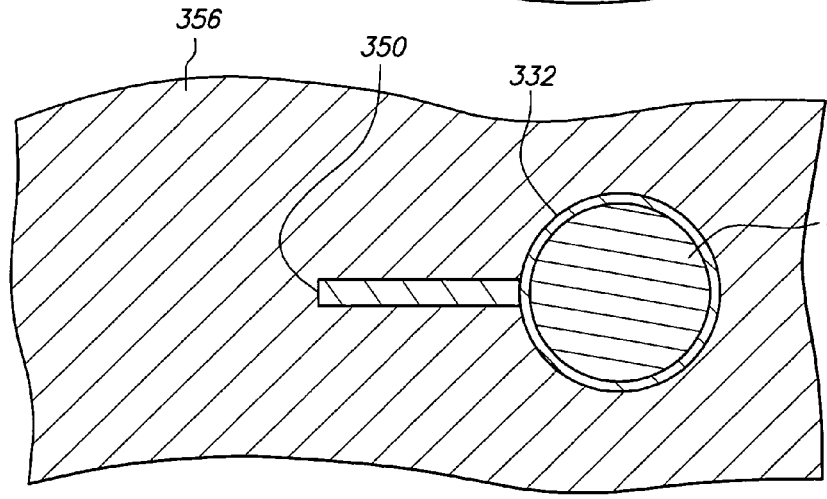

FIGS. 76A, 76B and 76C are cross-sectional, top and bottom views, respectively, of the structure after metal base 320 is removed.

Metal base 320 is removed by applying a back-side wet chemical etch to surface 324, metal containment wall 332 and solder layer 342. For instance, the bottom spray nozzle can spray the wet chemical etch on metal base 320 while the top spray nozzle is deactivated, or the structure can be dipped in the wet chemical etch since encapsulant 368 provides front-side protection. The wet chemical etch is highly selective of copper with respect to nickel, solder, epoxy and the molding compound, and therefore, highly selective of metal base 320 with respect to metal containment wall 332, solder layer 342, the nickel layer of routing line 350, solder mask 356 and encapsulant 368.

The wet chemical etch removes metal base 320. As a result, the wet chemical etch eliminates contact area between metal base 320 and metal containment wall 332, between metal base 320 and routing line 350, and between metal base 320 and solder mask 356.

Thus, metal base 320 is removed in essentially the same manner that metal base 120 is etched to form metal pillar 170 except that the wet chemical etch is applied longer so that it removes all (rather than most) of metal base 320.

A suitable wet chemical etch can be provided by a solution containing alkaline ammonia. The optimal etch time for exposing metal base 320 to the wet chemical etch in order to remove metal base 320 without excessively exposing metal containment wall 332 and routing line 350 to the wet chemical etch can be established through trial and error.

Figure 77A:
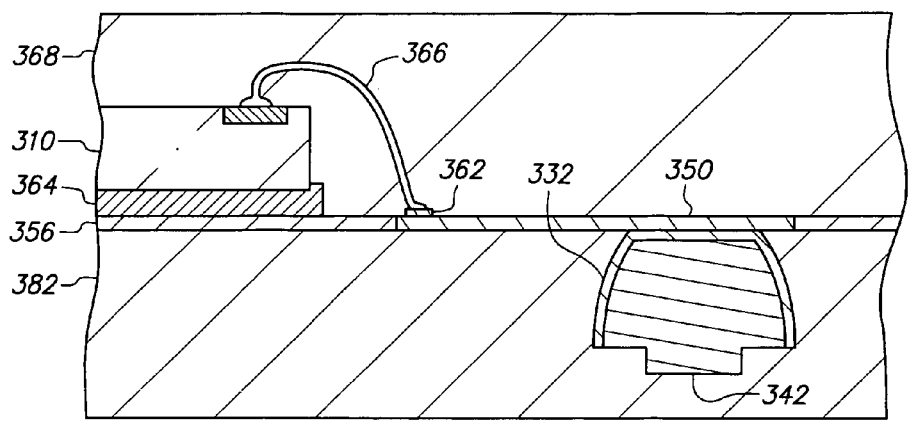
Figure 77B:
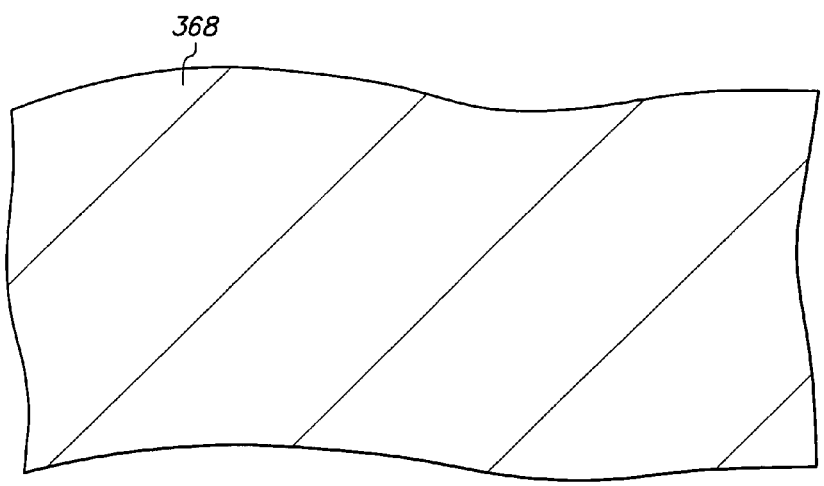
Figure 77C:
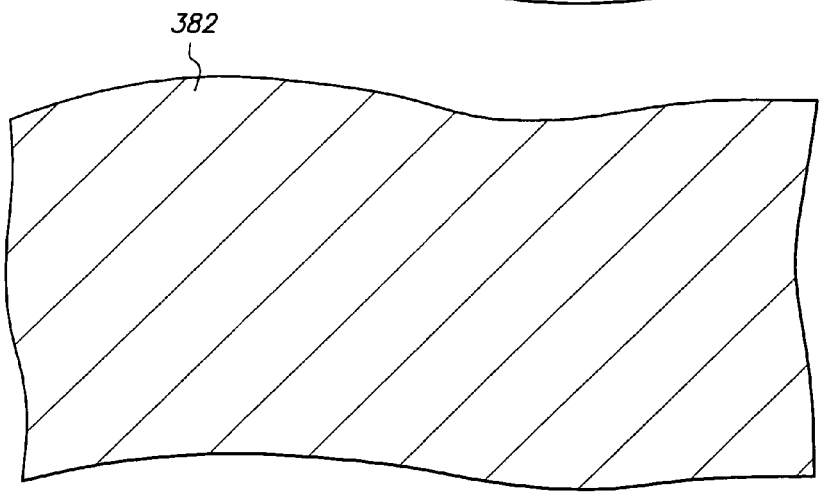

FIGS. 77A, 77B and 77C are cross-sectional, top and bottom views, respectively, of insulative base 382 formed on metal containment wall 332, solder layer 342, routing line 350 and solder mask 356.

Figure 78A:
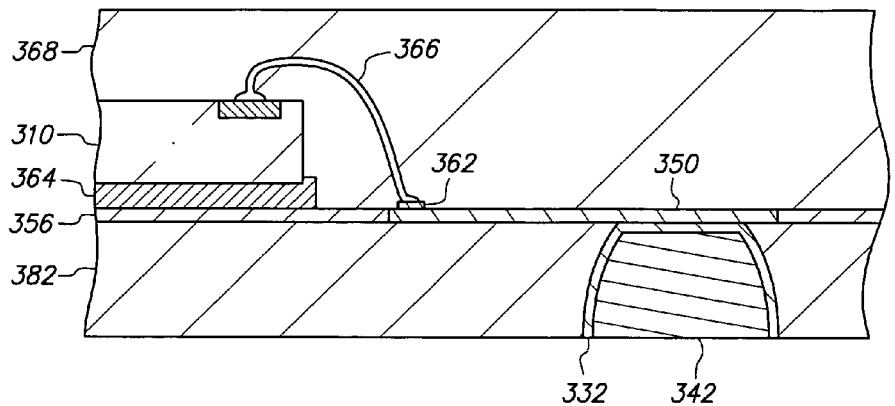
Figure 78B:
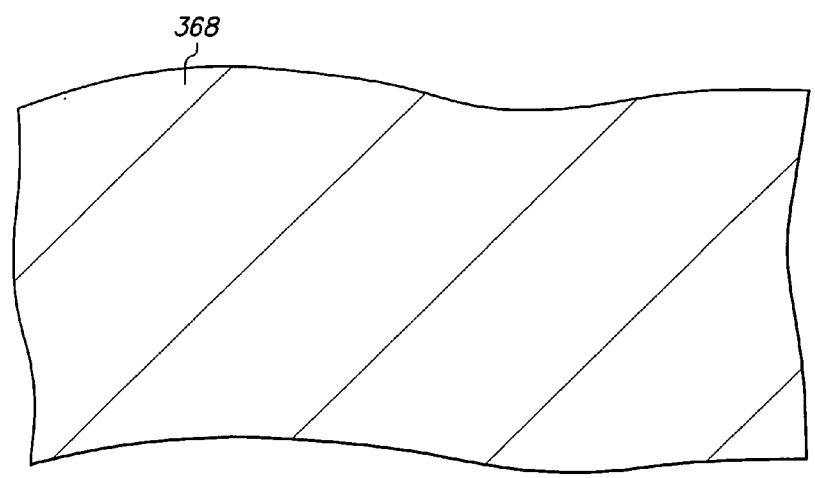
Figure 78C:
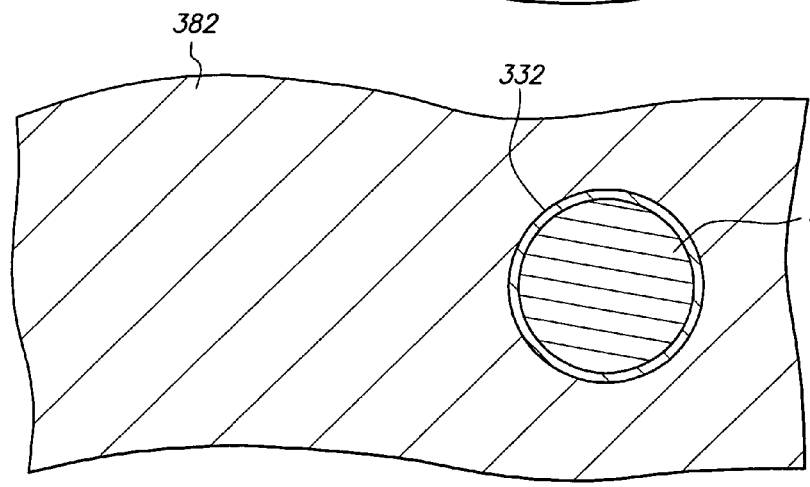

FIGS. 78A, 78B and 78C are cross-sectional, top and bottom views, respectively, of the structure after a lower portion of insulative base 382 is removed.

Figure 79A:
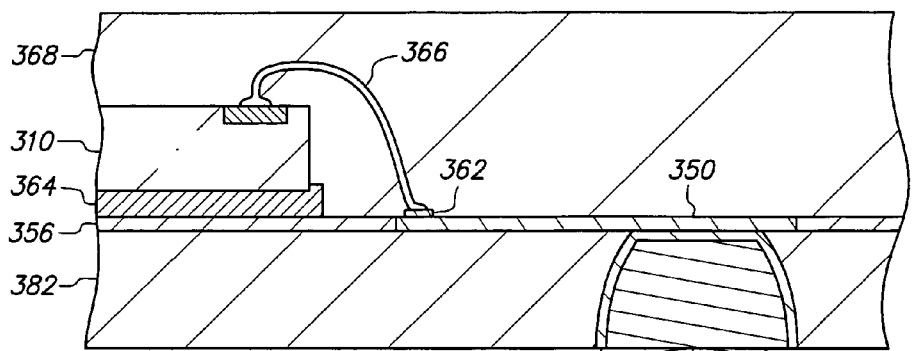
Figure 79B:
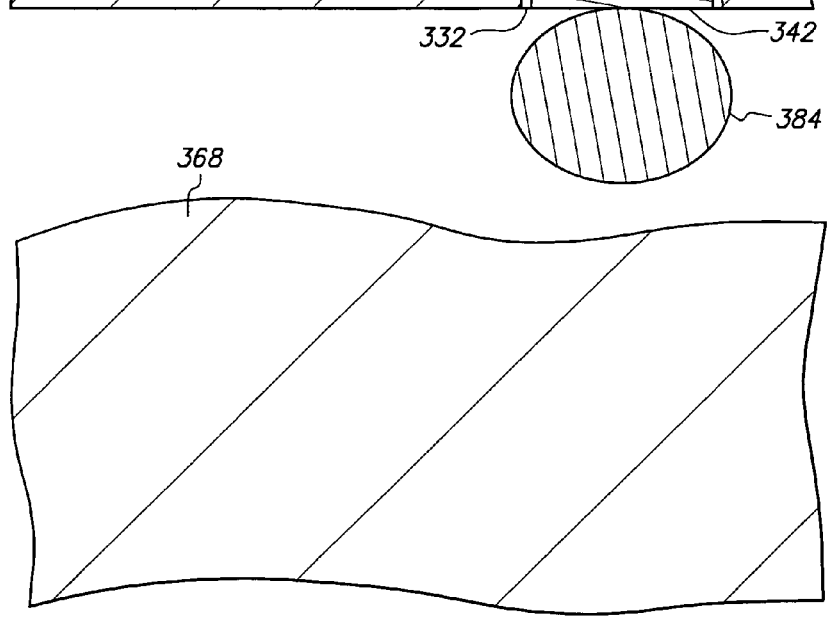
Figure 79C:
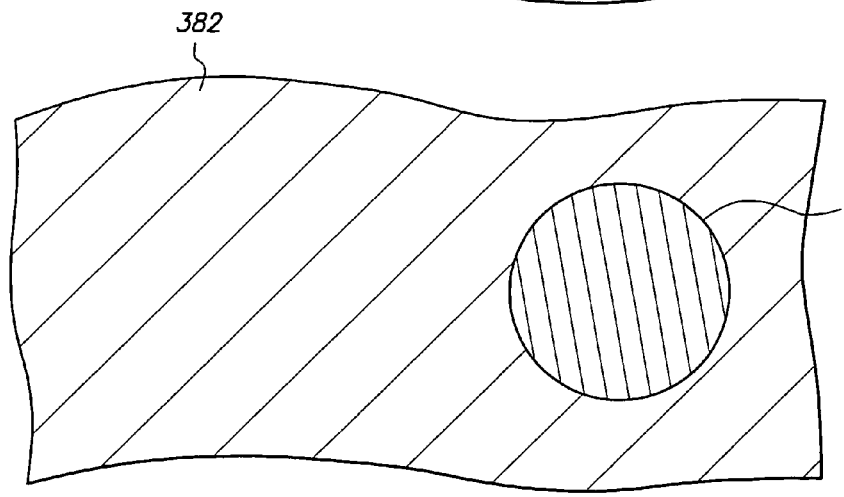

FIGS. 79A, 79B and 79C are cross-sectional, top and bottom views, respectively, of solder ball 384 formed on solder layer 342.

Figure 80A:
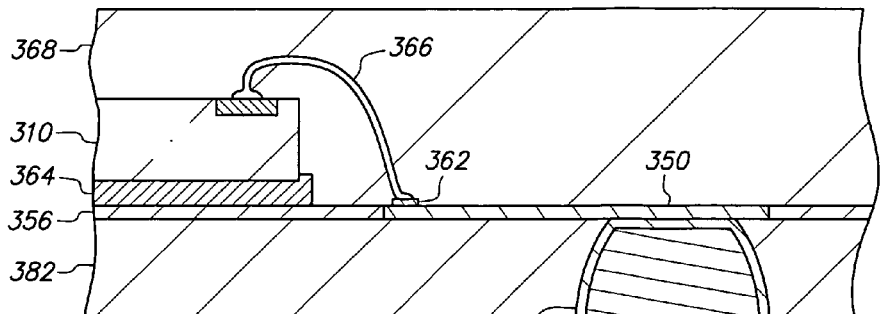
Figure 80B:
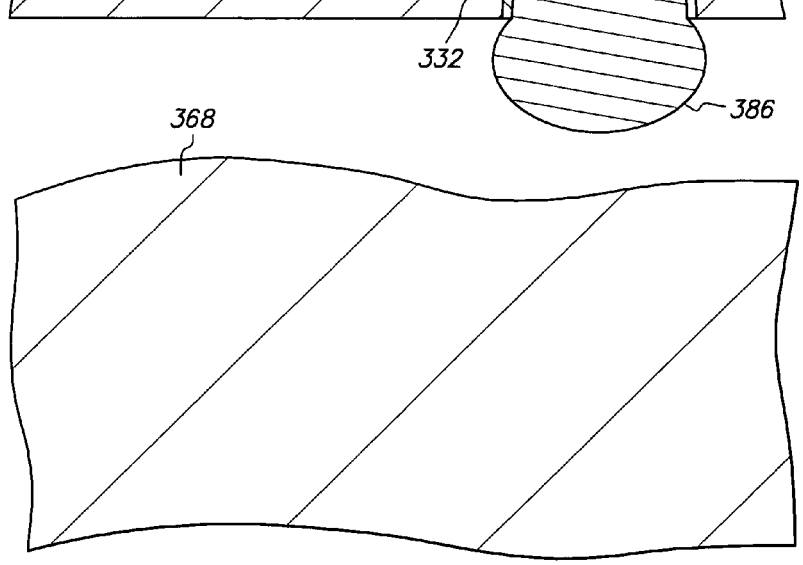
Figure 80C:
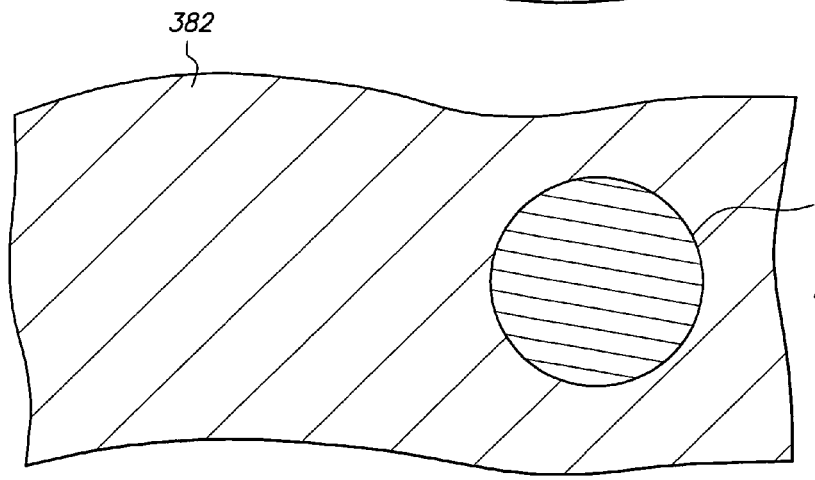

FIGS. 80A, 80B and 80C are cross-sectional, top and bottom views, respectively, of solder terminal 386 formed from solder layer 342 and solder ball 384.

Figure 81A:
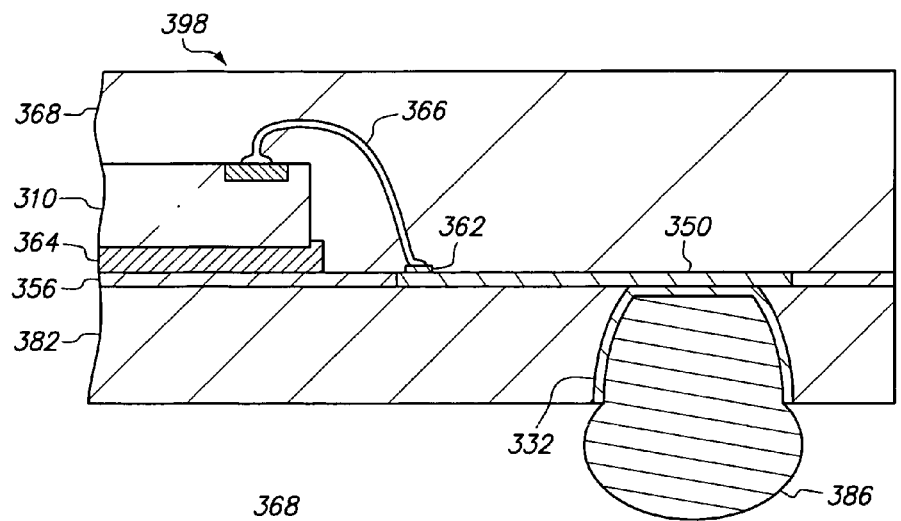
Figure 81B:
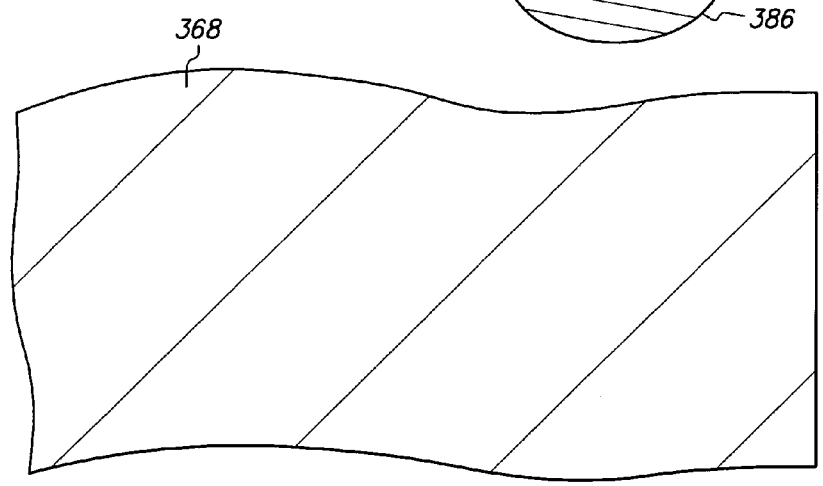
Figure 81C:
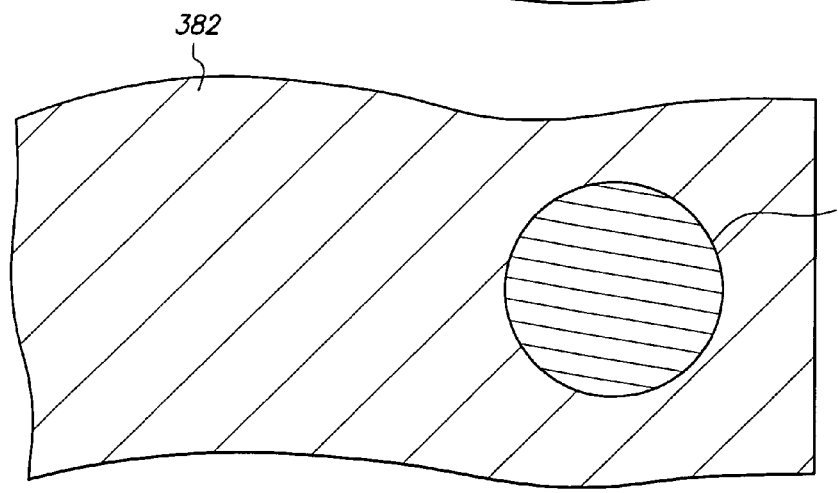

FIGS. 81A, 81B and 81C are cross-sectional, top and bottom views, respectively, of the structure after cutting solder mask 356, encapsulant 368 and insulative base 382 with an excise blade to singulate the assembly from other assemblies.

Metal containment wall 332 contacts only routing line 350, insulative base 382 and solder terminal 386, and there is no metal pillar (corresponding to metal pillar 170).

At this stage, the manufacture of semiconductor chip assembly 398 that includes chip 310, metal containment wall 332, routing line 350, solder mask 356, plated contact 362, adhesive 364, connection joint 366, encapsulant 368, insulative base 382 and solder terminal 386 can be considered complete.

Figure 82A:
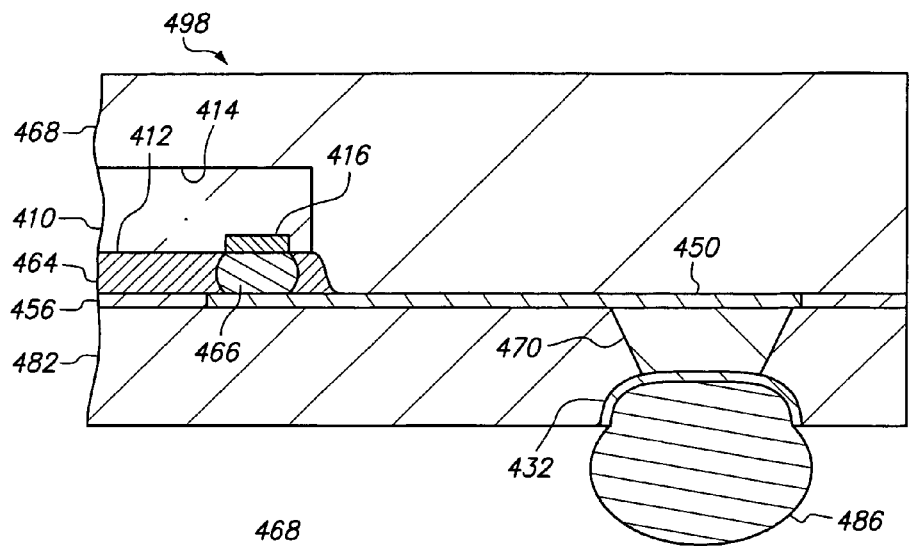
FIGS. 82A, 82B and 82C are cross-sectional, top and bottom views, respectively, of a semiconductor chip assembly in accordance with a fourth embodiment of the present invention.
Figure 82B:
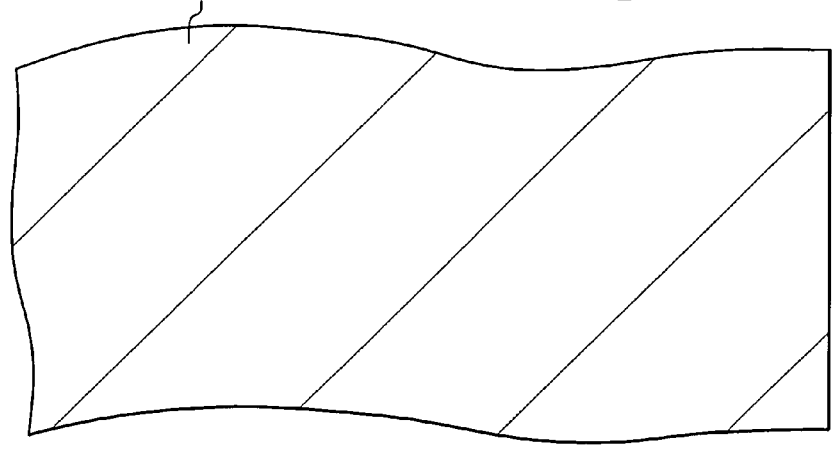
Figure 82C:
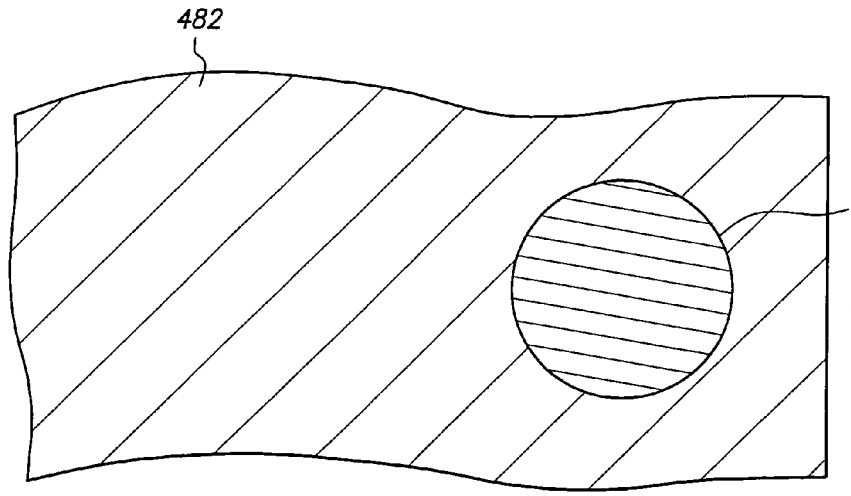

FIGS. 82A, 82B and 82C are cross-sectional, top and bottom views, respectively, of a semiconductor chip assembly in accordance with a fourth embodiment of the present invention. In the fourth embodiment, the chip is flip-chip bonded. For purposes of brevity, any description in the first embodiment is incorporated herein insofar as the same is applicable, and the same description need not be repeated. Likewise, elements of the fourth embodiment similar to those in the first embodiment have corresponding reference numerals indexed at four-hundred rather than one-hundred. For instance, chip 410 corresponds to chip 110, routing line 450 corresponds to routing line 150, etc.

Connection joint 466 is initially a solder bump deposited on pad 416. The solder bump has a hemispherical shape and a diameter of 100 microns.

Routing line 450 extends within and outside the periphery of chip 410. Thus, the elongated routing portion (corresponding to elongated routing portion 152) is lengthened. This is accomplished by a slight adjustment to the electroplating operation previously described for routing line 150. In particular, the photoresist layer (corresponding to photoresist layer 144) is patterned to reshape the opening for routing line 450, and therefore routing line 450 is lengthened relative to routing line 150. Furthermore, the plated contact (corresponding to plated contact 162) is omitted.

Chip 410 is positioned such that surface 412 faces downwardly, surface 414 faces upwardly, routing line 450 extends laterally across pad 416, and connection joint 466 contacts and is sandwiched between pad 416 and routing line 450. Thereafter, heat is applied to reflow connection joint 466, and then the heat is removed and connection joint 466 cools and solidifies into a hardened solder joint that mechanically attaches and electrically connects pad 416 and routing line 450. Connection joint 466 exhibits localized wetting and does not collapse, and chip 410 remains spaced from routing line 450.

Thereafter, adhesive 464 is dispensed into and underfills the open gap between chip 410 and solder mask 456, and then adhesive 464 is cured. As a result, adhesive 464 contacts and is sandwiched between chip 410 and solder mask 456, contacts connection joint 466 and is spaced from pad 416. Thus, adhesive 464 is significantly thicker than adhesive 164. A suitable underfill adhesive is Namics U8443.

Thereafter, encapsulant 468, metal pillar 470, insulative base 482 and solder terminal 486 are formed.

Semiconductor chip assembly 498 includes chip 410, metal containment wall 432, routing line 450, solder mask 456, adhesive 464, connection joint 466, encapsulant 468, metal pillar 470, insulative base 482 and solder terminal 486.

Figure 83A:
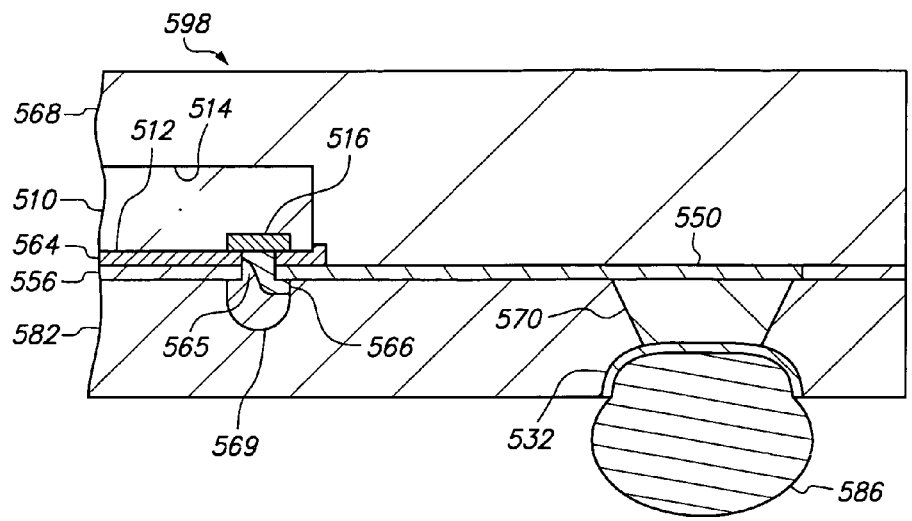
FIGS. 83A, 83B and 83C are cross-sectional, top and bottom views, respectively, of a semiconductor chip assembly in accordance with a fifth embodiment of the present invention.
Figure 83B:
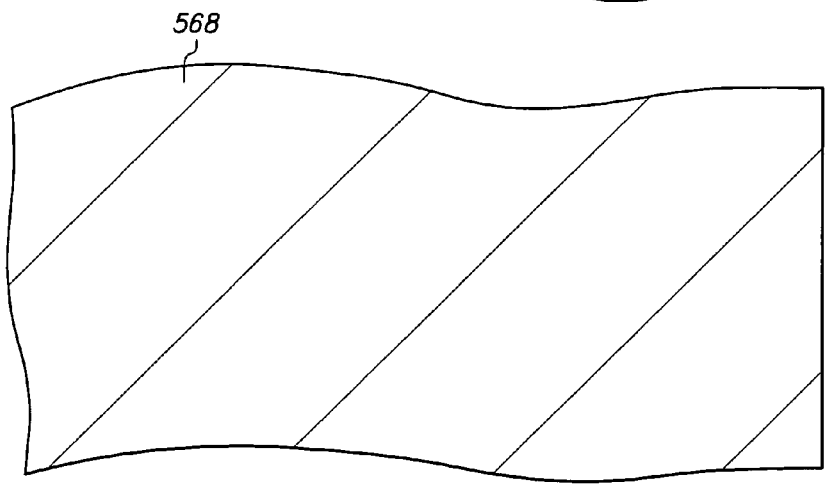
Figure 83C:
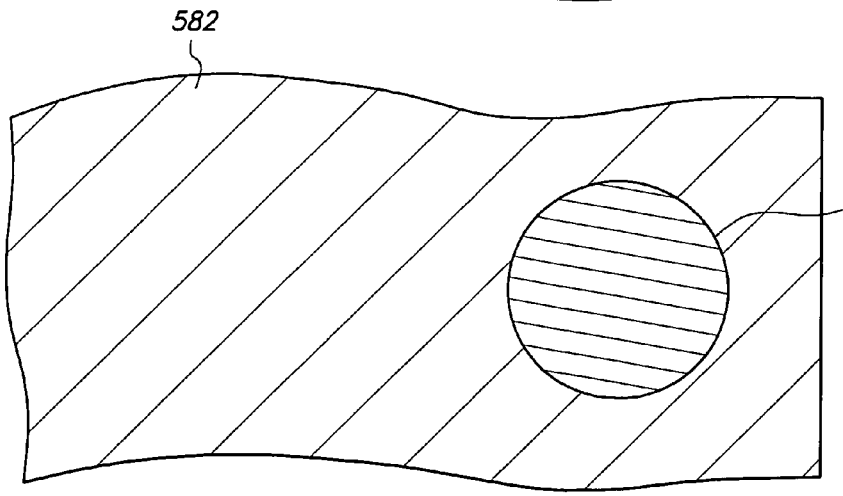

FIGS. 83A, 83B and 83C are cross-sectional, top and bottom views, respectively, of a semiconductor chip assembly in accordance with a fifth embodiment of the present invention. In the fifth embodiment, the connection joint is electroplated. For purposes of brevity, any description in the first embodiment is incorporated herein insofar as the same is applicable, and the same description need not be repeated. Likewise, elements of the fifth embodiment similar to those in the first embodiment have corresponding reference numerals indexed at five-hundred rather than one-hundred. For instance, chip 510 corresponds to chip 110, routing line 550 corresponds to routing line 150, etc.

Pad 516 is treated to accommodate an electroplated copper connection joint by forming a nickel surface layer on the aluminum base. For instance, chip 510 is dipped in a zinc solution to deposit a zinc layer on the aluminum base. This step is commonly known as zincation. Preferably, the zinc solution contains about 150 grams/liter of NaOH, 25 grams/liter of ZnO, and 1 gram/liter of $NaNO_3$, as well as tartaric acid to reduce the rate at which the aluminum base dissolves. Thereafter, the nickel surface layer is electrolessly deposited on the zincated aluminum base. A suitable electroless nickel plating solution is Enthone Enplate NI-424 at 85° C.

Routing line 550 extends within and outside the periphery of chip 510. Thus, the elongated routing portion (corresponding to elongated routing portion 152) is lengthened. This is accomplished by a slight adjustment to the electroplating operation previously described for routing line 150. In particular, the photoresist layer (corresponding to photoresist layer 144) is patterned to reshape the opening for routing line 550, and therefore routing line 550 is lengthened relative to routing line 150.

The metal base (corresponding to metal base 120) is etched to form a second back-side recess (not shown), the plated contact (corresponding to plated contact 162) is omitted, and adhesive 564 is deposited on routing line 550 and solder mask 556. Chip 510 is inverted and positioned such that surface 512 faces downwardly, surface 514 faces upwardly, adhesive 564 contacts and is sandwiched between and has a thickness of 5 microns between pad 516 and routing line 550, and routing line 550 partially overlaps pad 516. Thereafter, encapsulant 568 is formed, and then the metal base is etched again to convert the second back-side recess into a slot (not shown) that extends through the metal base, exposes solder mask 556 and is vertically aligned with pad 516.

Thereafter, through-hole 565 is formed in solder mask 556 and adhesive 564 that exposes pad 516. Through-hole 565 is formed by applying a suitable etch that is highly selective of solder mask 556 and adhesive 564 with respect to pad 516 and routing line 550. In this instance, a selective TEA $CO_2$ laser etch is applied. The laser is directed at and vertically aligned with and centered relative to pad 516. The laser has a spot size of 70 microns, and pad 516 has a length and width of 100 microns. As a result, the laser strikes pad 516 and portions of routing line 550, solder mask 556 and adhesive 564 that extend within the periphery of pad 516, and ablates solder mask 556 and adhesive 564. The laser drills through and removes a portion of solder mask 556 and adhesive 564. However, portions of solder mask 556 and adhesive 564 that extend across the peripheral edges of pad 516 are outside the scope of the laser and remain intact. Likewise, routing line 550 shields a portion of adhesive 564 from the laser etch, and a portion of adhesive 564 sandwiched between pad 516 and routing line 550 remains intact. The laser etch is anisotropic, and therefore little or none of adhesive 564 sandwiched between pad 516 and routing line 550 is undercut or removed. Through-hole 565 may slightly undercut adhesive 564 between pad 516 and routing line 550 and have a diameter that is slightly larger than 70 microns due to the beam angle of the laser, the thermal effects of the laser, and/or the isotropic nature of an oxygen plasma or wet chemical cleaning step. For convenience of explanation, this slight undercut and enlargement is ignored. However, through-hole 565 is formed without damaging chip 510 or routing line 550 and does not extend into chip 510.

Thereafter, a brief cleaning step can be applied to remove oxides and debris that may be present on the exposed portions of pad 516 and routing line 550. For instance, a brief oxygen plasma cleaning step can be applied to the structure. Alternatively, a brief wet chemical cleaning step using a solution containing potassium permanganate can be applied to the structure. In either case, the cleaning step cleans the exposed portions of pad 516 and routing line 550 without damaging the structure.

Thereafter, connection joint 566 is formed by an electroplating operation. Initially, the metal base is connected to a plating bus (not shown), current is applied to the plating bus from an external power source, and the structure is submerged in an electrolytic copper plating solution such as Sel-Rex CUBATH MT™ at room temperature. As a result, connection joint 566 electroplates on the exposed portions of the metal base. In addition, since the plating bus provides the current to the metal base, which in turn provides the current to routing line 550, connection joint 566 electroplates on the exposed portions of routing line 550 in through-hole 565. At the initial stage, since adhesive 564 is an electrical insulator and pad 516 is not connected to the plating bus, connection joint 566 does not electroplate on pad 516 and is spaced from pad 516. However, as the copper electroplating continues, connection joint 566 continues to plate on routing line 550, extends through adhesive 564 and contacts pad 516. As a result, pad 516 is connected to the plating bus by the metal base, routing line 550 and connection joint 566, and therefore connection joint 566 begins to electroplate on pad 516 as well. The copper electroplating continues until connection joint 566 has the desired thickness. Thereafter, the structure is removed from the electrolytic copper plating solution and rinsed in distilled water to remove contaminants.

Thereafter, insulative plug 569 is formed on solder mask 556 and connection joint 566 and disposed within the slot, and then metal pillar 570, insulative base 582 and solder terminal 586 are formed.

Semiconductor chip assembly 598 includes chip 510, metal containment wall 532, routing line 550, solder mask 556, adhesive 564, connection joint 566, encapsulant 568, insulative plug 569, metal pillar 570, insulative base 582 and solder terminal 586.

Figure 84A:
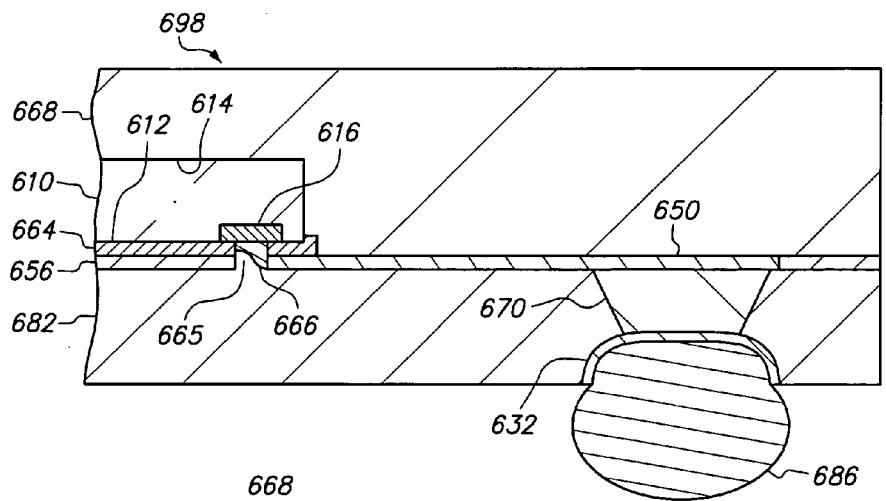
FIGS. 84A, 84B and 84C are cross-sectional, top and bottom views, respectively, of a semiconductor chip assembly in accordance with a sixth embodiment of the present invention.
Figure 84B:
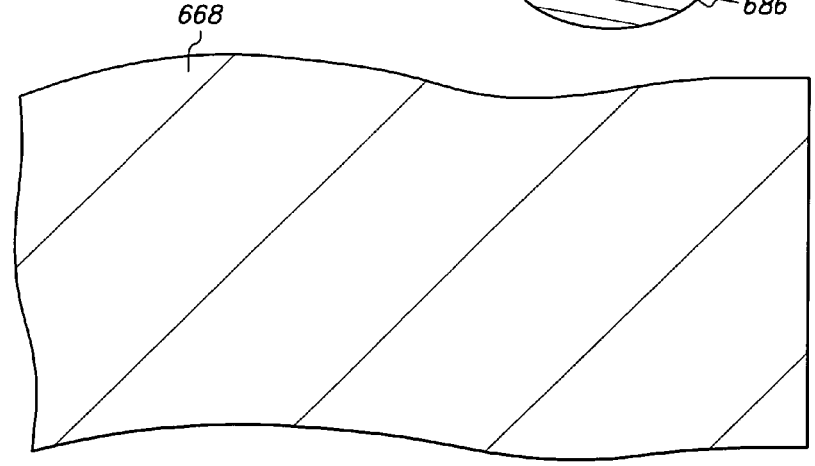
Figure 84C:
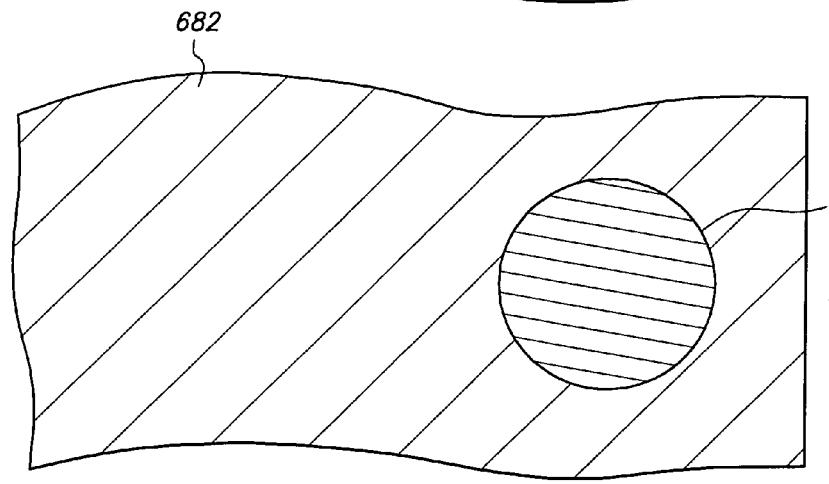

FIGS. 84A, 84B and 84C are cross-sectional, top and bottom views, respectively, of a semiconductor chip assembly in accordance with a sixth embodiment of the present invention. In the sixth embodiment, the connection joint is electrolessly plated. For purposes of brevity, any description in the first embodiment is incorporated herein insofar as the same is applicable, and the same description need not be repeated. Likewise, elements of the sixth embodiment similar to those in the first embodiment have corresponding reference numerals indexed at six-hundred rather than one-hundred. For instance, chip 610 corresponds to chip 110, routing line 650 corresponds to routing line 150, etc.

Pad 616 is treated to include a nickel surface layer in the same manner as pad 516, routing line 650 is configured in the same manner as routing line 550, adhesive 664 is deposited on routing line 650 and solder mask 656 in the same manner that adhesive 564 is deposited on routing line 550 and solder mask 556, and the plated contact (corresponding to plated contact 162) is omitted.

Chip 610 is inverted and positioned such that surface 612 faces downwardly, surface 614 faces upwardly, adhesive 664 contacts and is sandwiched between and has a thickness of 5 microns between pad 616 and routing line 650, and routing line 650 partially overlaps pad 616. Thereafter, encapsulant 668 is formed, and then the metal base (corresponding to metal base 120) is etched to form metal pillar 670. Thereafter, through-hole 665 is formed in solder mask 656 and adhesive 664 and exposes pad 616. Through-hole 665 is formed in the same manner as through-hole 565.

Thereafter, connection joint 666 is formed by an electroless plating operation. The structure is submerged in an electroless nickel plating solution such as Enthone Enplate NI-424 at 85° C. Preferred nickel plating solutions include nickel-sulfate and nickel-chloride and have a pH of about 9.5 to 10.5. A higher nickel concentration provides a faster plating rate but reduces the stability of the solution. The amount of chelating agents or ligands in the solution depends on the nickel concentration and their chemical structure, functionality and equivalent weight. Most of the chelating agents used in electroless nickel plating solutions are hydroxy organic acids which form one or more water soluble nickel ring complexes. These complexes reduce the free nickel ion concentration, thereby increasing the stability of the solution while retaining a reasonably fast plating rate. Generally, the higher the complex agent concentration, the slower the plating rate. In addition, the pH of the solution and the plating rate continually decrease as the electroless plating continues due to hydrogen ions being introduced into the solution as a byproduct of the nickel reduction. Accordingly, the solution is buffered to offset the effects of the hydrogen ions. Suitable buffering agents include sodium or potassium salts of mono and dibasic organic acids. Finally, those skilled in the art will understand that electroless nickel plating solutions do not deposit pure elemental nickel since a reducing agent such as $H_2PO_2$ will naturally decompose into the electrolessly plated nickel. Therefore, those skilled in the art will understand that electrolessly plated nickel refers to a nickel compound that is mostly nickel but not pure elemental nickel.

Pad 616 includes an exposed nickel surface layer and therefore is catalytic to electroless nickel. Furthermore, solder mask 656, adhesive 664 and encapsulant 668 are not catalytic to electroless nickel and therefore a plating mask is not necessary. Connection joint 666 plates on pad 616 and eventually contacts and electrically connects pad 616 and routing line 650 in through-hole 665. The electroless nickel plating operation continues until connection joint 666 is about 10 microns thick. Thereafter, the structure is removed from the electroless nickel plating solution and rinsed in distilled water.

Thereafter, insulative base 682 and solder terminal 686 are formed.

Semiconductor chip assembly 698 includes chip 610, metal containment wall 632, routing line 650, solder mask 656, adhesive 664, connection joint 666, encapsulant 668, metal pillar 670, insulative base 682 and solder terminal 686.

Figure 85A:
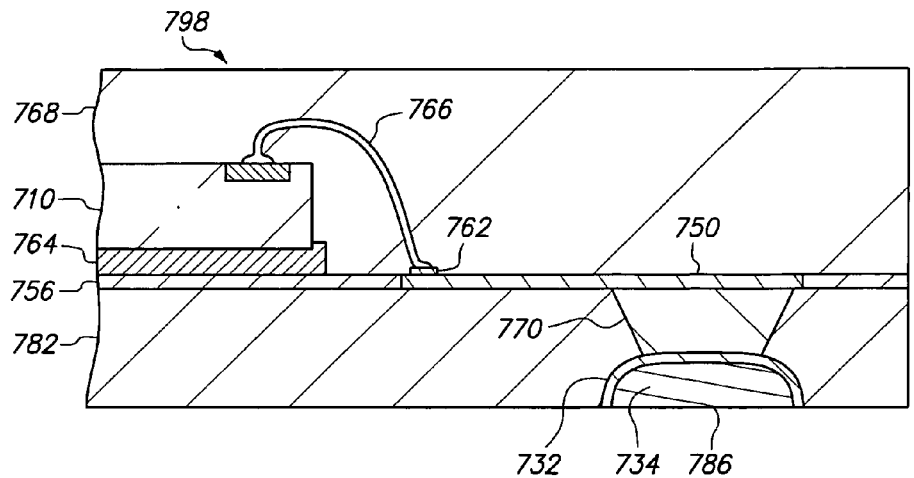
FIGS. 85A, 85B and 85C are cross-sectional, top and bottom views, respectively, is of a semiconductor chip assembly in accordance with a seventh embodiment of the present invention.
Figure 85B:
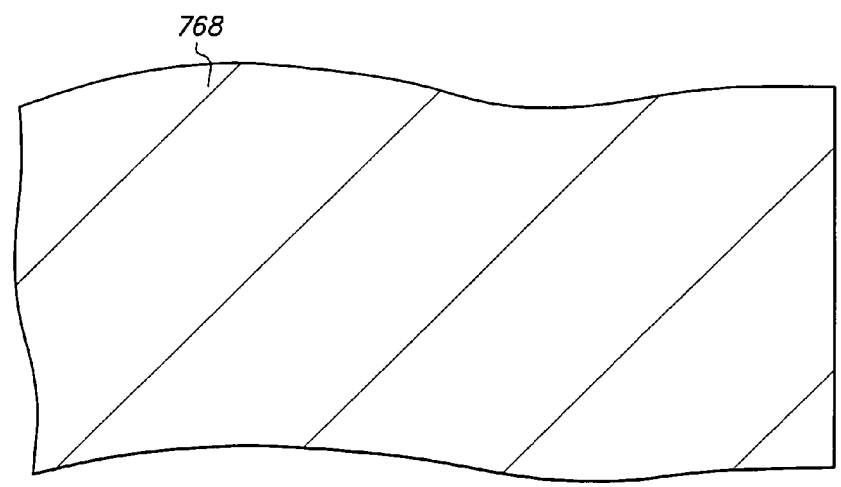
Figure 85C:
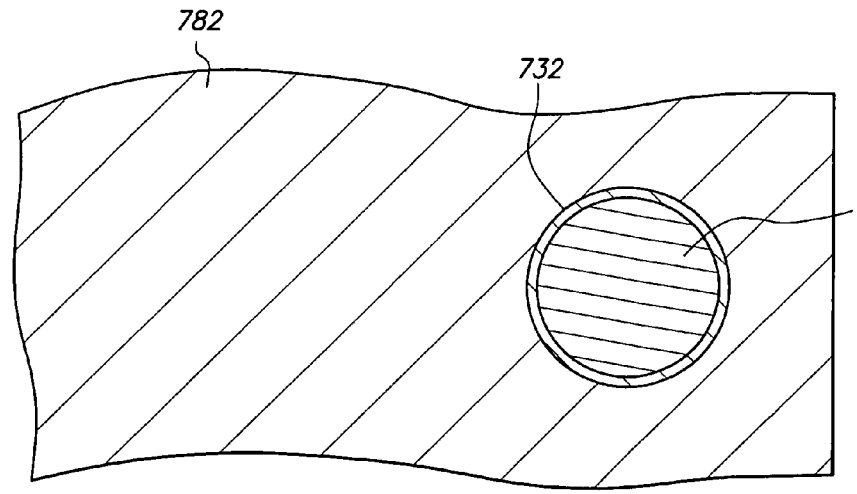

FIGS. 85A, 85B and 85C are cross-sectional, top and bottom views, respectively, of a semiconductor chip assembly in accordance with a seventh embodiment of the present invention. In the seventh embodiment, the solder layer provides the solder terminal. For purposes of brevity, any description in the first embodiment is incorporated herein insofar as the same is applicable, and the same description need not be repeated. Likewise, elements of the seventh embodiment similar to those in the first embodiment have corresponding reference numerals indexed at seven-hundred rather than one-hundred. For instance, chip 710 corresponds to chip 110, routing line 750 corresponds to routing line 150, etc.

The solder ball (corresponding to solder ball 184) is omitted, and therefore the solder layer (corresponding to solder layer 142) provides solder terminal 786. Solder terminal 786 is disposed within cavity 734, and metal containment wall 732, insulative base 782 and solder terminal 786 and are laterally aligned with one another at a surface that faces downwardly. Thus, an exposed planarized horizontal surface that faces downwardly includes metal containment wall 732, insulative base 782 and solder terminal 786. Furthermore, the conductive traces each include a laterally aligned (rather than downwardly protruding) solder terminal to provide a land grid array (LGA) package.

Semiconductor chip assembly 798 includes chip 710, metal containment wall 732, routing line 750, solder mask 756, plated contact 762, adhesive 764, connection joint 766, encapsulant 768, metal pillar 770, insulative base 782 and solder terminal 786.

Figure 86A:
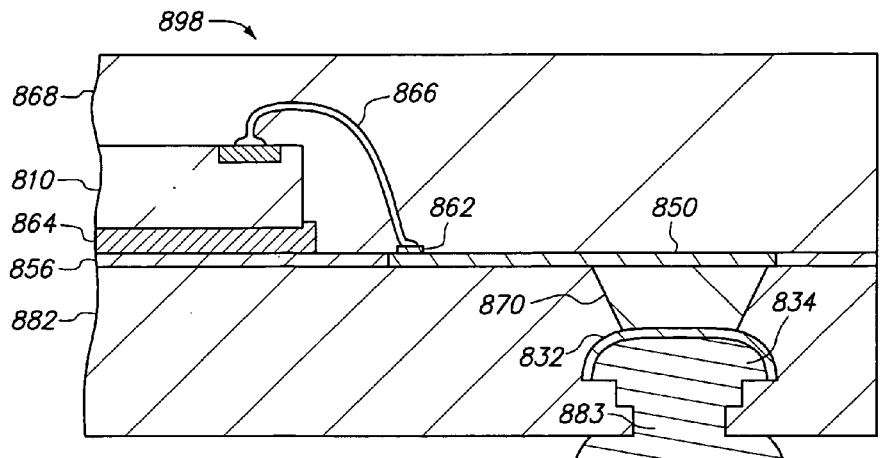
FIGS. 86A, 86B and 86C are cross-sectional, top and bottom views, respectively, of a semiconductor chip assembly in accordance with an eighth embodiment of the present invention.
Figure 86B:
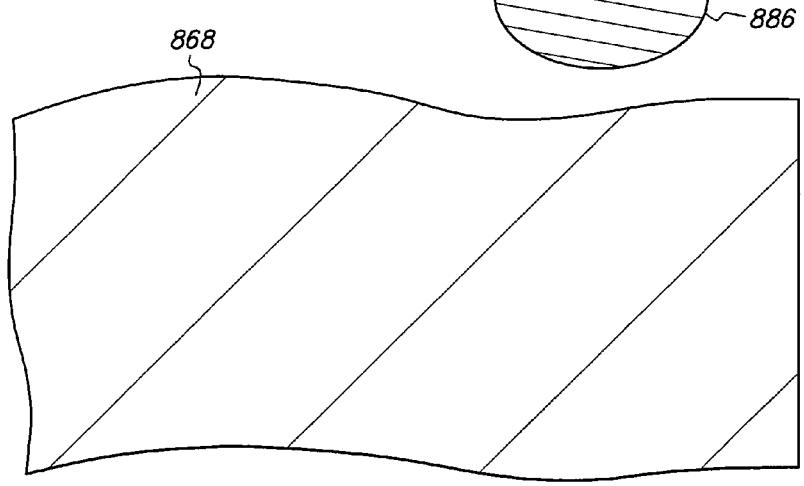
Figure 86C:
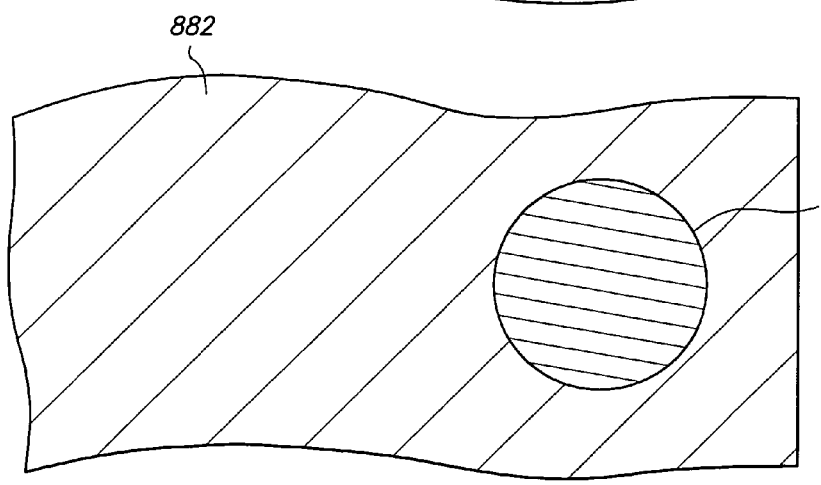

FIGS. 86A, 86B and 86C are cross-sectional, top and bottom views, respectively, of a semiconductor chip assembly in accordance with an eighth embodiment of the present invention. In the eighth embodiment, the portion of the insulative base is removed by laser ablation. For purposes of brevity, any description in the first embodiment is incorporated herein insofar as the same is applicable, and the same description need not be repeated. Likewise, elements of the eighth embodiment similar to those in the first embodiment have corresponding reference numerals indexed at eight-hundred rather than one-hundred. For instance, chip 810 corresponds to chip 110, routing line 850 corresponds to routing line 150, etc.

Insulative base 882 is formed without a filler. As a result, insulative base 882 is more susceptible to laser etching than insulative base 182. The grinding operation is omitted, and instead a selective TEA $CO_2$ laser etch is applied using multiple laser direct writes. The laser is directed at the solder layer (corresponding to solder layer 142). The laser has a spot size of 100 microns. Furthermore, the laser direct writes are offset relative to one another yet overlap so that the laser scans a central portion of the solder layer with a diameter of 150 microns. In this manner, the laser direct writes in combination are vertically aligned with and centered relative to metal containment wall 832, metal pillar 870 and the solder layer. As a result, the laser strikes the solder layer, a portion of insulative base 882 that overlaps the solder layer, and ablates insulative base 882.

The laser drills through and removes a portion of insulative base 882. However, a portion of insulative base 882 that extends across the periphery of the solder layer is outside the scope of the laser and remains intact. Thus, insulative base 882 continues to contact and overlap but no longer covers the solder layer.

Thereafter, a brief cleaning step can be applied to remove oxides and debris that may be present on the exposed portion of the solder layer. For instance, a brief oxygen plasma cleaning step can be applied to the structure. Alternatively, a brief wet chemical cleaning step using a solution containing potassium permanganate can be applied to the structure. In either case, the cleaning step cleans the exposed portion of the solder layer without damaging the structure.

Opening 883 is formed in and extends vertically into but not through insulative base 882, is disposed outside the periphery of chip 810, is vertically aligned with metal containment wall 832, metal pillar 870 and the solder layer, exposes the solder layer, is spaced from metal containment wall 832, routing line 850, solder mask 856 and metal pillar 870 and has a diameter of 150 microns. Opening 883 is formed without damaging or extending into the solder layer.

Opening 883 may have a diameter that is slightly larger than 150 microns due to the beam angle of the laser, the thermal effects of the laser, and/or the isotropic nature of an oxygen plasma or wet chemical cleaning step. For convenience of explanation, this slight enlargement is ignored.

Thereafter, solder terminal 886 is formed. Solder terminal 886 extends within and outside and fills opening 883 and extends downwardly beyond insulative base 882. Furthermore, although the entire portion of solder terminal 886 that extends into insulative base 882 is not disposed within cavity 834, the entire portion of solder terminal 886 that extends into insulative base 882 is within a surface area of cavity 834.

Semiconductor chip assembly 898 includes chip 810, metal containment wall 832, routing line 850, solder mask 856, plated contact 862, adhesive 864, connection joint 866, encapsulant 868, metal pillar 870, insulative base 882 and solder terminal 886.

Figure 87A:
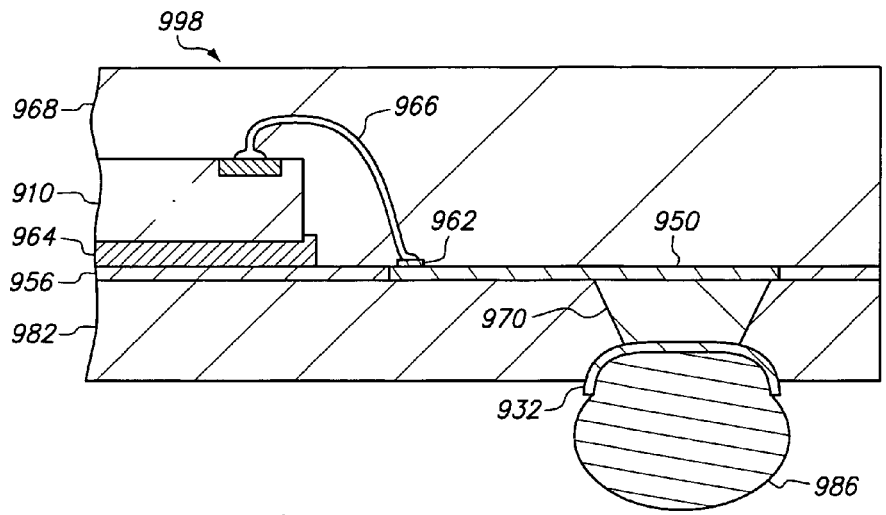
FIGS. 87A, 87B and 87C are cross-sectional, top and bottom views, respectively, of a semiconductor chip assembly in accordance with a ninth embodiment of the present invention.
Figure 87B:
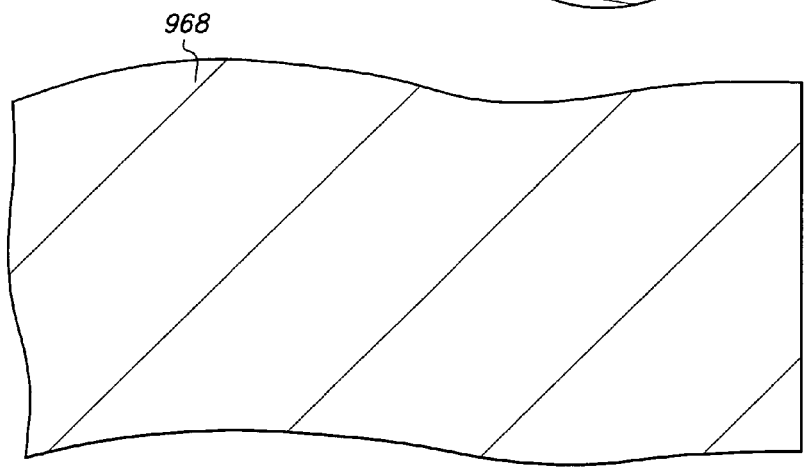
Figure 87C:
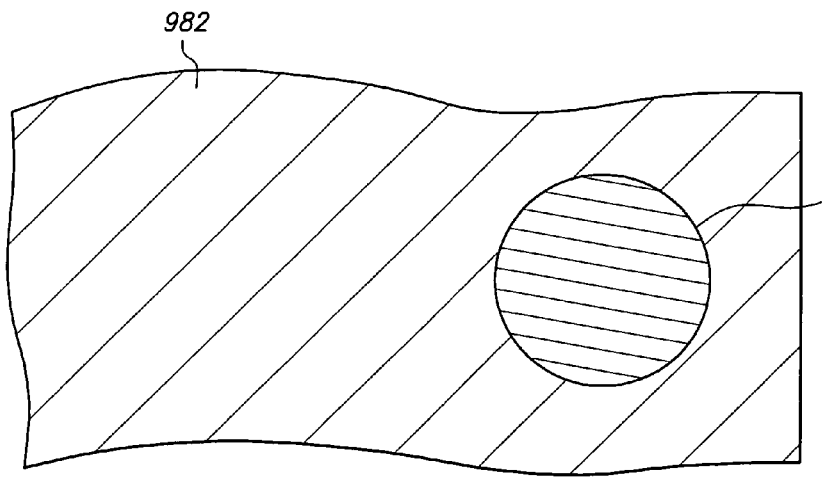

FIGS. 87A, 87B and 87C are cross-sectional, top and bottom views, respectively, of a semiconductor chip assembly in accordance with an ninth embodiment of the present invention. In the ninth embodiment, the portion of the insulative base is removed by plasma etching. For purposes of brevity, any description in the first embodiment is incorporated herein insofar as the same is applicable, and the same description need not be repeated. Likewise, elements of the ninth embodiment similar to those in the first embodiment have corresponding reference numerals indexed at nine-hundred rather than one-hundred. For instance, chip 910 corresponds to chip 110, routing line 950 corresponds to routing line 150, etc.

Insulative base 982 is formed without a filler. As a result, insulative base 982 is more susceptible to plasma etching than insulative base 182. The grinding operation is omitted, and instead a blanket back-side plasma etch is applied to the structure. The plasma etch is highly selective of epoxy with respect to nickel and solder, and therefore, highly selective of insulative base 982 with respect to metal containment wall 932 and solder terminal 986. The plasma etch removes an 80 micron thick lower portion of insulative base 982. As a result, metal containment wall 932 and solder terminal 986 protrude from and extend downwardly beyond insulative base 982, and insulative base 982 is recessed relative to metal containment wall 932 and solder terminal 986 in the downward direction. Furthermore, insulative base 982 extends downwardly beyond metal pillar 970, and metal pillar 970 remains unexposed.

Semiconductor chip assembly 998 includes chip 910, metal containment wall 932, routing line 950, solder mask 956, plated contact 962, adhesive 964, connection joint 966, encapsulant 968, metal pillar 970, insulative base 982 and solder terminal 986.

Figure 88A:
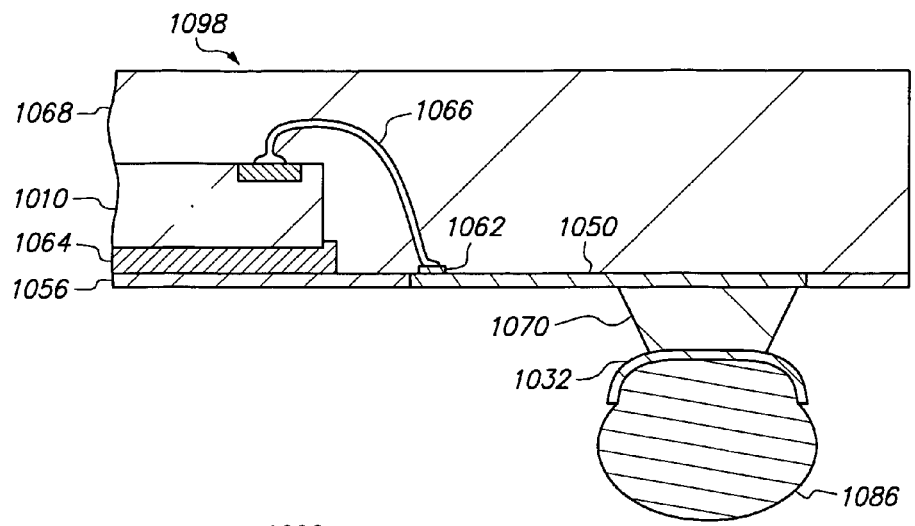
FIGS. 88A, 88B and 88C are cross-sectional, top and bottom views, respectively, of a semiconductor chip assembly in accordance with a tenth embodiment of the present invention.
Figure 88B:
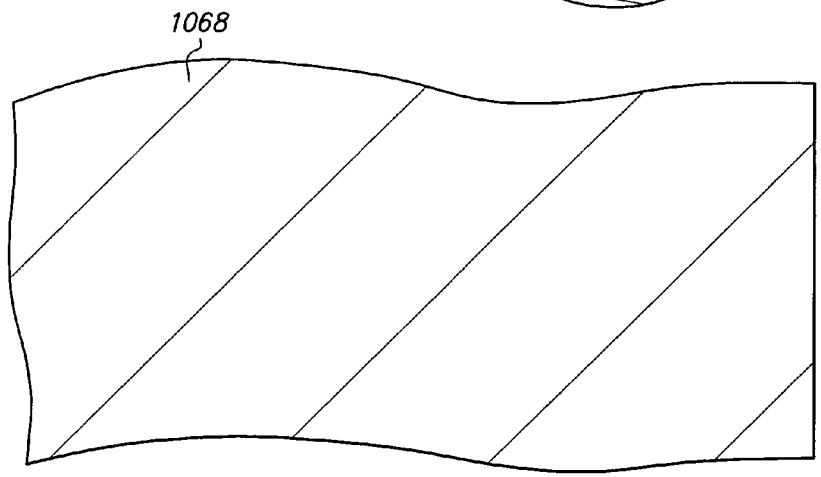
Figure 88C:
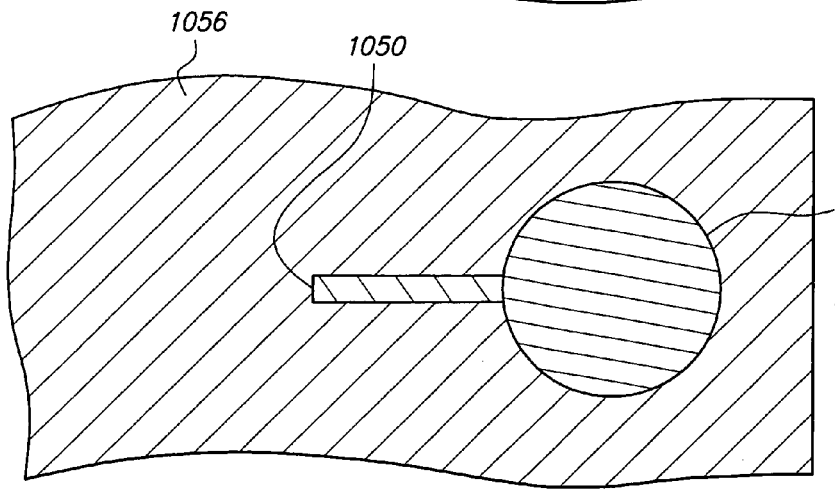

FIGS. 88A, 88B and 88C are cross-sectional, top and bottom views, respectively, of a semiconductor chip assembly in accordance with a tenth embodiment of the present invention. In the tenth embodiment, the insulative base is omitted. For purposes of brevity, any description in the first embodiment is incorporated herein insofar as the same is applicable, and the same description need not be repeated. Likewise, elements of the tenth embodiment similar to those in the first embodiment have corresponding reference numerals indexed at one-thousand rather than one-hundred. For instance, chip 1010 corresponds to chip 110, routing line 1050 corresponds to routing line 150, etc.

The insulative base (corresponding to insulative base 182) is omitted, and therefore the grinding operation is unnecessary.

Semiconductor chip assembly 1098 includes chip 1010, metal containment wall 1032, routing line 1050, solder mask 1056, plated contact 1062, adhesive 1064, connection joint 1066, encapsulant 1068, metal pillar 1070, and solder terminal 1086.

Figure 89A:
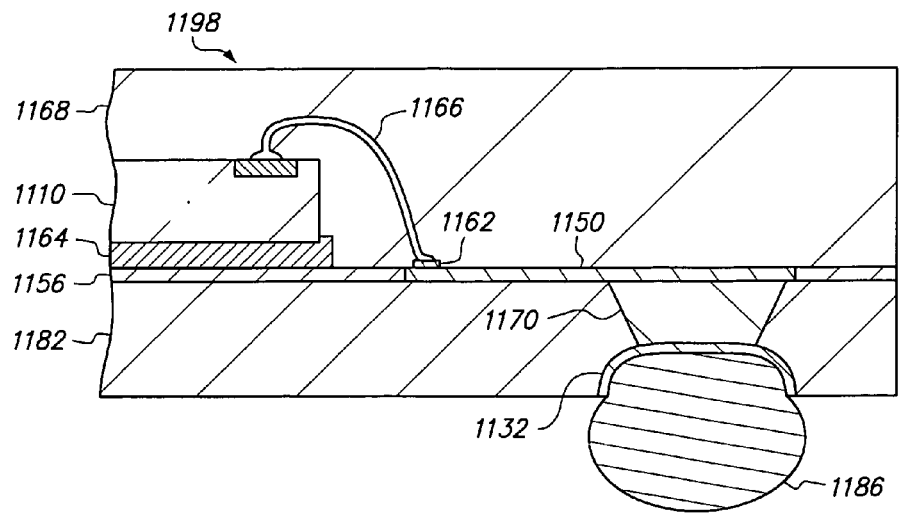
FIGS. 89A, 89B and 89C are cross-sectional, top and bottom views, respectively, of a semiconductor chip assembly in accordance with an eleventh embodiment of the present invention.
Figure 89B:
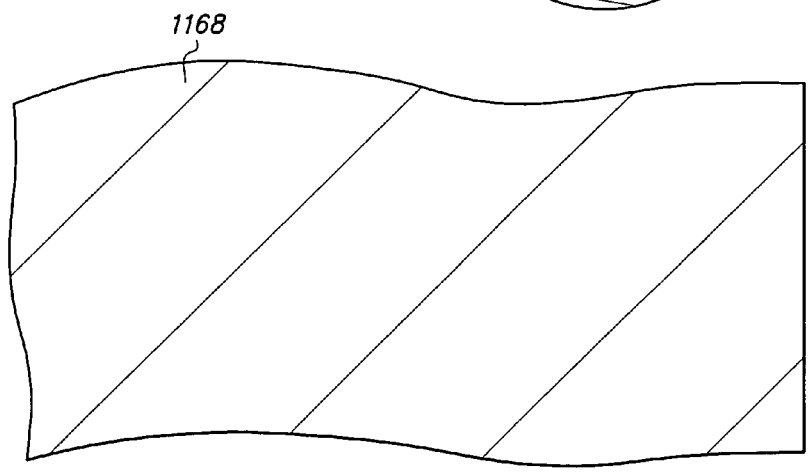
Figure 89C:
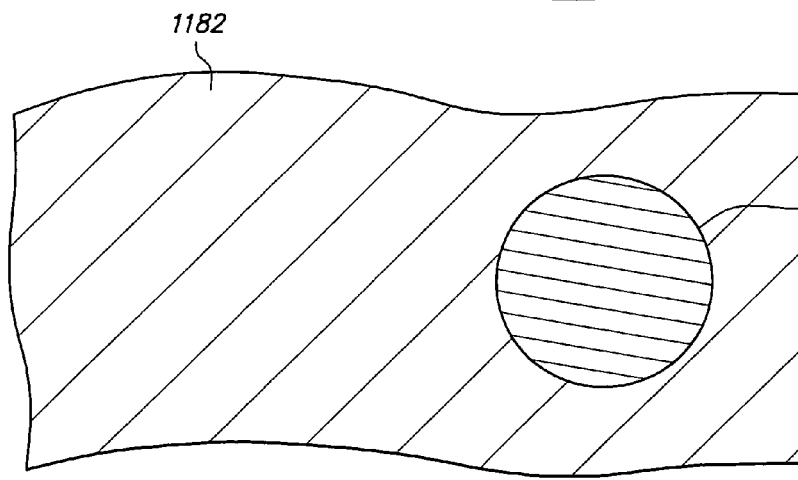

FIGS. 89A, 89B and 89C are cross-sectional, top and bottom views, respectively, of a semiconductor chip assembly in accordance with an eleventh embodiment of the present invention. In the eleventh embodiment, the metal containment wall and the routing line are simultaneously formed. For purposes of brevity, any description in the first embodiment is incorporated herein insofar as the same is applicable, and the same description need not be repeated. Likewise, elements of the eleventh embodiment similar to those in the first embodiment have corresponding reference numerals indexed at eleven-hundred rather than one-hundred. For instance, chip 1110 corresponds to chip 110, routing line 1150 corresponds to routing line 150, etc.

Metal containment wall 1132 and routing line 1150 are simultaneously formed during an electroplating operation. This is accomplished by a slight adjustment to the electroplating operation previously described for metal containment wall 132. In particular, the photoresist layer (corresponding to photoresist layer 126) is patterned like the photoresist layer (corresponding to photoresist layer 144) for routing line 1150. Furthermore, the recess (corresponding to recess 130) is formed by applying a back-side wet chemical etch without applying a front-side wet chemical etch since the photoresist layer (corresponding to photoresist layer 126) selectively exposes the front-side of the metal base (corresponding to metal base 120). For instance, the bottom spray nozzle can spray the wet chemical etch on the metal base while the top spray nozzle is deactivated. Thereafter, metal containment wall 1132 and routing line 1150 are simultaneously electroplated on the metal base. As a result, metal containment wall 1132 and routing line 1150 are each composed of a nickel layer electroplated on the metal base and a gold layer electroplated on the nickel layer. Furthermore, the nickel layer is 30 microns thick (rather than 10 microns thick). In both metal containment wall 1132 and routing line 1150, the nickel layer contacts and is sandwiched between the metal base and the gold layer, is buried beneath the gold layer and has a thickness of 30 microns, and the gold contacts the nickel layer, is spaced from the metal base, is exposed and has a thickness of 0.1 microns. In addition, the photoresist layers (corresponding to photoresist layers 144 and 146) and related electroplating operation for routing line 1150 are omitted.

Thereafter, the solder layer (corresponding to solder layer 142), solder mask 1156, plated contact 1162 and adhesive 1164 are formed, chip 1110 is mounted on adhesive 1164, and then connection joint 1166, encapsulant 1168, metal pillar 1170, insulative base 1182 and solder terminal 1186 are formed.

Semiconductor chip assembly 1198 includes chip 1110, metal containment wall 1132, routing line 1150, solder mask 1156, plated contact 1162, adhesive 1164, connection joint 1166, encapsulant 1168, metal pillar 1170, insulative base 1182 and solder terminal 1186.

Figure 90A:
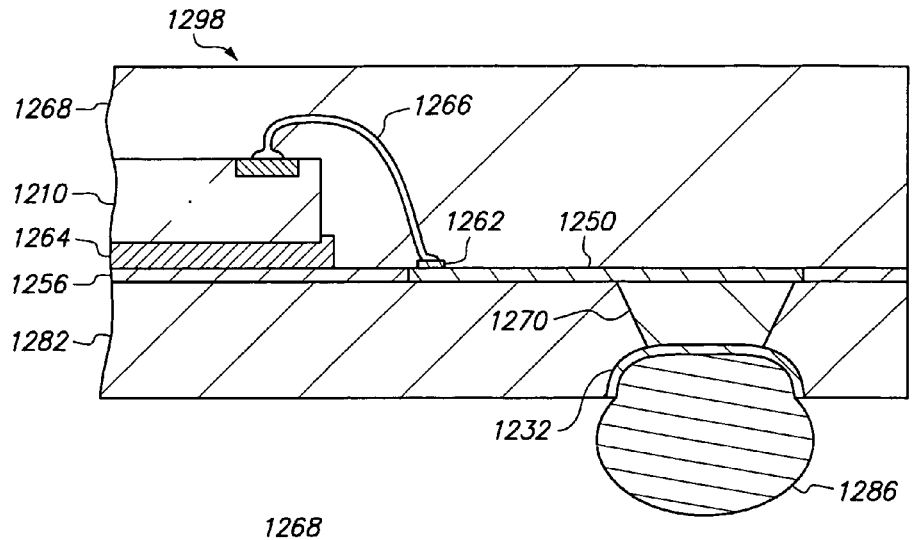
FIGS. 90A, 90B and 90C are cross-sectional, top and bottom views, respectively, of a semiconductor chip assembly in accordance with a twelfth embodiment of the present invention.
Figure 90B:
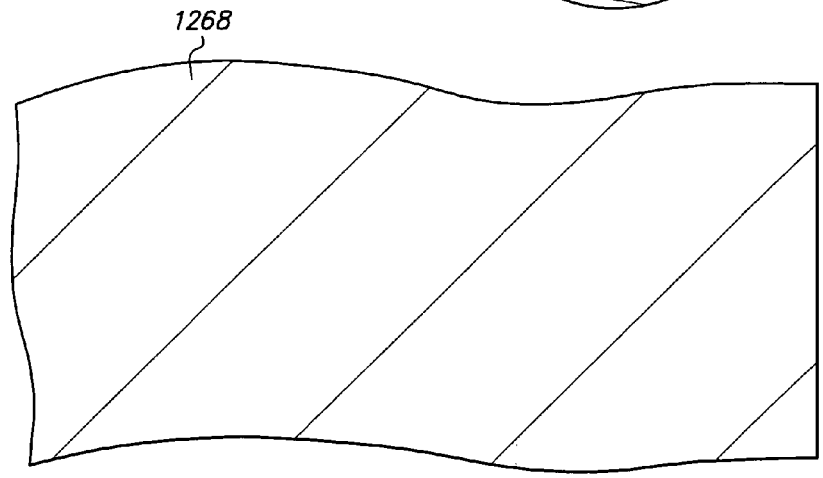
Figure 90C:
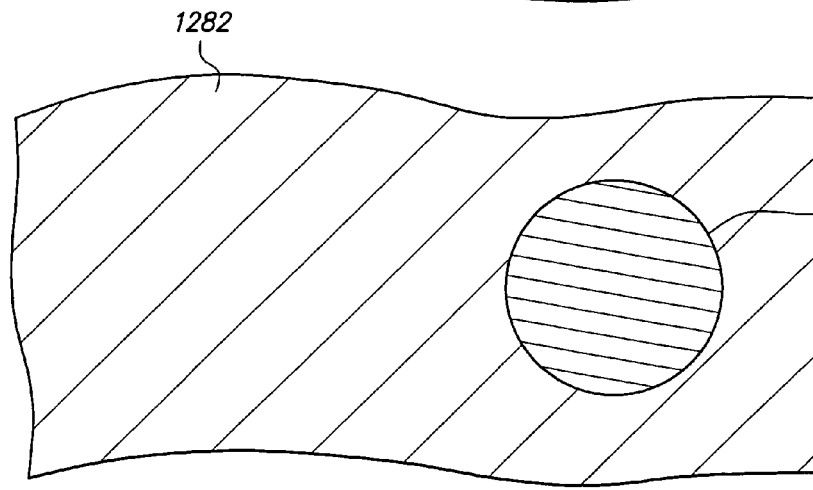

FIGS. 90A, 90B and 90C are cross-sectional, top and bottom views, respectively, of a semiconductor chip assembly in accordance with a twelfth embodiment of the present invention. In the twelfth embodiment, the metal containment wall and the plated contact are simultaneously formed. For purposes of brevity, any description in the first embodiment is incorporated herein insofar as the same is applicable, and the same description need not be repeated. Likewise, elements of the twelfth embodiment similar to those in the first embodiment have corresponding reference numerals indexed at twelve-hundred rather than one-hundred. For instance, chip 1210 corresponds to chip 110, routing line 1250 corresponds to routing line 150, etc.

Metal containment wall 1232 and plated contact 1262 are simultaneously formed during an electroplating operation. This is accomplished by a slight adjustment to the electroplating operation previously described for metal containment wall 132. In particular, after routing line 1250 and solder mask 1256 are formed, the photoresist layer (corresponding to photoresist layer 126) is patterned like the photoresist layer (corresponding to photoresist layer 158) for plated contact 1262. Furthermore, the recess (corresponding to recess 130) is formed by applying a back-side wet chemical etch without applying a front-side wet chemical etch since the photoresist layer (corresponding to photoresist layer 126) selectively exposes the copper layer of routing line 1250. For instance, the bottom spray nozzle can spray the wet chemical etch on the metal base (corresponding to metal base 120) while the top spray nozzle is deactivated. Thereafter, metal containment wall 1232 and plated contact 1262 are simultaneously electroplated on the metal base and routing line 1250, respectively. As a result, metal containment wall 1232 and plated contact 1262 are each composed of a nickel layer with a thickness of 10 microns and a gold layer with a thickness of 0.1 microns. In addition, the photoresist layers (corresponding to photoresist layers 158 and 160) and related electroplating operation for plated contact 1162 are omitted.

Thereafter, the solder layer (corresponding to solder layer 142) and adhesive 1264 are formed, chip 1210 is mounted on adhesive 1264, and then connection joint 1266, encapsulant 1268, metal pillar 1270, insulative base 1282 and solder terminal 1286 are formed.

Semiconductor chip assembly 1298 includes chip 1210, metal containment wall 1232, routing line 1250, solder mask 1256, plated contact 1262, adhesive 1264, connection joint 1266, encapsulant 1268, metal pillar 1270, insulative base 1282 and solder terminal 1286.

Figure 91A:
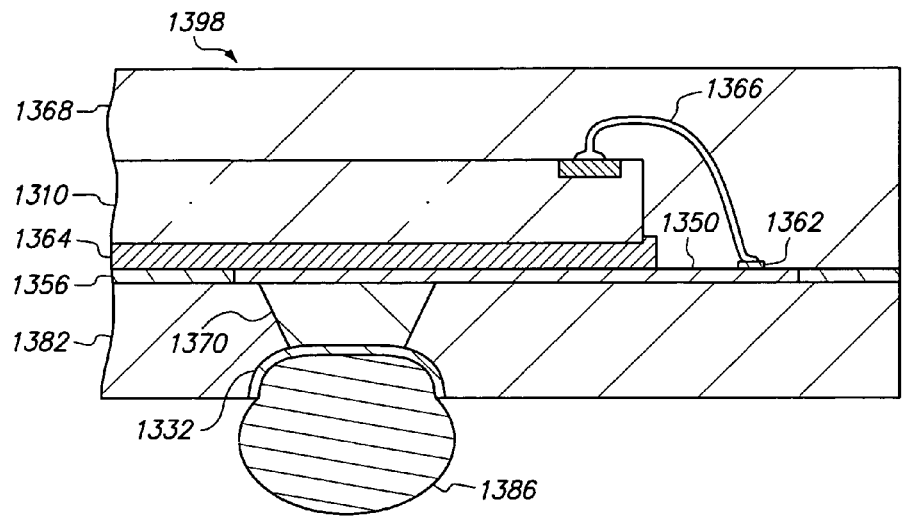
FIGS. 91A, 91B and 91C are cross-sectional, top and bottom views, respectively, of a semiconductor chip assembly in accordance with a thirteenth embodiment of the present invention.
Figure 91B:
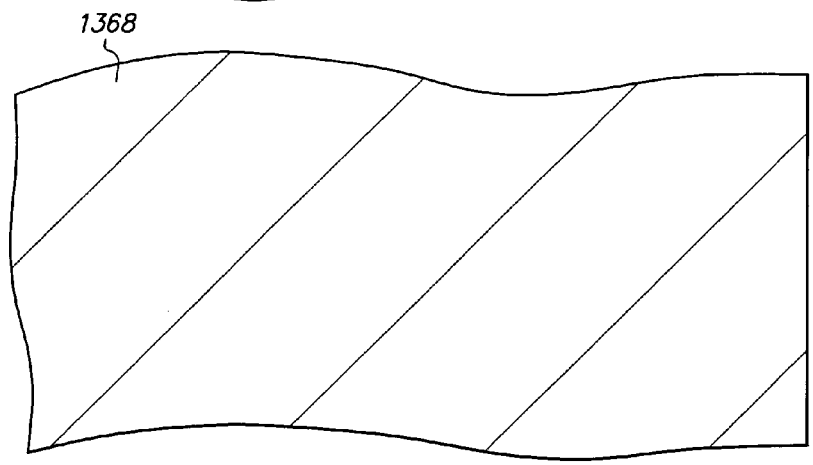
Figure 91C:
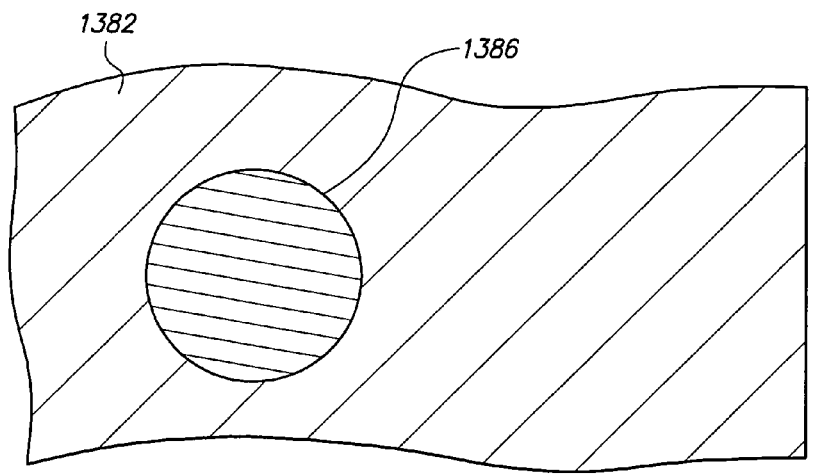

FIGS. 91A, 91B and 91C are cross-sectional, top and bottom views, respectively, of a semiconductor chip assembly in accordance with a thirteenth embodiment of the present invention. In the thirteenth embodiment, the metal containment wall, the metal pillar and the solder terminal are disposed within the periphery of the chip. For purposes of brevity, any description in the first embodiment is incorporated herein insofar as the same is applicable, and the same description need not be repeated. Likewise, elements of the thirteenth embodiment similar to those in the first embodiment have corresponding reference numerals indexed at thirteen-hundred rather than one-hundred. For instance, chip 1310 corresponds to chip 110, routing line 1350 corresponds to routing line 150, etc.

Routing line 1350 extends within and outside the periphery of chip 1310, and metal containment wall 1332, metal pillar 1370 and solder terminal 1386 are disposed within the periphery of chip 1310. This is accomplished by a slight adjustment to the etching operation previously described for recess 130 and the electroplating operation previously described for routing line 150. In particular, the photoresist layer (corresponding to photoresist layer 128) is patterned to laterally shift the opening for the recess (corresponding to recess 130), and therefore the recess is laterally shifted relative to recess 130. Thereafter, the photoresist layer (corresponding to photoresist layer 144) is patterned to reshape the opening for routing line 1350, and therefore routing line 1350 is laterally shifted and rotated relative to routing line 150. As a result, metal containment wall 1332, metal pillar 1370 and solder terminal 1386 are disposed within the periphery of chip 1310.

Semiconductor chip assembly 1398 includes chip 1310, metal containment wall 1332, routing line 1350, solder mask 1356, plated contact 1362, adhesive 1364, connection joint 1366, encapsulant 1368, metal pillar 1370, insulative base 1382 and solder terminal 1386.

Figure 92A:
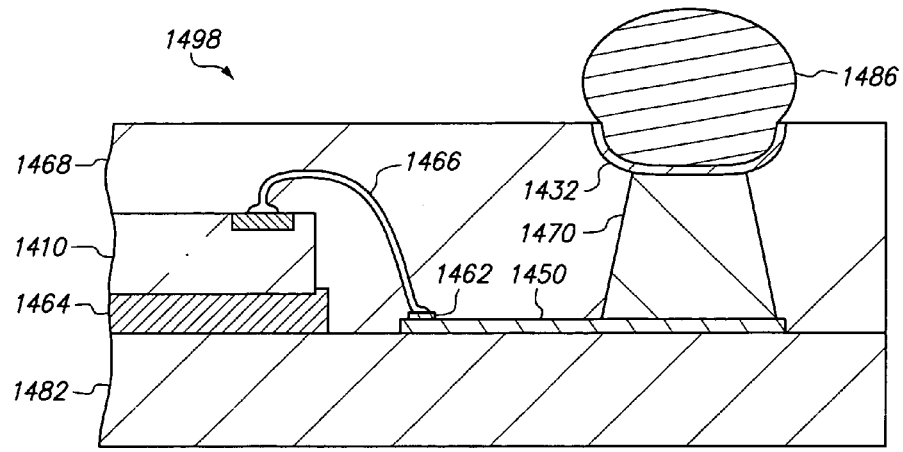
FIGS. 92A, 92B and 92C are cross-sectional, top and bottom views, respectively, of a semiconductor chip assembly in accordance with a fourteenth embodiment of the present invention.
Figure 92B:
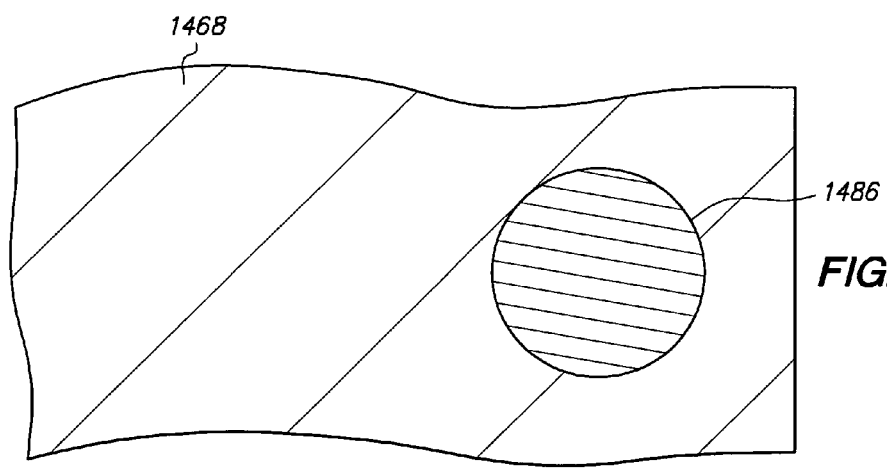
Figure 92C:
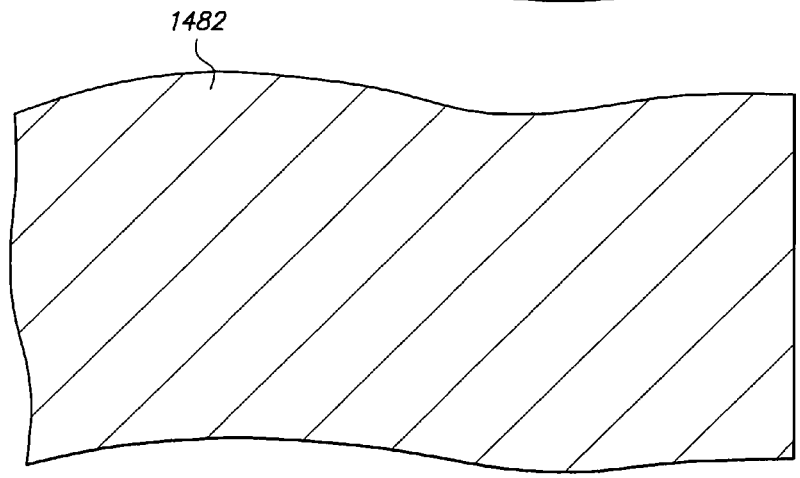

FIGS. 92A, 92B and 92C are cross-sectional, top and bottom views, respectively, of a semiconductor chip assembly in accordance with a fourteenth embodiment of the present invention. In the fourteenth embodiment, the metal pillar is inverted. For purposes of brevity, any description in the first embodiment is incorporated herein insofar as the same is applicable, and the same description need not be repeated. Likewise, elements of the fourteenth embodiment similar to those in the first embodiment have corresponding reference numerals indexed at fourteen-hundred rather than one-hundred. For instance, chip 1410 corresponds to chip 110, routing line 1450 corresponds to routing line 150, etc.

The metal base (corresponding to metal base 120) has a thickness of 500 microns (rather than 150 microns). The recess (corresponding to recess 130) and metal containment wall 1432 are formed on the upwardly facing surface (corresponding to surface 122) of the metal base, the solder layer (corresponding to solder layer 142) is formed on metal containment wall 1432, routing line 1450 is formed on the downwardly facing surface (corresponding to surface 124) of the metal base, and the solder mask (corresponding to solder mask 156) is omitted.

Thereafter, insulative base 1482 is deposited on routing line 1450 and the metal base, and then insulative base 1482 is partially polymerized and forms a gel.

Thereafter, the structure is placed on a support (not shown) similar to metal base 120 such that insulative base 1482 contacts the support and is sandwiched between the metal base and the support and between routing line 1450 and the support while insulative base 1482 is a gel, and then insulative base 1482 is hardened.

Thereafter, metal pillar 1470 is formed, and then plated contact 1462 is formed.

Thereafter, adhesive 1464 is deposited on insulative base 1482, then chip 1410 is placed on adhesive 1464, and then adhesive 1464 is hardened. Metal pillar 1470 is not disposed downwardly beyond chip 1410, and instead extends upwardly and downwardly beyond and vertically across the thickness of chip 1410. Furthermore, metal pillar 1470 has a thickness of 420 microns (rather than 70 microns).

Thereafter, connection joint 1466 is formed, and then encapsulant 1468 is formed. Encapsulant 1468 is similar to insulative base 182 (rather than encapsulant 168) and has a thickness of 600 microns (rather than 400 microns). Accordingly, encapsulant 1468 is deposited on chip 1410, routing line 1450, adhesive 1464, connection joint 1466, metal pillar 1470 and insulative base 1482, and then encapsulant 1468 is hardened.

Thereafter, encapsulant 1468 is grinded to expose metal containment wall 1432 and the solder layer, and then solder terminal 1486 is formed.

Semiconductor chip assembly 1498 includes chip 1410, metal containment wall 1432, routing line 1450, plated contact 1462, adhesive 1464, connection joint 1466, encapsulant 1468, metal pillar 1470, insulative base 1482 and solder terminal 1486.

Figure 93A:
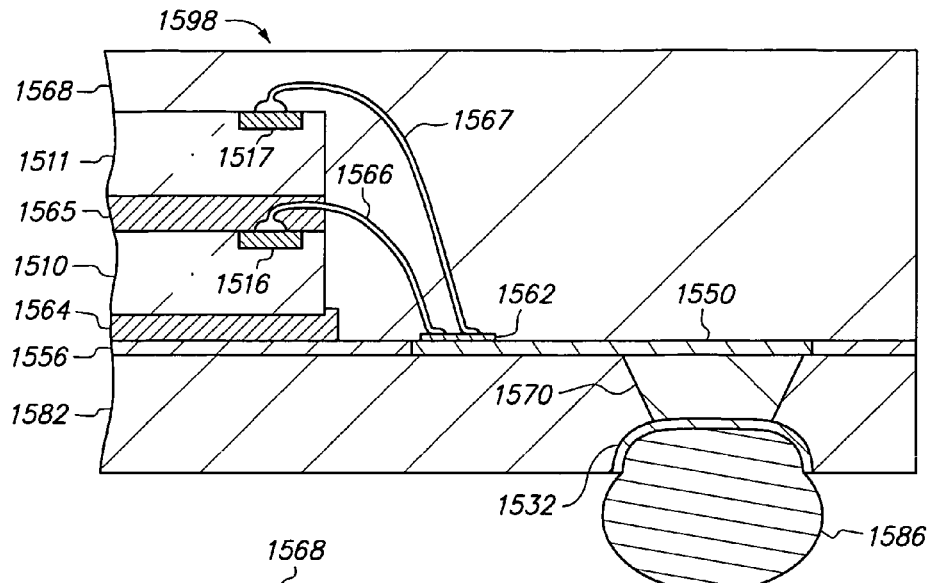
FIGS. 93A, 93B and 93C are cross-sectional, top and bottom views, respectively, of a semiconductor chip assembly in accordance with a fifteenth embodiment of the present invention.
Figure 93B:
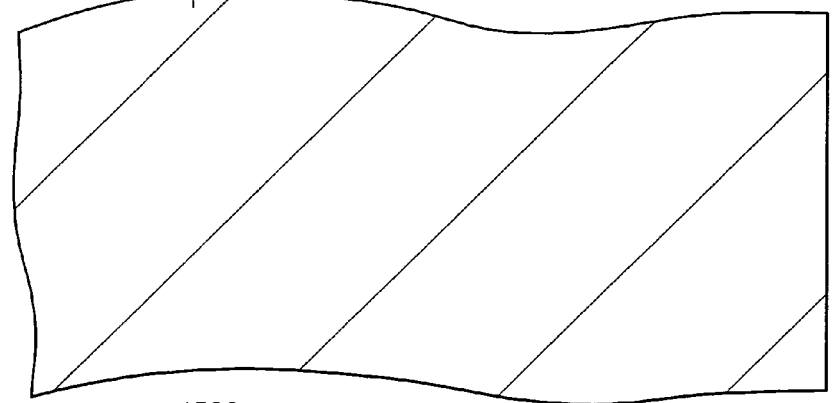
Figure 93C:
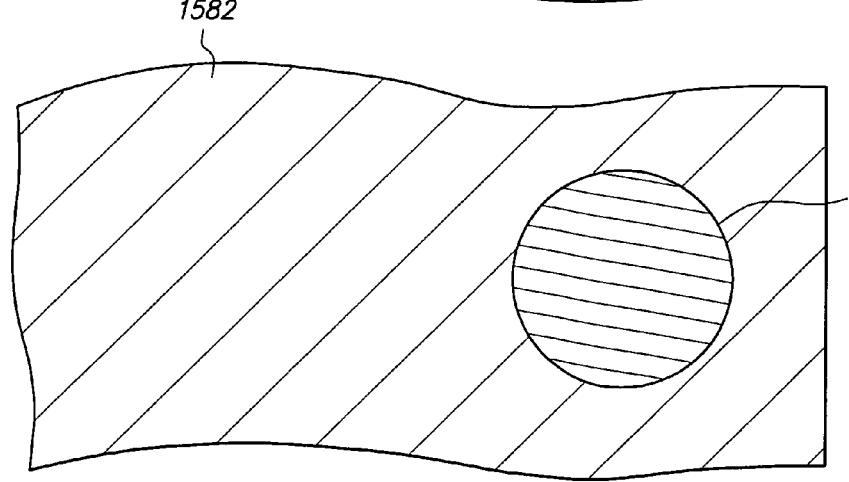
Figure 94:
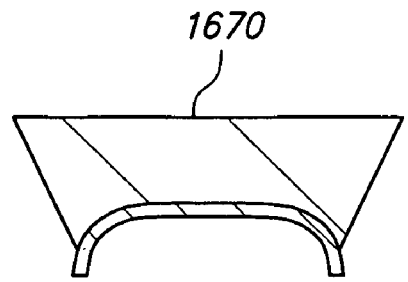
FIGS. 94-98 are cross-sectional views of metal containment walls in accordance with a sixteenth to twentieth embodiment of the present invention.
Figure 95:
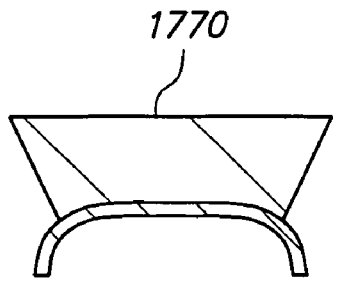
Figure 96:
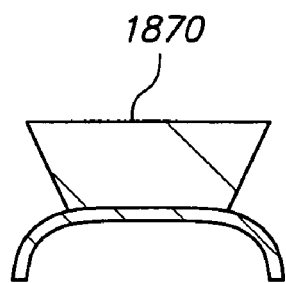
Figure 97:
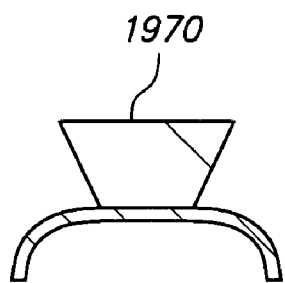
Figure 98:
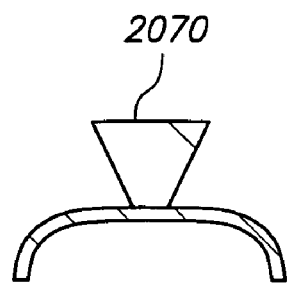

FIGS. 93A, 93B and 93C are cross-sectional, top and bottom views, respectively, of a semiconductor chip assembly in accordance with a fifteenth embodiment of the present invention. In the fifteenth embodiment, the assembly is a multi-chip package. For purposes of brevity, any description in the first embodiment is incorporated herein insofar as the same is applicable, and the same description need not be repeated. Likewise, elements of the fifteenth embodiment similar to those in the first embodiment have corresponding reference numerals indexed at fifteen-hundred rather than one-hundred. For instance, chip 1510 corresponds to chip 110, routing line 1550 corresponds to routing line 150, etc.

Plated contact 1562 is lengthened. This is accomplished by a slight adjustment to the electroplating operation previously described for plated contact 162. In particular, the photoresist layer (corresponding to photoresist layer 158) is patterned to lengthen the opening for plated contact 1562, and therefore plated contact 1562 is lengthened relative to plated contact 162.

Chip 1510 is mechanically attached to solder mask 1556 by adhesive 1564 and electrically connected to routing line 1550 by connection joint 1566.

Thereafter, adhesive 1565 is deposited as a spacer paste that includes silicon spacers on chip 1510, then chip 1511 (which includes pad 1517 and is essentially identical to chip 1510) is placed on adhesive 1565 such that adhesive 1565 contacts and is sandwiched between chips 1510 and 1.511, and then the structure is placed in an oven and adhesive 1565 is fully cured (C stage) at relatively low temperature in the range of 150 to 200° C. to form a solid adhesive insulative layer that mechanically attaches chips 1510 and 1511. Adhesive 1565 is 100 microns thick between chips 1510 and 1511, and chips 1510 and 1511 are spaced and separated from and vertically aligned with one another. A suitable spacer paste is Hysol QMI 500.

Thereafter, chip 1511 is electrically connected to routing line 1550 by connection joint 1567 in the same manner that chip 1510 is electrically connected to routing line 1550 by connection joint 1566.

Thereafter, encapsulant 1568 with a thickness of 700 microns (rather than 400 microns) is formed so that encapsulant 1568 contacts and covers chips 1510 and 1511, routing line 1550, solder mask 1556, plated contact 1562, adhesives 1564 and 1565 and connection joints 1566 and 1567, and then metal pillar 1570, insulative base 1582 and solder terminal 1586 are formed.

The semiconductor chip assembly is a multi-chip first-level package. Chips 1510 and 1511 are embedded in encapsulant 1568. Furthermore, an electrically conductive path between pad 1516 and solder terminal 1586 not only includes but also requires metal containment wall 1532, routing line 1550, plated contact 1562 and metal pillar 1570 and an electrically conductive path between pad 1517 and solder terminal 1586 not only includes but also requires metal containment wall 1532, routing line 1550, plated contact 1562 and metal pillar 1570. Thus, chips 1510 and 1511 are both embedded in encapsulant 1568 and electrically connected to solder terminal 1586 by an electrically conductive path that includes metal containment wall 1532, routing line 1550, plated contact 1562 and metal pillar 1570.

Semiconductor chip assembly 1598 includes chips 1510 and 1511, metal containment wall 1532, routing line 1550, solder mask 1556, plated contact 1562, adhesives 1564 and 1565, connection joints 1566 and 1567, encapsulant 1568, metal pillar 1570, insulative base 1582 and solder terminal 1586.

FIGS. 94, 95, 96, 97 and 98 are cross-sectional views of metal pillars 1670, 1770, 1870, 1970 and 2070, respectively, in accordance with a sixteenth to twentieth embodiment of the present invention.

Metal pillars 1670, 1770, 1870, 1970 and 2070 have increasingly narrow shape as the wet chemical etch that forms the metal pillar increasingly undercuts the metal containment wall, for instance by increasing the etch concentration or the etch time. Metal pillars 1670, 1770, 1870, 1970 and 2070 also have generally conical shapes with a diameter that substantially continuously decreases as the metal pillar extends downwardly. In addition, the metal pillars each include an upwardly facing surface (corresponding to surface 172), a downwardly facing surface (corresponding to surface 174) and tapered sidewalls (corresponding to sidewalls 176) therebetween, the downwardly facing surface is concentrically disposed within a surface area of the upwardly facing surface, and a surface area of the upwardly facing surface is at least 20 percent larger than a surface area of the downwardly facing surface.

The semiconductor chip assemblies described above are merely exemplary. Numerous other embodiments are contemplated. For instance, the solder mask, the plated contact, the metal pillar and the insulative base can be omitted. In addition, the embodiments described above can generally be combined with one another. For instance, the solder layer formed after the encapsulant in the second embodiment and the metal containment wall and the solder layer formed after the encapsulant in the third embodiment can be used in the other embodiments. Likewise, the omitted metal pillar in the third embodiment can be used in the other embodiments. Likewise, the flip-chip in the fourth embodiment and the plated connection joints in the fifth and sixth embodiments can be used in the other embodiments except for the multi-chip assembly in the fifteenth embodiment since the chips are not inverted. Likewise, the solder terminal in the seventh embodiment can be used in the other embodiments. Likewise, the insulative bases in the eighth and ninth embodiments and the omitted insulative base in the tenth embodiment can be used in the other embodiments. Likewise, the simultaneously formed metal containment wall and routing line in the eleventh embodiment and the simultaneously formed metal containment wall and plated contact in the twelfth embodiment can be used in the other embodiments. Likewise, the metal containment walls, metal pillars and solder terminals in the thirteenth and fourteenth embodiments can be used in the other embodiments. Likewise, the multi-chip assembly in the fifteenth embodiment can be used in the other embodiments except for the fourth to sixth embodiments since the chips are inverted. Likewise, the metal pillars in the sixteen, seventeen, eighteenth, nineteenth and twentieth embodiments can be used in the first, second and fourth to fifteenth embodiments but not in the third embodiment since the metal pillar is omitted. The embodiments described above can be mixed-and-matched with one another and with other embodiments depending on design and reliability considerations.

The metal base need not necessarily be removed within the periphery of the chip. For instance, a portion of the metal base that extends within the periphery of the chip and is spaced from the metal containment wall can remain intact and provide a heat sink.

The metal containment wall can be a wide variety of materials including copper, gold, nickel, palladium, tin, solder, and combinations thereof, can be formed by a wide variety of processes including electroplating, electroless plating, printing, reflowing and combinations thereof, can be a single layer or multiple layers and can have a wide variety of shapes and sizes. For instance, the metal containment wall can formed by a single process such as electroplating or solder paste deposition and reflow, or alternatively, multiple processes such as electroplating followed by solder paste deposition and reflow. Furthermore, the metal containment wall can include a single-piece metal surface that defines the cavity, and the single-piece metal surface can be various wettable metals including gold, tin and solder, particularly if solder reflow occurs thereon, or alternatively, various non-wettable metals, particularly if solder reflow has already occurred or does not occur thereon. In addition, the cavity can have an opening with a circular, rectangular or square shape.

The metal containment wall can be deposited on the metal base before, during or after the routing line is deposited on the metal base, before, during or after the plated contact is deposited on the routing line, before or after the chip is attached to the routing line, before or after the encapsulant is formed and before, during or after the connection joint is formed. For instance, an electroplated metal containment wall can be simultaneously formed with the routing line, the plated contact or the connection joint, thereby improving manufacturing throughput.

The solder layer can be formed by solder reflow that includes depositing a non-solidified solder-containing material on the metal containment wall and then applying energy to reflow the solder and form a hardened solder layer. Suitable solder-containing materials include solder paste, liquid solder and solder particles. The solder can be a tin-lead alloy, although lead-free compositions such as tin-bismuth and tin-silver-copper are becoming increasingly popular due to environmental concerns over lead usage in the electronics industry. Suitable deposition processes include screen printing, stencil printing, meniscus coating, liquid solder jetting and solder particle placement. Heat can be supplied by a convection oven, although other techniques such as infrared continuous belt reflow, hot nitrogen gas, a laser beam and vapor-phase reflow can be used. The preferred deposition and reflow techniques depend on the solder-containing material employed.

The solder layer can be formed on the metal containment wall before or after the routing line is deposited on the metal base, before or after the plated contact is deposited on the routing line, before or after the chip is attached to the routing line, before or after the encapsulant is formed, before or after the connection joint is formed, before or after the metal pillar is formed and before or after the insulative base is formed. The solder layer can be formed on the metal containment wall before or after the photoresist layer (corresponding to photoresist layer 128) that defines the metal containment wall is removed. For instance, the photoresist layer that defines the metal containment wall can remain intact during the solder paste deposition and reflow to assist with confining the solder layer to the metal containment wall.

The routing line can be various conductive metals including copper, gold, nickel, silver, palladium, tin, combinations thereof, and alloys thereof. The preferred composition of the routing line will depend on the nature of the connection joint as well as design and reliability factors. Furthermore, those skilled in the art will understand that in the context of a semiconductor chip assembly, a copper material is typically a copper alloy that is mostly copper but not pure elemental copper, such copper-zirconium (99.9% copper), copper-silver-phosphorus-magnesium (99.7% copper), or copper-tin-iron-phosphorus (99.7% copper). Likewise, the routing line can fan-in as well as fan-out.

The routing line can be formed on the metal base by numerous deposition techniques including electroplating and electroless plating. In addition, the routing line can be deposited on the metal base as a single layer or multiple layers. For instance, the routing line can be a 10 micron layer of gold, or alternatively, a 9.5 micron layer of nickel electroplated on a 0.5 micron layer of gold electroplated on a copper base to reduce costs, or alternatively, a 9 micron layer of nickel electroplated on a 0.5 micron layer of gold electroplated on a 0.5 micron layer of tin electroplated on a copper base to reduce costs and avoid gold-copper alloys that may be difficult to remove when the copper base is etched. As another example, the routing line can consist of a non-copper layer electroplated on a copper base and a copper layer electroplated on the non-copper layer. Suitable non-copper layers include nickel, gold, palladium and silver. After the routing line is formed, a wet chemical etch can be applied that is highly selective of copper with respect to the non-copper layer to etch the copper base and expose the routing line without removing the copper or non-copper layers. The non-copper layer provides an etch stop that prevents the wet chemical etch from removing the copper layer. Furthermore, it is understood that in the context of the present invention, the routing line and the metal base are different metals (or metallic materials) even if a multi-layer routing line includes a single layer that is similar to the metal base (such as the example described above) or a single layer of a multi-layer metal base.

The routing line can also be formed by etching a metal layer attached to the metal base. For instance, a photoresist layer can be formed on the metal layer, the metal layer can be etched using the photoresist layer as an etch mask, and then the photoresist layer can be stripped. Alternatively, a photoresist layer can be formed on the metal layer, a plated metal can be selectively electroplated on the metal layer using the photoresist layer as a plating mask, the photoresist layer can be stripped, and then the metal layer can be etched using the plated metal as an etch mask. In this manner, the routing line can be formed semi-additively and include unetched portions of the metal layer and the plated metal. Likewise, the routing line can be formed subtractively from the metal layer, regardless of whether the plated metal etch mask remains attached to the routing line.

The routing line can be spot plated near the pad to make it compatible with receiving the connection joint. For instance, a copper routing line can be spot plated with nickel and then silver to make it compatible with a gold ball bond connection joint and avoid the formation of brittle silver-copper intermetallic compounds. Likewise, the metal containment wall can be spot plated to make it compatible with receiving a solder material. For instance, a nickel metal containment wall can be spot plated with gold to facilitate solder reflow.

The metal pillar can have a wide variety of shapes and sizes. For instance, the upwardly and downwardly facing surfaces (corresponding to surfaces 172 and 174, respectively) can have a circular, rectangular or square shape. In addition, the upwardly facing surface of the metal pillar can have a diameter that is less than, equal to or greater than the diameter of the downwardly facing surface of the metal pillar. For example, the upwardly facing surface of the metal pillar and the enlarged circular portion of the routing line upon which the upwardly facing surface of the metal pillar is mounted can have diameters that are at least 100 microns less than the outer periphery of the metal containment wall to facilitate high-density circuitry.

Further details regarding a metal pillar that is etched from a metal base and contacts a routing line are disclosed in U.S. application Ser. No. 10/714,794 filed Nov. 17, 2003 by Chuen Rong Leu et al. entitled "Semiconductor Chip Assembly with Embedded Metal Pillar," U.S. application Ser. No. 10/994,604 filed Nov. 22, 2004 by Charles W. C Lin et al. entitled "Semiconductor Chip Assembly with Bumped Metal Pillar" and U.S. application Ser. No. 10/994,836 filed Nov. 22, 2004 by Charles W. C Lin et al. entitled "Semiconductor Chip Assembly with Carved Bumped Terminal" which are incorporated by reference.

The solder terminal can be uncovered in the downward direction by the encapsulant, the insulative base or any other insulative material of the assembly. For instance, the solder terminal can be exposed in the downward direction, or alternatively, the solder terminal can be covered in the downward direction by an insulative material external to the assembly such as another semiconductor chip assembly in a stacked arrangement. In every case, the solder terminal is not covered in the downward direction by the encapsulant, the insulative base or any other insulative material of the assembly.

The conductive trace can function as a signal, power or ground layer depending on the purpose of the associated chip pad.

The chip can be upright with the active surface that includes the pad facing in the upward direction and away from the routing line, or alternatively, the chip can be inverted with the active surface facing in the downward direction and towards the routing line. For instance, the chip can be wire bonded with the active surface facing in the upward direction, or alternatively, the chip can be flip-chip bonded with the active surface facing in the downward direction. Furthermore, the chip can be electrically connected to the routing line by various connection joints regardless of whether the chip is upright or inverted. For instance, the chip can be flip-chip bonded with a solder connection joint or a gold connection joint. For example, a solder bump can be formed on the pad, the chip can be inverted and positioned by a pick-up head such that the solder bump contacts and is sandwiched between the pad and the routing line, and a convection oven can apply heat to reflow the solder bump into a solder connection joint that is metallurgically bonded to the pad and the routing line. As another example, a gold stud bump can be formed on the pad, the routing line can be formed with a gold surface layer, the chip can be inverted and positioned by a pick-up head such that the gold stud bump contacts and is sandwiched between the pad and the routing line, the pick-up head can apply thermosonic energy and pressure that is transferred through the chip to the gold stud bump, and the combination of heat, pressure and ultrasonic vibration can form a gold-gold interconnect (GGI) between the gold stud bump and the gold surface layer of the routing line and thus a gold connection joint that is metallurgically bonded to the pad and the routing line.

The pad can have numerous shapes including a flat rectangular shape and a bumped shape. If desired, the pad can be treated to accommodate the connection joint.

Numerous adhesives can be applied to mechanically attach the chip to the routing line. For instance, the adhesive can be applied as a paste, a laminated layer, or a liquid applied by screen-printing, spin-on, or spray-on. The adhesive can be a single layer that is applied to the metal base or the solder mask and then contacted to the chip or a single layer that is applied to the chip and then contacted to the metal base or the solder mask. Similarly, the adhesive can be multiple layers with a first layer applied to the metal base or the solder mask, a second layer applied to the chip and then the layers contacted to one another. Thermosetting adhesive liquids and pastes such as epoxies are generally suitable. Likewise, thermoplastic adhesives such as an insulative thermoplastic polyimide film with a glass transition temperature (Tg) of 400° C. are also generally suitable. Silicone adhesives are also generally suitable.

The encapsulant can be deposited using a wide variety of techniques including printing and transfer molding. For instance, the encapsulant can be printed on the chip as an epoxy paste and then cured or hardened to form a solid adherent protective layer. The encapsulant can be any of the adhesives mentioned above. Moreover, the encapsulant need not necessarily contact the chip. For instance, a glob-top coating can be deposited on the chip after attaching the chip to the routing line, and then the encapsulant can be formed on the glob-top coating.

The insulative base may be rigid or flexible, and can be various dielectric films or prepregs formed from numerous organic or inorganic insulators such as tape (polyimide), epoxy, silicone, glass, aramid and ceramic. Organic insulators are preferred for low cost, high dielectric applications, whereas inorganic insulators are preferred when high thermal dissipation and a matched thermal coefficient of expansion are important. For instance, the insulative base can initially be an epoxy paste that includes an epoxy resin, a curing agent, an accelerator and a filler, that is subsequently cured or hardened to form a solid adherent insulative layer. The filler can be an inert material such as silica (powdered fused quartz) that improves thermal conductivity, thermal shock resistance and thermal coefficient of expansion matching. Organic fiber reinforcement may also be used in resins such as epoxy, cyanate ester, polyimide, PTFE and combinations thereof. Fibers that may be used include aramid, polyester, polyamide, poly-ether-ether-ketone, polyimide, polyetherimide and polysulfone. The fiber reinforcement can be woven fabric, woven glass, random microfiber glass, woven quartz, woven, aramid, non-woven fabric, non-woven aramid fiber or paper. Commercially available dielectric materials such as SPEEDBOARD C prepreg by W. L. Gore & Associates of Eau Claire, Wis. are suitable.

The insulative base can be deposited in numerous manners, including printing and transfer molding. Furthermore, the insulative base can be formed before or after attaching the chip to the routing line.

The insulative base can have its lower portion removed using a wide variety of techniques including grinding (including mechanical polishing and chemical-mechanical polishing), blanket laser ablation and blanket plasma etching. Likewise, the insulative base can have a selected portion below the metal containment wall, the metal pillar and the solder layer removed using a wide variety of techniques including selective laser ablation, selective plasma etching and photolithography.

The insulative base can be laterally aligned with the metal containment wall along a downwardly facing surface that extends downwardly beyond the routing line and the metal pillar by grinding the insulative base without grinding the metal containment wall, the metal pillar or the routing line, then grinding the insulative base and the metal containment wall without grinding the metal pillar or the routing line, and then discontinuing the grinding before reaching the metal pillar or the routing line. Likewise, the insulative base can be laterally aligned with the solder layer along a downwardly facing surface that extends downwardly beyond the routing line and the metal pillar by grinding the insulative base without grinding the solder layer, the metal pillar or the routing line, then grinding the insulative base and the solder layer without grinding the metal pillar or the routing line, and then discontinuing the grinding before reaching the metal pillar or the routing line. Likewise, the insulative base can be laterally aligned with the metal containment wall and the solder layer along a downwardly facing surface that extends downwardly beyond the metal pillar and the routing line by grinding the insulative base without grinding the metal containment wall, the solder layer, the metal pillar or the routing line, then grinding the insulative base, the metal containment wall and the solder layer without grinding the metal pillar or the routing line, and then discontinuing the grinding before reaching the metal pillar or the routing line.

The connection joint can be formed from a wide variety of materials including copper, gold, nickel, palladium, tin, alloys thereof, and combinations thereof, can be formed by a wide variety of processes including electroplating, electroless plating, ball bonding, wire bonding, stud bumping, solder reflowing, conductive adhesive curing, and welding, and can have a wide variety of shapes and sizes. The shape and composition of the connection joint depends on the composition of the routing line as well as design and reliability considerations. Further details regarding an electroplated connection joint are disclosed in U.S. application Ser. No. 09/865,367 filed May 24, 2001 by Charles W. C. Lin entitled "Semiconductor Chip Assembly with Simultaneously Electroplated Contact Terminal and Connection Joint" which is incorporated by reference. Further details regarding an electrolessly plated connection joint are disclosed in U.S. application Ser. No. 09/864,555 filed May 24, 2001 by Charles W. C. Lin entitled "Semiconductor Chip Assembly with Simultaneously Electrolessly Plated Contact Terminal and Connection Joint" which is incorporated by reference. Further details regarding a ball bond connection joint are disclosed in U.S. application Ser. No. 09/864,773 filed May 24, 2001 by Charles W. C. Lin entitled "Semiconductor Chip Assembly with Ball Bond Connection Joint" which is incorporated by reference. Further details regarding a solder or conductive adhesive connection joint are disclosed in U.S. application Ser. No. 09/927,216 filed Aug. 10, 2001 by Charles W. C. Lin entitled "Semiconductor Chip Assembly with Hardened Connection Joint" which is incorporated by reference. Further details regarding a welded connection joint are disclosed in U.S. application Ser. No. 10/302,642 filed Nov. 23, 2002 Cheng-Lien Chiang et al. entitled "Method of Connecting a Conductive Trace to a Semiconductor Chip Using Plasma Undercut Etching" which is incorporated by reference.

After the connection joint is formed, if a plating bus exists then it is disconnected from the conductive trace. The plating bus can be disconnected by mechanical sawing, laser cutting, chemical etching, and combinations thereof. If the plating bus is disposed about the periphery of the assembly but is not integral to the assembly, then the plating bus can be disconnected when the assembly is singulated from other assemblies. However, if the plating bus is integral to the assembly, or singulation has already occurred, then a photolithography step can be added to selectively cut related circuitry on the assembly that is dedicated to the plating bus since this circuitry would otherwise short the conductive traces together. Furthermore, the plating bus can be disconnected by etching the metal base.

A soldering material or solder ball can be deposited on the solder layer by plating or printing or placement techniques if required for the next level assembly. However, the next level assembly may not require that the semiconductor chip assembly contain solder. For instance, in land grid array (LGA)

packages, the soldering material is normally provided by the panel rather than the contact terminals on the semiconductor chip assembly.

Various cleaning steps, such as a brief oxygen plasma cleaning step, or a brief wet chemical cleaning step using a solution containing potassium permanganate, can be applied to the structure at various stages, such as immediately before forming the connection joint to clean the conductive trace and the pad.

It is understood that, in the context of the present invention, any chip embedded in the encapsulant is electrically connected to the solder terminal by an electrically conductive path that includes the routing line and the metal containment wall means that the routing line and the metal containment wall are in an electrically conductive path between the solder terminal and any chip embedded in the encapsulant. This is true regardless of whether a single chip is embedded in the encapsulant (in which case the chip is electrically connected to the solder terminal by an electrically conductive path that includes the routing line and the metal containment wall) or multiple chips are embedded in the encapsulant (in which case each of the chips is electrically connected to the solder terminal by an electrically conductive path that includes the routing line and the metal containment wall). This is also true regardless of whether the electrically conductive path includes or requires a connection joint and/or a plated contact between the routing line and the chip. This is also true regardless of whether the electrically conductive path includes or requires a metal pillar between the routing line and the metal containment wall. This is also true regardless of whether the electrically conductive path includes or requires a passive component such as a capacitor or a resistor. This is also true regardless of whether multiple chips are electrically connected to the routing line by multiple connection joints, and the multiple connection joints are electrically connected to one another only by the routing line. This is also true regardless of whether multiple chips are electrically connected to the solder terminal by different electrically conductive paths (such as the multiple connection joint example described above) as long as each of the electrically conductive paths includes the routing line and the metal containment wall.

It is also understood that, in the context of the present invention, the wet chemical etch that forms the metal pillar need not begin to form the metal pillar. For instance, a first wet chemical etch that forms the recess can form the downwardly facing surface of the metal pillar, and a second wet chemical etch can form the upwardly facing surface and the tapered sidewalls of the metal pillar. In this instance, the second wet chemical etch completes formation of the metal pillar and thus forms the metal pillar.

It is also understood that, in the context of the present invention, the metal pillar can have a generally conical shape with tapered sidewalls that are adjacent to and extend between the upwardly and downwardly facing surfaces of the metal pillar and slant inwardly even though the inward slant may not be constant. For instance, the tapered sidewalls can slant inwardly even if a portion of the tapered sidewalls slants outwardly as long as the upwardly facing surface has a larger diameter than the downwardly facing surface and the tapered sidewalls mostly slant inwardly as they extend from the upwardly facing surface to the downwardly facing surface.

It is also understood that, in the context of the present invention, the solder terminal can include the solder layer and contact the metal containment wall in the cavity. This is true regardless of whether the solder terminal includes the solder layer and another solder material or the solder terminal consists of the solder layer. This also true regardless of whether the solder terminal extends within and outside the cavity or is disposed within the cavity. This is also true regardless of whether the solder terminal contacts the metal containment wall outside the cavity. This is also true regardless of whether the solder layer contacts the metal containment wall.

It is also understood that, in the context of the present invention, the solder terminal can include the solder layer even though the solder layer may be altered. For instance, the shape of the solder layer may be altered during intervening process steps such as the wet chemical etch that forms the metal pillar, the cure that forms the insulative base, the grinding that exposes the solder layer and the solder reflow that forms the solder terminal. Likewise, the solder reflow that forms the solder terminal may alter the shape and composition of the solder layer, and may mix together the solder ball and the solder layer such that they are no longer separately identifiable. In each instance, the solder terminal includes the solder layer.

The "upward" and "downward" vertical directions do not depend on the orientation of the assembly, as will be readily apparent to those skilled in the art. For instance, the encapsulant extends vertically beyond the routing line in the "upward" direction, the metal containment wall extends vertically beyond the chip in the "downward" direction and the insulative base extends vertically beyond the encapsulant in the "downward" direction, regardless of whether the assembly is inverted and/or mounted on a printed circuit board. Likewise, the routing line extends "laterally" beyond the metal containment wall regardless of whether the assembly is inverted, rotated or slated. Thus, the "upward" and "downward" directions are opposite one another and orthogonal to the "lateral" direction, and the "laterally aligned" surfaces are coplanar with one another in a lateral plane orthogonal to the upward and downward directions. Moreover, the chip is shown above the routing line, the metal containment wall, the metal pillar, the solder terminal and the insulative base, and the encapsulant is shown above the chip, the routing line, the metal containment wall, the metal pillar, the solder terminal and the insulative base with a single orientation throughout the drawings for ease of comparison between the figures, although the assembly and its components may be inverted at various manufacturing stages.

The working format for the semiconductor chip assembly can be a single assembly or multiple assemblies based on the manufacturing design. For instance, a single assembly that includes a single chip can be manufactured individually. Alternatively, numerous assemblies can be simultaneously batch manufactured on a single metal base with a single solder mask, a single encapsulant and a single insulative base then separated from one another. For example, the recesses for multiple assemblies can be simultaneously etched in the metal base, then the metal containment walls for multiple assemblies can be simultaneously electroplated on the metal base in the recesses, then separate spaced solder pastes can be selectively disposed on the corresponding metal containment walls using a single stencil, then the solder pastes can be simultaneously reflowed to form the solder layers, then the routing lines for multiple assemblies can be simultaneously electroplated on the metal base, then the plated contacts can be simultaneously electroplated on the corresponding routing lines, then separate spaced adhesives for the respective assemblies can be selectively disposed on the solder mask, then the chips can be disposed on the corresponding adhesives, then the adhesives can be simultaneously fully cured, then the connection joints can be formed on the corresponding plated contacts and pads, then the encapsulant can be formed, then the metal base can be etched to simultaneously form the metal pillars, then the insulative base can be formed, then the insulative base, the metal containment walls and the solder layers can be simultaneously grinded, then separate spaced solder balls can be selectively disposed on the corresponding solder layers, then the solder layers and solder balls can be simultaneously reflowed to form the solder terminals, and then the solder mask, the encapsulant and the insulative base can be cut, thereby separating the individual single chip-substrate assemblies.

The semiconductor chip assembly can have a wide variety of packaging formats as required by the next level assembly. For instance, the conductive traces can be configured so that the assembly is a grid array such as a ball grid array (BGA), column grid array (CGA), land grid array (LGA) or pin grid array (PGA).

The semiconductor chip assembly can be a first-level package that is a single-chip package (such as the first to fourteenth embodiments) or a multi-chip package (such as the fifteenth embodiment). Furthermore, a multi-chip first-level package can include chips that are stacked and vertically aligned with one another or are coplanar and laterally aligned with one another.

Advantageously, the semiconductor chip assembly of the present invention is reliable and inexpensive. The encapsulant and the insulative base can protect the chip from handling damage, provide a known dielectric barrier for the conductive trace and protect the assembly from contaminants and unwanted solder reflow during the next level assembly. The encapsulant can provide mechanical support for the conductive trace as the metal base is etched to form the metal pillar or removed. The metal containment wall can confine the solder layer and the solder terminal during solder reflow operations. In addition, the solder terminal can extend into the metal containment wall within the insulative base rather than contact the assembly at a high-stress boundary in a lateral plane where an exposed major surface faces downwardly, thereby reducing solder separation and improving reliability. The mode of the connection can shift from the initial mechanical coupling to metallurgical coupling to assure sufficient metallurgical bond strength. Furthermore, the conductive trace can be mechanically and metallurgically coupled to the chip without wire bonding, TAB, solder or conductive adhesive, although the process is flexible enough to accommodate these techniques if desired. The process is highly versatile and permits a wide variety of mature connection joint technologies to be used in a unique and improved manner. Furthermore, the metal pillar is particularly well-suited for reducing thermal mismatch related stress in the next level assembly and yields enhanced reliability for the next level assembly that exceeds that of conventional BGA packages. As a result, the assembly of the present invention significantly enhances throughput, yield and performance characteristics compared to conventional packaging techniques. Moreover, the assembly of the present invention is well-suited for use with materials compatible with copper chip requirements.

Various changes and modifications to the presently preferred embodiments described herein will be apparent to those skilled in the art. For instance, the materials, dimensions and shapes described above are merely exemplary. Such changes and modifications may be made without departing from the spirit and scope of the present invention as defined in the appended claims.

We claim:

1. A method of making a semiconductor chip assembly, comprising:
   providing a metal base, a routing line, a metal containment wall and a solder layer, wherein the metal base includes first and second opposing surfaces, the first surface of the metal base faces in a first direction, the second surface of the metal base faces in a second direction opposite the first direction, the metal containment wall extends into the metal base from the second surface of the metal base towards the first surface of the metal base and includes a cavity, the cavity extends into the metal base from the second surface of the metal base towards the first surface of the metal base and includes an opening that faces in the second direction, and the solder layer contacts the metal containment wall in the cavity;
   mechanically attaching a semiconductor chip to the routing line, wherein the chip includes a conductive pad;
   forming a connection joint that electrically connects the routing line and the pad;
   etching the metal base using a wet chemical etch, thereby reducing contact area between the metal base and the routing line and between the metal base and the metal containment wall; and
   providing a solder terminal that contacts the metal containment wall in the cavity and includes the solder layer.

2. The method of claim 1, wherein forming the routing line includes depositing the routing line on the metal base.

3. The method of claim 2, wherein forming the routing line includes:
   forming a plating mask on the metal base, wherein the plating mask includes an opening that exposes a portion of the metal base; and then
   electroplating the routing line on the exposed portion of the metal base through the opening in the plating mask.

4. The method of claim 1, wherein forming the metal containment wall includes depositing the metal containment wall on the metal base.

5. The method of claim 4, wherein forming the metal containment wall includes:
   forming a plating mask on the metal base, wherein the plating mask includes an opening that exposes a portion of the metal base; and then
   electroplating the metal containment wall on the exposed portion of the metal base through the opening in the plating mask.

6. The method of claim 1, wherein forming the metal containment wall includes:
   etching the metal base to form a via that extends into the metal base from the second surface of the metal base towards the first surface of the metal base; and then
   depositing the metal containment wall into the via.

7. The method of claim 6, wherein:
   the via is a through-hole that extends through the metal base and exposes the routing line; and
   the metal containment wall extends through the metal base and contacts the routing line.

8. The method of claim 7, wherein etching the metal base eliminates contact area between the metal base and the routing line and between the metal base and the metal containment wall.

9. The method of claim 6, wherein:
   the via is a recess that extends into but not through the metal base and is spaced from the first surface of the metal base and the routing line; and
   the metal containment wall extends into but not through the metal base and is spaced from the first surface of the metal base and the routing line.

10. The method of claim 9, wherein etching the metal base forms a metal pillar from an unetched portion of the metal base that is defined by the metal containment wall and that contacts the routing line and the metal containment wall.

11. The method of claim 1, wherein forming the solder layer includes depositing the solder layer on the metal containment wall.

12. The method of claim 11, wherein forming the solder layer includes contacting the solder layer only to the metal containment wall.

13. The method of claim 11, wherein forming the solder layer includes:
depositing solder paste on the metal containment wall; and then
reflowing the solder paste.

14. The method of claim 1, wherein the solder terminal is the solder layer.

15. The method of claim 1, wherein forming the solder terminal includes:
depositing a solder material on the solder layer; and then
reflowing the solder material and the solder layer together.

16. The method of claim 1, wherein forming the solder terminal includes the following steps in the sequence set forth:
depositing solder paste on the metal containment wall;
reflowing the solder paste, thereby forming the solder layer;
depositing a solder material on the solder layer; and
reflowing the solder material and the solder layer together, thereby forming the solder terminal.

17. The method of claim 1, wherein forming the metal containment wall and the solder layer includes the following steps in the sequence set forth:
etching the metal base to form a via;
depositing the metal containment wall on the metal base and into the via; and
depositing the solder layer on the metal containment wall.

18. The method of claim 1, wherein forming the metal containment wall and the solder layer includes the following steps in the sequence set forth:
etching the metal base through an opening in an etch mask, thereby forming a via;
electroplating the metal containment wall on an exposed portion of the metal base and into the via;
depositing solder paste on the metal containment wall; and
reflowing the solder paste, thereby forming the solder layer.

19. The method of claim 1, wherein forming the metal containment wall and the solder layer includes the following steps in the sequence set forth:
etching the metal base to form a via;
electroplating the metal containment wall on an exposed portion of the metal base and into the via through an opening in a plating mask;
depositing solder paste on the metal containment wall; and
reflowing the solder paste, thereby forming the solder layer.

20. The method of claim 1, wherein forming the metal containment wall and the solder layer includes the following steps in the sequence set forth:
forming a mask on the metal base, wherein the mask includes an opening that exposes a portion of the metal base;
etching the metal base through the opening in the mask, thereby forming a via;
electroplating the metal containment wall on the exposed portion of the metal base and into the via through the opening in the mask;
depositing solder paste on the metal containment wall; and
reflowing the solder paste, thereby forming the solder layer.

21. The method of claim 1, wherein forming the metal containment wall and the solder layer includes the following steps in the sequence set forth:
forming an etch mask on the metal base, wherein the etch mask includes an opening that exposes a portion of the metal base;
etching the metal base through the opening in the etch mask, thereby forming a via;
forming a plating mask on the metal base, wherein the plating mask includes an opening that exposes a portion of the metal base and exposes the via;
electroplating the metal containment wall on the exposed portion of the metal base and into the via through the opening in the plating mask;
depositing solder paste on the metal containment wall; and
reflowing the solder paste, thereby forming the solder layer.

22. The method of claim 1, wherein attaching the chip to the routing line includes disposing an insulative adhesive between the chip and the metal base and then hardening the adhesive.

23. The method of claim 1, wherein forming the connection joint includes electroplating the connection joint between the routing line and the pad.

24. The method of claim 1, wherein forming the connection joint includes electrolessly plating the connection joint between the routing line and the pad.

25. The method of claim 1, wherein forming the connection joint includes depositing a non-solidified material between the routing line and the pad and then hardening the non-solidified material.

26. The method of claim 1, wherein forming the connection joint includes providing a wire bond between the routing line and the pad.

27. The method of claim 1, wherein etching the metal base using the wet chemical etch exposes the routing line.

28. The method of claim 1, wherein etching the metal base using the wet chemical etch removes most of the metal base.

29. The method of claim 1, wherein etching the metal base using the wet chemical etch removes all of the metal base within a periphery of the pad.

30. The method of claim 1, wherein etching the metal base using the wet chemical etch removes all of the metal base within a periphery of the chip.

31. The method of claim 1, wherein etching the metal base using the wet chemical etch reduces but does not eliminate contact area between the metal base and the routing line and between the metal base and the metal containment wall.

32. The method of claim 1, wherein etching the metal base using the wet chemical etch forms a metal pillar from an unetched portion of the metal base that is defined by the metal containment wall and that contacts and electrically connects the routing line and the metal containment wall.

33. The method of claim 1, wherein etching the metal base using the wet chemical etch eliminates contact area between the metal base and the routing line and between the metal base and the metal containment wall.

34. The method of claim 1, wherein etching the metal base using the wet chemical etch removes the metal base.

35. The method of claim 1, wherein etching the metal base using the wet chemical etch electrically isolates the routing line from other routing lines that contact the metal base.

36. The method of claim 1, wherein etching the metal base using the wet chemical etch electrically isolates the pad from other conductive pads of the chip.

37. The method of claim 1, including forming the metal containment wall before forming the solder layer.

38. The method of claim 37, including forming the routing line before forming the metal containment wall.

39. The method of claim 37, including forming the routing line after forming the metal containment wall.

40. The method of claim 37, including forming the routing line simultaneously with forming the metal containment wall.

41. The method of claim 37, including forming the metal containment wall before attaching the chip to the metal base and the routing line.

42. The method of claim 37, including forming the metal containment wall after attaching the chip to the metal base and the routing line.

43. The method of claim 37, including forming the solder layer before attaching the chip to the metal base and the routing line.

44. The method of claim 37, including forming the solder layer after attaching the chip to the metal base and the routing line.

45. The method of claim 37, including forming the solder layer before forming the solder terminal.

46. The method of claim 37, including forming the solder layer as the solder terminal.

47. The method of claim 37, including forming the connection joint before etching the metal base using the wet chemical etch.

48. The method of claim 37, including forming the connection joint after etching the metal base using the wet chemical etch.

49. The method of claim 37, including forming the solder terminal before attaching the chip to the metal base and the routing line.

50. The method of claim 37, including forming the solder terminal after attaching the chip to the metal base and the routing line.

51. The method of claim 37, including forming the solder terminal before forming the connection joint.

52. The method of claim 37, including forming the solder terminal after forming the connection joint.

53. The method of claim 37, including forming the solder terminal before etching the metal base using the wet chemical etch.

54. The method of claim 37, including forming the solder terminal after etching the metal base using the wet chemical etch.

55. The method of claim 1, including forming the metal containment wall, then forming the solder layer, then attaching the chip to the metal base, the routing line, the metal containment wall and the solder layer, and then etching the metal base using the wet chemical etch.

56. The method of claim 1, including forming the metal containment wall, then attaching the chip to the metal base, the routing line and the metal containment wall, then forming the solder layer, and then etching the metal base using the wet chemical etch.

57. The method of claim 1, including attaching the chip to the metal base and the routing line, then forming the metal containment wall, then forming the solder layer, and then etching the metal base using the wet chemical etch.

58. The method of claim 1, including forming an encapsulant that covers the chip in the first direction after attaching the chip to the routing line.

59. The method of claim 58, including forming an insulative base that covers the routing line, the metal containment wall and the solder layer in the second direction after forming the encapsulant, and then removing a portion of the insulative base such that the insulative base does not cover the solder layer in the second direction.

60. The method of claim 1, wherein the assembly is a first-level package.

61. A method of making a semiconductor chip assembly, comprising:
  providing a metal base that includes first and second opposing surfaces, wherein the first surface of the metal base faces in a first direction and the second surface of the metal base faces in a second direction opposite the first direction; then
  forming a routing line on the first surface of the metal base, wherein the routing line contacts the first surface of the metal base and is spaced from the second surface of the metal base;
  etching the metal base using a first wet chemical etch, thereby forming a via in the metal base that extends into the metal base from the second surface of the metal base towards the first surface of the metal base;
  forming a metal containment wall on the metal base, wherein the metal containment wall contacts the metal base in the via, extends into the metal base from the second surface of the metal base towards the first surface of the metal base and includes a cavity, and the cavity extends into the metal base from the second surface of the metal base towards the first surface of the metal base, is covered in the first direction by the metal containment wall and includes an opening that faces in the second direction;
  forming a solder layer that contacts the metal containment wall in the cavity and is spaced from the routing line;
  mechanically attaching a semiconductor chip to the metal base and the routing line, wherein the chip includes a conductive pad;
  forming a connection joint that electrically connects the routing line and the pad;
  etching the metal base using a second wet chemical etch after attaching the chip to the metal base and the routing line and forming the metal containment wall and the solder layer, thereby reducing contact area between the metal base and the routing line and between the metal base and the metal containment wall; and
  providing a solder terminal that contacts the metal containment wall in the cavity and includes the solder layer.

62. The method of claim 61, wherein forming the routing line includes:
  forming a plating mask on the metal base, wherein the plating mask includes an opening that exposes a portion of the metal base; and then
  electroplating the routing line on the exposed portion of the metal base through the opening in the plating mask.

63. The method of claim 61, wherein forming the metal containment wall and the solder layer includes the following steps in the sequence set forth:
  electroplating the metal containment wall on the metal base and into the via through an opening in a plating mask;
  depositing solder paste on the metal containment wall; and
  reflowing the solder paste, thereby forming the solder layer.

64. The method of claim 61, wherein the solder terminal is the solder layer.

65. The method of claim 61, wherein forming the solder terminal includes:
  depositing a solder material on the solder layer after etching the metal base using the second wet chemical etch; and then
  reflowing the solder material and the solder layer together to form the solder terminal.

66. The method of claim 61, wherein attaching the chip to the metal base and the routing line includes disposing an insulative adhesive between the chip and the metal base and then hardening the adhesive.

67. The method of claim 61, wherein forming the connection joint includes providing a wire bond between the routing line and the pad.

68. The method of claim 61, wherein etching the metal base using the second wet chemical etch exposes the routing line.

69. The method of claim 68, wherein:
etching the metal base using the first wet chemical etch forms the via as a through-hole that extends through the metal base and exposes the routing line; and
etching the metal base using the second wet chemical etch eliminates contact area between the metal base and the routing line and between the metal base and the metal containment wall.

70. The method of claim 69, wherein etching the metal base using the second wet chemical etch removes the metal base.

71. The method of claim 68, wherein:
etching the metal base using the first wet chemical etch forms the via as a recess that extends into but not through the metal base; and
etching the metal base using the second wet chemical etch forms a metal pillar from an unetched portion of the metal base that is defined by the metal containment wall and that contacts and electrically connects the routing line and the metal containment wall.

72. The method of claim 71, wherein etching the metal base using the second wet chemical etch removes most of the metal base.

73. The method of claim 71, wherein etching the metal base using the second wet chemical etch removes all of the metal base within a periphery of the pad.

74. The method of claim 71, wherein etching the metal base using the second wet chemical etch removes all of the metal base within a periphery of the chip.

75. The method of claim 68, wherein etching the metal base using the second wet chemical etch electrically isolates the routing line from other routing lines that contact the metal base.

76. The method of claim 68, wherein etching the metal base using the second wet chemical etch electrically isolates the pad from other conductive pads of the chip.

77. The method of claim 61, including forming the metal containment wall before attaching the chip to the metal base and the routing line.

78. The method of claim 61, including forming the metal containment wall after attaching the chip to the metal base and the routing line.

79. The method of claim 61, including forming the solder layer before attaching the chip to the metal base and the routing line.

80. The method of claim 61, including forming the solder layer after attaching the chip to the metal base and the routing line.

81. The method of claim 61, including forming the connection joint before etching the metal base using the second wet chemical etch.

82. The method of claim 61, including forming the connection joint after etching the metal base using the second wet chemical etch.

83. The method of claim 61, including forming an encapsulant that contacts the chip and covers the chip in the first direction after attaching the chip to the metal base and the routing line.

84. The method of claim 83, including forming an insulative base that contacts the routing line, the metal containment wall and the solder layer and covers the routing line, the metal containment wall and the solder layer in the second direction after forming the encapsulant, and then removing a portion of the insulative base such the insulative base does not cover the solder layer in the second direction.

85. The method of claim 84, wherein removing the portion of the insulative base exposes the metal containment wall and the solder layer in the second direction without exposing the routing line.

86. The method of claim 85, wherein removing the portion of the insulative base includes grinding the insulative base.

87. The method of claim 86, wherein removing the portion of the insulative base includes grinding the insulative base without grinding the metal containment wall and without grinding the solder layer, then grinding the insulative base, the metal containment wall and the solder layer, and then discontinuing the grinding such that the insulative base is laterally aligned with the metal containment wall and the solder layer at a surface that faces in the second direction and the metal containment wall and the solder layer are exposed.

88. The method of claim 87, wherein the solder terminal is the solder layer.

89. The method of claim 87, wherein forming the solder terminal includes:
depositing a solder material on the solder layer after grinding the insulative base, the metal containment wall and the solder layer; and then
reflowing the solder material and the solder layer together to form the solder terminal.

90. The method of claim 61, wherein the assembly is a first-level package.

91. A method of making a semiconductor chip assembly, comprising:
providing a metal base that includes first and second opposing surfaces, wherein the first surface of the metal base faces in a first direction and the second surface of the metal base faces in a second direction opposite the first direction; then
forming a routing line on the first surface of the metal base, wherein the routing line contacts the first surface of the metal base and is spaced from the second surface of the metal base;
etching the metal base using a first wet chemical etch, thereby forming a via in the metal base that extends into the metal base from the second surface of the metal base towards the first surface of the metal base;
forming a metal containment wall on the metal base, wherein the metal containment wall contacts the metal base in the via, extends into the metal base from the second surface of the metal base towards the first surface of the metal base and includes a cavity, and the cavity extends into the metal base from the second surface of the metal base towards the first surface of the metal base, is covered in the first direction by the metal containment wall and includes an opening that faces in the second direction;
forming a solder layer that contacts the metal containment wall in the cavity and is spaced from the routing line;
mechanically attaching a semiconductor chip to the metal base and the routing line, wherein the chip includes a conductive pad;
forming a connection joint that electrically connects the routing line and the pad;
forming an encapsulant after attaching the chip to the metal base and the routing line, wherein the encapsulant contacts the chip and extends vertically beyond the chip, the metal base and the routing line in the first direction, and the metal base extends vertically beyond the chip and the routing line in the second direction;

etching the metal base using a second wet chemical etch after forming the metal containment wall, the solder layer and the encapsulant, thereby reducing contact area between the metal base and the routing line and between the metal base and the metal containment wall;

forming an insulative base that contacts the routing line, the metal containment wall and the solder layer and covers the routing line, the metal containment wall and the solder layer in the second direction after etching the metal base using the second wet chemical etch;

removing a portion of the insulative base such than the insulative base does not cover the solder layer in the second direction; and providing a solder terminal that contacts the metal containment wall in the cavity and includes the solder layer.

92. The method of claim 91, wherein forming the routing line includes:

forming a plating mask on the metal base, wherein the plating mask includes an opening that exposes a portion of the metal base; and then electroplating the routing line on the exposed portion of the metal base through the opening in the plating mask.

93. The method of claim 91, wherein forming the metal containment wall and the solder layer includes the following steps in the sequence set forth:

electroplating the metal containment wall on the metal base and into the via through an opening in a plating mask;

depositing solder paste on the metal containment wall; and reflowing the solder paste, thereby forming the solder layer.

94. The method of claim 91, wherein the solder terminal is the solder layer.

95. The method of claim 91, wherein forming the solder terminal includes:

depositing a solder material on the solder layer after etching the metal base using the second wet chemical etch; and then reflowing the solder material and the solder layer together to form the solder terminal.

96. The method of claim 91, wherein attaching the chip to the metal base and the routing line includes disposing an insulative adhesive between the chip and the metal base and then hardening the adhesive.

97. The method of claim 91, wherein forming the connection joint includes providing a wire bond between the routing line and the pad.

98. The method of claim 91, wherein etching the metal base using the second wet chemical etch exposes the routing line.

99. The method of claim 98, wherein:

etching the metal base using the first wet chemical etch forms the via as a through-hole that extends through the metal base and exposes the routing line; and etching the metal base using the second wet chemical etch eliminates contact area between the metal base and the routing line and between the metal base and the metal containment wall.

100. The method of claim 99, wherein etching the metal base using the second wet chemical etch removes the metal base.

101. The method of claim 98, wherein:

etching the metal base using the first wet chemical etch forms the via as a recess that extends into but not through the metal base; and etching the metal base using the second wet chemical etch forms a metal pillar from an unetched portion of the metal base that is defined by the metal containment wall and that contacts and electrically connects the routing line and the metal containment wall.

102. The method of claim 101, wherein etching the metal base using the second wet chemical etch removes most of the metal base.

103. The method of claim 101, wherein etching the metal base using the second wet chemical etch removes all of the metal base within a periphery of the pad.

104. The method of claim 101, wherein etching the metal base using the second wet chemical etch removes all of the metal base within a periphery of the chip.

105. The method of claim 98, wherein etching the metal base using the second wet chemical etch electrically isolates the routing line from other routing lines that contact the metal base.

106. The method of claim 98, wherein etching the metal base using the second wet chemical etch electrically isolates the pad from other conductive pads of the chip.

107. The method of claim 91, including forming the metal containment wall before attaching the chip to the metal base and the routing line.

108. The method of claim 91, including forming the metal containment wall after attaching the chip to the metal base and the routing line.

109. The method of claim 91, including forming the solder layer before attaching the chip to the metal base and the routing line.

110. The method of claim 91, including forming the solder layer after attaching the chip to the metal base and the routing line.

111. The method of claim 91, including forming the connection joint before etching the metal base using the second wet chemical etch.

112. The method of claim 91, including forming the connection joint after etching the metal base using the second wet chemical etch.

113. The method of claim 91, wherein forming the encapsulant includes transfer molding.

114. The method of claim 91, wherein removing the portion of the insulative base exposes the metal containment wall and the solder layer in the second direction without exposing the routing line.

115. The method of claim 114, wherein removing the portion of the insulative base removes all of the insulative base that covers the metal containment wall and the solder layer in the second direction.

116. The method of claim 115, wherein removing the portion of the insulative base includes grinding the insulative base.

117. The method of claim 116, wherein removing the portion of the insulative base includes grinding the insulative base without grinding the metal containment wall and without grinding the solder layer, then grinding the insulative base, the metal containment wall and the solder layer, and then discontinuing the grinding such that the insulative base is laterally aligned with the metal containment wall and the solder layer at a surface that faces in the second direction and the metal containment wall and the solder layer are exposed.

118. The method of claim 117, wherein the solder terminal is the solder layer.

119. The method of claim 117, wherein forming the solder terminal includes:
depositing a solder material on the solder layer after grinding the insulative base, the metal containment wall and the solder layer; and then
reflowing the solder material and the solder layer together to form the solder terminal.

120. The method of claim 91, wherein the assembly is a first-level package.

121. A method of making a semiconductor chip assembly, comprising:
providing a metal base that includes first and second opposing surfaces, wherein the first surface of the metal base faces in a first direction and the second surface of the metal base faces in a second direction opposite the first direction; then
forming a routing line on the first surface of the metal base, wherein the routing line contacts the first surface of the metal base and is spaced from the second surface of the metal base;
etching the metal base using a first wet chemical etch, thereby forming a via in the metal base that extends into the metal base from the second surface of the metal base towards the first surface of the metal base;
forming a metal containment wall on the metal base, wherein the metal containment wall contacts the metal base in the via, extends into the metal base from the second surface of the metal base towards the first surface of the metal base and includes a cavity, and the cavity extends into the metal base from the second surface of the metal base towards the first surface of the metal base, is covered in the first direction by the metal containment wall and includes an opening that faces in the second direction;
forming a solder layer that contacts the metal containment wall in the cavity and is spaced from the routing line;
mechanically attaching a semiconductor chip to the metal base, the routing line, the metal containment wall and the solder layer, wherein the chip includes a conductive pad;
forming a connection joint that electrically connects the routing line and the pad;
forming an encapsulant after attaching the chip to the metal base, the routing line, the metal containment wall and the solder layer, wherein the encapsulant contacts the chip and extends vertically beyond the chip, the metal base, the routing line, the metal containment wall and the solder layer in the first direction, and the metal base extends vertically beyond the chip and the routing line in the second direction;
etching the metal base using a second wet chemical etch after forming the encapsulant, thereby reducing contact area between the metal base and the routing line and between the metal base and the metal containment wall and exposing the routing line;
forming an insulative base that contacts the routing line, the metal containment wall and the solder layer and covers the routing line, the metal containment wall and the solder layer in the second direction after etching the metal base using the second wet chemical etch;
removing a portion of the insulative base such that the insulative base does not cover the solder layer in the second direction; and
providing a solder terminal that contacts the metal containment wall in the cavity and includes the solder layer.

122. The method of claim 121, wherein forming the routing line includes:
forming a plating mask on the metal base, wherein the plating mask includes an opening that exposes a portion of the metal base; and then
electroplating the routing line on the exposed portion of the metal base through the opening in the plating mask.

123. The method of claim 121, wherein forming the metal containment wall and the solder layer includes the following steps in the sequence set forth:
electroplating the metal containment wall on the metal base and into the via through an opening in a plating mask;
depositing solder paste on the metal containment wall; and
reflowing the solder paste, thereby forming the solder layer.

124. The method of claim 121, wherein the solder terminal is the solder layer.

125. The method of claim 121, wherein forming the solder terminal includes:
depositing a solder material on the solder layer after etching the metal base using the second wet chemical etch; and then
reflowing the solder material and the solder layer together to form the solder terminal.

126. The method of claim 121, wherein:
etching the metal base using the first wet chemical etch forms the via as a through-hole that extends through the metal base and exposes the routing line; and
etching the metal base using the second wet chemical etch eliminates contact area between the metal base and the routing line and between the metal base and the metal containment wall.

127. The method of claim 126, wherein etching the metal base using the second wet chemical etch removes the metal base.

128. The method of claim 121, wherein:
etching the metal base using the first wet chemical etch forms the via as a recess that extends into but not through the metal base; and
etching the metal base using the second wet chemical etch forms a metal pillar from an unetched portion of the metal base that is defined by the metal containment wall and that contacts and electrically connects the routing line and the metal containment wall.

129. The method of claim 128, wherein etching the metal base using the second wet chemical etch removes most of the metal base.

130. The method of claim 121, wherein etching the metal base using the second wet chemical etch electrically isolates the routing line from other routing lines that contact the metal base.

131. The method of claim 121, wherein etching the metal base using the second wet chemical etch electrically isolates the pad from other conductive pads of the chip.

132. The method of claim 121, including forming the connection joint before etching the metal base using the second wet chemical etch.

133. The method of claim 121, including forming the connection joint after etching the metal base using the second wet chemical etch.

134. The method of claim 121, wherein removing the portion of the insulative base exposes the metal containment wall and the solder layer in the second direction without exposing the routing line.

135. The method of claim 134, wherein removing the portion of the insulative base removes all of the insulative base that covers the metal containment wall and the solder layer in the second direction.

136. The method of claim 135, wherein removing the portion of the insulative base includes grinding the insulative base.

137. The method of claim 136, wherein removing the portion of the insulative base includes grinding the insulative base without grinding the metal containment wall and without grinding the solder layer, then grinding the insulative base, the metal containment wall and the solder layer, and then discontinuing the grinding such that the insulative base is laterally aligned with the metal containment wall and the solder layer at a surface that faces in the second direction and the metal containment wall and the solder layer are exposed.

138. The method of claim 137, wherein the solder terminal is the solder layer.

139. The method of claim 137, wherein forming the solder terminal includes:
depositing a solder material on the solder layer after grinding the insulative base, the metal containment wall and the solder layer; and then
reflowing the solder material and the solder layer together to form the solder terminal.

140. The method of claim 121, wherein the assembly is a first-level package.

141. A method of making a semiconductor chip assembly, comprising:
providing a metal base that includes first and second opposing surfaces, wherein the first surface of the metal base faces in a first direction and the second surface of the metal base faces in a second direction opposite the first direction; then
forming a routing line on the first surface of the metal base, wherein the routing line contacts the first surface of the metal base and is spaced from the second surface of the metal base;
etching the metal base using a first wet chemical etch, thereby forming a via in the metal base that extends into the metal base from the second surface of the metal base towards the first surface of the metal base;
forming a metal containment wall on the metal base, wherein the metal containment wall contacts the metal base in the via, extends into the metal base from the second surface of the metal base towards the first surface of the metal base and includes a cavity, and the cavity extends into the metal base from the second surface of the metal base towards the first surface of the metal base, is covered in the first direction by the metal containment wall and includes an opening that faces in the second direction;
mechanically attaching a semiconductor chip to the metal base, the routing line and the metal containment wall, wherein the chip includes a conductive pad;
forming a connection joint that electrically connects the routing line and the pad;
forming an encapsulant after attaching the chip to the metal base, the routing line and the metal containment wall, wherein the encapsulant contacts the chip and extends vertically beyond the chip, the metal base, the routing line and the metal containment wall in the first direction, and the metal base extends vertically beyond the chip and the routing line in the second direction;
forming a solder layer that contacts the metal containment wall in the cavity and is spaced from the routing line after forming the encapsulant;
etching the metal base using a second wet chemical etch after forming the solder layer, thereby reducing contact area between the metal base and the routing line and between the metal base and the metal containment wall and exposing the routing line;
forming an insulative base that contacts the routing line, the metal containment wall and the solder layer and covers the routing line, the metal containment wall and the solder layer in the second direction after etching the metal base using the second wet chemical etch;
removing a portion of the insulative base such that the insulative base does not cover the solder layer in the second direction; and
providing a solder terminal that contacts the metal containment wall in the cavity and includes the solder layer.

142. The method of claim 141, wherein forming the routing line includes:
forming a plating mask on the metal base, wherein the plating mask includes an opening that exposes a portion of the metal base; and then
electroplating the routing line on the exposed portion of the metal base through the opening in the plating mask.

143. The method of claim 141, wherein forming the metal containment wall and the solder layer includes the following steps in the sequence set forth:
electroplating the metal containment wall on the metal base and into the via through an opening in a plating mask;
depositing solder paste on the metal containment wall; and
reflowing the solder paste, thereby forming the solder layer.

144. The method of claim 141, wherein the solder terminal is the solder layer.

145. The method of claim 141, wherein forming the solder terminal includes:
depositing a solder material on the solder layer after etching the metal base using the second wet chemical etch; and then
reflowing the solder material and the solder layer together to form the solder terminal.

146. The method of claim 141, wherein:
etching the metal base using the first wet chemical etch forms the via as a through-hole that extends through the metal base and exposes the routing line; and
etching the metal base using the second wet chemical etch eliminates contact area between the metal base and the routing line and between the metal base and the metal containment wall.

147. The method of claim 146, wherein etching the metal base using the second wet chemical etch removes the metal base.

148. The method of claim 141, wherein:
etching the metal base using the first wet chemical etch forms the via as a recess that extends into but not through the metal base; and
etching the metal base using the second wet chemical etch forms a metal pillar from an unetched portion of the metal base that is defined by the metal containment wall and that contacts and electrically connects the routing line and the metal containment wall.

149. The method of claim 148, wherein etching the metal base using the second wet chemical etch removes most of the metal base.

150. The method of claim 141, wherein etching the metal base using the second wet chemical etch electrically isolates the routing line from other routing lines that contact the metal base.

151. The method of claim 141, wherein etching the metal base using the second wet chemical etch electrically isolates the pad from other conductive pads of the chip.

152. The method of claim 141, including forming the connection joint before etching the metal base using the second wet chemical etch.

153. The method of claim 141, including forming the connection joint after etching the metal base using the second wet chemical etch.

154. The method of claim 141, wherein removing the portion of the insulative base exposes the metal containment wall and the solder layer in the second direction without exposing the routing line.

155. The method of claim 154, wherein removing the portion of the insulative base removes all of the insulative base that covers the metal containment wall and the solder layer in the second direction.

156. The method of claim 155, wherein removing the portion of the insulative base includes grinding the insulative base.

157. The method of claim 156, wherein removing the portion of the insulative base includes grinding the insulative base without grinding the metal containment wall and without grinding the solder layer, then grinding the insulative base, the metal containment wall and the solder layer, and then discontinuing the grinding such that the insulative base is laterally aligned with the metal containment wall and the solder layer at a surface that faces in the second direction and the metal containment wall and the solder layer are exposed.

158. The method of claim 157, wherein the solder terminal is the solder layer.

159. The method of claim 157, wherein forming the solder terminal includes:
depositing a solder material on the solder layer after grinding the insulative base, the metal containment wall and the solder layer; and then
reflowing the solder material and the solder layer together to form the solder terminal.

160. The method of claim 141, wherein the assembly is a first-level package.

161. A method of making a semiconductor chip assembly, comprising:
providing a metal base that includes first and second opposing surfaces, wherein the first surface of the metal base faces in a first direction and the second surface of the metal base faces in a second direction opposite the first direction; then
forming a routing line on the first surface of the metal base, wherein the routing line contacts the first surface of the metal base and is spaced from the second surface of the metal base;
mechanically attaching a semiconductor chip to the metal base and the routing line, wherein the chip includes a conductive pad;
forming a connection joint that electrically connects the routing line and the pad;
forming an encapsulant after attaching the chip to the metal base and the routing line, wherein the encapsulant contacts the chip and extends vertically beyond the chip, the metal base and the routing line in the first direction, and the metal base extends vertically beyond the chip and the routing line in the second direction;
etching the metal base using a first wet chemical etch after forming the encapsulant, thereby forming a via in the metal base that extends into the metal base from the second surface of the metal base towards the first surface of the metal base;
forming a metal containment wall on the metal base, wherein the metal containment wall contacts the metal base in the via, extends into the metal base from the second surface of the metal base towards the first surface of the metal base and includes a cavity, and the cavity extends into the metal base from the second surface of the metal base towards the first surface of the metal base, is covered in the first direction by the metal containment wall and includes an opening that faces in the second direction;
forming a solder layer that contacts the metal containment wall in the cavity and is spaced from the routing line;
etching the metal base using a second wet chemical etch after forming the solder layer, thereby reducing contact area between the metal base and the routing line and between the metal base and the metal containment wall and exposing the routing line;
forming an insulative base that contacts the routing line, the metal containment wall and the solder layer and covers the routing line, the metal containment wall and the solder layer in the second direction after etching the metal base using the second wet chemical etch;
removing a portion of the insulative base such that the insulative base does not cover the solder layer in the second direction; and
providing a solder terminal that contacts the metal containment wall in the cavity and includes the solder layer.

162. The method of claim 161, wherein forming the routing line includes:
forming a plating mask on the metal base, wherein the plating mask includes an opening that exposes a portion of the metal base; and then
electroplating the routing line on the exposed portion of the metal base through the opening in the plating mask.

163. The method of claim 161, wherein forming the metal containment wall and the solder layer includes the following steps in the sequence set forth:
electroplating the metal containment wall on the metal base and into the via through an opening in a plating mask;
depositing solder paste on the metal containment wall; and
reflowing the solder paste, thereby forming the solder layer.

164. The method of claim 161, wherein the solder terminal is the solder layer.

165. The method of claim 161, wherein forming the solder terminal includes:
depositing a solder material on the solder layer after etching the metal base using the second wet chemical etch; and then
reflowing the solder material and the solder layer together to form the solder terminal.

166. The method of claim 161, wherein:
etching the metal base using the first wet chemical etch forms the via as a through-hole that extends through the metal base and exposes the routing line; and
etching the metal base using the second wet chemical etch eliminates contact area between the metal base and the routing line and between the metal base and the metal containment wall.

167. The method of claim 166, wherein etching the metal base using the second wet chemical etch removes the metal base.

168. The method of claim 161, wherein:
etching the metal base using the first wet chemical etch forms the via as a recess that extends into but not through the metal base; and etching the metal base using the second wet chemical etch forms a metal pillar from an unetched portion of the metal base that is defined by the metal containment wall and that contacts and electrically connects the routing line and the metal containment wall.

169. The method of claim 168, wherein etching the metal base using the second wet chemical etch removes most of the metal base.

170. The method of claim 161, wherein etching the metal base using the second wet chemical etch electrically isolates the routing line from other routing lines that contact the metal base.

171. The method of claim 161, wherein etching the metal base using the second wet chemical etch electrically isolates the pad from other conductive pads of the chip.

172. The method of claim 161, including forming the connection joint before etching the metal base using the second wet chemical etch.

173. The method of claim 161, including forming the connection joint after etching the metal base using the second wet chemical etch.

174. The method of claim 161, wherein removing the portion of the insulative base exposes the metal containment wall and the solder layer in the second direction without exposing the routing line.

175. The method of claim 174, wherein removing the portion of the insulative base removes all of the insulative base that covers the metal containment wall and the solder layer in the second direction.

176. The method of claim 175, wherein removing the portion of the insulative base includes grinding the insulative base.

177. The method of claim 176, wherein removing the portion of the insulative base includes grinding the insulative base without grinding the metal containment wall and without grinding the solder layer, then grinding the insulative base, the metal containment wall and the solder layer, and then discontinuing the grinding such that the insulative base is laterally aligned with the metal containment wall and the solder layer at a surface that faces in the second direction and the metal containment wall and the solder layer are exposed.

178. The method of claim 177, wherein the solder terminal is the solder layer.

179. The method of claim 177, wherein forming the solder terminal includes:
depositing a solder material on the solder layer after grinding the insulative base, the metal containment wall and the solder layer; and then
reflowing the solder material and the solder layer together to form the solder terminal.

180. The method of claim 161, wherein the assembly is a first-level package.

181. A method of making a semiconductor chip assembly, comprising:
providing a metal base that includes first and second opposing surfaces, wherein the first surface of the metal base faces in a first direction and the second surface of the metal base faces in a second direction opposite the first direction; then
forming a routing line on the first surface of the metal base, wherein the routing line contacts the first surface of the metal base and is spaced from the second surface of the metal base;
etching the metal base using a first wet chemical etch, thereby forming a through-hole in the metal base that extends through the metal base between the first and second surfaces of the metal base and exposes the routing line;
forming a metal containment wall on the metal base and the routing line, wherein the metal containment wall contacts the metal base and the routing line in the through-hole, extends through the metal base between the first and second surfaces of the metal base and includes a cavity, and the cavity extends into the metal base from the second surface of the metal base towards the first surface of the metal base, is covered in the first direction by the metal containment wall and includes an opening that faces in the second direction;
forming a solder layer that contacts the metal containment wall in the cavity and is spaced from the routing line;
mechanically attaching a semiconductor chip to the metal base and the routing line, wherein the chip includes a conductive pad;
forming a connection joint that electrically connects the routing line and the pad;
forming an encapsulant after attaching the chip to the metal base and the routing line, wherein the encapsulant contacts the chip and extends vertically beyond the chip, the metal base and the routing line in the first direction, and the metal base extends vertically beyond the chip and the routing line in the second direction;
etching the metal base using a second wet chemical etch after forming the metal containment wall, the solder layer and the encapsulant, thereby eliminating contact area between the metal base and the routing line and between the metal base and the metal containment wall and exposing the routing line;
forming an insulative base that contacts the routing line, the metal containment wall and the solder layer and covers the routing line, the metal containment wall and the solder layer in the second direction after etching the metal base using the second wet chemical etch;
removing a portion of the insulative base such that the insulative base does not cover the solder layer in the second direction; and
providing a solder terminal that contacts the metal containment wall in the cavity and includes the solder layer.

182. The method of claim 181, wherein forming the routing line, the metal containment wall and the solder layer includes:
electroplating the routing line on the metal base;
electroplating the metal containment wall on the metal base and the routing line;
depositing solder paste on the metal containment wall; and
reflowing the solder paste, thereby forming the solder layer.

183. The method of claim 181, wherein the solder terminal is the solder layer.

184. The method of claim 181, wherein forming the solder terminal includes:
depositing a solder material on the solder layer after etching the metal base using the second wet chemical etch; and then
reflowing the solder material and the solder layer together to form the solder terminal.

185. The method of claim 181, wherein etching the metal base using the second wet chemical etch removes the metal base.

186. The method of claim 181, wherein etching the metal base using the second wet chemical etch electrically isolates the routing line from other routing lines that contact the metal base and electrically isolates the pad from other conductive pads of the chip.

187. The method of claim 181, including forming the metal containment wall, then forming the solder layer, then attaching the chip to the metal base, the routing line, the metal containment wall and the solder layer, and then forming the encapsulant.

188. The method of claim 181, including forming the metal containment wall, then attaching the chip to the metal base, the routing line and the metal containment wall, then forming the encapsulant, and then forming the solder layer.

189. The method of claim 181, including attaching the chip to the metal base and the routing line, then forming the encapsulant, then forming the metal containment wall, and then forming the solder layer.

190. The method of claim 181, wherein removing the portion of the insulative base includes grinding the insulative base without grinding the metal containment wall and without grinding the solder layer, then grinding the insulative base, the metal containment wall and the solder layer, and then discontinuing the grinding such that the insulative base is laterally aligned with the metal containment wall and the solder layer at a surface that faces in the second direction and the metal containment wall and the solder layer are exposed.

191. A method of making a semiconductor chip assembly, comprising:
   providing a metal base that includes first and second opposing surfaces, wherein the first surface of the metal base faces in a first direction and the second surface of the metal base faces in a second direction opposite the first direction; then
   forming a routing line on the first surface of the metal base, wherein the routing line contacts the first surface of the metal base and is spaced from the second surface of the metal base;
   etching the metal base using a first wet chemical etch, thereby forming a recess in the metal base that extends into but not through the metal base from the second surface of the metal base towards the first surface of the metal base and is spaced from the first surface of the metal base;
   forming a metal containment wall on the metal base, wherein the metal containment wall contacts the metal base in the recess, extends into but not through the metal base from the second surface of the metal base towards the first surface of the metal base, is spaced from the first surface of the metal base and includes a cavity, and the cavity extends into the metal base from the second surface of the metal base towards the first surface of the metal base, is covered in the first direction by the metal containment wall and includes an opening that faces in the second direction;
   forming a solder layer that contacts the metal containment wall in the cavity and is spaced from the routing line;
   mechanically attaching a semiconductor chip to the metal base and the routing line, wherein the chip includes a conductive pad;
   forming a connection joint that electrically connects the routing line and the pad;
   forming an encapsulant after attaching the chip to the metal base and the routing line, wherein the encapsulant contacts the chip and extends vertically beyond the chip, the metal base and the routing line in the first direction, and the metal base extends vertically beyond the chip and the routing line in the second direction;
   etching the metal base using a second wet chemical etch after forming the metal containment wall, the solder layer and the encapsulant, thereby reducing but not eliminating contact area between the metal base and the routing line and between the metal base and the metal containment wall and forming a metal pillar from an unetched portion of the metal base that is defined by the metal containment wall and that contacts and electrically connects the routing line and the metal containment wall and is spaced from the solder layer and exposing the routing line;
   forming an insulative base that contacts the routing line, the metal containment wall, the metal pillar and the solder layer and covers the routing line, the metal containment wall, the metal pillar and the solder layer in the second direction after etching the metal base using the second wet chemical etch;
   removing a portion of the insulative base such that the insulative base does not cover the solder layer in the second direction; and
   providing a solder terminal that contacts the metal containment wall in the cavity and includes the solder layer.

192. The method of claim 191, wherein forming the routing line, the metal containment wall and the solder layer includes:
   electroplating the routing line on the metal base;
   electroplating the metal containment wall on the metal base and the routing line;
   depositing solder paste on the metal containment wall; and
   reflowing the solder paste, thereby forming the solder layer.

193. The method of claim 191, wherein the solder terminal is the solder layer.

194. The method of claim 191, wherein forming the solder terminal includes:
   depositing a solder material on the solder layer after etching the metal base using the second wet chemical etch; and then
   reflowing the solder material and the solder layer together to form the solder terminal.

195. The method of claim 191, wherein etching the metal base using the second wet chemical etch removes most of the metal base.

196. The method of claim 191, wherein etching the metal base using the second wet chemical etch electrically isolates the routing line from other routing lines that contact the metal base and electrically isolates the pad from other conductive pads of the chip.

197. The method of claim 191, including forming the metal containment wall, then forming the solder layer, then attaching the chip to the metal base, the routing line, the metal containment wall and the solder layer, and then forming the encapsulant.

198. The method of claim 191, including forming the metal containment wall, then attaching the chip to the metal base, the routing line and the metal containment wall, then forming the encapsulant, and then forming the solder layer.

199. The method of claim 191, including attaching the chip to the metal base and the routing line, then forming the encapsulant, then forming the metal containment wall, and then forming the solder layer.

200. The method of claim 191, wherein removing the portion of the insulative base includes grinding the insulative base without grinding the metal containment wall and without grinding the solder layer, then grinding the insulative base, the metal containment wall and the solder layer, and then discontinuing the grinding such that the insulative base is laterally aligned with the metal containment wall and the solder layer at a surface that faces in the second direction and the metal containment wall and the solder layer are exposed.

* * * * *